US012593517B2

(12) United States Patent
Watanabe et al.

(10) Patent No.: US 12,593,517 B2
(45) Date of Patent: Mar. 31, 2026

(54) SOLID-STATE IMAGING DEVICE, DRIVE METHOD THEREOF AND ELECTRONIC APPARATUS

(71) Applicant: SONY GROUP CORPORATION, Tokyo (JP)

(72) Inventors: Taiichiro Watanabe, Kanagawa (JP); Akihiro Yamada, Kanagawa (JP); Hideo Kido, Kanagawa (JP); Hiromasa Saito, Kanagawa (JP); Keiji Mabuchi, Kanagawa (JP); Yuko Ohgishi, Tokyo (JP)

(73) Assignee: Sony Group Corporation, Tokyo (JP)

( * ) Notice: Subject to any disclaimer, the term of this patent is extended or adjusted under 35 U.S.C. 154(b) by 270 days.

(21) Appl. No.: 18/467,364

(22) Filed: Sep. 14, 2023

(65) Prior Publication Data

US 2024/0047504 A1 Feb. 8, 2024

Related U.S. Application Data

(60) Continuation of application No. 17/902,664, filed on Sep. 2, 2022, now Pat. No. 11,817,473, which is a (Continued)

(30) Foreign Application Priority Data

Jun. 9, 2008 (JP) ................................ 2008-150963
Nov. 6, 2008 (JP) ................................ 2008-285907
(Continued)

(51) Int. Cl.
H10F 39/15 (2025.01)
H10F 39/00 (2025.01)
(Continued)

(52) U.S. Cl.
CPC ....... *H10F 39/158* (2025.01); *H10F 39/1825* (2025.01); *H10F 39/199* (2025.01); (Continued)

(58) Field of Classification Search
CPC .. H10F 39/158; H10F 39/1825; H10F 39/199; H10F 39/802; H10F 39/813; H10F 39/1865; H10F 39/806
See application file for complete search history.

(56) References Cited

U.S. PATENT DOCUMENTS 4,638,361 A 1/1987 Takeshita
5,965,875 A 10/1999 Merrill
(Continued)

FOREIGN PATENT DOCUMENTS

EP 1562233 8/2005
JP H08-255888 10/1996
(Continued)

OTHER PUBLICATIONS

Partial European Search Report for Europe Patent Application No. 09007482, dated Nov. 2, 2011, 6 pages.
(Continued)

*Primary Examiner* — Georgia Y Epps
*Assistant Examiner* — Don J Williams
(74) *Attorney, Agent, or Firm* — SHERIDAN ROSS P.C.

(57) ABSTRACT

A solid-state imaging device includes: plural photodiodes formed in different depths in a unit pixel area of a substrate; a plural vertical transistors formed in the depth direction from one face side of the substrate so that gate portions for reading signal charges obtained by photelectric conversion in the plural photodiodes are formed in depths corresponding to the respective photodiodes.

20 Claims, 84 Drawing Sheets

Related U.S. Application Data continuation of application No. 16/932,544, filed on Jul. 17, 2020, now Pat. No. 11,489,001, which is a continuation of application No. 16/228,244, filed on Dec. 20, 2018, now Pat. No. 10,748,958, which is a continuation of application No. 14/082,832, filed on Nov. 18, 2013, now Pat. No. 10,199,427, which is a division of application No. 12/480,351, filed on Jun. 8, 2009, now Pat. No. 8,614,759.

(30) Foreign Application Priority Data

| Nov. 6, 2008 | (JP) | ................................. | 2008-285908 |
| Nov. 6, 2008 | (JP) | ................................. | 2008-285909 |

(51) Int. Cl.

| *H10F 39/12* | (2025.01) |
| *H10F 39/18* | (2025.01) |

(52) U.S. Cl.

CPC ......... *H10F 39/802* (2025.01); *H10F 39/813* (2025.01); *H10F 39/1865* (2025.01); *H10F 39/806* (2025.01)

(56) References Cited

U.S. PATENT DOCUMENTS

| 6,066,510 | A | 5/2000 | Merrill |
| 6,756,616 | B2 | 6/2004 | Rhodes |
| 7,186,583 | B2 | 3/2007 | Lee |
| 7,345,703 | B2 | 3/2008 | Lee |
| 7,518,171 | B2 | 4/2009 | Sze et al. |
| 7,531,857 | B2 | 5/2009 | Park et al. |
| 7,704,782 | B2 | 4/2010 | Ladd et al. |
| 7,714,915 | B2 | 5/2010 | Endo et al. |
| 7,745,860 | B2 | 6/2010 | Inoue et al. |
| 7,794,394 | B2 | 9/2010 | Frangioni |
| 7,928,352 | B2 | 4/2011 | Toda |
| 7,973,377 | B2 | 7/2011 | King et al. |
| 8,614,759 | B2 | 12/2013 | Watanabe et al. |
| 10,199,427 | B2 | 2/2019 | Watanabe et al. |
| 10,748,958 | B2 | 8/2020 | Watanabe et al. |
| 11,489,001 | B2 | 11/2022 | Watanabe et al. |
| 2001/0043275 | A1* | 11/2001 | Hirota ................... H04N 25/00 348/E3.018 |
| 2002/0058353 | A1 | 5/2002 | Merrill |
| 2003/0189656 | A1 | 10/2003 | Shinohara |
| 2003/0214595 | A1 | 11/2003 | Mabuchi |
| 2004/0036789 | A1 | 2/2004 | Shinohara |
| 2004/0080638 | A1 | 4/2004 | Lee |
| 2005/0167704 | A1 | 8/2005 | Ezaki et al. |
| 2005/0194653 | A1 | 9/2005 | Hynecek et al. |
| 2006/0006488 | A1 | 1/2006 | Kanbe |
| 2006/0022223 | A1 | 2/2006 | Kumesawa |
| 2006/0022232 | A1 | 2/2006 | Lim |
| 2006/0081887 | A1* | 4/2006 | Lyu ....................... H10F 39/803 257/E27.131 |
| 2006/0084195 | A1 | 4/2006 | Lyu |
| 2006/0091290 | A1 | 5/2006 | Yoshihara et al. |
| 2006/0103750 | A1 | 5/2006 | Iwamoto |
| 2006/0163619 | A1 | 7/2006 | Wada |
| 2006/0208285 | A1 | 9/2006 | Inoue et al. |
| 2006/0214199 | A1 | 9/2006 | Inoue et al. |
| 2006/0266922 | A1 | 11/2006 | McGrath et al. |
| 2006/0273361 | A1 | 12/2006 | Tanaka et al. |
| 2007/0003261 | A1 | 1/2007 | Yamasaki |
| 2007/0012970 | A1 | 1/2007 | Mouli |
| 2007/0023852 | A1 | 2/2007 | Okawa et al. |
| 2007/0052051 | A1 | 3/2007 | Osaka et al. |
| 2007/0063299 | A1 | 3/2007 | Hwang |
| 2007/0102740 | A1 | 5/2007 | Ellis-Monaghan et al. |
| 2007/0114629 | A1 | 5/2007 | Dosluoglu |
| 2007/0131987 | A1 | 6/2007 | Kim |
| 2007/0194400 | A1 | 8/2007 | Yokoyama |
| 2007/0215204 | A1 | 9/2007 | Maehara |
| 2007/0215968 | A1 | 9/2007 | Wilson et al. |
| 2007/0218613 | A1 | 9/2007 | Lee |
| 2007/0247538 | A1 | 10/2007 | Fujita et al. |
| 2007/0279501 | A1 | 12/2007 | Goto et al. |
| 2008/0017892 | A1 | 1/2008 | Parks et al. |
| 2008/0023729 | A1 | 1/2008 | Izawa |
| 2008/0024640 | A1 | 1/2008 | Izawa |
| 2008/0036888 | A1 | 2/2008 | Sugawa et al. |
| 2008/0076202 | A1 | 3/2008 | Suzuki et al. |
| 2008/0102554 | A1 | 5/2008 | Abe et al. |
| 2008/0217718 | A1 | 9/2008 | Mauritzson |
| 2009/0002531 | A1 | 1/2009 | Godaiin |
| 2009/0067702 | A1 | 3/2009 | Mauritzson |
| 2009/0144354 | A1 | 6/2009 | Misawa et al. |
| 2009/0189234 | A1 | 7/2009 | Mabuchi |
| 2022/0415961 | A1 | 12/2022 | Watanabe et al. |

FOREIGN PATENT DOCUMENTS

| JP | H10-284714 | 10/1998 |
| JP | 2000-201300 | 7/2000 |
| JP | 2002-513145 | 5/2002 |
| JP | 2003-031785 | 1/2003 |
| JP | 2005-223084 | 8/2005 |
| JP | 2006-253309 | 9/2006 |
| JP | 2007-096271 | 4/2007 |
| JP | 2007-165886 | 6/2007 |
| JP | 2007-294531 | 11/2007 |
| JP | 2007-531254 | 11/2007 |
| JP | 2008-016542 | 1/2008 |
| JP | 2008-258316 | 10/2008 |

OTHER PUBLICATIONS

Official Action (no English translation available) for Japanese Patent Application No. 2008-285907 mailed Apr. 16, 2013, 5 pages.

Official Action (no English translation available) for Japanese Patent Application No. 2008-285909 mailed Apr. 23, 2013, 2 pages.

Official Action (no English translation available) for Japanese Patent Application No. 2008-285908 mailed May 28, 2013, 4 pages.

Official Action (with English translation) for Korean Patent Application No. 10-2009-0050878 dated May 29, 2015, 19 pages.

Official Action for U.S. Appl. No. 12/480,351, dated Jun. 16, 2011, 6 pages. Restriction Requirement.

Official Action for U.S. Appl. No. 12/480,351, dated Oct. 13, 2011, 19 pages.

Official Action for U.S. Appl. No. 12/480,351, dated Jul. 5, 2012, 19 pages.

Official Action for U.S. Appl. No. 12/480,351, dated Dec. 31, 2012, 22 pages.

Notice of Allowance for U.S. Appl. No. 12/480,351, dated Aug. 19, 2013, 6 pages.

Official Action for U.S. Appl. No. 14/082,832, dated Nov. 19, 2015, 13 pages.

Official Action for U.S. Appl. No. 14/082,832, dated Aug. 9, 2016, 12 pages.

Official Action for U.S. Appl. No. 14/082,832, dated Nov. 23, 2016, 14 pages.

Official Action for U.S. Appl. No. 14/082,832, dated Jun. 2, 2017, 17 pages.

Official Action for U.S. Appl. No. 14/082,832, dated Dec. 14, 2017, 17 pages.

Official Action for U.S. Appl. No. 14/082,832, dated Jul. 6, 2018, 15 pages.

Notice of Allowance for U.S. Appl. No. 14/082,832, dated Sep. 20, 2018, 8 pages.

Official Action for U.S. Appl. No. 16/228,244, dated Oct. 7, 2019, 11 pages.

Notice of Allowance for U.S. Appl. No. 16/228,244, dated Apr. 14, 2020, 9 pages.

Official Action for U.S. Appl. No. 16/932,544, dated Mar. 7, 2022, 10 pages.

(56) References Cited

OTHER PUBLICATIONS

Notice of Allowance for U.S. Appl. No. 16/932,544, dated Jun. 27, 2022, 8 pages.
Official Action for U.S. Appl. No. 17/902,664, dated Mar. 30, 2023, 9 pages.
Notice of Allowance for U.S. Appl. No. 17/902,664, dated Jul. 11, 2023, 8 pages.

\* cited by examiner

2 PIXEL

9
VERTICAL
SIGNAL LINE

VERTICAL DRIVE CIRCUIT

8

CONTROL
CIRCUIT

5 COLUMN
SIGNAL
PROCESSING
CIRCUIT

90 HORIZONTAL
SIGNAL LINE
(1010,2031,3010)

7

HORIZONTAL DRIVE CIRCUIT

6

13 SUBSTRATE
(1011,2030,3011)

A-A CROSS-SECTIONAL VIEW

B-B CROSS-SECTIONAL VIEW

C-C CROSS-SECTIONAL VIEW

D-D CROSS-SECTIONAL VIEW

E-E CROSS-SECTIONAL VIEW

F-F CROSS-SECTIONAL VIEW

IMAGING SIGNAL

1027 — p-well

1031 — p

1030 — n

1029 — p n p-well

1028 — n n⁻

1037    1035(1034)    1011

1047    1047

1027 — p-well

1031 — p

1030 — n

1029 — p n p-well p

1027 p-well

1025 p⁺

1022 p

1021 n⁻

1037　　　　　　　　　　　　1011

1027 p-well 1031　　p 1030　　n 1029　　p

1028

1021

1025 p⁺

1022 n n n n⁻

1037　　　　　　1035(1034)　　1011

*FIG.96A*                   *FIG.96B*
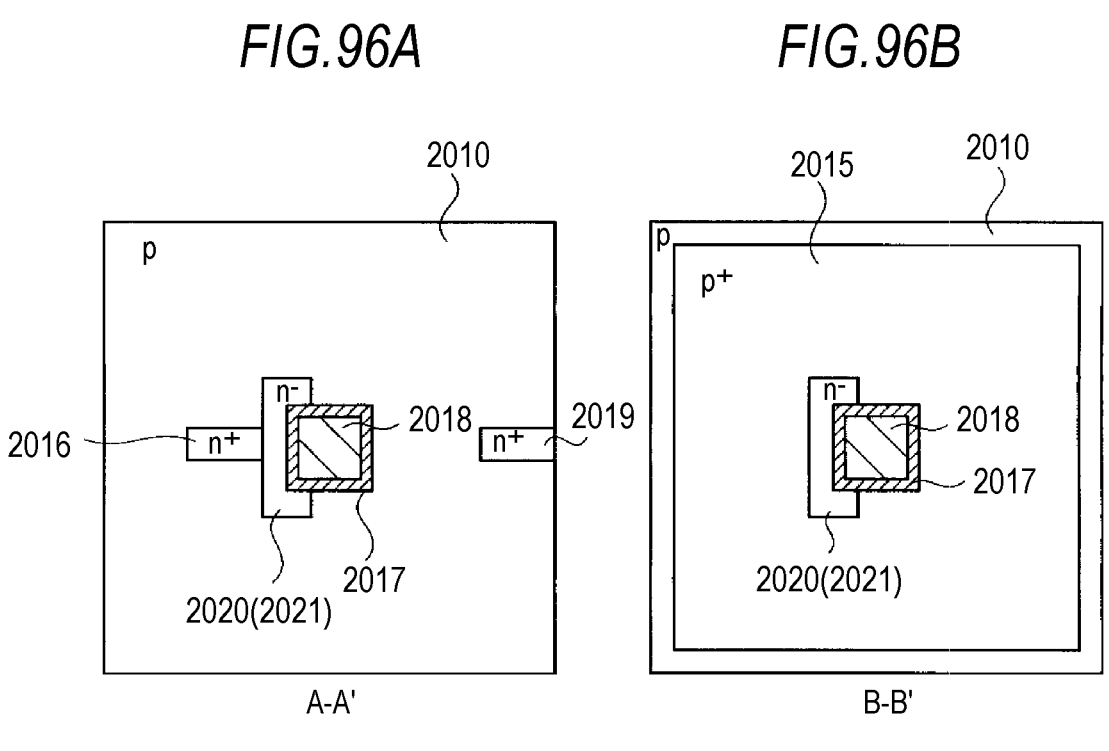
A-A'                                B-B'
*FIG.96C*                   *FIG.96D*
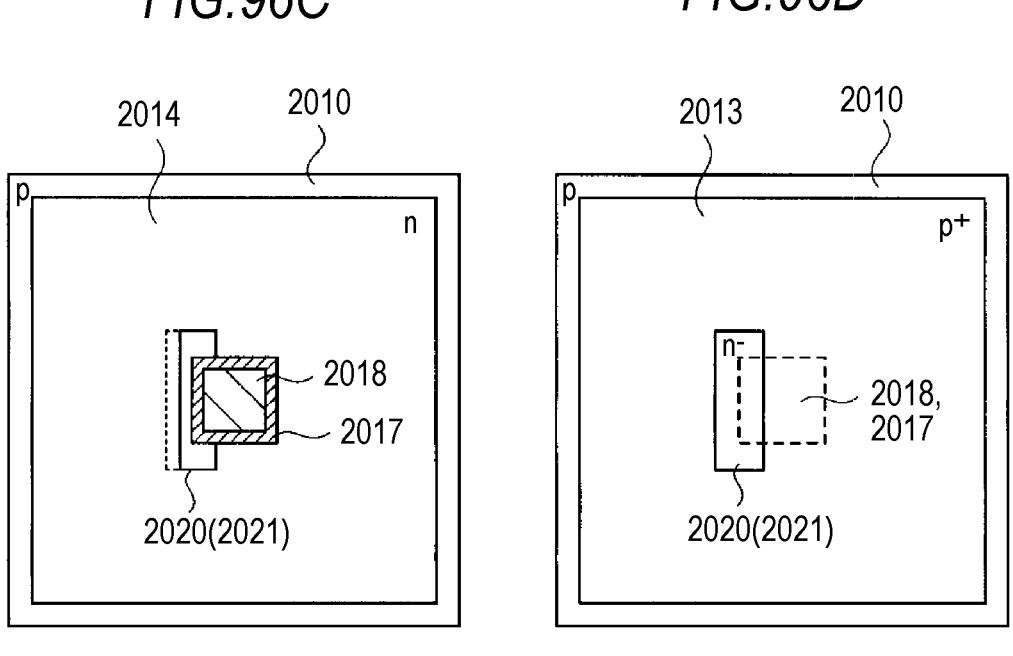
C-C'                                D-D'

SOLID-STATE IMAGING DEVICE, DRIVE METHOD THEREOF AND ELECTRONIC APPARATUS

CROSS-REFERENCE TO RELATED APPLICATIONS

This application is a continuation of U.S. patent application Ser. No. 17/902,664, filed Sep. 2, 2022, which is a continuation of U.S. patent application Ser. No. 16/932,544, filed Jul. 17, 2020, now U.S. Pat. No. 11,489,001, which is a continuation of U.S. patent application Ser. No. 16/228,244, filed Dec. 20, 2018, now U.S. Pat. No. 10,748,958, which is a continuation of U.S. patent application Ser. No. 14/082,832, filed Nov. 18, 2013, now U.S. Pat. No. 10,199,427 which is a divisional of U.S. patent application Ser. No. 12/480,351, filed Jun. 8, 2009, now U.S. Pat. No. 8,614,759, which claims priority to Japanese Patent Application Serial Nos. JP 2008-150963, JP 2008-285907, JP 2008-285908 and JP 2008-285909, filed in the Japan Patent Office on Jun. 9, 2008, Nov. 6, 2008, Nov. 6, 2008 and Nov. 6, 2008, respectively, the entire disclosures of which are hereby incorporated herein by reference.

BACKGROUND OF THE INVENTION

1. Field of the Invention

The invention relates to a solid-state imaging device including plural photodiodes in a unit pixel area, a drive method thereof and an electronic apparatus using the solid-state imaging device.

2. Description of the Related Art

Color separation in a CCD image sensor or a CMOS image sensor as a solid-state imaging device is realized by mainly using color filters. In the image sensor using color filters, a color filter of one kind is mounted with respect to one pixel, and three pixel circuits principally having color filters of red, green and blue are arranged so as to be adjacent to one another. Accordingly, light which can be received in one pixel is only one color corresponding to the color filter in a narrow sense. Therefore, in the image sensor using color filters, colors are generated by using information of light incident on adjacent pixels on which color filters of different colors are mounted.

Therefore, in the image sensor using color filters, a false color in which a color generated at an arbitrary pixel is different from a color of light which has been actually incident on the pixel occurs. Additionally, for example, in a case of a red color filter, incident lights of green and blue are absorbed by the color filter and do not reach a receiving portion by using the color filter. Therefore, more than two thirds of the incident light amount is lost. The lost of the incident light amount occurs also in green and blue color filters.

Accordingly, in order to utilize the incident light amount efficiently as well as to prevent occurrence of false colors, a method of separating colors by forming plural photodiodes in a pixel in the depth direction of a substrate has been developed.

In JP-A-2002-513145 (Patent Document 1), for example, a method of separating colors is described, in which a three-layer structure of an n-type semiconductor layer 3102, a p-type semiconductor layer 3104 and an n-type semiconductor layer 3106 is formed in a p-type Si substrate 3100, and blue, green and red lights are taken out by photoelectrically converting light in the order from a shallow-depth layer as shown in FIG. 4.

In the method, blue, green and red signals are outputted to the outside from terminals connected to respective layers on a surface of the Si substrate 3100. This utilizes the length of wavelengths and characteristics of light absorption in the depth direction. According to this, color separation in one pixel becomes possible, which can prevent occurrence of false colors. Therefore, a low-pass filter is not necessary. Furthermore, since the color filters are not used, red, green and blue colors which have different wavelengths are incident on the unit pixel. Accordingly, the loss of the light amount is reduced.

A CMOS-type solid-state imaging device is configured by arranging plural pixels in a necessary pattern, in which one pixel includes a photodiode and plural MOS transistors. The photodiode is a photoelectric conversion element which generates and accumulates signal charges in accordance with the light receiving amount, and plural MOS transistors are elements for transferring signal charges from the photodiode. In the pixels, signal charges are obtained by illuminated light and the obtained signal charges are outputted as pixel signals from respective pixels. The pixel signals outputted as the above are processed by a given signal processing circuit and outputted to the outside as video signals.

In recent years, reduction of the pixel size and improvement of a saturation charge amount (Qs) and sensitivity are addressed in order to improve characteristics of the solid-state imaging device. In JP-A-2005-223084 (Patent Document 2), a solid-state imaging device is described, which uses a charge readout transistor having a vertical gate electrode formed in the depth direction of a semiconductor substrate in order to realize the reduction of pixel size without reducing the saturation charge amount (Qs) and sensitivity.

FIG. 1A shows a schematic cross-sectional configuration of a solid-state imaging device in a related art which is described in Patent Document 2, and FIG. 18 shows a planar configuration thereof.

As shown in FIG. 1A and FIG. 1B, the solid-state imaging device in the related art includes a p-type semiconductor substrate 203, a photodiode PD included in each pixel formed in the semiconductor substrate 203 and a charge-reading transistor Tr.

The photodiode PD includes a p-type high concentration impurity region (p+ region) 206 formed on the surface side of the semiconductor substrate 203, an n-type high concentration impurity region (n+ region) 205 formed adjacent to the region 206 in the depth direction toward the back side and an n-type low concentration impurity region (n-region) 204. A primary pn junction "j0" included in the photodiode PD is formed by the p+ region 206 and the n+ region 205. As shown in FIG. 1B, the photodiode PD is formed in a photodiode region 260 in the semiconductor substrate 203, which is demarcated by a pixel isolation region 210 in each pixel.

The charge readout transistor Tr is a MOS transistor for transferring signal charges accumulated in the photodiode PD. The charge-reading transistor Tr includes a floating diffusion region 202 provided on the surface side of the semiconductor substrate 203 and a vertical gate electrode 201 formed in the semiconductor substrate 203 from the surface side in the depth direction through a gate insulating film 218. The vertical gate electrode 201 touches the floating diffusion region 202 through the gate insulating film 218 as well as is formed to reach a position deeper than the pn junction "j0" of the photodiode PD. In the vertical gate electrode 201 included in the charge readout transistor Tr, the gate insulating film 218 is formed at a groove portion formed to have the depth reaching the pn junction "j0" of the photodiode PD from the surface side of the semiconductor substrate 203. The columnar-shaped vertical gate electrode 201 is formed by filling the groove on the gate insulating film 218.

In the charge readout transistor Tr, a transfer channel is formed in the depth direction of the semiconductor substrate 203 so as to reach the floating diffusion region 202 from the pn junction "j0" included in the photodiode PD along the vertical gate electrode 201.

The solid-state imaging device is a back-illuminated solid-state imaging device illuminating light from the back side of the semiconductor substrate 203 as shown in FIG. 1B, in which the vertical gate electrode 201 included in the charge readout transistor Tr is formed at the central position of the photodiode PD.

In the solid-state imaging device having the above configuration, light incident from the back side is photoelectrically converted by the photodiode PD and signal charges are accumulated in the photodiode PD. Then, the accumulated signal charges in the photodiode PD are transferred through the transfer channel by applying positive voltage to the vertical gate electrode 201 of the charge readout transistor Tr, read out to the floating diffusion region 202 formed on the surface of the semiconductor substrate 203.

As described above, the device has the configuration in which the photodiode PD is formed in the depth direction of the semiconductor substrate 203 and signal charges accumulated in the photodiode PD are read by the vertical gate electrode 201. Accordingly, when the pixel size is reduced, the saturation charge amount (Qs) and sensitivity are not reduced. Additionally, MOS transistors and wiring layers are not formed on the light illumination side due to the back-illuminated type, therefore, an opening area can be widely secured.

On the other hand, FIG. 2A and FIG. 2B show a schematic cross-sectional configuration and a planar configuration of relevant parts of a solid-state imaging device in a related art in which the vertical gate electrode is not applied. In FIG. 2A and FIG. 2B, same symbols are given to portions corresponding to FIG. 1A and FIG. 1B and repeated explanation is omitted. As shown in FIG. 2A, when a normal planar gate electrode 301 which is not the vertical gate electrode is used, the gate electrode 301 is formed on an upper surface of the semiconductor substrate 203 at an outer peripheral portion of the photodiode region 260 in which photodiode PD is formed through the gate insulating film 218.

The saturation charge amount (Qs) of the photodiode PD is in proportion with capacitance of the pn junction "j0" included in the photodiode PD. Since the impurity concentration is commonly high in the vicinity of the center of the photodiode PD, capacitance in a unit area is high, conversely, capacitance is low at end portions of the photodiode PD which are pixel edges. That is, in the photodiode PD shown in FIG. 1A, 1B and FIG. 2A, 2B, capacitance is high in portions surrounded by dashed lines (vicinity of the center of the photodiode region 260) and the saturation charge amount (Qs) per a unit area is also high.

According to the above, since the gate electrode 301 is formed in the outer peripheral portion of the photodiode region 260 in the example shown in FIG. 2A and FIG. 2B, the saturation charge amount (Qs) of the photodiode PD is not lost.

However, when the vertical gate is arranged at the center of the photodiode like the example shown in FIG. 1A and FIG. 1B, the vertical gate electrode 201 is buried in the portion in which capacitance is high in the photodiode PD. In this case, there is fear that the saturation charge amount (Qs) is lost in the area including the region where the vertical gate electrode 201 is formed and the periphery thereof.

When the vertical gate electrode 201 and the floating diffusion region 202 are arranged at the center of the photodiode PD included in the pixel as shown in FIG. 1A and FIG. 1B, it is difficult to share the floating diffusion region 202 among plural pixels, which makes the reduction of pixel size harder. Additionally, charges accumulated in the photodiode PD are transferred to the floating diffusion region 202 formed on the surface of the semiconductor substrate 203 through the transfer channel of the charge readout transistor Tr. Therefore, if there is a defect in the gate portion of the charge readout transistor Tr, it is anticipated that transfer failure of charges occurs or that generation of large dark current is caused. As the defect in this case, there are defects generated by processing a deep groove portion formed at the time of forming the vertical gate electrode 201 or an interface state.

The solid-state imaging device is roughly divided into an amplification-type solid-state imaging device typified by a CMOS (Complementary Metal Oxide Semiconductor) image sensor a CMOS (Complementary Metal Oxide Semiconductor) image sensor by a CCD (Charge Coupled Device) image sensor. There solid-state imaging devices are widely used for a digital still camera, a digital video camera and the like. In recent years, as the solid-state imaging device mounted on mobile apparatuses such as a cellular phone with a camera and a PDA (Personal Digital Assistant), the CMOS image sensor is widely used in the light of power consumption, in which power supply voltage is low.

A CMOS solid-state imaging device is proposed (refer to Patent Document 2), in which a photoelectric conversion element (photodiode) is formed inside a p-type silicon semiconductor substrate and a vertical transfer transistor is formed to realize the reduction of pixel size without lowering the saturation charge amount (Qs) and the sensitivity. FIG. 3 shows a cross-sectional configuration of a relevant part of a pixel in the above CMOS solid-state imaging device.

A CMOS solid-state imaging device 1111 is a back-illuminated solid-state imaging device which illuminates light from the back of the substrate. In the CMOS solid-state imaging device 1111, pixel transistors included in each pixel, in this example, a transfer transistor Tr1, a reset transistor Tr2 and an amplification transistor Tr3 are formed on the front side of a semiconductor substrate 1112. A photodiode PD is formed below these pixel transistors. The photodiode PD includes an n-type semiconductor region 1113 having a high concentration impurity region (n+ region) 1113A and a low concentration impurity region (n region) 111313 to be charge accumulation regions and a p-type semiconductor region (p+ region) 1121 having high concentration impurity on the surface side thereof inside the semiconductor substrate 1112.

The vertical transfer transistor Tr1 is configured by including a columnar transfer gate electrode 1116 which is buried in a groove portion 1114 reaching the inside of the n-type high concentration impurity region (n+ region) 1113A of the photodiode PD from the surface of the semiconductor substrate 1112 in the depth direction through a gate insulating film 1115. On the surface of the semiconductor substrate 1112, an n-type source/drain region 1117 to be a floating diffusion (FD) 40 is formed so as to touch the gate insulating film 1115. The transfer gate electrode 1116 of the vertical transfer transistor Tr1 formed at a position corresponding to the center of a unit pixel 1131, namely, the center of the photodiode PD. A p-type semiconductor region (p+ region) 1121 having high concentration impurity is formed so as to surround the gate insulating film 1115 formed in the high concentration impurity region 1113A of the photodiode PD.

The reset transistor Tr2 includes a pair of n-type source/drain regions 1117, 1118 on the surface side of the semiconductor substrate 1112 and a reset gate electrode 1123 formed through the gate insulating film. The amplification transistor Tr3 includes a pair of n-type source/drain regions 1119, 1120 on the surface side of the semiconductor substrate 1112 and a reset gate electrode 1124 formed through the gate insulating film. Further, a multilevel-wiring layer in which plural layers of wirings 1126 is formed on the semiconductor substrate 1112 in which these pixel transistors (Tr1, Tr2 and Tr3) are formed through an interlayer insulating layer 1125. On the back of the semiconductor substrate 1112, color filters and on-chip micro lenses at positions corresponding to respective pixels thereabove are formed, though not shown. A numeral 1130 represents a pixel isolation region. A numeral 1131 represents a unit pixel.

Other descriptions concerning the back-illuminated solid-state imaging device are also disclosed in JP-A-2003-31785 (Patent Document 3).

As a solid-state imaging device, a CMOS solid-state imaging device is known. In the CMOS solid-state imaging device, a photodiode and plural MOS transistor forms one pixel. The solid-state imaging device having plural pixels is configured by arranging plural pixels in a necessary pattern. The photodiode is a photoelectric conversion element which generates and accumulates signal charges in accordance with the light receiving amount, and the plural MOS transistors are elements for transferring signal charges from the photodiode.

In recent years, reduction of pixel size is proceeding in the CMOS solid-state imaging device. However, since the photodiode and plural MOS transistors such as a charge readout transistor are arranged in the same plane in each pixel region in the CMOS solid-state imaging device, areas for respective elements are necessary on the plane, which tends to increase an area of one pixel. Accordingly, it is difficult to reduce the pixel size, and when the size is reduced, an area of the photodiode is also reduced, which causes problems such as the lowering of the saturation charge amount and the lowering of sensitivity.

In Patent Document 1, the configuration in which the pn junction formed in the high concentration regions of the photodiode is provided inside the semiconductor substrate is described. In this case, the channel portion of the charge readout transistor for reading signal charges is formed in the depth direction of the semiconductor substrate, and the bottom portion of the gate electrode of the reading transistor and the gate insulating film is formed at the position deeper than the depth of the pn junction. Such configuration is applied in Patent Document 2, thereby maintaining the area of the photodiode large and preventing the lowering of the saturation charge amount even when the pixel area is reduced.

However, in the solid-state imaging device of Patent Document 2, the potential which can be completely transferred with respect to one photodiode in which signal charges are accumulated in one pixel is fixed, and it is difficult to increase the saturation charge amount (Qs) more than a fixed amount. That is, it is difficult to be a configuration in which reduction of pixel size and improvement of the saturation charge amount (Qs) are realized at the same time.

SUMMARY OF THE INVENTION

It is desirable to provide a solid-state imaging device and an electronic apparatus using the solid-state imaging device in which increase of the saturation charge amount (Qs) and improvement of sensitivity can be realized as well as having high transfer efficiency of signal charges.

In the above solid-state imaging device 1111, the vertical transfer transistor Tr1 is arranged in the center of the pixel to thereby allow distances between the periphery of the photodiode PD and the transfer gate electrode 1116 are the same and make the complete transfer of signal charges easy. However, the transfer gate electrode 1116 may inhibit formation of the photodiode PD. Therefore, it is difficult to allow a portion of the transfer gate electrode 1116 to be formed as the photodiode PD, which reduces the saturation charge amount (Qs) per a unit area, as a result, a configuration will be disadvantageous for pixel characteristics.

In the solid-state imaging device 1111, an effective channel length is determined by the distance between the photodiode PD and the floating diffusion FD (n-type source/drain region 1117) However, in the configuration, n+ region 1113A exists below the transfer gate electrode in the state of touching the electrode, therefore, there are fears that white defects caused by dark current due to GIDL (Gate Induced Drain Leakage) occur and that pixel characteristics are reduced.

In the solid-state imaging device 1111, a p-region 1122 is formed so as to surround the transfer gate electrode 1116 on the surface of then-type semiconductor region (n+ region) 1113A of the photodiode PD as shown in FIG. 3. The p-region 1122 makes the charge accumulation amount of the photodiode PD to maintain as well as makes charge transfer by the transfer gate electrode 1116 easy. However, when the region 1122 is "p−", it is difficult to secure a transfer path actually.

In the solid-state imaging device 1111, the p-region 1122 is formed between the gate insulating film 1115 attached to the transfer gate electrode 1116 and the n-type semiconductor region (n+ region) 1113A of the photodiode PD, thereby suppressing occurrence of dark current due to defects in the photodiode PD and the like. However, it is necessary to suppress dark current occurring due to defects caused by damages generated when the silicon semiconductor substrate 1112 is selectively etched for forming the transfer gate electrode 1116, and the p-region 1122 is insufficient.

In the solid-state imaging device 1111, a channel region at sides of the transfer gate electrode between then-type source/drain region 1117 as the floating diffusion and the photodiode PD is a p-type region. However, it is difficult to completely transfer signal charges accumulated in the photodiode PD in the configuration. In the solid-state imaging device, it is necessary to increase the saturation charge amount as well as to improve charge transfer even when the pixel size is reduced.

It is desirable to provide a solid-state imaging device and a manufacturing method thereof, in which the saturation charge amount (Qs) is increased and the transfer gate interface is adjusted. It is also desirable to provide an electronic apparatus using the solid-state imaging device.

It is further desirable to provide a solid-state imaging device and a drive method of the solid-state imaging device, in which the pixel size can be reduced as well as the saturation charge amount (Qs) is increased to improve sensitivity. It is also desirable to provide an electronic apparatus using the solid-state imaging device.

However, in the invention utilizing the length of wavelengths and characteristics of absorption of light in the depth direction as in Patent Document 1, it is necessary that the photodiode which photoelectrically converts light of red having a long wavelength is formed in the depth approximately 2 μm from the surface of the Si substrate 3100. Accordingly the distance with respect to an output terminal on the surface of the Si substrate 3100 is long, therefore, it is extremely difficult to completely transfer charges accumulated in the photodiode, which may cause residual images. Additionally, light is incident from the direction of the surface of the Si substrate 3100 and charges generated by photoelectric conversion are accumulated in the photodiode formed by the well-layers of several layers. In this case, the end of the photodiode reaches the surface of the Si substrate 3100, and the depth of a pn junction at that portion and the depth of a pn junction at the center of the photodiode differ from each other. This will be a factor of color mixture as well as a factor of generating noise on the surface of the Si substrate 3100.

There is a need for providing a solid-state imaging device and a drive method thereof, which prevents false colors, residual images, noise and color mixture as well as improves an open area ratio of pixels and sensitivity. It is also desirable to provide an electronic apparatus using the solid-state imaging device.

A solid-state imaging device according to an embodiment of the invention includes the following configuration. First, a buried photodiode formed in the depth direction of a semiconductor substrate is included. Additionally, a vertical gate electrode is included, which is formed at a peripheral portion of a photodiode region in which the photodiode included in a pixel is formed from a surface of the semiconductor substrate to the depth reaching the photodiode through a gate insulating film. Also, a floating diffusion region accumulating signal charges read from the photodiode is included. The vertical gate electrode and the floating diffusion region make up a charge readout transistor.

Here, the "photodiode region" indicates a region in which the photodiode is formed when the photodiode formed in the semiconductor substrate is viewed in plan.

In the solid-state imaging device according to the embodiment of the invention, when potential for reading is applied to the vertical gate electrode, potential gradient in the photodiode region is changed so as to become deeper toward the floating diffusion region. Accordingly, signal charges accumulated in the photodiode are transferred along the potential gradient.

An electronic apparatus according to another embodiment of the invention includes an optical lens, a solid-state imaging device and a signal processing device which processes output signals from the solid-state imaging device. The solid-state imaging device includes, first, a buried photodiode formed in the depth direction of the semiconductor substrate. Additionally, a vertical gate electrode is included, which is formed at a peripheral portion of a photodiode region in which the photodiode included in a pixel is formed from a surface of the semiconductor substrate to the depth reaching the photodiode through a gate insulating film. Also, a floating diffusion region accumulating signal charges read from the photodiode is included. The vertical gate electrode and the floating diffusion region make up a charge readout transistor.

Here, the "photodiode region" indicates a region in which the photodiode is formed when the photodiode formed in the semiconductor substrate is viewed in plan.

In the electronic apparatus according to the embodiment of the invention, when potential for reading is applied to the vertical gate electrode, potential gradient in the photodiode region is changed so as to become deeper toward the floating diffusion region in the solid-state imaging device. Accordingly, signal charges accumulated in the photodiode are transferred along the potential gradient.

A solid-state imaging device according to another embodiment of the invention includes plural layers of photodiodes to be photoelectric conversion elements formed in the depth direction of a semiconductor substrate, a vertical transfer transistor channel direction of which is vertical with respect to the semiconductor substrate, an overflow path connecting second-conductive type semiconductor regions to be respective charge accumulation regions of the plural layers of photodiodes, and an ion implantation region for adjusting a gate interface formed around a transfer gate portion of the vertical transfer transistor.

In the solid-state imaging device according to the embodiment of the invention, plural layers of photodiodes are formed in the depth direction of the semiconductor substrate, and at the time of accumulating charges, when any of the photodiodes reaches the saturation charge amount, overflowed signal charges are accumulated in the photodiode which has not been saturated through the overflow path. Accordingly, the saturation charge amount (Qs) is increased. Since the ion implantation region for adjusting the gate interface is formed around the vertical transfer gate portion, the configuration in which residual images are not generated as well as occurrence of white defects are suppressed can be realized. When the ion implantation region is, for example, the second-conductive type semiconductor region, charge transfer efficiency is further improved, and when the region is the first-conductive type semiconductor region, occurrence of dark current can be suppressed as well as occurrence of white defects can be suppressed.

A solid-state imaging device according to another embodiment of the invention includes a photodiode to be a photoelectric conversion element buried in a semiconductor substrate, a vertical transfer transistor arranged at the end of a pixel and channel direction of which is vertical with respect to the semiconductor substrate in plural pixel transistors and an ion implantation region which has a necessary conductive type, which is formed around a transfer gate portion of the vertical transfer transistor.

In the solid-state imaging device according to the embodiment, both the case in which one layer photodiode to be the photoelectric conversion element buried in the semiconductor substrate is formed and the case in which plural layers of photodiodes are formed are included. In both cases, the vertical transfer transistor is arranged at the end of the pixel, therefore, the area of the photodiode can be widely secured and the saturation charge amount (Qs) is increased. When the ion implantation region having a necessary conductive type around the vertical transfer gate portion is, for example, the second-conductive type semiconductor region, the charge transfer efficiency is further improved. When the ion implantation region having a necessary conductive type is the first-conductive type semiconductor region, occurrence of dark current can be suppressed as well as occurrence of white defects can be suppressed.

A method of manufacturing a solid-state imaging device according to another embodiment of the invention includes the steps of forming plural layers of photodiodes in the depth direction of a semiconductor substrate and an overflow path connecting second-conductive type semiconductor regions to be charge accumulation regions of respective photodiodes, forming an ion implantation region in the depth direction of the semiconductor substrate so as to touch the overflow path, forming a groove portion stretching in the depth direction of the semiconductor substrate in the ion implantation region, and forming a gate insulating film in an inner wall surface of the groove portion as well as forming a transfer gate electrode of a vertical transfer transistor so as to be buried into the groove.

In the method of manufacturing the solid-state imaging device according to the embodiment of the invention, after the plural layers of photodiodes and the overflow path are formed, the ion implantation region is formed, then, the groove portion for burying the transfer gate electrode in the ion implantation region is formed. Accordingly, the ion implantation region which abuts on the inner wall surface of the groove can be formed. In addition, the vertical transfer gate portion facing the overflow path can be formed, sandwiching the ion implantation region therebetween.

A method of manufacturing a solid-state imaging device according to another embodiment of the invention includes the steps of forming an ion implantation region in the depth direction of a semiconductor substrate, forming a groove portion stretching in the depth direction of the semiconductor substrate in the ion implantation region, forming plural layers of photodiodes in the depth direction of a semiconductor substrate and an overflow path connecting second-conductive type semiconductor regions to be charge accumulation regions of respective photodiodes, which touches the ion implantation region, and forming a gate insulating film in an inner wall surface of the groove portion as well as forming a transfer gate electrode of a vertical transfer transistor so as to be buried into the groove.

In the method of manufacturing the solid-state imaging device according to the embodiment of the invention, after the ion implantation region is formed and the groove portion for burying the transfer gate electrode in the ion implantation region is formed, plural layers of photodiodes and the overflow path are formed. Accordingly, the ion implantation region which abuts on the inner wall surface of the groove can be formed. In addition, the vertical transfer gate portion facing the overflow path can be formed, sandwiching the ion implantation region therebetween.

An electronic apparatus according to another embodiment of the invention includes an optical lens, a solid-state imaging device and a signal processing circuit which processes output signals of the solid-state imaging device. The solid-state imaging device includes plural layers of photodiodes to be optical conversion elements formed in the depth direction of the semiconductor substrate, a vertical transfer transistor channel direction of which is vertical with respect to the semiconductor substrate, an ion implantation region formed around the transfer gate portion of the vertical transfer transistor and an overflow path connecting the second-type semiconductor regions to be respective charge accumulation regions of the plural photodiodes.

A solid-state imaging device according to another embodiment of the invention includes plural photodiodes formed in different depths in a semiconductor substrate, each having a junction surface between a first-conductive type and having a junction surface between a first-conductive type impurity region and a second-conductive impurity region. Additionally, a vertical transistor having a gate insulating film, a reading gate electrode, a transfer channel and a floating diffusion region is included. The charge readout gate electrode is formed in the depth direction from the surface of the semiconductor substrate through the gate insulating film. The transfer channel transfers signal charges read from plural photodiodes. The floating diffusion region is a region in which signal charges transferred through the transfer channel are accumulated. The solid-state imaging device according to the embodiment of the invention further includes an overflow path between the plural photodiodes and between the photodiodes and the floating diffusion region at the time of accumulating charges in the photodiodes.

In the solid-state imaging device according to the embodiment, signal charges exceeding the saturation charge amount of one photodiode at the time of accumulating signal charges are transferred to the other photodiode or the floating diffusion region through the overflow path. Since plural photodiodes are included, the whole saturation charge amount can be increased. Further, plural photodiodes are formed in the depth direction of the semiconductor substrate, the pixel size can be reduced.

In a drive method of a solid-state imaging device according to another embodiment of the invention, first, signal charges are accumulated in the photodiodes by irradiating light to plural photodiodes formed in the depth direction of the semiconductor substrate. Then, signal charges exceeding the saturation charge amount in one photodiode at the time of accumulating signal charges are transferred to another photodiode or the floating diffusion region through the overflow path. When the accumulation of signal charges is completed, signal charges accumulated in plural photodiodes are transferred to the floating diffusion regions at the same time.

In the drive method according to the embodiment of the invention, signal charges exceeding the saturation charge amount of one photodiode at the time of accumulating signal charges are transferred to another photodiode or the floating diffusion region. Accordingly, the saturation charge amount of the whole photodiode is improved and the dynamic range can be increased.

An electronic apparatus according to another embodiment of the invention includes an optical lens, a solid-state imaging device and a signal processing circuit. The solid-state imaging device includes plural photodiodes formed in different depths in a semiconductor substrate, each having a junction surface between a first-conductive type impurity region and a second-conductive impurity region. Also, a vertical transistor having an gate insulating film, a reading gate electrode, a transfer channel and a floating diffusion is included. The charge readout gate electrode is formed in the depth direction from the surface of the semiconductor substrate through the gate insulating film. The transfer channel transfers signal charges read from plural photodiodes. The floating diffusion region is a region in which signal charges transferred through the transfer channel are accumulated. The solid-state imaging device according to the embodiment of the invention further includes an overflow path between the plural photodiodes and between the photodiodes and the floating diffusion region at the time of accumulating charges in the photodiodes.

The signal processing circuit processes output signals from the solid-state imaging device.

In the electronic apparatus according to the embodiment of the invention, signal charges exceeding the saturation charge amount of one photodiode are transferred to the other photodiode or the floating diffusion region through the overflow path at the time of accumulating signal charges in the solid-state imaging device. In addition, since plural photodiodes are provided, the whole saturation charge amount can be increased.

A solid-state imaging device according to another embodiment of the invention includes plural photodiodes formed in different depths in a unit pixel area of a substrate and plural vertical transistors. The plural vertical transistors are transistors for reading signal charges obtained by photoelectric conversion in the plural photodiodes. In the plural vertical transistors, gate portions thereof are formed in the depth direction from one face side of the substrate so as to be formed in depths corresponding to respective plural photodiodes.

In the solid-state imaging device according to the embodiment of the invention, plural photodiodes are formed in the unit pixel area, therefore, plural colors are read from the unit pixel area. Also, the gate portions of the vertical transistors are formed in the depths corresponding to respective plural photodiodes, therefore, all signal charges of target photodiodes are read. Respective gate portions have different gate lengths, respectively.

An electronic apparatus includes a solid-state imaging device, an optical lens system and a signal processing device which processes output signals of the solid-state imaging device.

Particularly, the solid-state imaging device includes plural photodiodes formed in different depths and plural vertical transistors in the unit pixel area of the substrate. The plural vertical transistors are transistors for reading signal charges obtained by photoelectric conversion in the plural photodiodes. In the plural vertical transistors, gate portions thereof are formed in the depth direction from one face side of the substrate so as to be formed in depths corresponding to respective plural photodiodes.

In the electronic apparatus according to the embodiment of the invention, light incident into the solid-state imaging device through the optical lens system is photoelectrically converted in plural photodiodes in the unit pixel area. Signal charges obtained by photoelectric conversion are read by the vertical transistors formed in the depths of the photodiodes to form images.

According to the embodiments of the invention, it is possible to obtain a solid-state imaging device in which the increase of the saturation charge amount (Qs) and improvement of sensitivity are realized. Also according to the embodiments of the invention, it is possible to improve the saturation charge amount (Qs) and sensitivity, as a result, an electronic apparatus having higher image quality can be obtained.

In the solid-state imaging device and the method of manufacturing the same according to the embodiments of the invention, it is possible to provide a solid-state imaging device in which charge transfer efficiency is further improved by increasing the saturation charge amount (Qs) in a unit pixel or occurrence of white defects is suppressed by suppressing generation of dark current.

In the electronic apparatus according to the embodiments of the invention, the solid-state imaging device according to the embodiment of the invention is included, therefore, it is possible to obtain the electronic apparatus in which dynamic range is improved and which has higher image quality.

According to the embodiments of the invention, it is possible to obtain a solid-state imaging device in which the increase of the saturation charge amount (Qs) and improve of sensitivity are realized as well as the pixel size reduction is easy. Also according to the embodiments of the invention, it is possible to obtain an electronic apparatus having higher image quality by using the solid-state imaging device in which the saturation charge amount (Qs) and the sensitivity can be improved as well as the pixel size reduction can be realized.

In the solid-state imaging device and the drive method according to the embodiments of the invention, false colors, residual images, noise and color mixture can be reduced as well as sensitivity can be improved. In addition, color filters and a low-pass filter are not necessary.

In the electronic apparatus according to the embodiments of the invention, it is possible to obtain images in which false colors, residual images, noise and color mixture are reduced as well as sensitivity is improved.

BRIEF DESCRIPTION OF DRAWINGS

FIG. 4 is a schematic cross-sectional configuration view of a photodiode used in an imaging device in a related art;

FIG. 28 a schematic planar configuration view of a relevant part of a solid-state imaging device according to Embodiment 15 of the invention;

FIG. 42 a schematic planar configuration view of a relevant part of a solid-state imaging device according to Embodiment 28 of the invention;

FIG. 59 a schematic planar configuration view of a relevant part of a solid-state imaging device according to Embodiment 46 of the invention;

FIG. 60 a schematic planar configuration view of a relevant part of a solid-state imaging device according to Embodiment 47 of the invention;

FIG. 83 is a manufacturing process view (No. 2) showing another example of a manufacturing method of a solid-state imaging device according to an embodiment of the invention;

FIG. 96A to FIG. 96D are configuration views when seeing planes along respective cross sections of the solid-state imaging device according to Embodiment 64;

FIG. 104A is a schematic cross-sectional configuration view of a solid-state imaging device according to Embodiment 69 and FIG. 104B is a schematic configuration view showing the whole solid-state imaging device;

FIG. 105 is a schematic cross-sectional configuration view of a solid-state imaging device according to Embodiment 70 of the invention;

DESCRIPTION OF THE PREFERRED EMBODIMENTS

Hereinafter, embodiments of the invention will be explained with reference to FIG. 5 to FIG. 71.

[Whole Configuration of a Solid-State Imaging Device]

First, the whole configuration of a CMOS solid-state imaging device, namely, a CMOS image sensor to which Embodiment 1 and Embodiment 2 explained as follows are applied will be explained with reference to FIG. 5.

Figure 5:
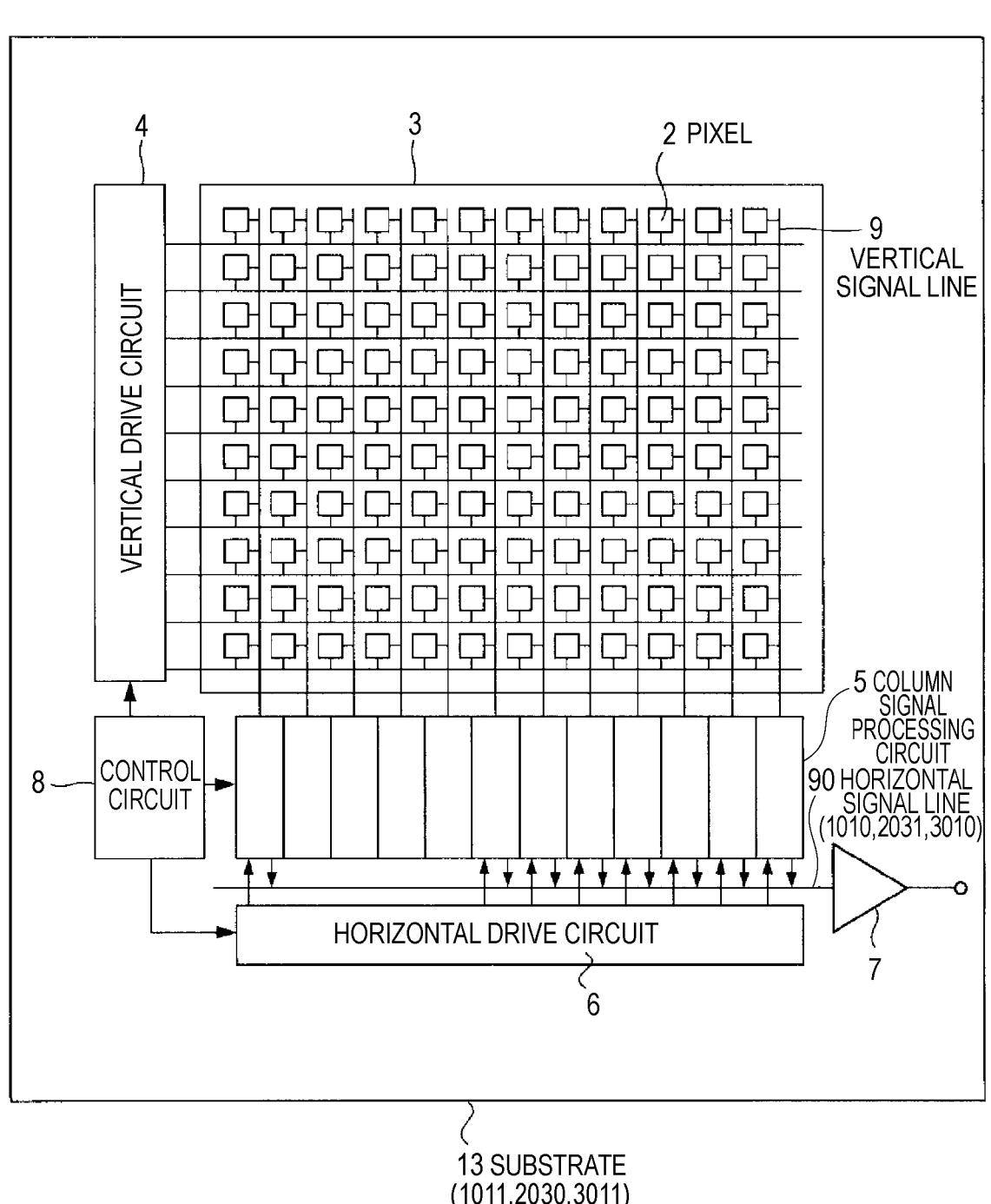
FIG. 5 is the whole configuration view of a solid-state imaging device according to Embodiment 1 to Embodiment 56 of the invention.

A solid-state imaging device 1 shown in FIG. 5 includes an imaging area 3 having plural pixels 2 arranged on a semiconductor substrate 13 made of Si, a vertical drive circuit 4, column signal processing circuits 5, a horizontal drive circuit 6, an output circuit 7, a control circuit 8 and the like as peripheral circuits of the imaging area 3.

The pixel 2 includes a photodiode as a photoelectric conversion element and plural MOS transistors, and plural pixels 2 are arranged regularly on the semiconductor substrate 13 in a two-dimensional array state.

The imaging area 3 includes the plural pixels 2 regularly arranged in the two-dimensional array state. The imaging area 3 includes an effective pixel area in which light is actually received and signal charges generated by photoelectric conversion are accumulated and a black reference pixel area which is formed around the effective pixel area for outputting optical black to be a reference of a black level.

The control circuit 8 generates a clock signal, a control signal and the like to be references of operations of the vertical drive circuit 4, the column signal processing circuits 5, the horizontal drive circuit 6 and the like based on a vertical synchronization signal, a horizontal synchronization signal and a master clock. The clock signal, the control signal and the like generated in the control circuit 8 are inputted to the vertical drive circuit 4, the column signal processing circuits 5 and the horizontal drive circuit 6 and the like.

The vertical drive circuit 4 includes, for example, a shift register, selectively scanning respective pixels 2 in the imaging area 3 by the row sequentially in the vertical direction. Then, pixel signals based on signal charges generated in accordance with the light receiving amount in photodiodes of respective pixels 2 are supplied to the column signal processing circuits 5 through vertical signal lines.

The column signal processing circuits 5 are arranged, for example, at respective columns of pixels 2, performing signal processing such as noise removal or signal amplification to signals outputted from pixels 2 of one row by the pixel column using a signal from a black reference pixel area (formed around the effective pixel area though not shown). Horizontal selection switches (not shown) are provided at output stages of the column signal processing circuits 5 between the circuits 5 and a horizontal signal line 90.

The horizontal drive circuit 6 includes, for example, a shift register, sequentially selecting respective column signal processing circuits 5 by sequentially outputting horizontal scanning pulses to thereby allow respective column signal processing circuits 5 to output pixel signals to the horizontal signal line 90.

The output circuit 7 performs signal processing to signals sequentially supplied from respective column signal processing circuits 5 through the horizontal signal line 90 and output the signals.

The solid-state imaging devices in Embodiments 1 to 56 explained as follows are included in the solid-state imaging device 1 shown in FIG. 5, in which cross-sectional configurations of pixels in effective imaging areas are particularly shown.

Embodiment 1

[Example Including Two Vertical Gate Electrodes]

Figure 6:
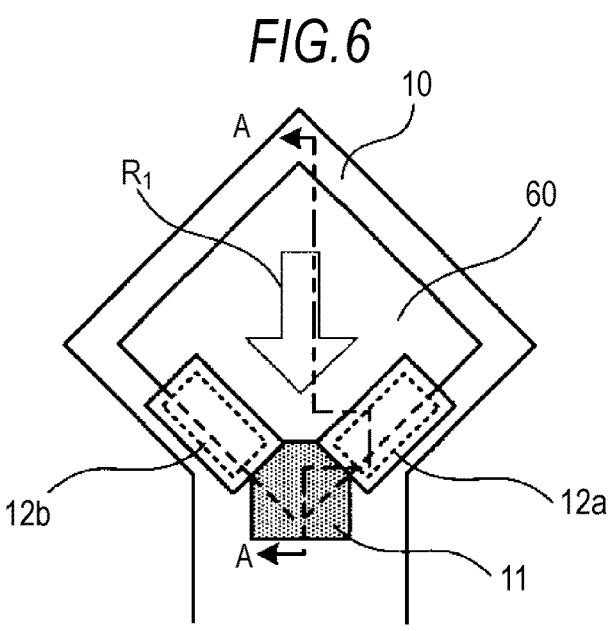
FIG. 6 is a schematic plan view of a relevant part of solid-state imaging device according to Embodiment 1 of the invention.
Figure 7:
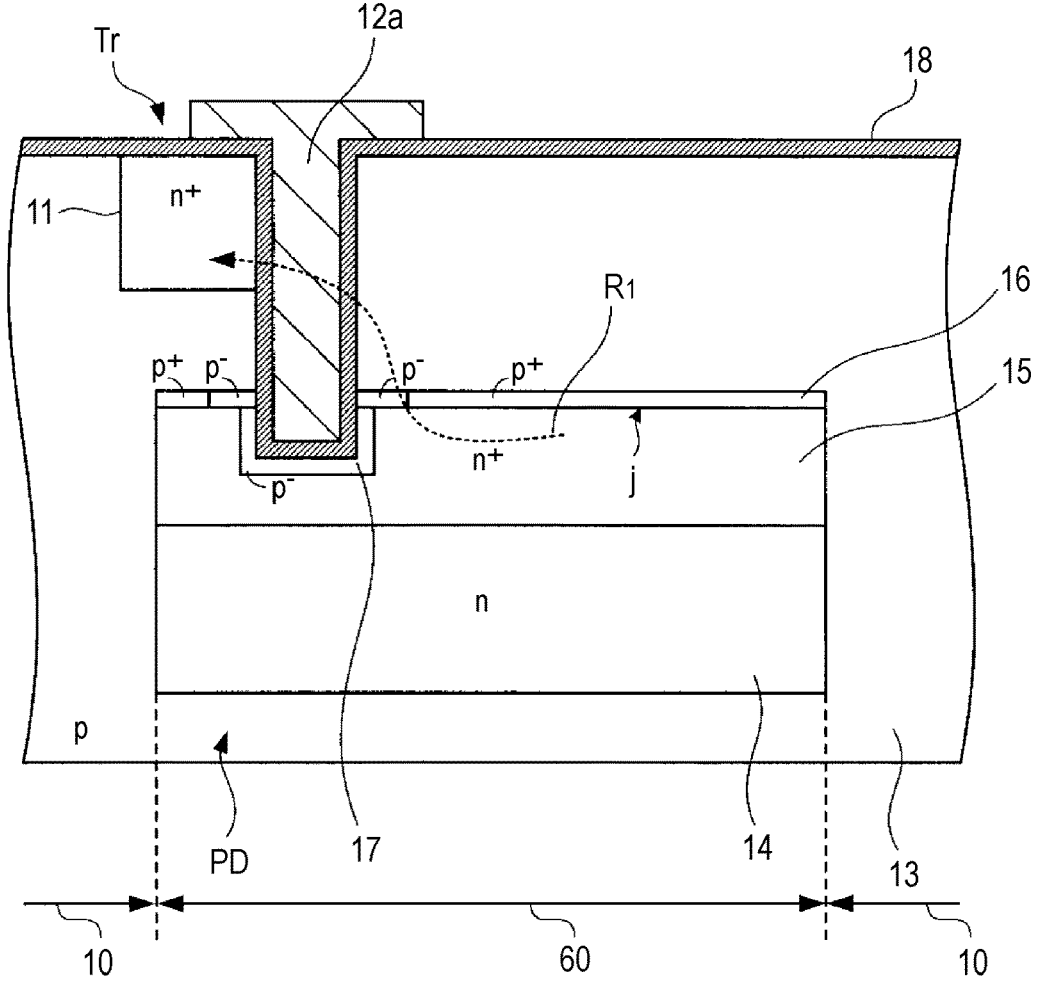
FIG. 7 is a schematic cross-sectional configuration view taken along A-A line of FIG. 6.

FIG. 6 shows a schematic planar configuration of a solid-state imaging device according to Embodiment 1 of the invention, and FIG. 7 shows a schematic cross-sectional configuration taken along A-A line of FIG. 6. FIG. 6 and FIG. 7 are a plan view and a cross-sectional view of a relevant part included in one pixel. As shown in FIG. 6 and FIG. 7, the solid-state imaging device includes a photodiode PD and a charge readout transistor Tr formed in a semiconductor substrate 13. The charge readout transistor Tr includes two vertical gate electrodes 12a, 12b formed in a peripheral portion of the photodiode PD and a floating diffusion region 11 formed at a corner portion of a photodiode region 60 toward an outside region. In the present embodiment, a case in which a first conductive type is a p-type and a second conductive type is an n-type will be explained.

The semiconductor substrate 13 is made of a p-type silicon substrate.

The photodiode PD includes an n-type impurity region (n region) 14, an n-type high concentration impurity region (n+ region) 15, and a p-type high concentration impurity region (p+ region) 16 sequentially formed in the semiconductor substrate 13 from the back side to the surface side of the semiconductor substrate 13. The photodiode PD is mainly formed by a pn junction "j" which is a joint surface between the p+ region 16 and the n+ region 15. In the embodiment, the photodiode PD is formed in a photodiode region 60 having an approximately square shape when seen from the front as shown in FIG. 6, and the photodiode region 60 is demarcated from adjacent pixels by a pixel isolation region 10 made of the p-type semiconductor substrate 13. In the embodiment, the photodiode region 60 has the square shape, however, it is not limited to the square shape and various shapes such as a rectangular shape or a polygonal shape can be applied. As a matter of convenience, the photodiode 60 is made to be the square shape in the embodiment.

In the plan view shown in FIG. 6, a region where the photodiode PD is formed in the pixel isolation region 10 is shown as the photodiode region 60.

The two vertical gate electrodes 12a, 12b are formed at an outer peripheral portion of the photodiode region 60 respectively along two edges forming a corner portion of the photodiode region 60. That is, the electrodes are respectively formed along two adjacent edges of the photodiode region 60 having a polygonal shape in plan view, the square shape in FIG. 6. A cross-sectional shape of the vertical gate electrodes 12a, 12b is a rectangular shape, and the electrodes are arranged so that long axis directions in the cross-sectional shape are parallel to edges of the photodiode region 60 in which the vertical gate electrodes 12a, 12b are formed. Additionally, the vertical gate electrodes 12a, 12b are formed by being buried in the semiconductor substrate 13 are formed by being buried in the semiconductor substrate 13 where the electrodes touch the pn junction "j" of the photodiode PD formed in the semiconductor substrate 13 through a gate insulating film 18. At a portion corresponding to a lower peripheral portion including a lower portion of the vertical gate electrodes 12a, 12b, a p-type low concentration impurity region (p-region) 17 whose impurity concentration is lower than the p+ region 16 is formed between the n+ region 15 included in the photodiode PD and the gate insulating film 18. In the p+ region 16 included in the photodiode PD, a portion near the gate insulating film 18 is also formed as the p-type low concentration impurity region (p-region) 17.

The floating diffusion region 11 is made of an n-type high concentration impurity region (n+) at an region on the surface side of the semiconductor substrate 13 from the corner portion of the photodiode region 60 adjacent to the vertical gate electrodes 12a, 12b toward the outside of the photodiode region 60. The floating diffusion region 11 is shared between the two vertical gate electrodes 12a, 12b. In the embodiment, the floating diffusion region 11 is formed so as to touch the vertical gate electrodes 12a, 12b through the gate insulating film 18.

The two vertical gate electrodes 12a, 12b and the floating diffusion region 11 formed in the semiconductor substrate 13 through the gate insulating film 18 make up a charge readout transfer transistor Tr.

In the solid-state imaging device of the embodiment, desired MOS transistors such as a reset transistor, an amplification transistor, a selection transistor and the like included in one pixel are formed in the vicinity of the photodiode region 60 of the semiconductor substrate 13, which are not shown in FIG. 6. On the surface side of the semiconductor substrate 13, plural layers of wiring layers for driving these MOS transistors are formed through an interlayer insulating film.

The solid-state imaging device of the embodiment may be used as a front-illuminated solid-state imaging device which illuminates light from the surface side of the semiconductor 13 or may be used as a back-illuminated solid-state imaging device which illuminates light from the back side of the semiconductor substrate 13.

In the case of the front-illuminated type, light is incident from the surface side of the semiconductor substrate 13 through on-chip lenses, color filter films and the like, and in the case of the back-illuminated type, light is incident from the back side of the semiconductor substrate 13 through on-chip lenses, color filter films and the like.

[Drive Method]

A drive method of the solid-state imaging device in the embodiment having the above configuration will be explained.

First, a light "L" is illuminated from the side in which the on-chip lens is formed in the solid-state imaging device. Then, the light condensed by the on-chip lens is incident on the photodiode PD in the semiconductor substrate 13.

Then, the light incident on the photodiode PD is photoelectrically converted in then-region 14 and the pn junction portion "J" portion, and signal charges are generated in the photodiode PD. The generated signal charges are accumulated in a potential well formed in the n+ region 15. In the solid-state imaging device of the embodiment, negative voltage is applied to the vertical gate electrodes 12a, 12b at the time of accumulating signal charges. Since the p-region 17 is formed near the bottom portions of the vertical gate electrodes 12a, 12b and the gate insulating film 18 in the embodiment, holes are pinned at the bottom portions of the vertical gate electrodes 12a, 12b through the gate insulating film 18. The hole pinning in which holes are pinned occurs in this manner, thereby shutting dark current noise entering from the bottom portions of the vertical gate electrodes 12a, 12b and the gate insulating film 18 into the p-region 17 at the time of accumulating signal charges. Accordingly, it is possible to reduce dark current reaching the photodiode PD.

Figure 8:
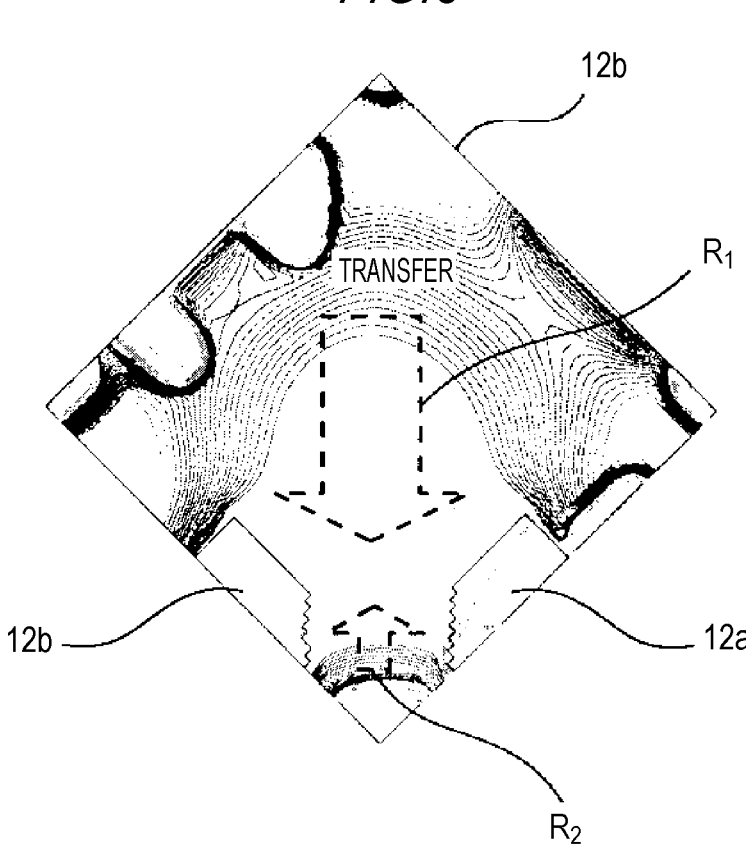
FIG. 8 is a view showing potential gradient in contour lines in the solid-state imaging device according to Embodiment 1 of the invention.

After accumulating signal charges, positive voltage is applied to the vertical gate electrodes 12a, 12b. Here, the same potential is applied to the two vertical gate electrodes 12a, 12b. In FIG. 8, potentials generated in the photodiode region 60 when the potential for reading signal charges is applied to the two vertical gate electrodes 12a, 12b are shown by contour lines. As shown in FIG. 8, when the potential for reading signal charges are applied to the two vertical gate electrodes 12a, 12b, potential becomes deeper toward the corner portion of the photodiode region 60 formed by the vertical gate electrodes 12a, 12b as shown by an arrow RI. In the embodiment, the floating diffusion region 11 is formed from the corner portion of the photodiode region 60 formed by the vertical gate electrodes 12a, 12b toward the outside region of the photodiode region 60. Accordingly, potential gradient is formed in the photodiode region 60 by applying positive voltage to the vertical gate electrodes 12a, 12b, and accumulated signal charges are transferred in the direction shown by the arrow R1 in FIG. 6 and FIG. 7 along the potential gradient. Consequently, signal charges are read to the floating diffusion region 11.

The potential in the photodiode region 60 becomes deeper toward the position where the vertical gate electrodes 12a, 12b are formed due to effects of the potential applied to the vertical gate electrodes 12a, 12b by applying positive voltage to the vertical gate electrodes 12a, 12b. In the embodiment, the vertical gate electrodes 12a, 12b are respectively formed along two edges of the outer peripheral portion forming one corner portion of the photodiode region 60, therefore, the portion sandwiched by the vertical gate electrodes 12a, 12b particularly becomes deep. The floating diffusion region 11 is formed at the position where the potential becomes deep, therefore, signal charges accumulated in the photodiode PD are read to the floating diffusion region 11 so as to be read along a valley of potential.

Accordingly, in the embodiment, signal charges can be read by changing the potential gradient in the photodiode region 60 by the charge readout transistor Tr, therefore, signal charges are read not only through the transfer channel in related arts. Accordingly, it is possible to transfer signal charges without affected by defects generated at side surfaces of the vertical gate electrodes 12a, 12b. As a result, transfer failure of signal charges and generation of dark current can be suppressed.

Additionally, the vertical gate electrodes 12a, 12b are formed at the outer peripheral portion of the photodiode region 60, therefore, it is possible to reduce the loss of the saturation charge amount (Qs) of the area of the vertical gate electrodes 12a, 12b and the periphery thereof as compared with the case in which the vertical gate electrode is formed at the center of the photodiode PD as in relate arts. That is to say, it is possible to reduce the loss of the saturation charge amount (Qs) at the central portion of the photodiode PD, in which capacitance per a unit area is usually high. According to this, the saturation charge amount (Qs) and sensitivity can be improved.

Embodiment 2

[Example Including Two Vertical Gate Electrodes]

Figure 9:
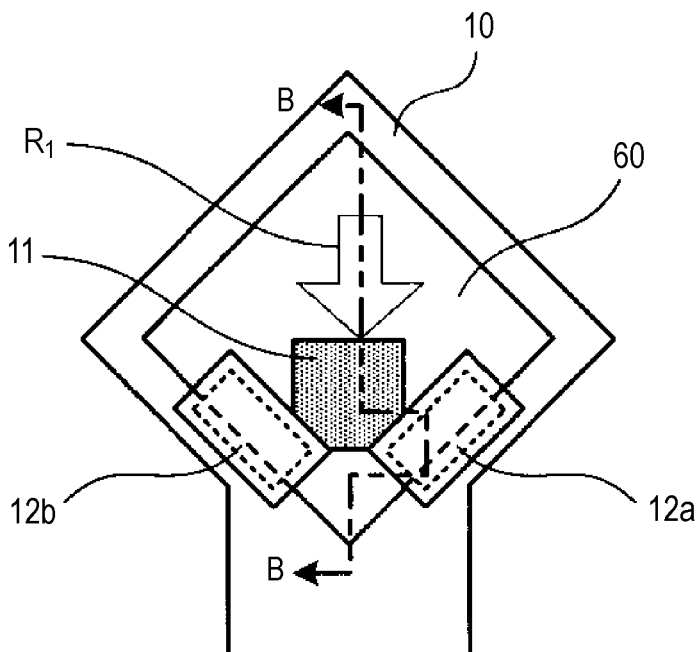
FIG. 9 is a schematic plan view of a relevant part of a solid-state imaging device according to Embodiment 2 of the invention.
Figure 10:
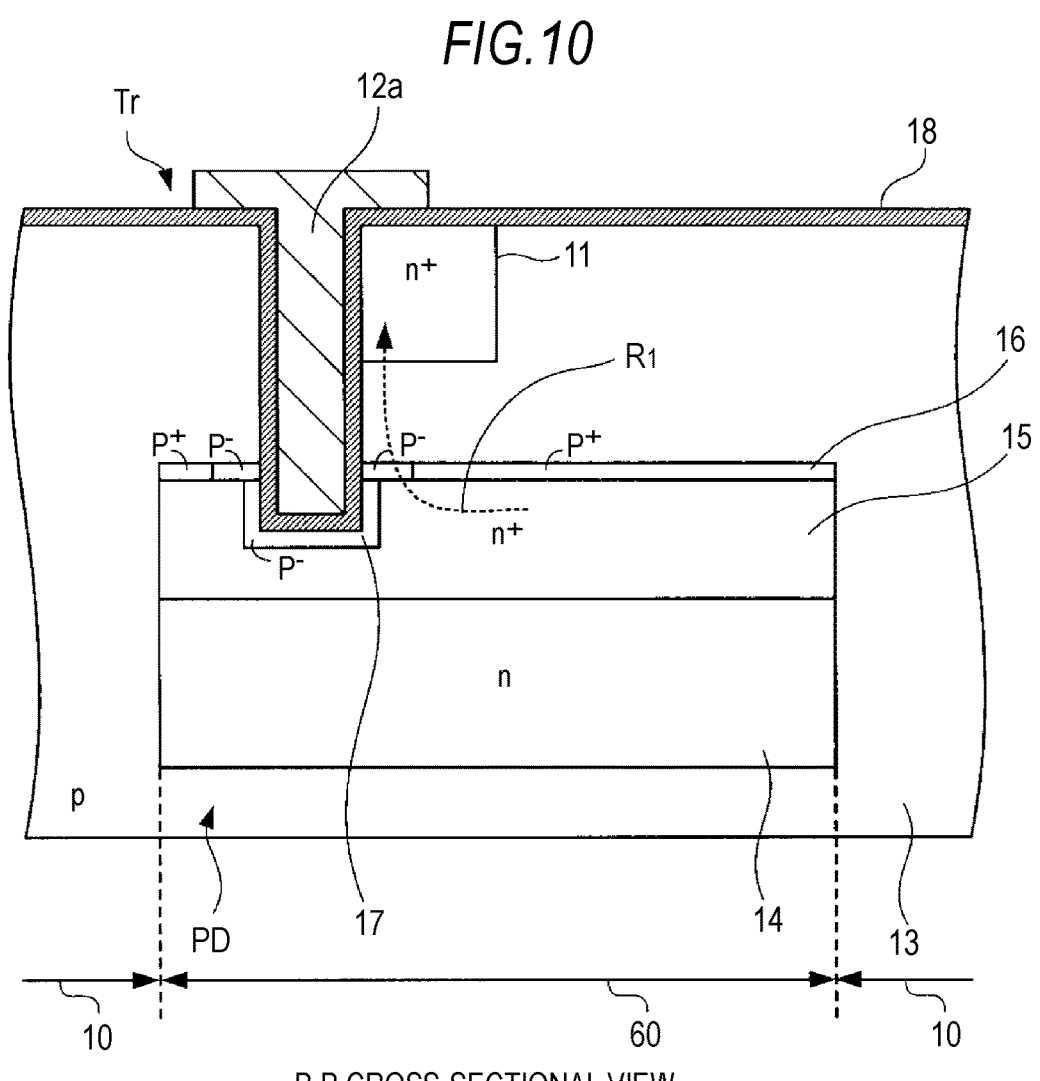
FIG. 10 is a schematic cross-sectional configuration view taken along B-B line of FIG. 9.

FIG. 9 shows a schematic planar configuration of a solid-state imaging device according to Embodiment 2 of the invention, and FIG. 10 shows a cross-sectional configuration taken along B-B line. The present embodiment differs from the Embodiment 1 in a position in which the floating diffusion region 11 is formed. In FIG. 9 and FIG. 10, same symbols are given to portions corresponding to FIG. 6 and FIG. 7, and the repeated explanation is omitted.

In the solid-state imaging device of the embodiment, the floating diffusion region 11 is formed on the surface side of the semiconductor substrate 13 from the corner portion of the photodiode region 60 sandwiched by the vertical gate electrodes 12a, 12b toward the inside of the photodiode region 60. The floating diffusion region 11 is shared between the two vertical gate electrodes 12a, 12b. In the embodiment, the floating diffusion region 11 is formed so as to touch the vertical gate electrodes 12a, 12b through the gate insulating film 18.

Also in the solid-state imaging device having the above configuration, signal charges accumulated in the photodiode PD are transferred in the direction shown by the arrow R1 along the potential gradient in the photodiode region 60 which is made by application of positive voltage to the vertical gate electrodes 12a, 12b. Consequently, the signal charges are read to the floating diffusion region 11.

Also according to the solid-state imaging device of the embodiment, the same advantages as Embodiment 1 can be obtained. Further, in the solid-state imaging device of the embodiment, the floating diffusion region 11 is formed inside the photodiode region 60, therefore, the reduction of pixel size can be realized.

Embodiment 3

[Example Including Two Vertical Gate Electrodes and a Planar Gate Electrode]

Figure 11:
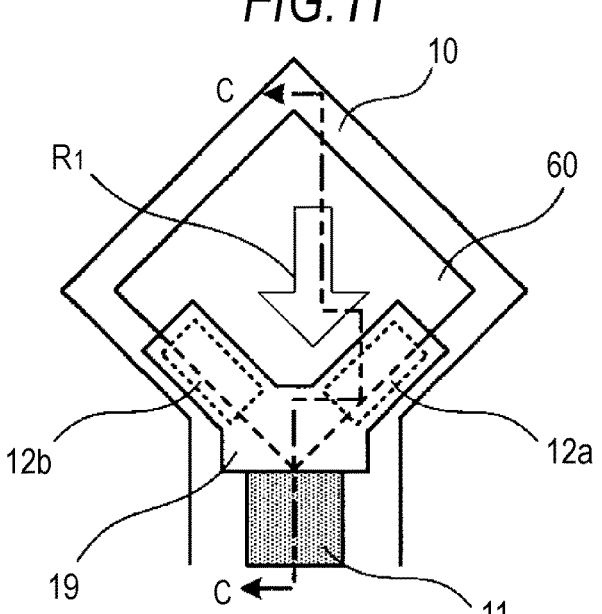
FIG. 11 is a schematic plan view of a relevant part of a solid-state imaging device according to Embodiment 3 of the invention.
Figure 12:
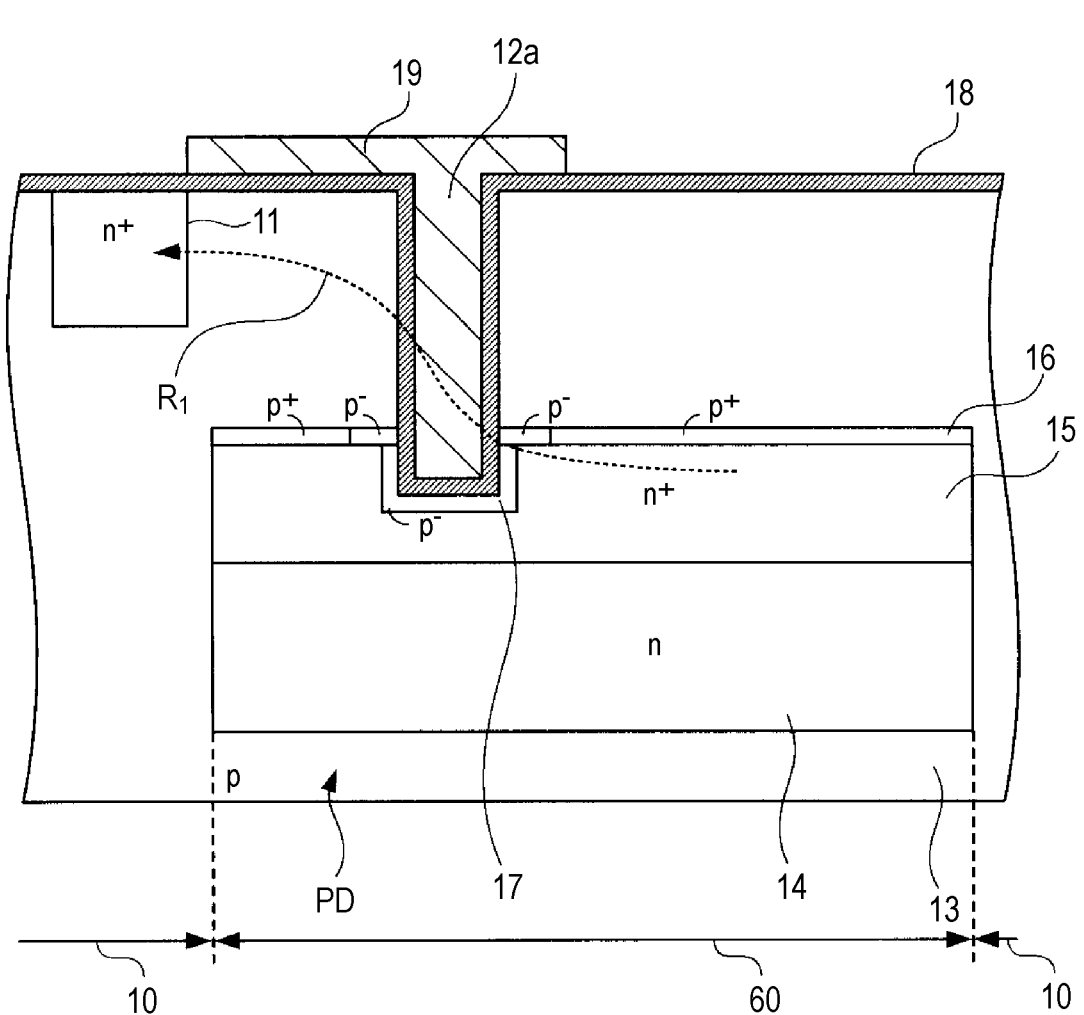
FIG. 12 is a schematic cross-sectional configuration view taken along C-C line of FIG. 11.

FIG. 11 shows a schematic planar configuration of a solid-state imaging device according to Embodiment 3 of the invention, and FIG. 12 shows a cross-sectional configuration taken along C-C line of FIG. 11. In FIG. 11 and FIG. 12, same symbols are given to portions corresponding to FIG. 6 and FIG. 7 and the repeated explanation is omitted.

In the solid-state imaging device of the present embodiment, the charge readout transistor Tr included in one pixel includes a planar gate electrode 19, the vertical gate electrodes 12a, 12b and the floating diffusion region 11.

The two vertical gate electrodes 12a, 12b are formed at an outer peripheral portion of the photodiode region 60 respectively along two edges forming a corner portion of the photodiode region 60. On an upper surface of the semiconductor substrate 13 positioned at the corner portion of the photodiode region 60 sandwiched by the vertical gate electrodes 12a, 12b, the planar gate electrode 19 integrally formed with the vertical gate electrodes 12a, 12b is formed. The planar gate electrode 19 is formed through the gate insulating film 18 on a surface of the semiconductor substrate 13. The same potential as the vertical gate electrodes 12a, 12b is applied to the planar gate electrode 19.

In the embodiment, the floating diffusion region 11 is formed at a region outside the photodiode region 60 on the surface side of the semiconductor substrate 13, which is a region touching the semiconductor substrate 13 under the planar gate electrode 19.

Also in the solid-state imaging device having the above configuration, signal charges accumulated in the photodiode PD are transferred by the potential gradient made by application of positive voltage to the vertical gate electrodes 12a, 12b and the planar gate electrode 19 and read to the floating diffusion region 11.

Figure 13:
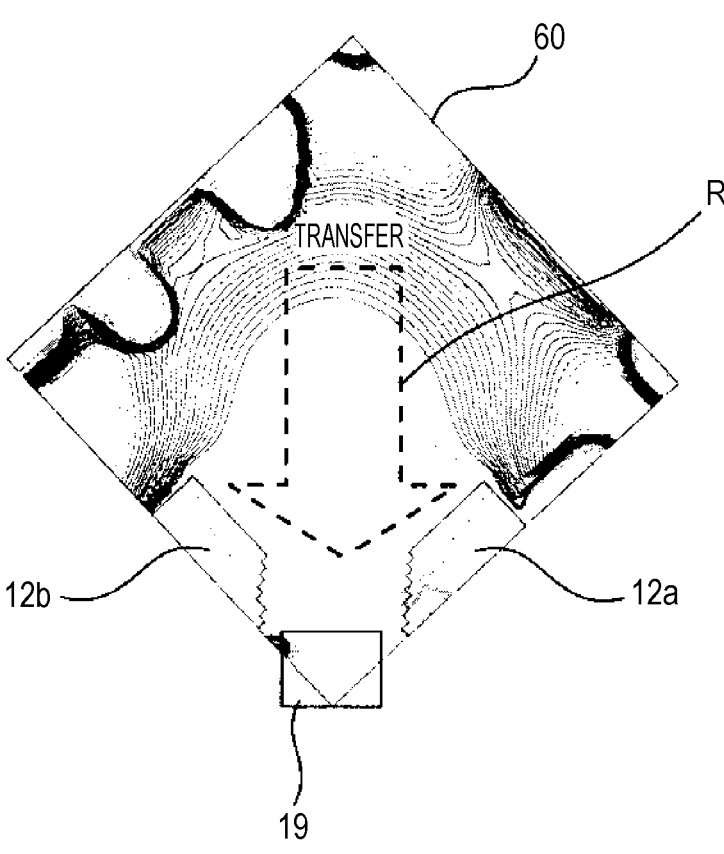
FIG. 13 is a view showing potential gradient in contour lines in the solid-state imaging device according to Embodiment 3 of the invention.

In FIG. 13, potentials in the photodiode region 60 generated when the potential for reading signal charges is applied to the two vertical gate electrodes 12a, 12b and the planar gate electrode 19 are shown by contour lines. As shown in FIG. 13, when the potential for reading signals is applied to the two vertical gate electrodes 12a, 12b and the planar gate electrode 19, the potential becomes deeper toward a corner portion region formed by the vertical gate electrodes 12a, 12b and the planar gate electrode 19.

When comparing FIG. 8 shown in Embodiment 1, the gradient to be deeper toward the corner portion sandwiched by the vertical gate electrodes 12a, 12b was made in FIG. 8, however, at the corner portion, potential gradient is made so as to be deeper in the direction shown by an arrow R2.

The potential gradient in the direction shown by the arrow R2 at the corner portion in the photodiode region 60 shown in FIG. 8 may cause transfer loss of signal charges. On the other hand, in the present embodiment, the potential does not become shallow at the corner portion sandwiched by the vertical gate electrodes 12a, 12b as shown in FIG. 13 and a gradient is made in the direction in which the potential becomes deeper. In short, the gradient of the arrow R2 as shown in FIG. 8 does not exist. This is because of effects of the planar gate electrode 19. That is, the planar gate electrode 19 is used together with the vertical gate electrodes 12a, 12b, thereby forming the potential gradient more effectively from the inside of the photodiode region 60 toward the floating diffusion region 11. Accordingly, it is possible to suppress occurrence of transfer loss of signal charges.

Also in the solid-state imaging device of the embodiment, it is possible to obtain the same advantages as Embodiment 1.

Embodiment 4

[Example Including Two Vertical Gate Electrodes and a Planar Gate Electrode]

Figure 14:
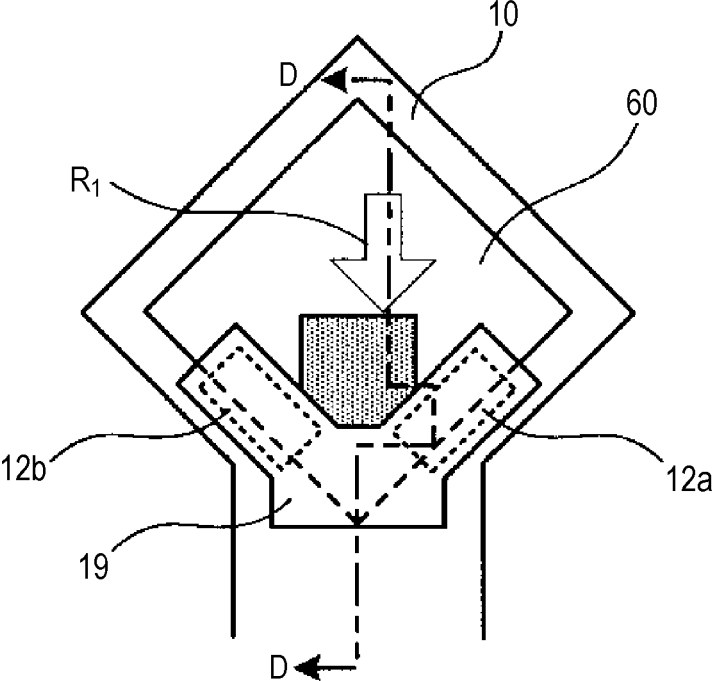
FIG. 14 is a schematic planar configuration view of a relevant part of a solid-state imaging device according to Embodiment 4 of the invention.
Figures 15, 16:
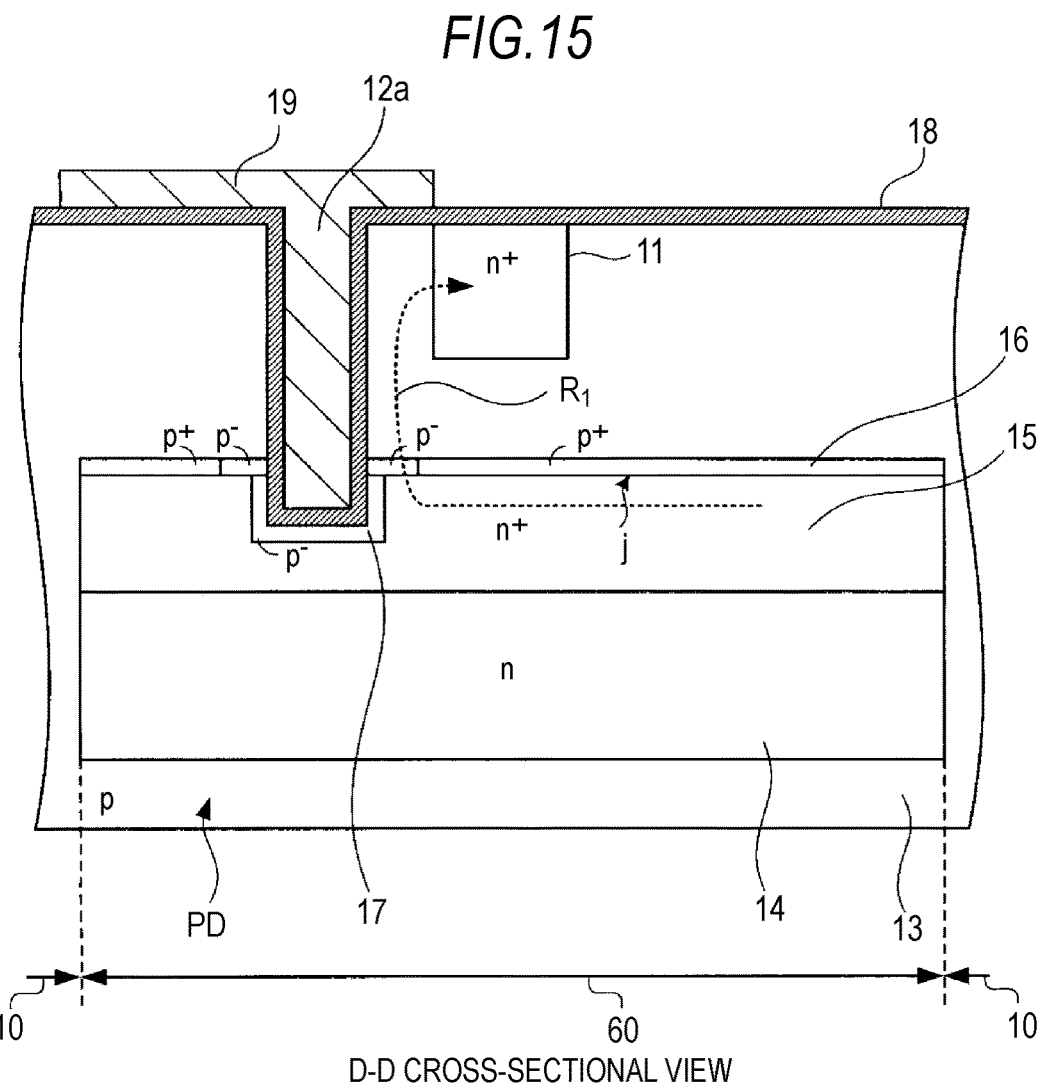
FIG. 15 is a schematic cross-sectional configuration view taken along D-D line of FIG. 14.
FIG. 16 is a schematic planar configuration view of a relevant part of a solid-state imaging device according to Embodiment 5 of the invention.

FIG. 14 shows a schematic planar configuration of a solid-state imaging device according to Embodiment 4 of the invention, and FIG. 15 shows a cross-sectional configuration taken along D-D line of FIG. 14. In FIG. 14 and FIG. 15, same symbols are given to portions corresponding to FIG. 11 and FIG. 12 and the repeated explanation is omitted. The embodiment differs from the Embodiment 3 in a position of the floating diffusion region 11.

In the solid-state imaging device of the embodiment, the floating diffusion region 11 is formed at a region inside the photodiode region 60 on the surface side of the semiconductor substrate 13, which is a region touching the semiconductor substrate 13 under the planar gate electrode 19.

Also in the solid-state imaging device having the above configuration, signal charges accumulated in the photodiode PD are transferred along the potential gradient shown by the arrow R1 in the photodiode region 60, which is made by application of positive voltage to the vertical gate electrodes 12a, 12b. The transfer signal charges are read to the floating diffusion region 11.

Also in the solid-state imaging device of the embodiment, the same advantages as Embodiment 1 can be obtained. Moreover, since the floating diffusion region 11 is formed inside the photodiode region 60 in the solid-state imaging device of the embodiment, the pixel size can be reduced.

Embodiment 5

[Example Including a Vertical Gate Electrode Under a Planar Gate Electrode]

Figures 17, 18:
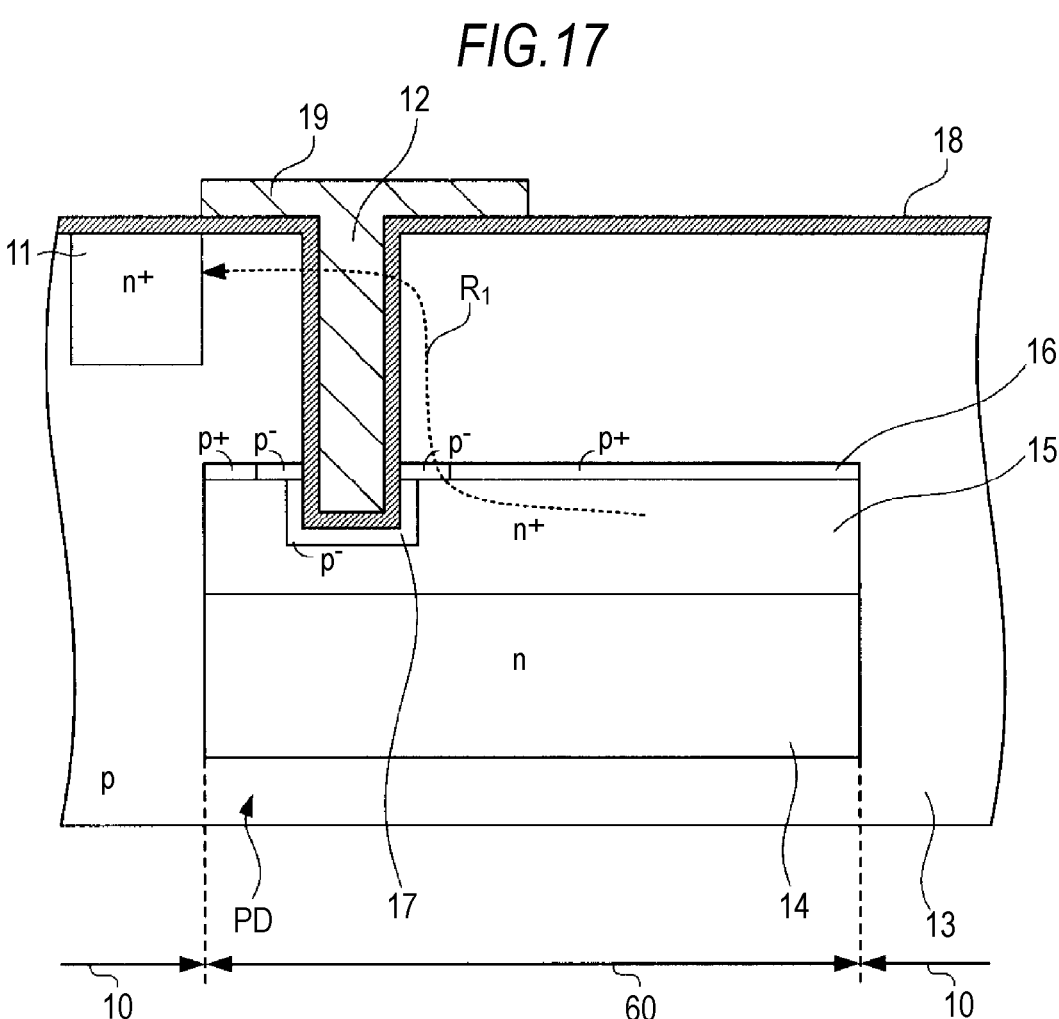
FIG. 17 is a schematic cross-sectional configuration view taken along E-E line of FIG. 16.
FIG. 18 is a schematic planar configuration view of a relevant part of a solid-state imaging device according to Embodiment 6 of the invention.

FIG. 16 shows a schematic planar configuration of a solid-state imaging device according to Embodiment 5 of the invention, and FIG. 17 shows a cross-sectional configuration taken along E-E line of FIG. 16. In FIG. 16 and FIG. 17, same symbols are given to portions corresponding to FIG. 11 and FIG. 12 and the repeated explanation is omitted.

In the solid-state imaging device of the embodiment, the charge readout transistor Tr included in one pixel includes the planar gate electrode 19, the vertical gate electrode 12 and the floating diffusion region 11.

The planar gate electrode 19 is formed on the semiconductor substrate 13 at a corner portion of the photodiode region 60 through the gate insulating film 18. The vertical gate electrode 12 formed integrally with the planar gate electrode 19 is formed under the planar gate electrode 19. The vertical gate electrode 12 is formed so as to touch the pn junction "j" of the photodiode PD formed inside the semiconductor substrate 13 through the gate insulating film 18. The vertical gate electrode 12 has a cross section of an approximately square shape, which is formed to have a size not enough to cover the whole lower surface of the planar gate electrode 19 formed at the corner portion of the photodiode region 60.

In the embodiment, the floating diffusion region 11 is formed at a region outside the photodiode region 60 on the surface side of the semiconductor substrate 13, which is a region touching the semiconductor substrate 13 under the planar gate electrode 19.

Also in the solid-state imaging device having the above configuration, signal charges accumulated in the photodiode PD are transferred along the potential gradient shown by the arrow R1 in the photodiode region 60, which is made by application of positive voltage to the vertical gate electrode 12. The signal charges are consequently read to the floating diffusion region 11. In the embodiment, the vertical gate electrode 12 is formed to have the size not enough to cover the whole lower surface of the planar gate electrode 19. Therefore, the transfer of signal charges to the floating diffusion region 11 through the potential gradient of the photodiode region 60 is not interrupted by the vertical gate electrode 12.

Also in the solid-state imaging device of the embodiment, the same advantages as Embodiment 1 can be obtained.

Embodiment 6

[Example Including a Vertical Gate Electrode Under a Planar Gate Electrode]

Figure 19:
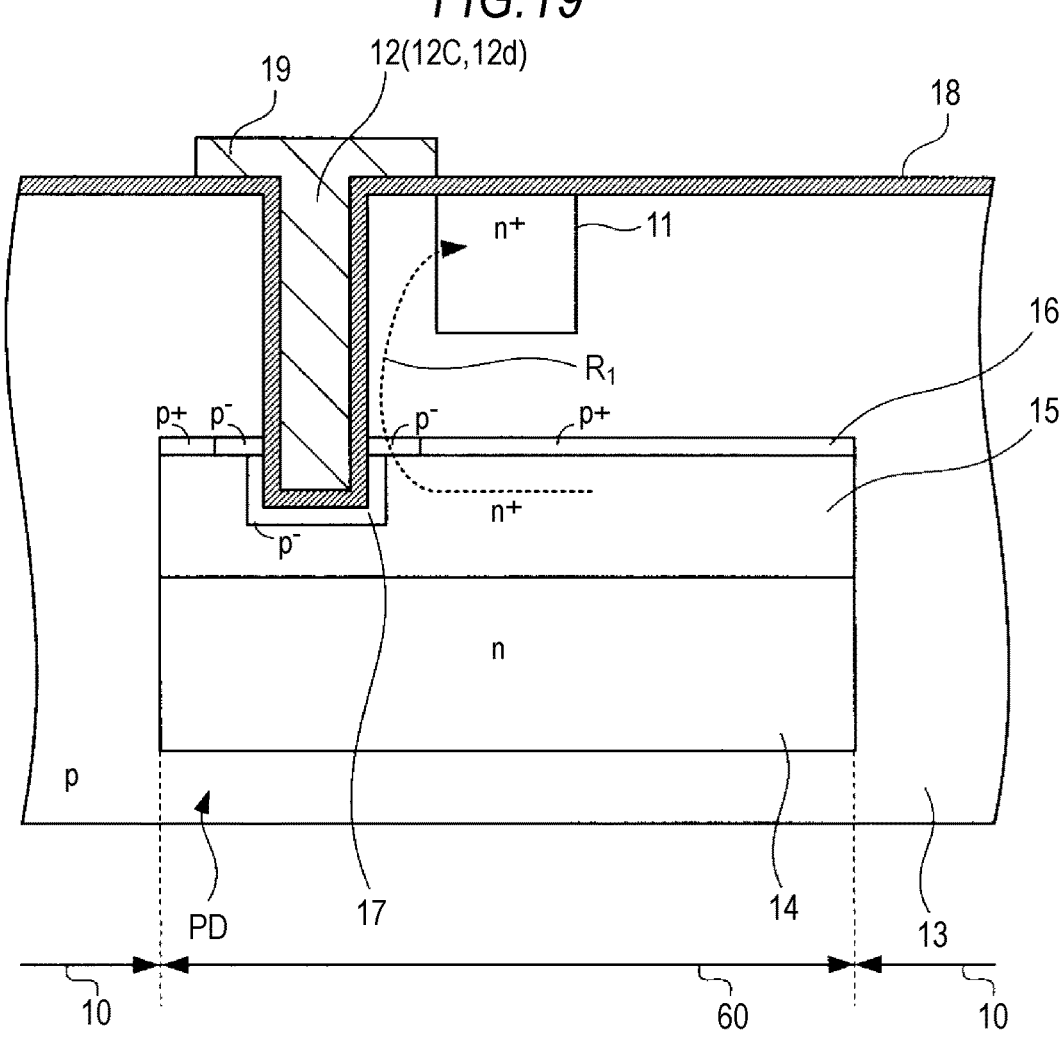
FIG. 19 is a schematic cross-sectional configuration view taken along F-F line of FIG. 18.

FIG. 18 shows a schematic planar configuration of a solid-state imaging device according to Embodiment 6 of the invention, and FIG. 19 shows a cross-sectional configuration taken along F-F line of FIG. 18. In FIG. 18 and FIG. 19, same symbols are given to portions corresponding to FIG. 16, FIG. 17 and the repeated explanation is omitted.

The embodiment differs from Embodiment 5 in a position of the floating diffusion region 11.

In the embodiment, the floating diffusion region 11 is formed at a region inside the photodiode region 60 on the surface side of the semiconductor substrate 13, which is a region touching the semiconductor substrate 13 under the planar gate electrode 19.

Also in the solid-state imaging device having the above configuration, signal charges accumulated in the photodiode PD are transferred along the potential gradient shown by the arrow R1 in the photodiode region 60, which is made by application of positive voltage to the vertical gate electrode 12. The signal charges are consequently read to the floating diffusion region 11. In the embodiment, the vertical gate electrode 12 is formed to have the size not enough to cover the whole lower surface of the planar gate electrode 19. Therefore, the transfer of signal charges to the floating diffusion region 11 through the potential gradient of the photodiode region 60 is not interrupted by the vertical gate electrode 12.

Also in the solid-state imaging device in the embodiment, the same advantages as Embodiment 1 can be obtained. Moreover, since the floating diffusion region 11 is formed inside the photodiode region 60 in the solid-state imaging device in the embodiment, the pixel size can be reduced.

Embodiment 7

[Example Including One Vertical Gate Electrode]

Figure 20:
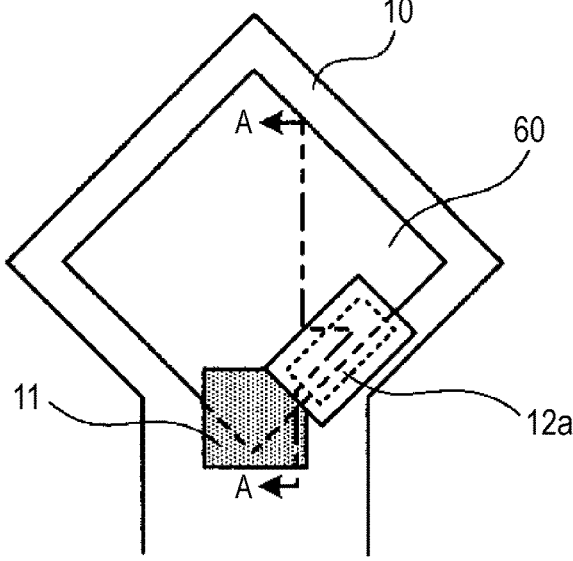
FIG. 20 a schematic planar configuration view of a relevant part of a solid-state imaging device according to Embodiment 7 of the invention.

FIG. 20 shows a schematic planar configuration of a solid-state imaging device according to Embodiment 7 of the invention. A cross-sectional configuration taken along A-A line in FIG. 20 is the same as FIG. 7. In FIG. 20, same symbols are given to portions corresponding to FIG. 6 and the repeated explanation is omitted.

In the solid-state imaging device of the embodiment, the charge readout transistor Tr included in one pixel includes the vertical gate electrode 12a and the floating diffusion region 11. One vertical gate electrode 12a is formed along one edge of an outer peripheral portion of the photodiode region 60. The vertical gate electrode 12a is also formed to the depth where the electrode 12a touches the pn junction "j" of the photodiode PD formed inside the semiconductor substrate 13 through the gate insulating film 18.

The floating diffusion region 11 is formed on the surface side of the semiconductor substrate 13 from the corner portion of the photodiode region 60 adjacent to the vertical gate electrode 12a toward the outside.

Also in the solid-state imaging device having the above configuration, signal charges accumulated in the photodiode PD are transferred along the potential gradient in the photodiode region 60, which is made by application of positive voltage to the vertical gate electrode 12a. Then, the transferred signal charges are consequently read to the floating diffusion region 11.

Also in the solid-state imaging device of the embodiment, the same advantages as Embodiment 1 can be obtained.

Embodiment 8

[Example Including One Vertical Gate Electrode]

Figures 21, 22, 23:
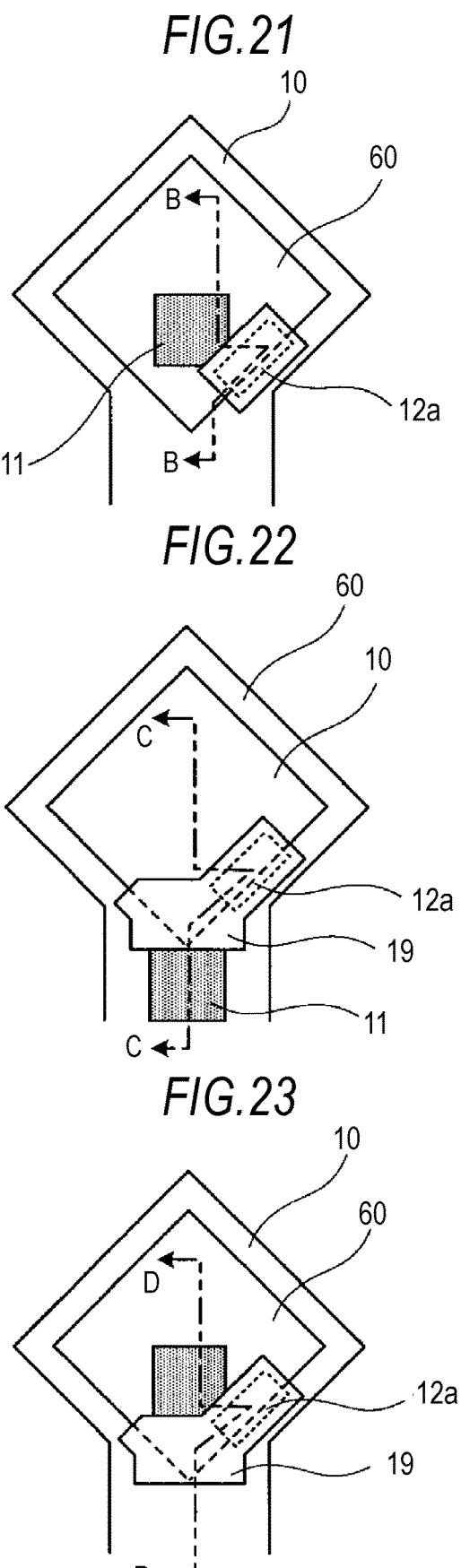
FIG. 21 a schematic planar configuration view of a relevant part of a solid-state imaging device according to Embodiment 8 of the invention.
FIG. 22 a schematic planar configuration view of a relevant part of a solid-state imaging device according to Embodiment 9 of the invention.
FIG. 23 a schematic planar configuration view of a relevant part of a solid-state imaging device according to Embodiment 10 of the invention.

FIG. 21 shows a schematic planar configuration of a solid-state imaging device according to Embodiment 8 of the invention. A cross-sectional configuration taken along B-B line in FIG. 21 is the same as FIG. 10. In FIG. 21, same symbols are given to portions corresponding to FIG. 9 and the repeated explanation is omitted.

The embodiment differs from Embodiment 7 in a position of the floating diffusion region 11.

In the solid-state imaging device of the embodiment, the floating diffusion region 11 is formed inside the photodiode region 60 on the surface side of the semiconductor substrate 13, which is adjacent to the vertical gate electrode 12a.

Also in the solid-state imaging device having the above configuration, signal charges accumulated in the photodiode PD are transferred along the potential gradient in the photodiode region 60, which is made by application of positive voltage to the vertical gate electrode 12a. Then, the transferred signal charges are consequently read to the floating diffusion region 11.

Also in the solid-state imaging device in the embodiment, the same advantages as Embodiment 1 can be obtained. Moreover, since the floating diffusion region 11 is formed inside the photodiode region 60 in the solid-state imaging device of the embodiment, the pixel size can be reduced.

Embodiment 9

[Example Including One Vertical Gate Electrode and One Planar Gate Electrode]

FIG. 22 shows a schematic planar configuration of a solid-state imaging device according to Embodiment 9 of the invention. A cross-sectional configuration taken along C-C line in FIG. 22 is the same as FIG. 12. In FIG. 22, same symbols are given to portions corresponding to FIG. 11 and the repeated explanation is omitted.

In the solid-state imaging device of the embodiment, the charge readout transistor Tr included in one pixel includes the vertical gate electrode 12a, the planar gate electrode 19 and the floating diffusion region 11.

First, one vertical gate electrode 12a is formed along one edge of the outer peripheral portion of the photodiode region 60. The vertical gate electrode 12a is also formed to the depth where the electrode 12a touches the pn junction "j" of the photodiode PD formed inside the semiconductor substrate 13 through the gate insulating film 18.

The planar gate electrode 19 is formed on the semiconductor substrate 13 at the corner portion of the photodiode region 60 which touches the vertical gate electrode 12a through the gate insulating film 18 integrally with the vertical gate electrode 12a.

The floating diffusion region 11 is formed at a region inside the photodiode region 60 on the surface side of the semiconductor substrate 13, which is a region touching the semiconductor substrate 13 under the planar gate electrode 19.

Also in the solid-state imaging device having the above configuration, signal charges accumulated in the photodiode PD are transferred along the potential gradient in the photodiode region 60, which is made by application of positive voltage to the vertical gate electrode 12a and the planar gate electrode 19. Then, the transferred signal charges are read to the floating diffusion region 11.

Also in the solid-state imaging device, the same advantages as Embodiment 1 can be obtained. Moreover, the planar gate electrode 19 is used together with the vertical gate electrode 12a, thereby forming the potential gradient more effectively from the inside of the photodiode region 60 toward the floating diffusion region 11. Accordingly, occurrence of transfer loss of signal charges can be suppressed.

Embodiment 10

[Example Including One Vertical Gate Electrode and One Planar Gate Electrode]

FIG. 23 shows a schematic planar configuration of a solid-state imaging device according to Embodiment 10 of the invention. A cross-sectional configuration taken along D-D line in FIG. 23 is the same as FIG. 15. In FIG. 23, same symbols are given to portions corresponding to FIG. 14 and the repeated explanation is omitted.

The embodiment differs from Embodiment 9 in a position of the floating diffusion region 11.

In the solid-state imaging device of the embodiment, the floating diffusion region 11 is formed at a region outside the photodiode region 60 on the surface side of the semiconductor substrate 13, which is a region touching the semiconductor substrate 13 under the planar gate electrode 19.

Also in the solid-state imaging device having the above configuration, signal charges accumulated in the photodiode PD are transferred along the potential gradient in the photodiode region 60, which is made by application of positive voltage to the vertical gate electrode 12a and the planar gate electrode 19. Then, the transferred signal charges are read to the floating diffusion region 11.

Also in the solid-state imaging device, the same advantages as Embodiment 1 can be obtained. Moreover, since the floating diffusion region 11 is formed inside the photodiode region 60 in the solid-state imaging device of the embodiment, the pixel size can be reduced.

Embodiment 11

[Example Including a Vertical Gate Electrode Extending to Two Edges and a Planer Gate Electrode]

Figure 24:
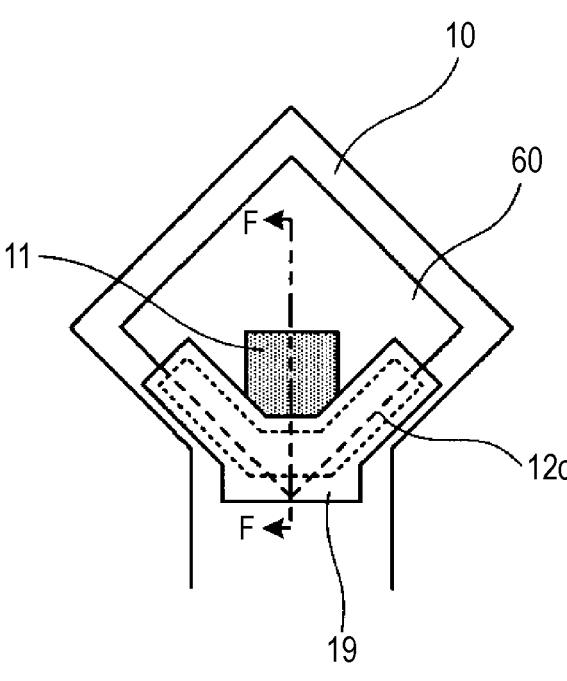
FIG. 24 a schematic planar configuration view of a relevant part of a solid-state imaging device according to Embodiment 11 of the invention.

FIG. 24 shows a schematic planar configuration of a solid-state imaging device according to Embodiment 11 of the invention. A cross-sectional configuration taken along F-F line in FIG. 24 is the same as FIG. 19. In FIG. 24, same symbols are given to portions corresponding to FIG. 18 and the repeated explanation is omitted.

The charge readout transistor Tr included in one pixel of the solid-state imaging device of the embodiment includes a vertical gate electrode 12c, the planer gate electrode 19 and the floating diffusion region 11.

First, the vertical gate electrode 12c is formed extending to two edges adjacent to each other at the outer peripheral portion of the photodiode region 60. The vertical gate electrode 12c is formed from the surface of the semiconductor substrate 13 to the depth where the electrode 12c touches the pn junction "j" of the photodiode PD in the semiconductor substrate 13 through the gate insulating film 18.

The planer gate electrode 19 is formed integrally with the vertical gate electrode 12c at the region of the corner portion of the photodiode region 60 in which the vertical gate electrode 12c is formed.

The floating diffusion region 11 is formed on the surface side of the semiconductor substrate adjacent to the planar gate electrode 19 in the photodiode region 60.

Also in the solid-state imaging device of the embodiment, signal charges accumulated in the photodiode PD are transferred along the potential gradient in the photodiode region 60, which is made by application of positive voltage to the vertical gate electrode 12c. Then, the transferred signal charges are read to the floating diffusion region 11. Since the signal charges are transferred through the potential gradient formed inside the photodiode region 60 in the embodiment, it is necessary that the floating diffusion region 11 is formed at a position in which the transfer of signal charges is not interrupted by the vertical gate electrode 12c. In the embodiment, the floating diffusion region 11 is formed in the photodiode region 60 in which signal charges are accumulated with respect to the vertical gate electrode 12c, therefore, the transfer of signal charges is not interrupted by the vertical gate electrode 12c.

Also in the solid-state imaging device, the same advantages as Embodiment 1 can be obtained. Moreover, since the floating diffusion region 11 is formed inside the photodiode region 60 in the solid-state imaging device of the embodiment, the pixel size can be reduced.

Embodiment 12

[Example Including a Vertical Gate Electrode Extending to One Edge as Well as a Corner Portion and a Planar Gate Electrode]

Figure 25:
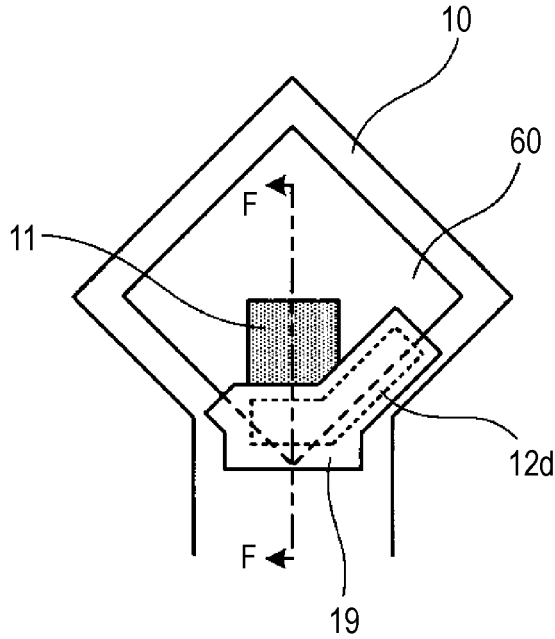
FIG. 25 a schematic planar configuration view of a relevant part of a solid-state imaging device according to Embodiment 12 of the invention.

FIG. 25 shows a schematic planar configuration of a solid-state imaging device according to Embodiment 12 of the invention. A cross-sectional configuration taken along F-F line in FIG. 25 is the same as FIG. 19. In FIG. 25, same symbols are given to portions corresponding to FIG. 24 and the repeated explanation is omitted.

In the solid-state imaging device of the embodiment, the charge readout transistor Tr included in one pixel includes a vertical gate electrode 12d, the planar gate electrode 19 and the floating diffusion region 11.

First, the vertical gate electrode 12d is formed extending to one edge of the outer peripheral portion of the photodiode region 60 and the corner portion of the photodiode region 60 adjacent to the edge. The vertical gate electrode 12d is formed from the surface of the semiconductor substrate 13 to the depth where the electrode 12d touches the pn junction "j" of the photodiode PD formed in the semiconductor substrate 13 through the gate insulating film 18.

The planar gate electrode 19 is formed integrally with the vertical gate electrode 12d at the corner region of the photodiode region 60 in which the vertical gate electrode 12d is formed.

The floating diffusion region 11 is formed on the surface side of the semiconductor substrate 13 adjacent to the vertical gate electrode 12d in the photodiode region 60.

Also in the solid-state imaging device having the above configuration, signal charges accumulated in the photodiode PD are transferred along the potential gradient in the photodiode region 60, which is made by application of positive voltage to the vertical gate electrode 12d. Consequently, the transferred signal charges are read to the floating diffusion region 11. In the solid-state imaging device of the embodiment, the vertical gate electrode 12d is formed extending to two edges of the outer peripheral portion of the photodiode region 60. Since the signal charges are transferred by the potential gradient formed in the photodiode region 6 0 in the embodiment, the floating diffusion region 11 is formed at a position where the transfer of signal charges is not interrupted by the vertical gate electrode 12d. That is, in the embodiment, the floating diffusion region 11 is formed inside the photodiode region 60 which is the side in which signal charges are accumulated with respect to the vertical gate electrode 12d, therefore, the transfer of signal charges is not interrupted by the vertical gate electrode 12d.

Also in the solid-state imaging device of the embodiment, the same advantages as Embodiment 1 can be obtained. Moreover, since the floating diffusion region 11 is formed inside the photodiode region 60 in the solid-state imaging device according to the embodiment of the invention, the pixel size can be reduced.

In Embodiments 1 to 12 described above, configurations of one pixel have been explained. The charge readout transistor Tr according to the embodiment of the invention can share the vertical gate electrode, the planar gate electrode or the floating diffusion region included in the charge readout transistor Tr among adjacent pixels. Layout examples of the charge readout transistor Tr with respect to the photodiode region will be explained while showing adjacent four pixels as follows. In the following explanation of embodiments, only planar configurations in the pixel portion of the solid-state imaging device will be shown and cross-sectional configurations are omitted, however, the cross-sectional configurations correspond to the cross-sectional configurations in the solid-state imaging devices according to Embodiments 1 to 12. Therefore, the photodiode region is defined as a region in which the photodiode formed in the semiconductor substrate is formed, which is seen in plan view, thought not shown. The vertical gate electrode is defined as a gate electrode formed from the surface of the semiconductor substrate to the depth where the electrode reaches the pn junction of the photodiode formed in the semiconductor substrate through the gate insulating film. The planer gate electrode is defined as a gate electrode formed on the semiconductor substrate through the gate insulating film.

Embodiment 13

[Example in which a Planar Gate Electrode and a Floating Diffusion Region are Shared Among Adjacent Pixels]

Figure 26:
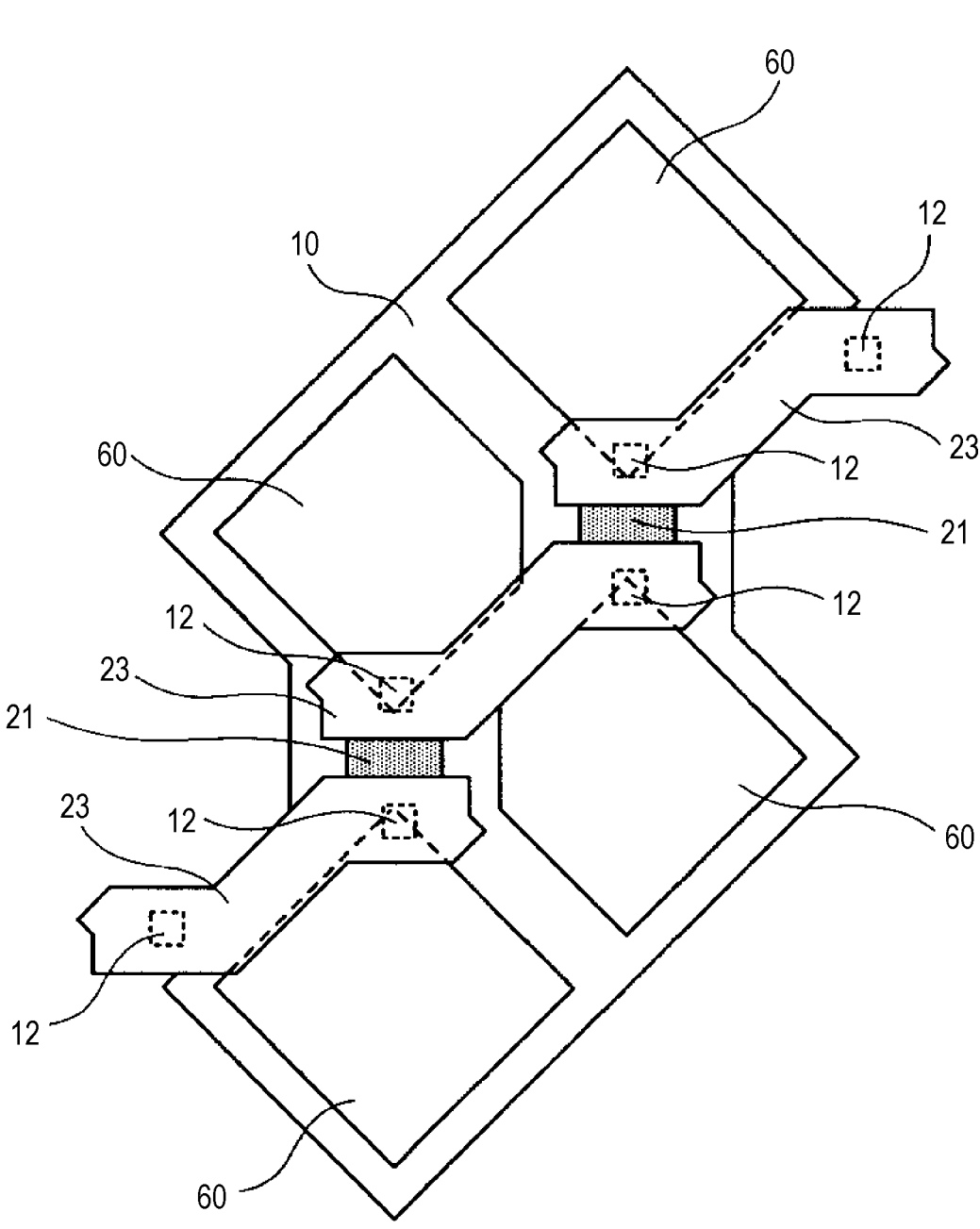
FIG. 26 a schematic planar configuration view of a relevant part of a solid-state imaging device according to Embodiment 13 of the invention.

FIG. 26 shows a schematic planar configuration of a solid-state imaging device according to Embodiment 13 of the invention. FIG. 26 is a plan view of a relevant part included in adjacent four pixels, showing an example in which adjacent pixels are shifted in the vertical direction or the horizontal direction so as to be a so-called honeycomb pixel arrangement. In FIG. 26, same symbols are given to portions corresponding to the above drawings and the repeated explanation is omitted.

In the solid-state imaging device of the embodiment, the charge readout transistor Tr included in one pixel includes a planar gate electrode 23, the vertical gate electrode 12 formed integrally with the planar gate electrode 23 and a floating diffusion region 21.

The planar gate electrode 23 is formed at a region extending to one edge of the peripheral portion of the photodiode region 60 and a corner portion of the photodiode region 60 adjacent to the edge so as to be parallel to the edge and the corner. At a position of the corner portion of the photodiode region 60 under the planar gate electrode 23, the vertical gate electrode 12 integrally formed with the planar gate electrode 23 is formed. The vertical gate electrode 12 has a cross section of an approximately square shape, which is formed to have a size not enough to cover the whole lower surface of the planar gate electrode 23 formed at the corner portion of the photodiode region 60.

The floating diffusion region 21 is formed outside the photodiode region 6 0 which is a region adjacent to the semiconductor substrate under the planar gate electrode 23.

In the solid-state imaging device of the embodiment, the planar gate electrode 23 formed along one edge of the peripheral portion of the photodiode region 60 is shared between pixels adjacent in an oblique direction, respectively.

Moreover, the floating diffusion region 21 formed outside the photodiode region 60 is shared between pixels adjacent in the vertical direction.

Also in the solid-state imaging device having the above configuration, signal charges accumulated in the photodiode PD are transferred along the potential gradient in the photodiode region 60, which is made by application of positive voltage to the vertical gate electrode 12. Then, the transferred signal charges are read to the floating diffusion region 21. In the solid-state imaging device according to the embodiment of the invention, the planar gate electrode 23 formed along one edge of the outer peripheral portion of the photodiode region 6 0 is shared between two pixels adjacent in the oblique direction. Therefore, signal charges accumulated in the photodiode regions 60 of two pixels are transferred at the same time. Additionally, the vertical gate electrode 12 is formed to have the size not enough to cover the whole lower surface of the planar gate electrode 23 in the embodiment. Therefore, transfer of signal charges to the floating diffusion region 21 by the potential gradient in the photodiode region 60 is not interrupted by the vertical gate electrode 12.

In the embodiment, the planar gate electrode 23 and the floating diffusion region 21 are shared between adjacent two pixels, thereby reducing the pixel size.

Also in the solid-state imaging device of the embodiment, the same advantages as Embodiment 1 can be obtained.

Embodiment 14

[Example in which a Planar Gate Electrode is Shared Between Adjacent Pixels]

Figure 27:
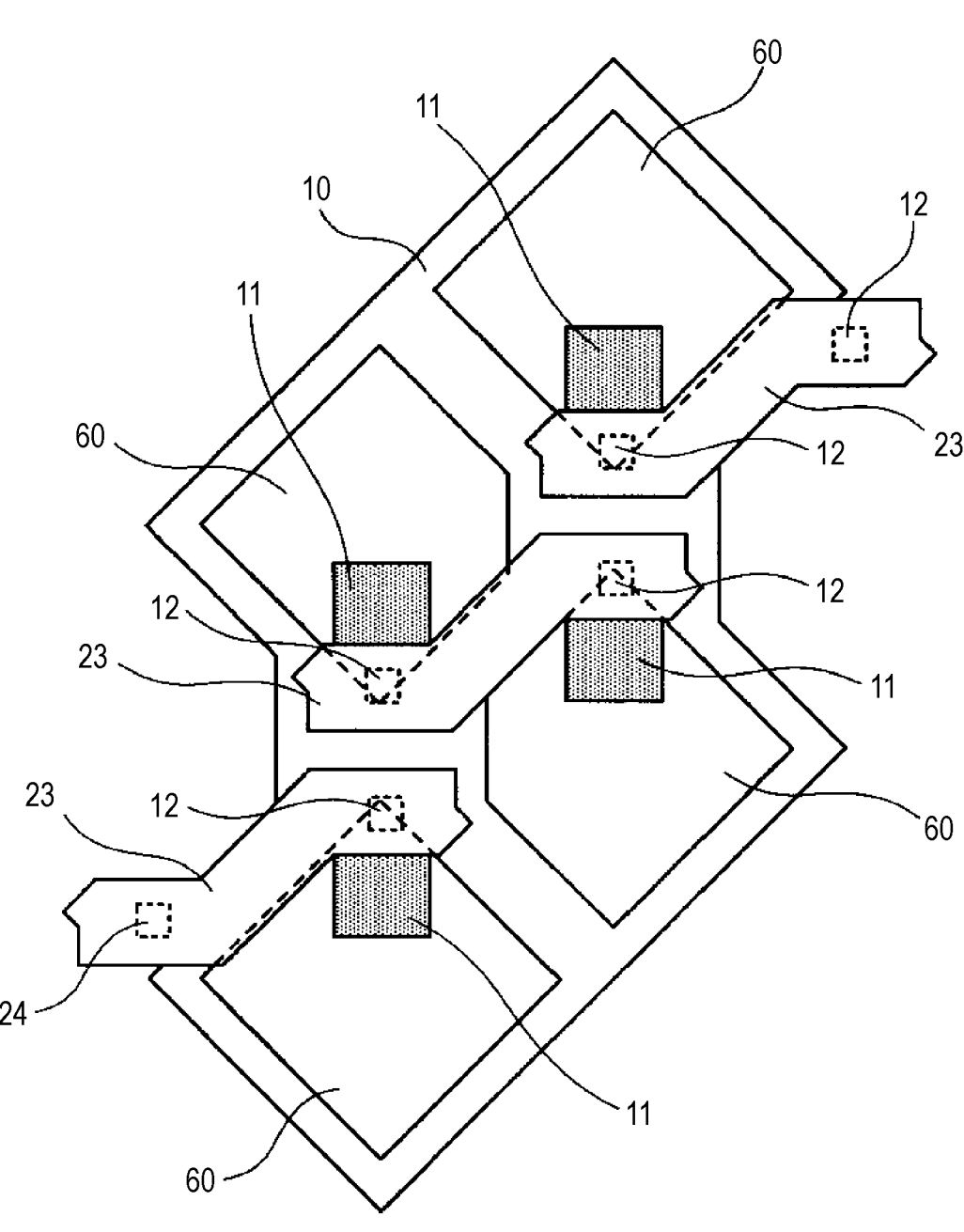
FIG. 27 a schematic planar configuration view of a relevant part of a solid-state imaging device according to Embodiment 14 of the invention.

FIG. 27 shows a schematic planar configuration of a solid-state imaging device according to Embodiment 14 of the invention. In FIG. 27, same symbols are given to portions corresponding to FIG. 26 and the repeated explanation is omitted.

The embodiment differs from Embodiment 13 in a configuration of the floating diffusion region.

In the solid-state imaging device of the embodiment, the floating diffusion region 11 is formed at a region on the surface side of the semiconductor substrate 13 inside the photodiode region 60, which is adjacent to the semiconductor substrate 13 under the planar gate electrode 23. That is, the floating diffusion region 11 is not shared between adjacent pixels.

Also in the solid-state imaging device having the above configuration, signal charges accumulated in the photodiode PD are transferred along the potential gradient in the photodiode region 60, which is made by application of positive voltage to the vertical gate electrode 12. Then, the transferred signal charges are read to the floating diffusion region 11. In the solid-state imaging device of the embodiment, the planar gate electrode 23 formed along one edge of the outer peripheral portion of the photodiode region 60 is shared between two pixels adjacent in the oblique direction, therefore, signal charges accumulated in the photodiode regions 60 of two pixels are transferred at the same time.

In the embodiment, the planar gate electrode 23 is shared between adjacent two pixels, thereby reducing the pixel size. Moreover, since the floating diffusion region 11 is formed inside the photodiode region 60 in the solid-state imaging device of the embodiment, the pixel size can be reduced.

Also in the solid-state imaging device of the embodiment, the same advantages as Embodiment 1 can be obtained.

Embodiment 15

[Example in which Two Planar Gate Electrodes are Shared Between Adjacent Pixels]

Figure 1A:
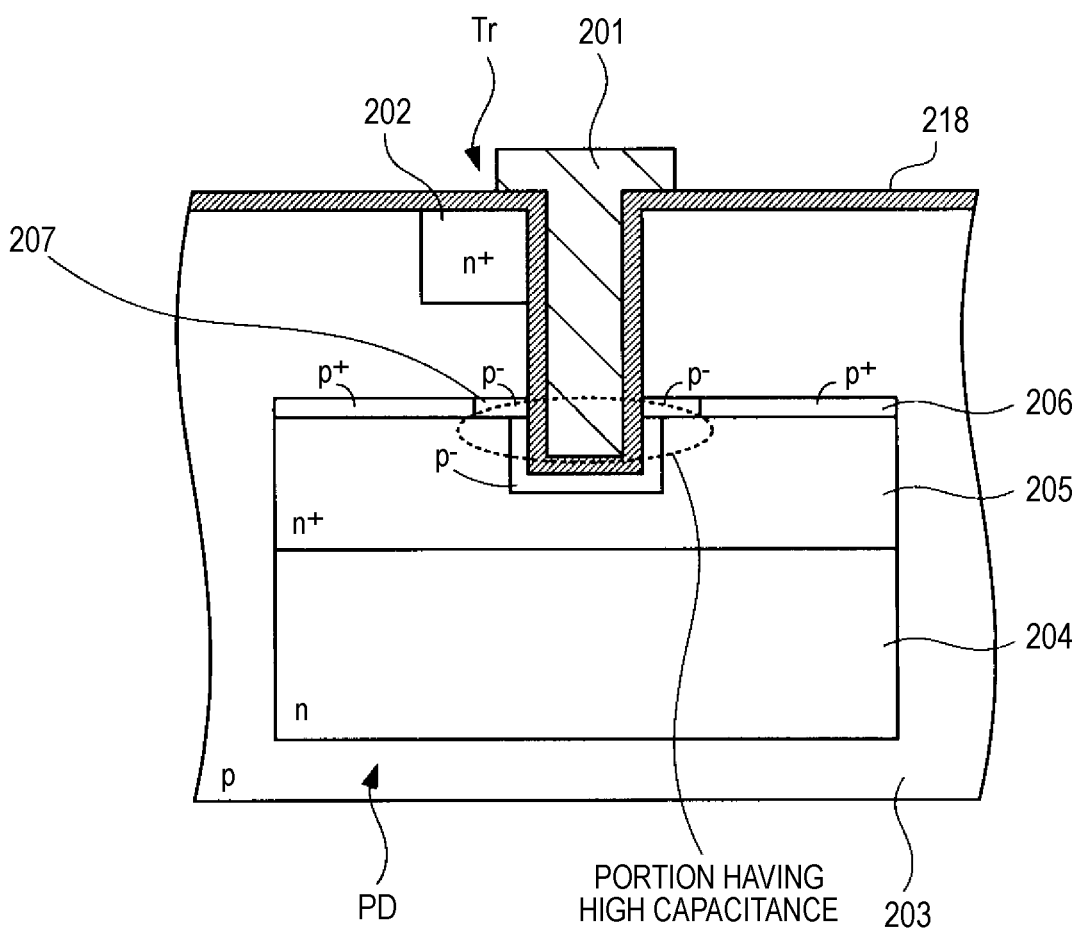
FIG. 1A and FIG. 1B are a schematic cross-sectional configuration view and a planar configuration view of a solid-state imaging device in a related art.
Figure 1B:
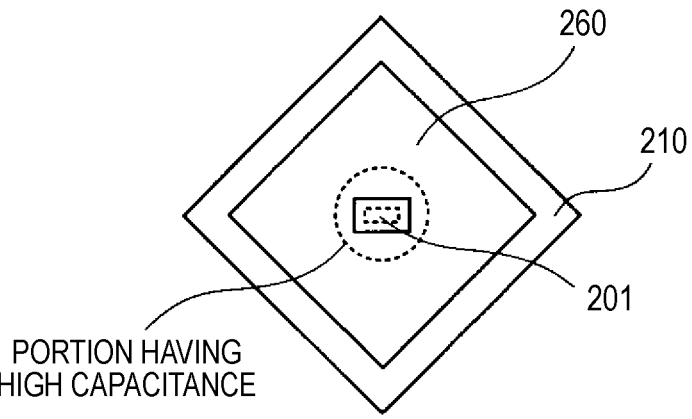
Figure 2A:
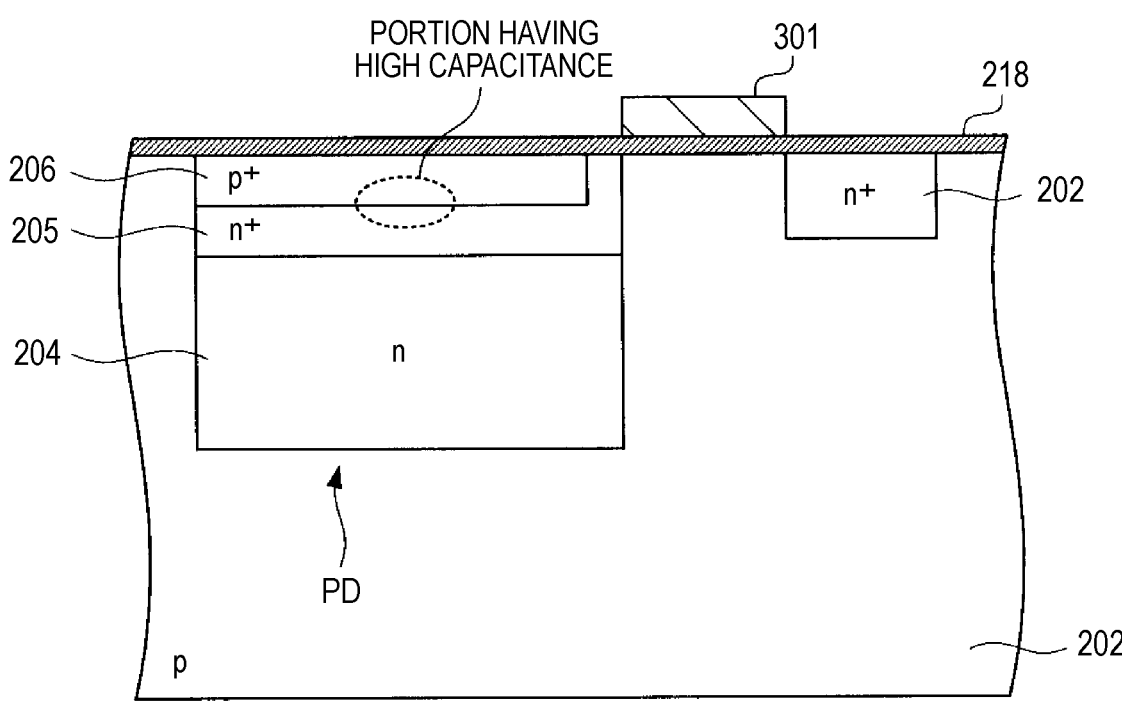
FIG. 2A and FIG. 2B are a schematic cross-sectional configuration view and a planar configuration view of a solid-state imaging device in a related art.
Figure 2B:
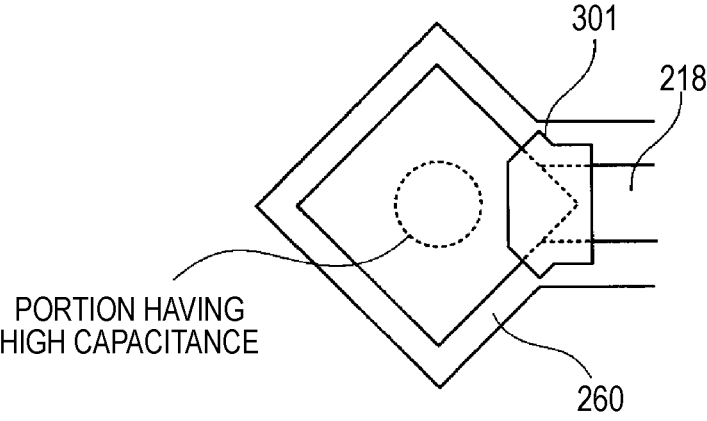
Figure 28:
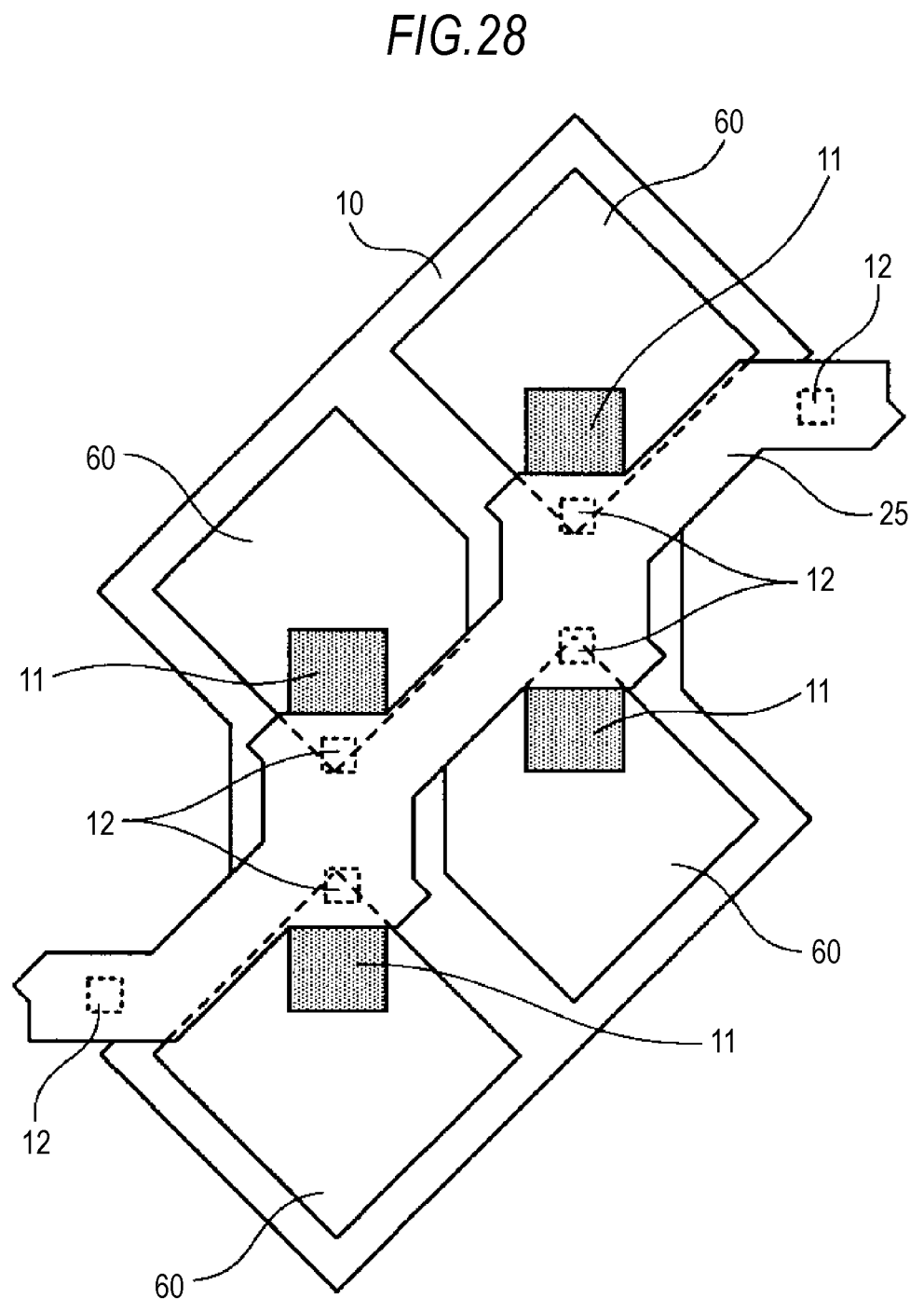

FIG. 28 shows a schematic planar configuration of a solid-state imaging device according to Embodiment 15 of the invention. In FIG. 28, same symbols are given to portions corresponding to FIG. 2 7 and the repeated explanation is omitted.

In the embodiment, the planar gate electrodes formed at the corner portion of the photodiode region 60 in Embodiment 14 is shared between adjacent pixels.

In the solid-state imaging device of the embodiment, a planar gate electrode 25 formed at the corner portion of the photodiode region 6 0 is shared between pixels adjacent in the vertical direction.

Also in the solid-state imaging device having the above configuration, signal charges accumulated in the photodiode PD are transferred along the potential gradient in the photodiode region 60, which is made by application of positive voltage to the vertical gate electrode 12. Then, the transferred signal charges are read to respective floating diffusion regions 11. In the embodiment, the planar gate electrode 25 is shared between pixels adjacent in the oblique direction as well as between pixels adjacent in the vertical direction. Accordingly, positive voltage is applied to the vertical gate electrode 12 and the planar gate electrode 25, thereby transferring signal charges of four pixels shown in FIG. 28 are transferred at the same time. Then, the signal charges are read to respective floating diffusion regions 11.

In the embodiment, the planar gate electrode 25 is shared between pixels adjacent in the oblique direction as well as between pixels adjacent in the vertical direction, thereby reducing the pixel size.

Also in the solid-state imaging device of the embodiment, the same advantages as Embodiment 1 can be obtained. Moreover, since the floating diffusion region 11 is formed inside the photodiode region 60 in the solid-state imaging device according to the embodiment of the invention, the pixel size can be reduced.

Embodiment 16

[Example in which a Planar Gate Electrode and a Vertical Gate Electrode are Shared Between Two Pixels]

Figure 29:
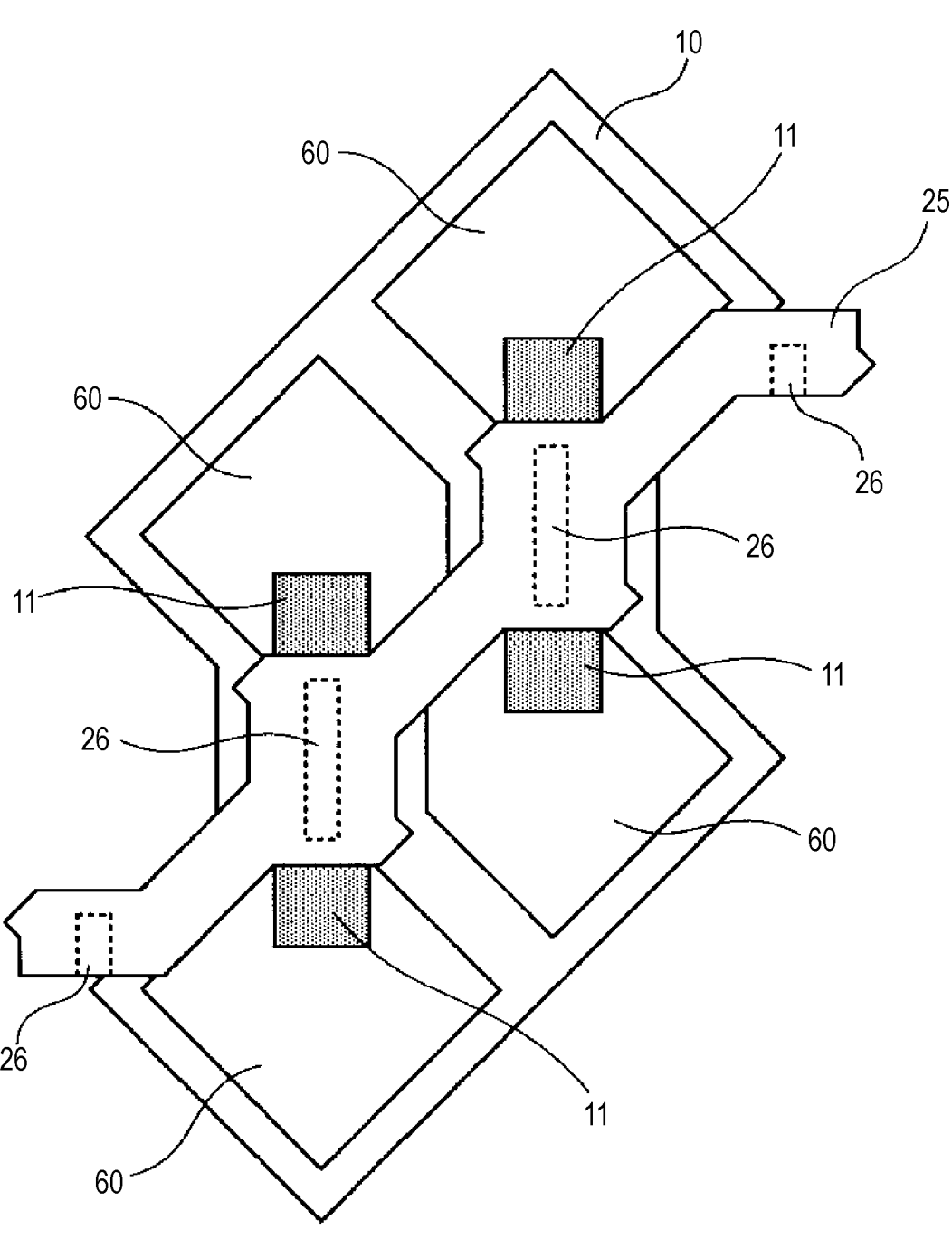
FIG. 29 a schematic planar configuration view of a relevant part of a solid-state imaging device according to Embodiment 16 of the invention.

FIG. 29 shows a schematic planar configuration of a solid-state imaging device according to Embodiment 16 of the invention. In FIG. 29, same symbols are given to portions corresponding to FIG. 2 8 and the repeated explanation is omitted.

In the embodiment, the vertical gate electrode in Embodiment 15 is shared between pixels adjacent in the vertical direction.

In the solid-state imaging device of the embodiment, a vertical gate electrode 26 is shared between pixels adjacent in the vertical direction. That is, the vertical gate electrode 26 in the embodiment is formed to have a rectangular shape in cross section so as to extend to adjacent pixels.

Also in the solid-state imaging device having the above configuration, signal charges accumulated in the photodiode PD are transferred along the potential gradient in the photodiode region 60, which is made by application of positive voltage to the vertical gate electrode 26. Then, the transferred signal charges are read to the floating diffusion region 11. In the embodiment, the planar gate electrode 25 is shared between pixels adjacent in the oblique direction as well as between pixels adjacent in the vertical direction. Accordingly, positive voltage is applied to the vertical gate electrodes 26 and the planar gate electrode 23, thereby signal charges of four pixels shown in FIG. 29 are transferred at the same time. Then, the signal charges are read to respective floating diffusion regions 11.

In the embodiment, the planar gate electrode 25 is shared between two pixels adjacent in the vertical direction as well as in the oblique direction, thereby reducing the pixel size. Moreover, since the floating diffusion region 11 is formed inside the photodiode region 60 in the solid-state imaging device of the embodiment, the pixel size can be reduced.

Also in the solid-state imaging device of the embodiment, the same advantages as Embodiment 1 can be obtained.

Embodiment 17

[Example in which a Vertical Gate Electrode and a Floating Diffusion Region are Shared Between Two Pixels]

Figure 30:
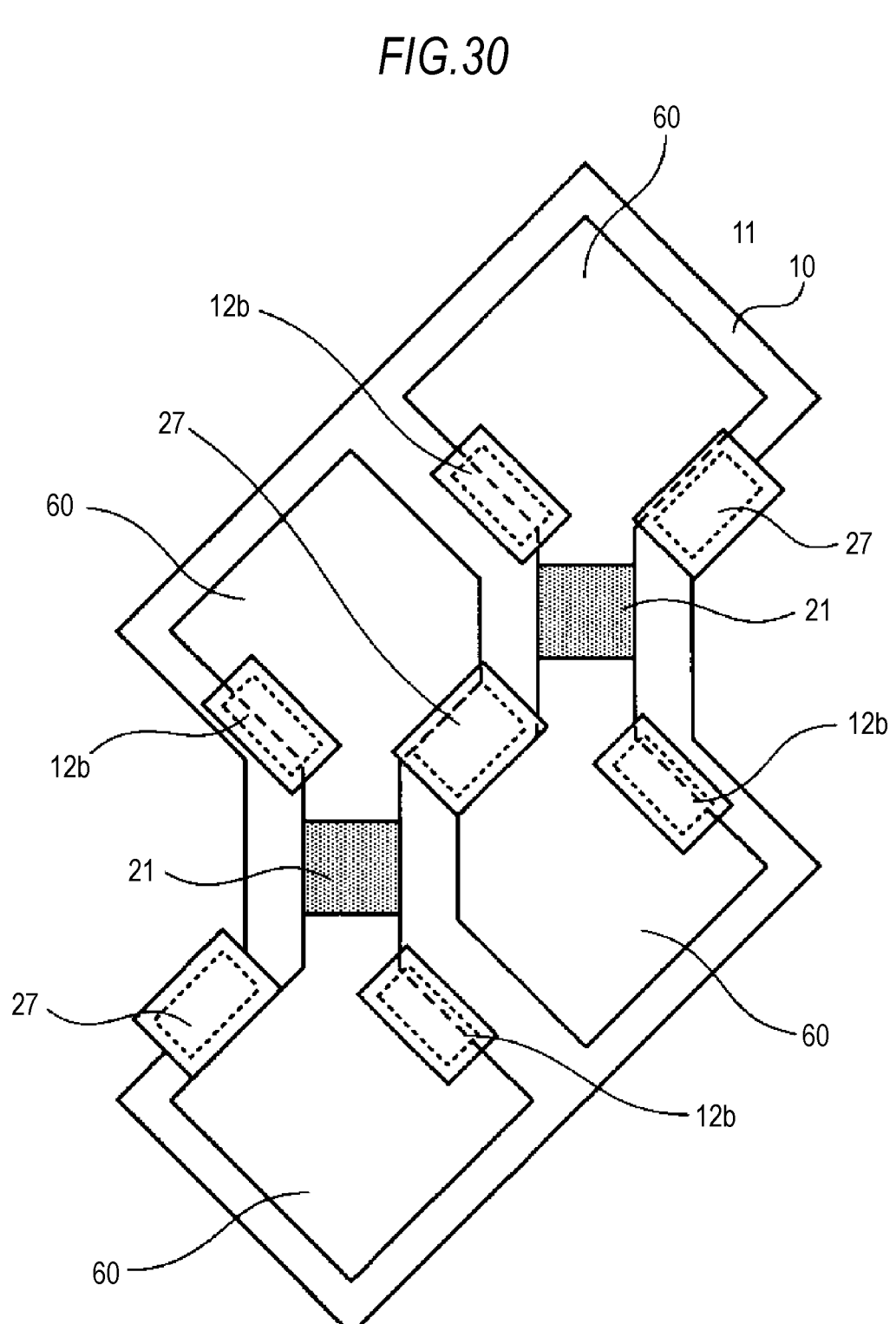
FIG. 30 a schematic planar configuration view of a relevant part of a solid-state imaging device according to Embodiment 17 of the invention.

FIG. 30 shows a schematic planar configuration of a solid-state imaging device according to Embodiment 17 of the invention. In FIG. 30, same symbols are given to portions corresponding to FIG. 6 and the repeated explanation is omitted.

In the solid-state imaging device of the embodiment, the charge readout transistor Tr included in one pixel includes vertical gate electrode 12b, 27 and the floating diffusion region 21.

The two vertical gate electrodes 12b, 27 are formed at outer peripheral portions of each photodiode region 6 0, which forms one corner portion of the photodiode region 60. Then, one vertical gate electrode 27 of the two vertical gate electrodes 12b, 27 is shared between pixels adjacent in the oblique direction. The vertical gate electrode 27 to be shared is arranged so that side surfaces of the electrode 27 which are opposed to each other are allowed to face different photodiode regions 60, respectively.

The floating diffusion region 21 is formed outside of the photodiode region 60 on the surface side of the semiconductor substrate 13 adjacent to the vertical electrodes 12b, 27. The floating diffusion region 21 is shared between pixels adjacent in the vertical direction.

Also in the solid-state imaging device having the above configuration, signal charges accumulated in the photodiode PD are transferred along the potential gradient in the photodiode region 60, which is made by application of positive voltage to the vertical gate electrodes 12b, 27. Then, the transferred signal charges are read to the floating diffusion region 21. In the embodiment, the vertical gate electrode 27 is shared between pixels adjacent in the oblique direction. Accordingly, positive voltage is applied to the two vertical gate electrodes 12b, 27 included in one pixel at the same time, thereby transferring signal charges of two pixels adjacent in the oblique direction shown in FIG. 30. Then, the signal charges are read to respective floating diffusion regions 21.

In the embodiment, the vertical gate electrode 27 and the floating diffusion region 21 are shared between adjacent two pixels, thereby reducing the pixel size.

Also in the solid-state imaging device of the embodiment, the same advantages as Embodiment 1 can be obtained.

Embodiment 18

[Example in which a Vertical Gate Electrode is Shared Between Two Pixels]

Figure 31:
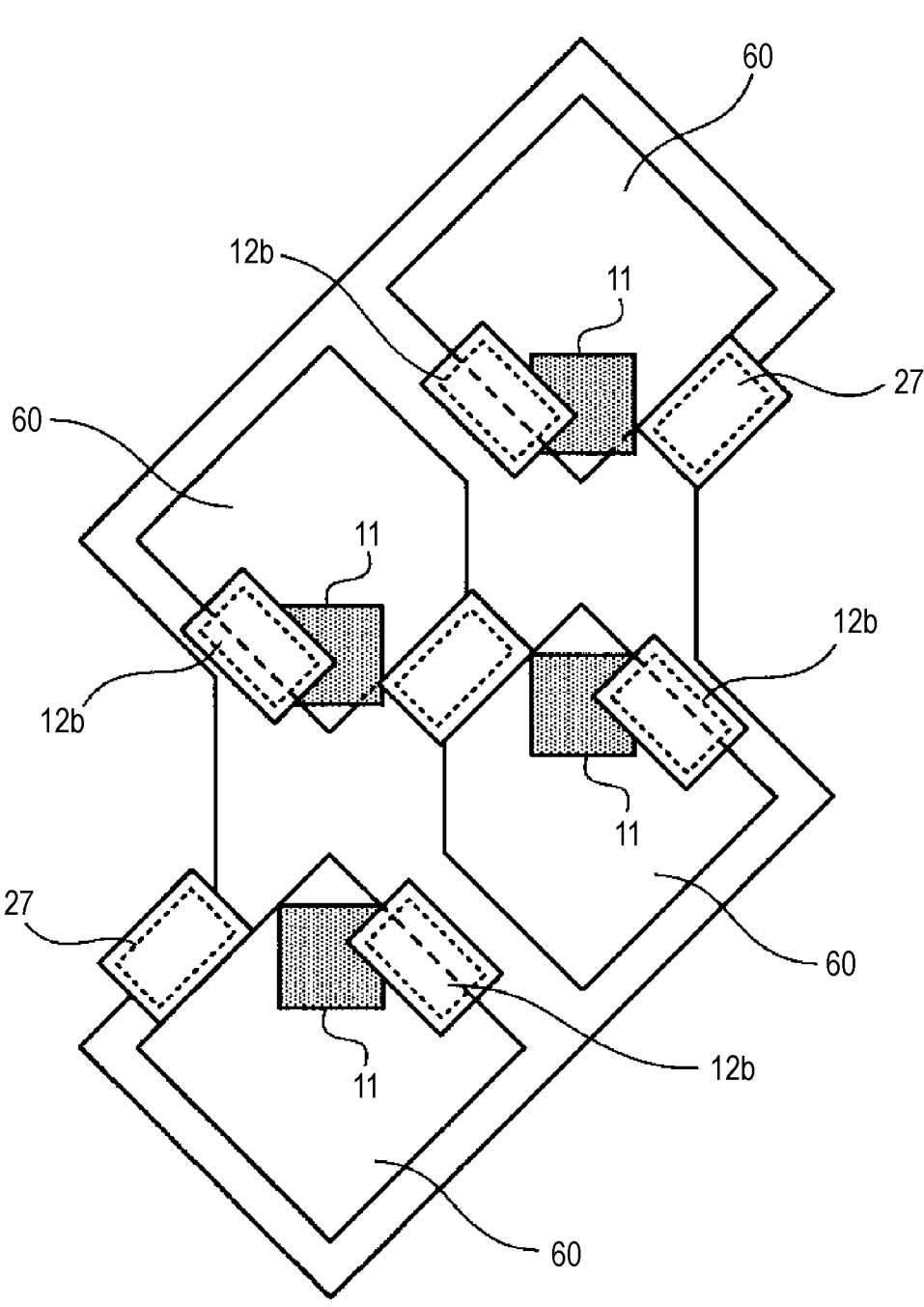
FIG. 31 a schematic planar configuration view of a relevant part of a solid-state imaging device according to Embodiment 18 of the invention.

FIG. 31 shows a schematic planar configuration of a solid-state imaging device according to Embodiment 18 of the invention. In FIG. 31, same symbols are given to portions corresponding to FIG. 3 0 and the repeated explanation is omitted. The embodiment differs from Embodiment 17 in a configuration of the floating diffusion region.

In the solid-state imaging device of the embodiment, the floating diffusion region 11 included in the charge readout transistor Tr of one pixel is formed adjacent to the vertical gate electrodes 12b, 27 inside the photodiode region 60.

Also in the solid-state imaging device having the above configuration, signal charges accumulated in the photodiode PD are transferred along the potential gradient in the photodiode region 60, which is made by application of positive voltage to the vertical gate electrodes 12b, 27. Then, the transferred signal charges are read to the floating diffusion region 11. In the embodiment, the vertical gate electrode 27 is shared between pixels adjacent in the oblique direction. Accordingly, positive voltage is applied to the two vertical gate electrodes 12b, 27 included in one pixel at the same time, thereby transferring signal charges of two pixels adjacent in the oblique direction shown in FIG. 31 are transferred at the same time. Then, the signal charges are read to respective floating diffusion regions 11.

In the embodiment, the vertical gate electrode 27 is shared between adjacent two pixels, thereby reducing the pixel size. Moreover, since the floating diffusion region 11 is formed inside the photodiode region 60 in the solid-state imaging device of the embodiment, the pixel size can be reduced.

Also in the solid-state imaging device according to the embodiment of the invention, the same advantages as Embodiment 1 can be obtained.

Embodiment 19

[Example in which a Vertical Gate Electrode and a Floating Diffusion Region are Shared Between Adjacent Pixels]

Figure 32:
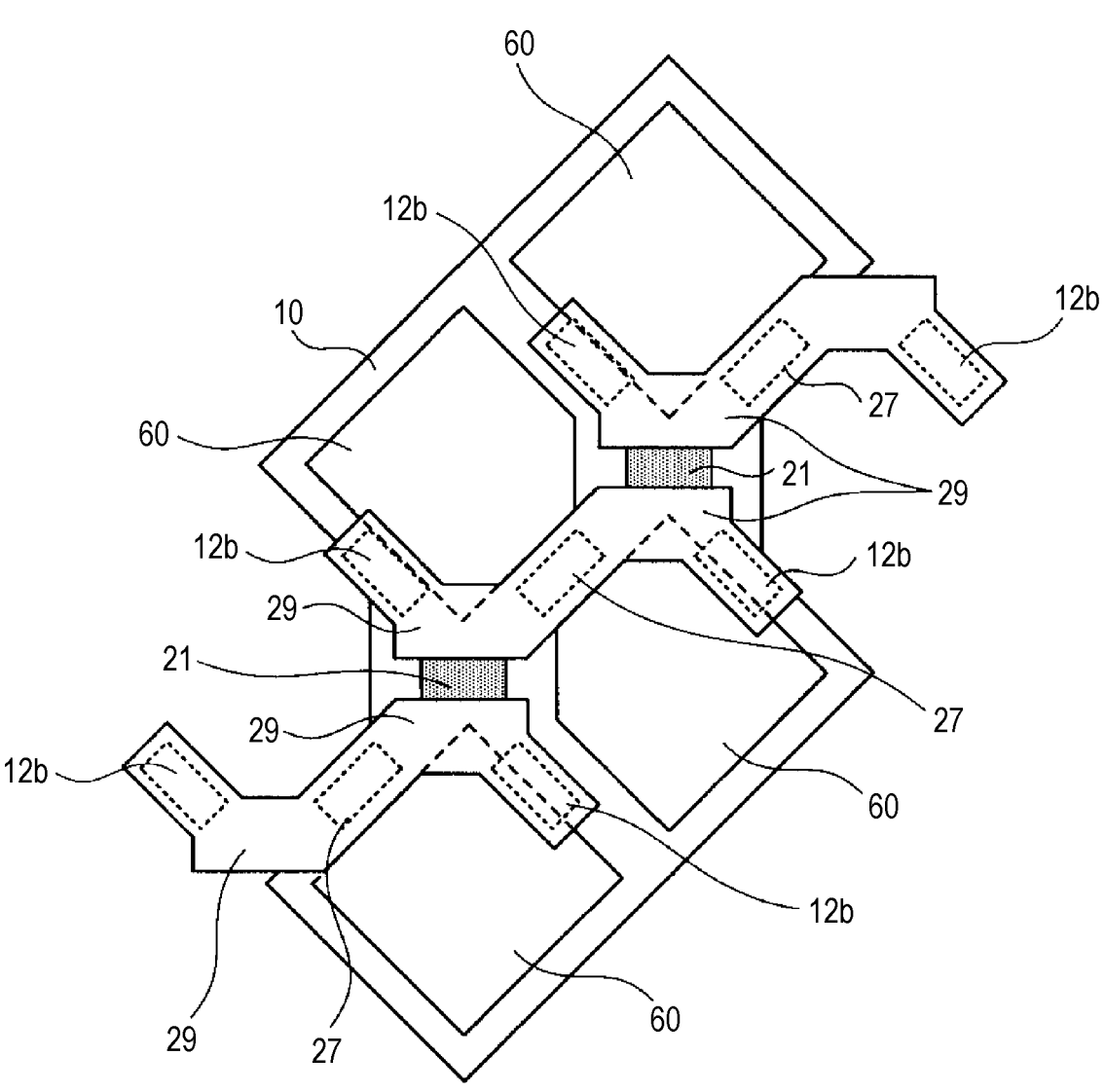
FIG. 32 a schematic planar configuration view of a relevant part of a solid-state imaging device according to Embodiment 19 of the invention.

FIG. 32 shows a schematic planar configuration of a solid-state imaging device according to Embodiment 19 of the invention. In FIG. 32, same symbols are given to portions corresponding to FIG. 11 and the repeated explanation is omitted.

In the solid-state imaging device of the embodiment, the charge readout transistor Tr included in one pixel includes vertical gate electrodes 12b, 27, a planar gate electrode 29 and the floating diffusion region 21.

The vertical gate electrodes 12b, 27 are formed at the outer peripheral portion of the photodiode region 60 along two edges forming one corner portion of the photodiode region 60 respectively. On an upper surface of the semiconductor substrate 13 positioned at the corner portion of the photodiode region 60 sandwiched by the vertical gate electrodes 12b, 27, the planar gate electrode 29 integrally formed with the vertical electrodes 12b, 27 is formed. One vertical gate electrode 27 of the two vertical gate electrodes 12b, 27 is shared between pixels adjacent in the oblique direction.

The floating diffusion region 21 is formed outside the photodiode region 60 on the surface side of the semiconductor substrate 13 adjacent to the vertical electrodes 12b, 27. Then, the floating diffusion region 21 is shared between two pixels adjacent in the vertical direction.

Also in the solid-state imaging device having the above configuration, signal charges accumulated in the photodiode PD are transferred along the potential gradient in the photodiode region 60, which is made by application of positive voltage to the vertical gate electrodes 12b, 27. Then, the transferred signal charges are read to the floating diffusion region 21. In the embodiment, the vertical gate electrode 27 is shared between pixels adjacent in the oblique direction. Accordingly, positive voltage is applied to the two vertical gate electrodes 12b, 27 included in one pixel at the same time, thereby transferring signal charges of two pixels adjacent in the oblique direction shown in FIG. 32 are transferred at the same time. Then, the signal charges are read to respective floating diffusion regions 21.

In the embodiment, the vertical gate electrode 27 and the floating diffusion region 21 are shared between adjacent two pixels, thereby reducing the pixel size.

Also in the solid-state imaging device of the embodiment, the same advantages as Embodiment 1 can be obtained.

Embodiment 20

[Example in which a Vertical Gate Electrode is Shared Between Adjacent Pixels]

Figure 33:
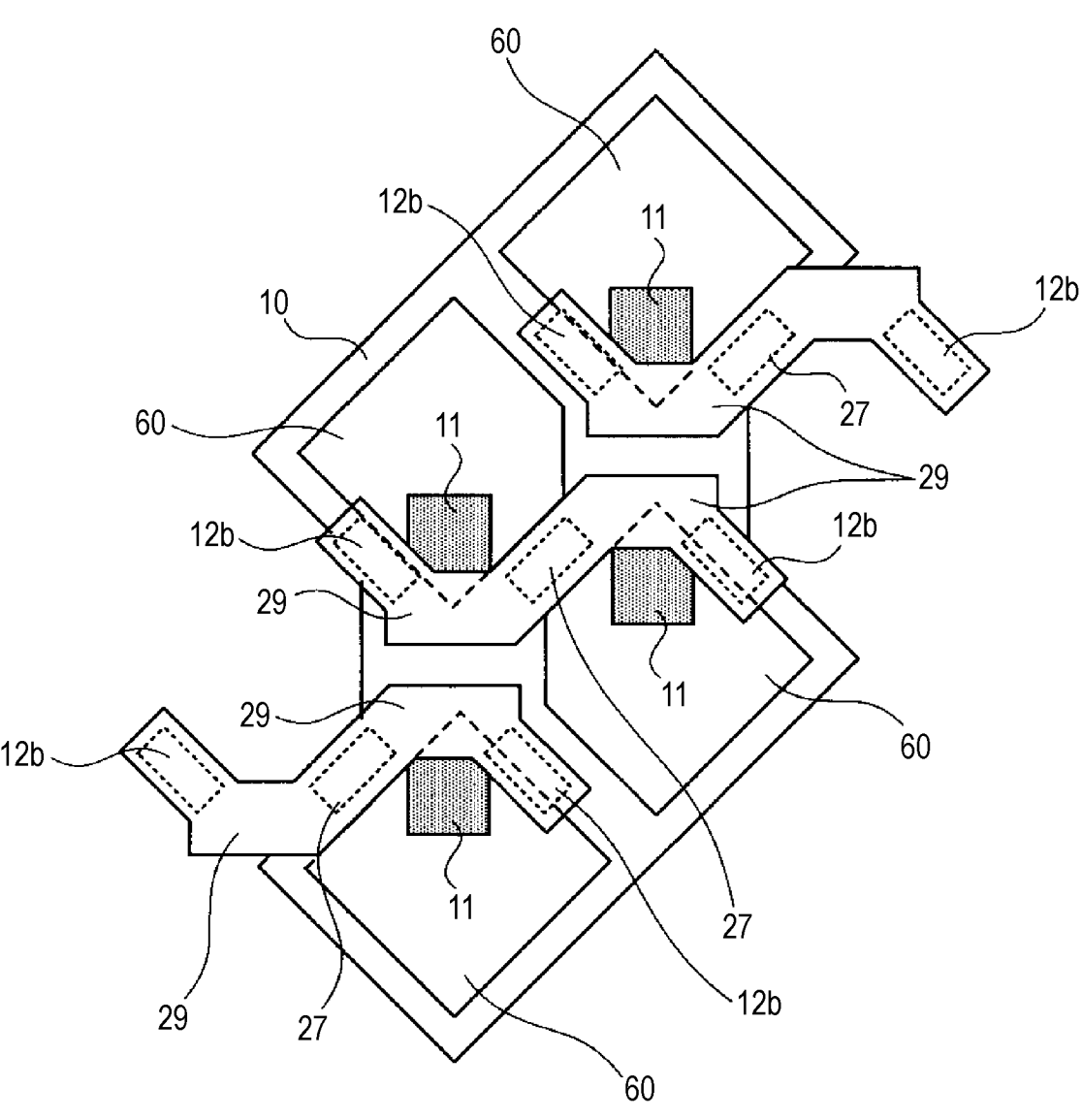
FIG. 33 a schematic planar configuration view of a relevant part of a solid-state imaging device according to Embodiment 20 of the invention.

FIG. 33 shows a schematic planar configuration of a solid-state imaging device according to Embodiment 20 of the invention. In FIG. 33, same symbols are given to portions corresponding to FIG. 3 2 and the repeated explanation is omitted.

The embodiment differs from Embodiment 19 in a configuration of the floating diffusion region.

In the solid-state imaging device of the embodiment, the floating diffusion region 11 included in the charge readout transistor Tr of one pixel is formed adjacent to the vertical gate electrodes 12b, 27 inside the photodiode region 60.

Also in the solid-state imaging device having the above configuration, signal charges accumulated in the photodiode PD are transferred along the potential gradient in the photodiode region 60, which is made by application of positive voltage to the vertical gate electrodes 12b, 27. Then, the transferred signal charges are read to the floating diffusion region 11. In the embodiment, the vertical gate electrode 27 is shared between pixels adjacent in the oblique direction. Accordingly, positive voltage is applied to the two vertical gate electrodes 12b, 27 included in one pixel at the same time, thereby transferring signal charges of two pixels adjacent in the oblique direction shown in FIG. 33 are transferred at the same time. Then, the signal charges are read to respective floating diffusion regions 11.

In the embodiment, the vertical gate electrode 27 is shared between adjacent two pixels, thereby reducing the pixel size. Moreover, since the floating diffusion region 11 is formed inside the photodiode region 60 inside the solid-state imaging device of the embodiment, the pixel size can be reduced.

Also in the solid-state imaging device according to the embodiment of the invention, the same advantages as Embodiment 1 can be obtained.

Embodiment 21

[Example in which a Vertical Gate Electrode and a Planar Gate Electrode are Shared Between Adjacent Pixels]

Figure 34:
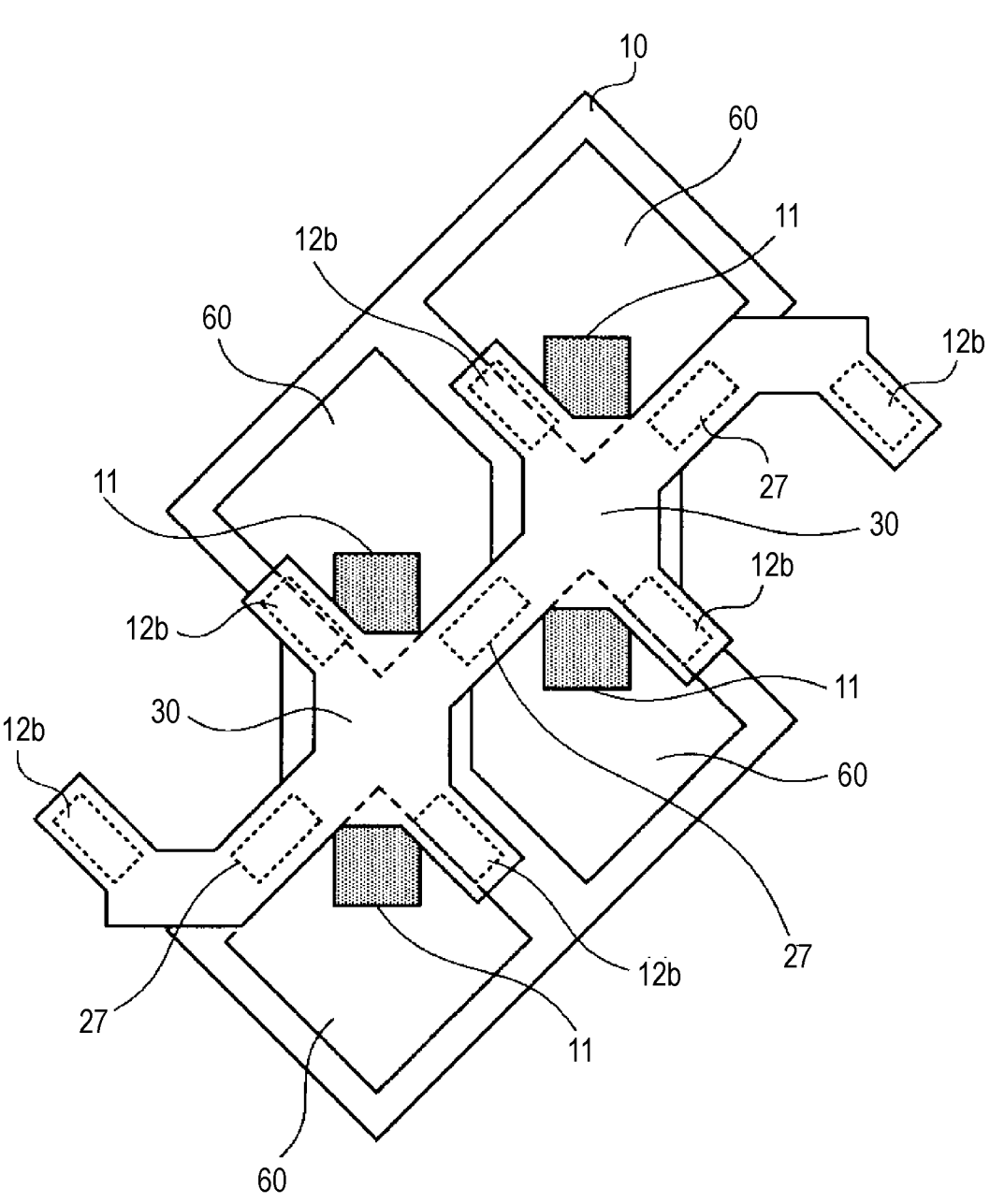
FIG. 34 a schematic planar configuration view of a relevant part of a solid-state imaging device according to Embodiment 21 of the invention.

FIG. 34 shows a schematic planar configuration of a solid-state imaging device according to Embodiment 21 of the invention. In FIG. 34, same symbols are given to portions corresponding to FIG. 3 3 and the repeated explanation is omitted.

The solid-state imaging device of the embodiment differs from Embodiment 20 in a configuration of the planar gate electrode.

In the solid-state imaging device according to the embodiment of the invention, a planar gate electrode 30 included in the charge readout transistor Tr of one pixel is shared between pixels adjacent in the vertical direction.

Also in the solid-state imaging device having the above configuration, signal charges accumulated in the photodiode PD are transferred along the potential gradient in the photodiode region 60, which is made by application of positive voltage to the vertical gate electrodes 12b, 27. Then, the transferred signal charges are read to the floating diffusion region 11. In the embodiment, the vertical gate electrode is shared between pixels adjacent in the oblique direction. Additionally, the planar gate electrode 30 is shared between pixels adjacent in the vertical direction. Accordingly, positive voltage is applied to the vertical gate electrodes 12b, 2 7 and the planar gate electrode 3 0 included in one pixel at the same time, thereby transferring signal charges of four pixels shown in FIG. 34 at the same time. Then, signal charges accumulated in respective photodiode regions are read to respective floating diffusion regions 11.

In the embodiment, the vertical gate electrode 27 and the planar gate electrode 30 are shared between adjacent two pixels, thereby reducing the pixel size. Moreover, since the floating diffusion region 11 is formed inside the photodiode region 60 in the solid-state imaging device of the embodiment, the pixel size can be reduced.

Also in the solid-state imaging device of the embodiment, the same advantages as Embodiment 1 can be obtained.

Embodiment 22

[Example Including a Vertical Gate Electrode Extending to Two Edges is Shared Between Adjacent Pixels]

Figure 35:
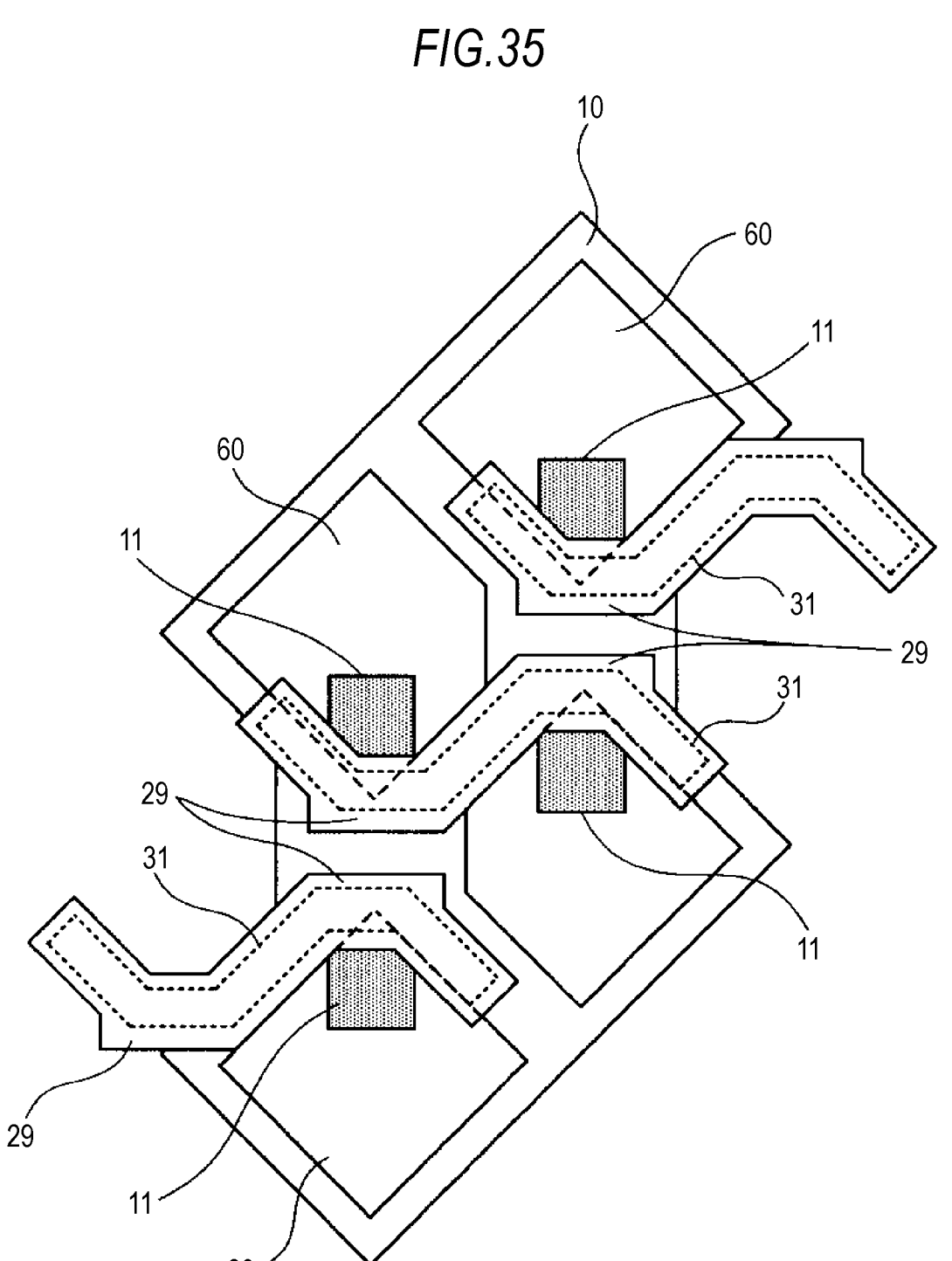
FIG. 35 a schematic planar configuration view of a relevant part of a solid-state imaging device according to Embodiment 22 of the invention.

FIG. 35 shows a schematic planar configuration of a solid-state imaging device according to Embodiment 22 of the invention. In FIG. 35, same symbols are given to portions corresponding to FIG. 3 3 and the repeated explanation is omitted.

In the solid-state imaging device of the embodiment, the charge readout transistor Tr included in one pixel includes a vertical gate electrode 31 and the floating diffusion region 11.

The vertical gate electrode 31 included in one pixel is formed extending to adjacent two edges at the outer peripheral portion of the photodiode region 60. A portion corresponding to one edge of the vertical gate electrode 31 formed extending to adjacent two edges at the outer peripheral portion of the photodiode region 60 is shared between pixels adjacent in the oblique direction.

The planar gate electrode 19 is formed integrally with the vertical gate electrode 31 at the corner portion of the photodiode region 60 in which the vertical gate electrode 31 is formed.

The floating diffusion region 11 is formed adjacent to the vertical gate electrode inside the photodiode region.

Also in the solid-state imaging device having the above configuration, signal charges accumulated in the photodiode PD are transferred along the potential gradient in the photodiode region 60, which is made by application of positive voltage to the vertical gate electrode 31. Then, the transferred signal charges are read to the floating diffusion region 11. In the embodiment, the vertical gate electrode 31 is shared between pixels adjacent in the oblique direction. Accordingly, signal charges of two pixels shown in FIG. 35 adjacent in the oblique direction are transferred at the same time. Then, signal charges accumulated in respective photodiodes PD are read to respective floating diffusion regions 11.

In the embodiment, the vertical gate electrode 31 is shared between adjacent two pixels, thereby reducing the pixel size. Moreover, since the floating diffusion region 11 is formed inside the photodiode region 60 in the solid-state imaging device of the embodiment, the pixel size can be reduced.

Also in the solid-state imaging device of the embodiment, the same advantages as Embodiment 1 can be obtained.

Embodiment 23

[Example in which a Vertical Gate Electrode and a Planar Gate Electrode Extending to Two Edges are Shared Between Adjacent Pixels]

Figure 36:
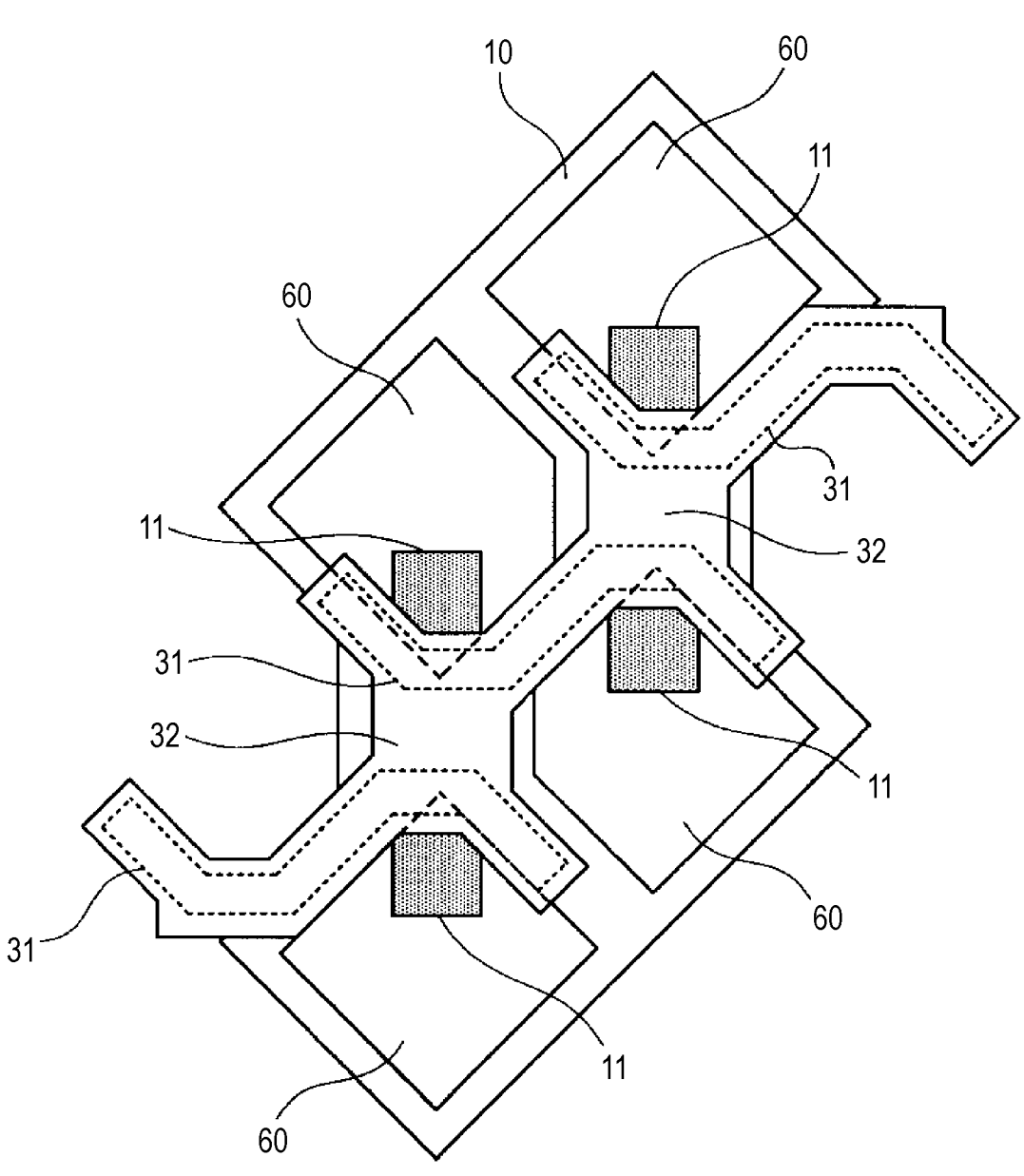
FIG. 36 a schematic planar configuration view of a relevant part of a solid-state imaging device according to Embodiment 23 of the invention.

FIG. 36 shows a schematic planar configuration of a solid-state imaging device according to Embodiment 23 of the invention. In FIG. 36, same symbols are given to portions corresponding to FIG. 3 5 and the repeated explanation is omitted.

The present embodiment differs from the Embodiment 22 in a configuration of the planar gate electrode.

A planar gate electrode 32 of the embodiment is shared between pixels adjacent in the vertical direction.

Also in the solid-state imaging device having the above configuration, signal charges accumulated in the photodiode PD are transferred along the potential gradient in the photodiode region 60, which is made by application of positive voltage to the vertical gate electrode 31. Then, the transferred signal charges are read to the floating diffusion region 11. In the embodiment, the vertical gate electrode 31 is shared between pixels adjacent in the oblique direction. Additionally, the planar gate electrode 32 is shared between pixels adjacent in the vertical direction. Accordingly, signal charges of four pixels shown in FIG. 36 are transferred at the same time by application of positive voltage to the vertical gate electrode 31. Then, signal charges accumulated in respective photodiodes PD are read to respective floating diffusion regions 11.

In the embodiment, the vertical gate electrode 31 and the planar gate electrode 32 are shared between adjacent pixels, thereby reducing the pixel size. Moreover, since the floating diffusion region 11 is formed inside the photodiode region 60 in the solid-state imaging device of the embodiment, the pixel size can be reduced.

Also in the solid-state imaging device of the embodiment, the same advantages as Embodiment 1 can be obtained.

Embodiment 24

[Example in which a Vertical Gate Electrode Extending to Two Edges is Shared Between Two Pixels]

Figure 37:
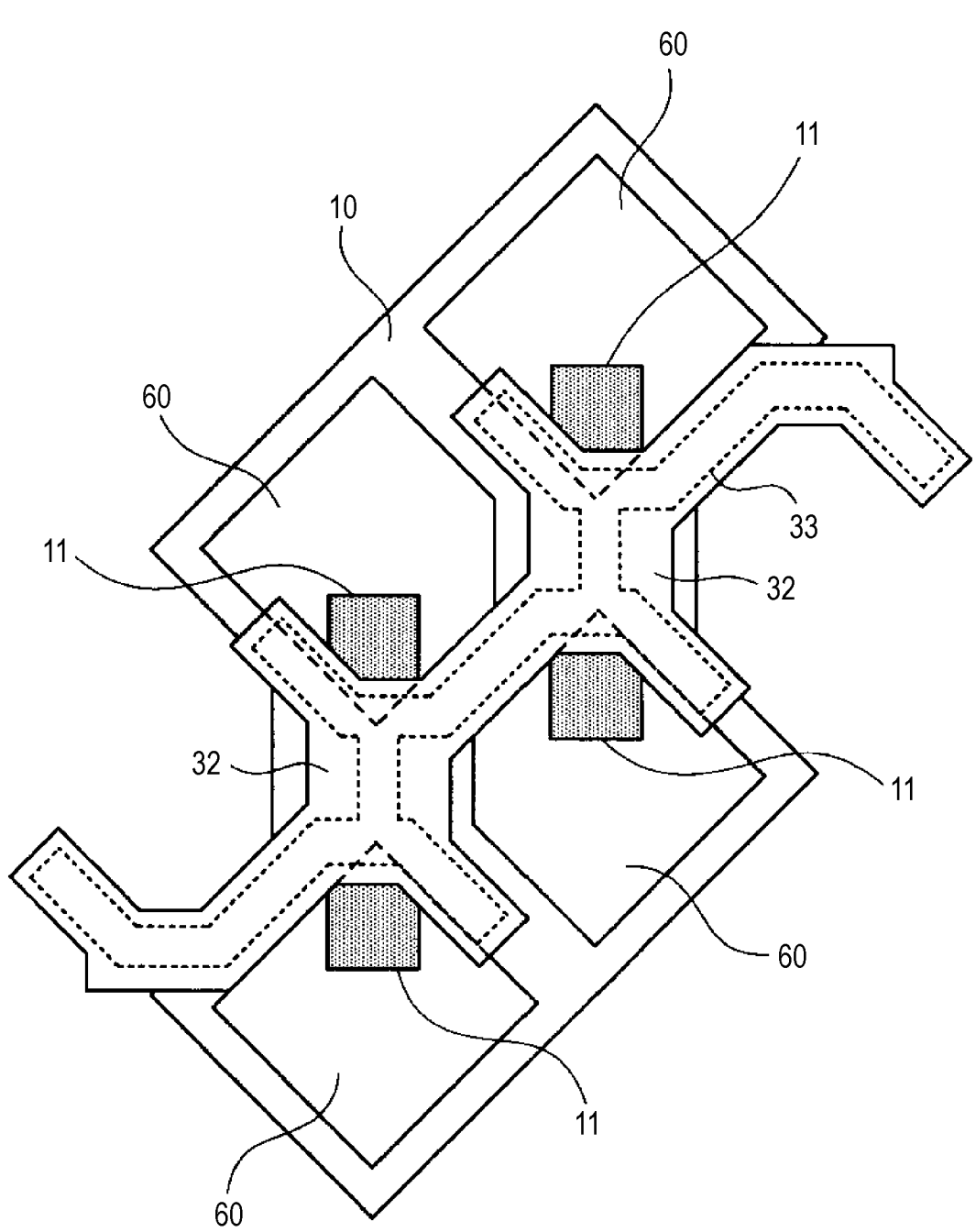
FIG. 37 a schematic planar configuration view of a relevant part of a solid-state imaging device according to Embodiment 24 of the invention.

FIG. 37 shows a schematic planar configuration of a solid-state imaging device according to Embodiment 24 of the invention. In FIG. 37, same symbols are given to portions corresponding to FIG. 3 6 and the repeated explanation is omitted.

The present embodiment differs from the Embodiment 23 in a configuration of the vertical gate electrode.

A vertical gate electrode 33 of the embodiment is integrally formed extending to adjacent two edges as well as extending to pixels adjacent in the vertical direction at the outer peripheral portion of the photodiode region 60. A portion corresponding to one edge of the vertical gate electrode 31 formed extending adjacent two edges at the outer peripheral portion of the photodiode region 60 is shared between pixels adjacent in the oblique direction. Additionally, a portion formed extending to pixels adjacent in the vertical direction in the vertical gate electrode 33 is formed under the planar gate electrode 32 which is shared between pixels adjacent in the vertical direction.

Figure 3:
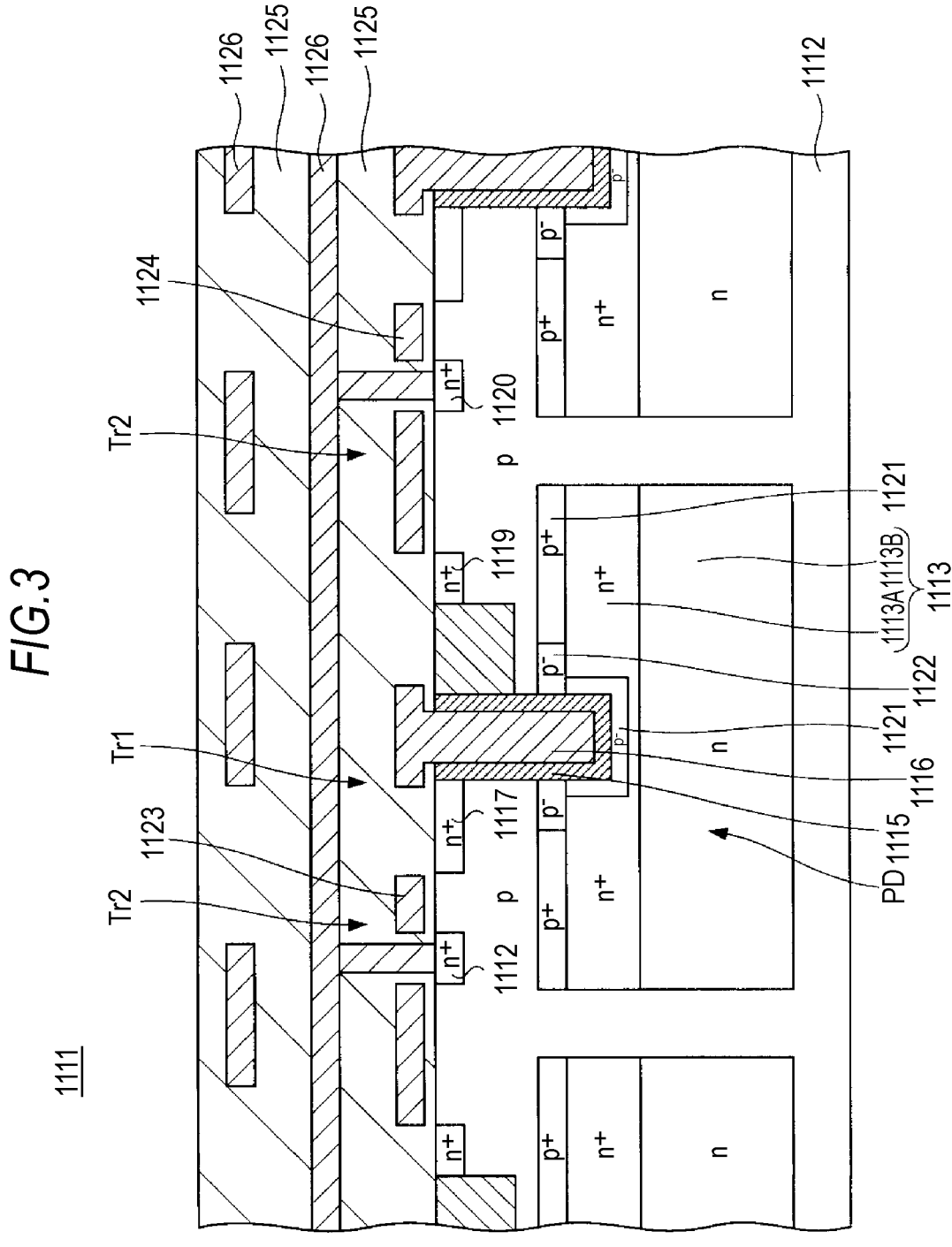
FIG. 3 is a configuration view of a relevant part showing an example of a solid-state imaging device in a related art.

Also in the solid-state imaging device having the above configuration, signal charges accumulated in the photodiode PD are transferred along the potential gradient in the photodiode region 60, which is made by application of positive voltage to the vertical gate electrode 33. Then, the transferred signal charges are read to the floating diffusion region 11. In the embodiment, the vertical gate electrode 33 is shared between pixels adjacent in the oblique direction as well as pixels adjacent in the vertical direction. Additionally, the planar gate electrode 32 is shared between pixels adjacent in the vertical direction. Accordingly, signal charges of four pixels shown in FIG. 3 7 are transferred at the same time by application of positive voltage to the vertical gate electrode 33 and the planar gate electrode 32. Then, signal charges accumulated in respective photodiodes PD are read to respective floating diffusion regions 11.

In the embodiment, the vertical gate electrode 33 and the planar gate electrode 32 are shared between adjacent two pixels, thereby reducing the pixel size. Moreover, since the floating diffusion region 11 is formed inside the photodiode region 60 in the solid-state imaging device of the embodiment, the pixel size can be reduced.

Also in the solid-state imaging device of the embodiment, the same advantages as Embodiment 1 can be obtained.

Embodiment 25

[Example in which a Vertical Gate Electrode and a Floating Diffusion Region are Shared Between Adjacent Pixels]

Figure 38:
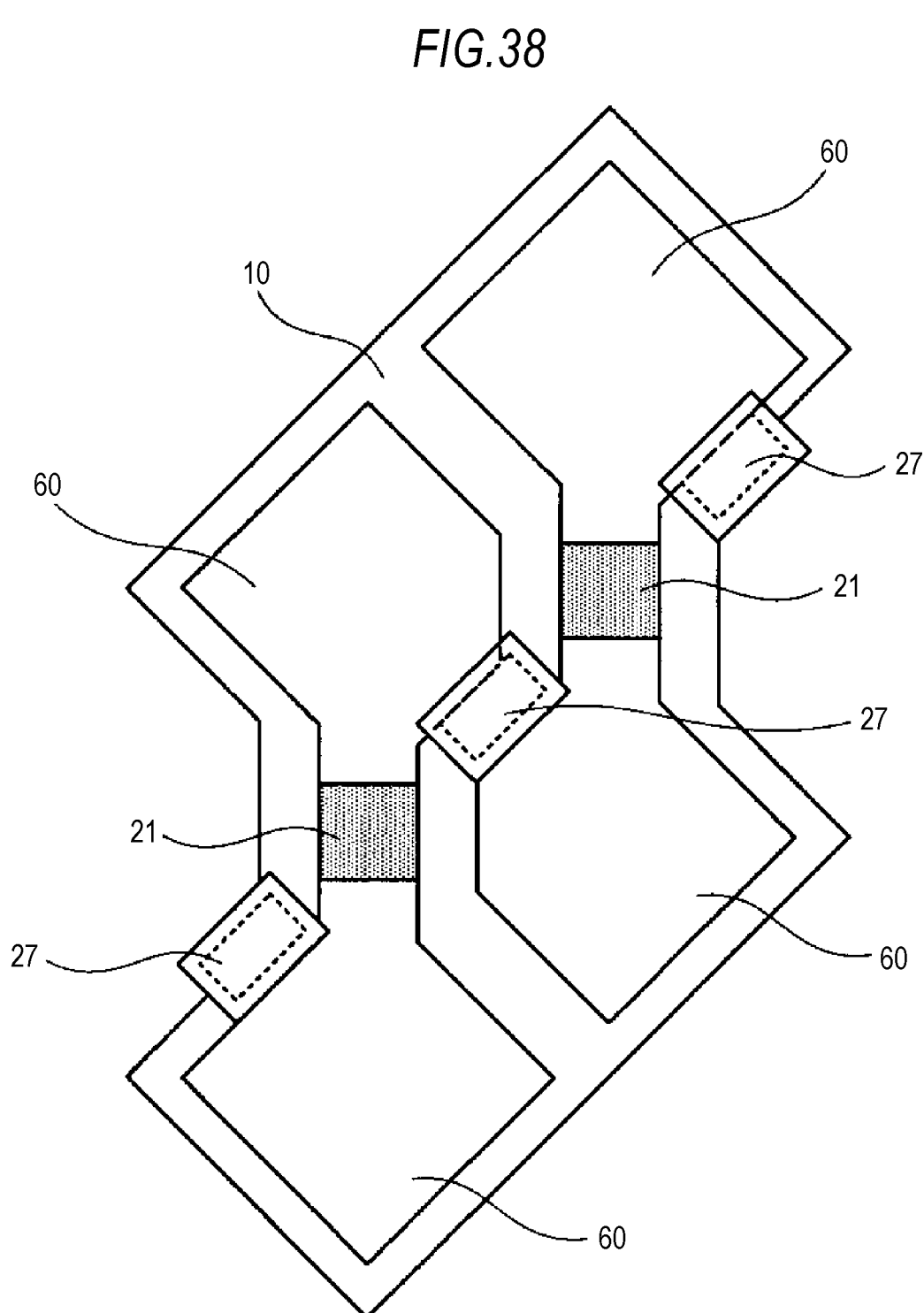
FIG. 38 a schematic planar configuration view of a relevant part of a solid-state imaging device according to Embodiment 25 of the invention.

FIG. 38 shows a schematic planar configuration of a solid-state imaging device according to Embodiment 25 of the invention. In FIG. 38, same symbols are given to portions corresponding to FIG. 3 0 and the repeated explanation is omitted.

In the solid-state imaging device of the embodiment, the charge readout transistor Tr included in one pixel includes the vertical gate electrode 27 and the floating diffusion region 21.

One vertical gate electrode 27 included in one pixel is formed along one edge of the outer peripheral portion of the photodiode region 60. The vertical gate electrode 27 is shared between pixels adjacent in the oblique direction.

The floating diffusion region 21 included in one pixel is formed outside the photodiode region 60 on the surface side of the semiconductor substrate 13, which is adjacent to the vertical gate electrode 27. The floating diffusion region 21 is shared between pixels adjacent in the vertical direction.

Also in the solid-state imaging device having the above configuration, signal charges accumulated in the photodiode PD are transferred along the potential gradient in the photodiode region 60, which is made by application of positive voltage to the vertical gate electrode 27. Then, the transferred signal charges are read to the floating diffusion region 21. In the embodiment, the vertical gate electrode 27 is shared between pixels adjacent in the oblique direction. Accordingly, signal charges of two pixels adjacent in the oblique direction are transferred at the same time by application of positive voltage to the vertical gate electrode 27. Then, signal charges accumulated in respective photodiodes PD are read to respective floating diffusion regions 21.

In the embodiment, the vertical gate electrode 27 and the floating diffusion region 21 are shared between adjacent two pixels, thereby reducing the pixel size.

Also in the solid-state imaging device of the embodiment, the same advantages as Embodiment 1 can be obtained.

Embodiment 26

[Example in which a Vertical Gate Electrode and a Floating Diffusion Region are Shared Between Adjacent Pixels]

Figure 39:
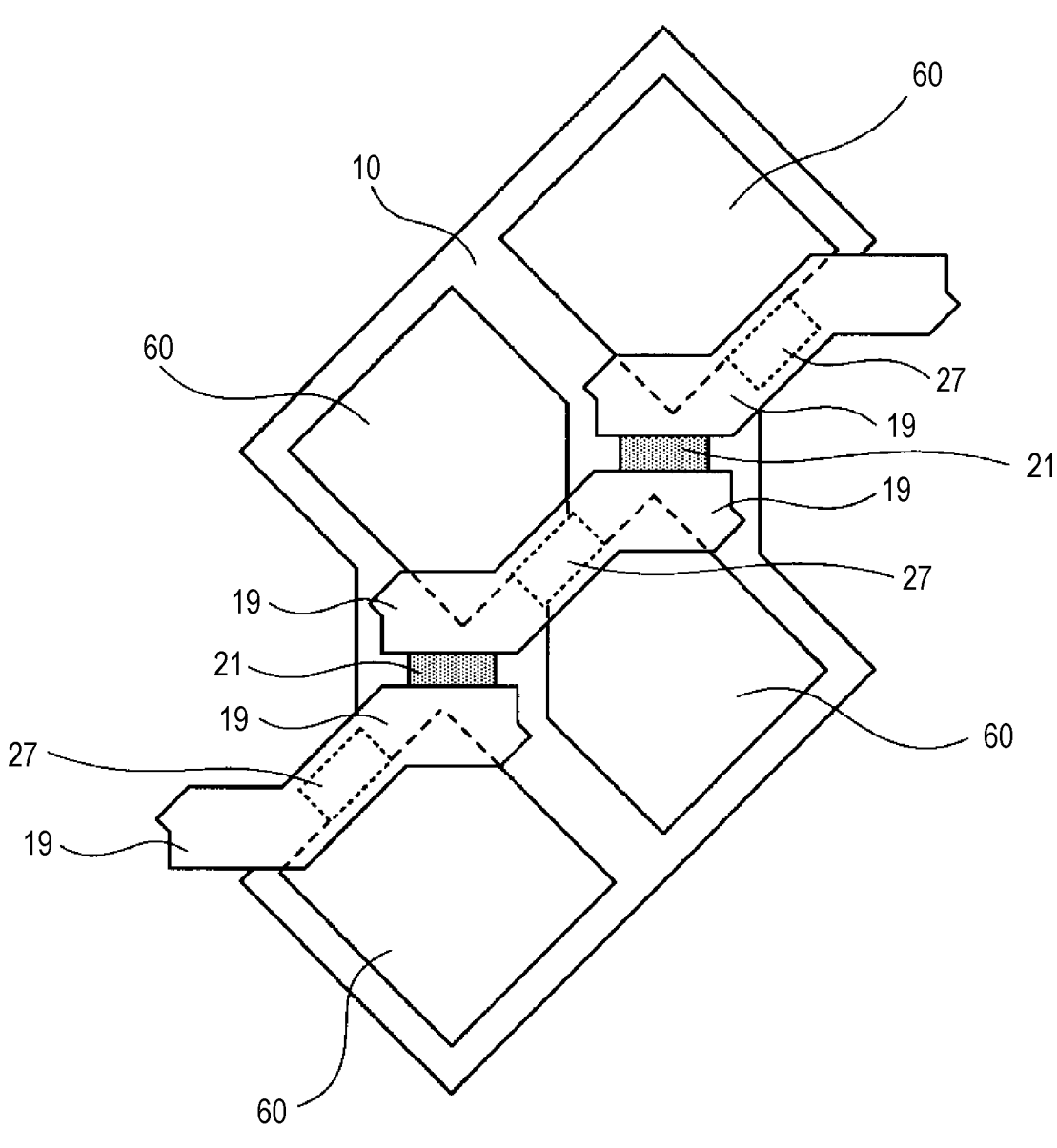
FIG. 39 a schematic planar configuration view of a relevant part of a solid-state imaging device according to Embodiment 26 of the invention.

FIG. 39 shows a schematic planar configuration of a solid-state imaging device according to Embodiment 26 of the invention. In FIG. 39, same symbols are given to portions corresponding to FIG. 22 and the repeated explanation is omitted.

In the solid-state imaging device of the embodiment, the charge readout transistor Tr included in one pixel includes the planar gate electrode 19, the vertical gate electrode 27 integrally formed with the planar gate electrode 19 and the floating diffusion region 21.

First, one vertical gate electrode 27 is formed along one edge of the outer peripheral portion of the photodiode region 60. The vertical gate electrode 27 is shared between pixels adjacent in the oblique direction.

The planar gate electrode 19 is formed at the corner portion of the photodiode region 60 adjacent to the vertical gate electrode 27, which is formed integrally with the vertical gate electrode 27.

The floating diffusion region 21 is formed at a region outside the photodiode region 60 so as to touch the semiconductor substrate 13 under the planar gate electrode 19. The floating diffusion region 21 is shared between pixels adjacent in the vertical direction.

Also in the solid-state imaging device having the above configuration, signal charges accumulated in the photodiode PD are transferred along the potential gradient in the photodiode region 60, which is made by application of positive voltage to the vertical gate electrode 27. Then, the transferred signal charges are read to the floating diffusion region 21. In the embodiment, the vertical gate electrode 27 is shared between pixels adjacent in the oblique direction. Accordingly, signal charges of two pixels adjacent in the oblique direction are transferred at the same time by application of positive voltage to the vertical gate electrode 27. Then, signal charges accumulated in respective photodiodes PD are read to respective floating diffusion regions 21.

In the embodiment, the vertical gate electrode 17 and the floating diffusion region 21 are shared between adjacent two pixels, thereby reducing the pixel size.

Also in the solid-state imaging device of the embodiment, the same advantages as Embodiment 1 can be obtained.

Embodiment 27

[Example in which a Vertical Gate Electrode is Shared Between Adjacent Pixels]

Figure 40:
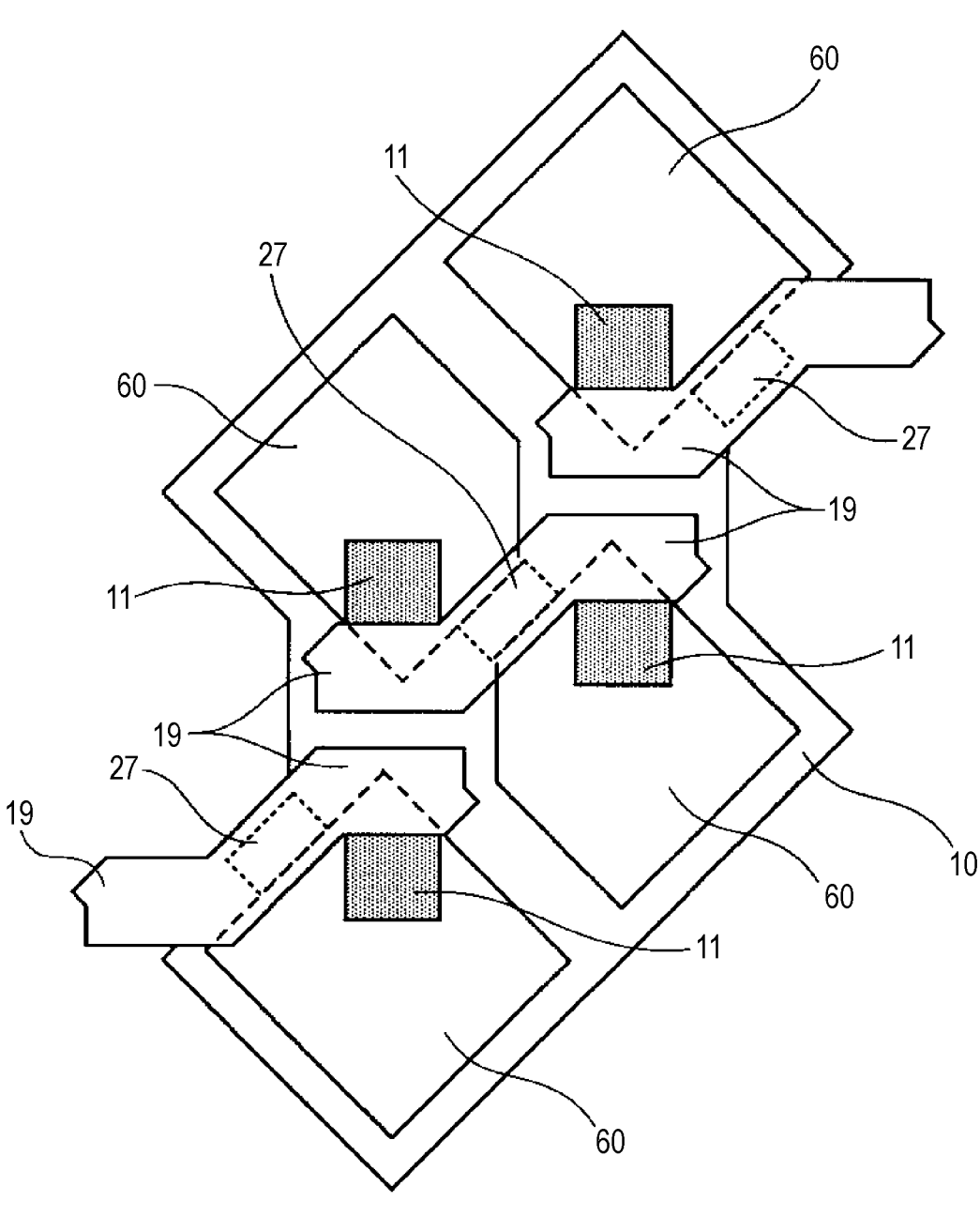
FIG. 40 a schematic planar configuration view of a relevant part of a solid-state imaging device according to Embodiment 27 of the invention.

FIG. 40 shows a schematic planar configuration of a solid-state imaging device according to Embodiment 27 of the invention. In FIG. 40, same symbols are given to portions corresponding to FIG. 39 and the repeated explanation is omitted.

The present embodiment differs from Embodiment 26 in a configuration of the floating diffusion region.

In the solid-state imaging device of the embodiment, the floating diffusion region 11 is formed inside the photodiode region 60 so as to touch the semiconductor substrate 13 under the planar gate electrode 19.

Also in the solid-state imaging device having the above configuration, signal charges accumulated in the photodiode PD are transferred along the potential gradient in the photodiode region 60, which is made by application of positive voltage to the vertical gate electrode 27, and read to the floating diffusion region 11. In the embodiment, the vertical gate electrode 27 is shared between pixels adjacent in the oblique direction. Accordingly, signal charges of two pixels adjacent in the oblique direction are transferred at the same time by application of positive voltage to the vertical gate electrode 27. Then, signal charges accumulated in respective photodiodes PD are read to respective floating diffusion regions 11.

In the embodiment, the vertical gate electrode 27 is shared between adjacent two pixels, thereby reducing the pixel size. Moreover, since the floating diffusion region 11 is formed inside the photodiode region 60 in the solid-state imaging device of the embodiment, the pixel size can be reduced.

Also in the solid-state imaging device of the embodiment, the same advantages as Embodiment 1 can be obtained.

Embodiment 28

[Example in which a Vertical Gate Electrode and a Planar Gate Electrode are Shared Between Adjacent Pixels]

Figure 41:
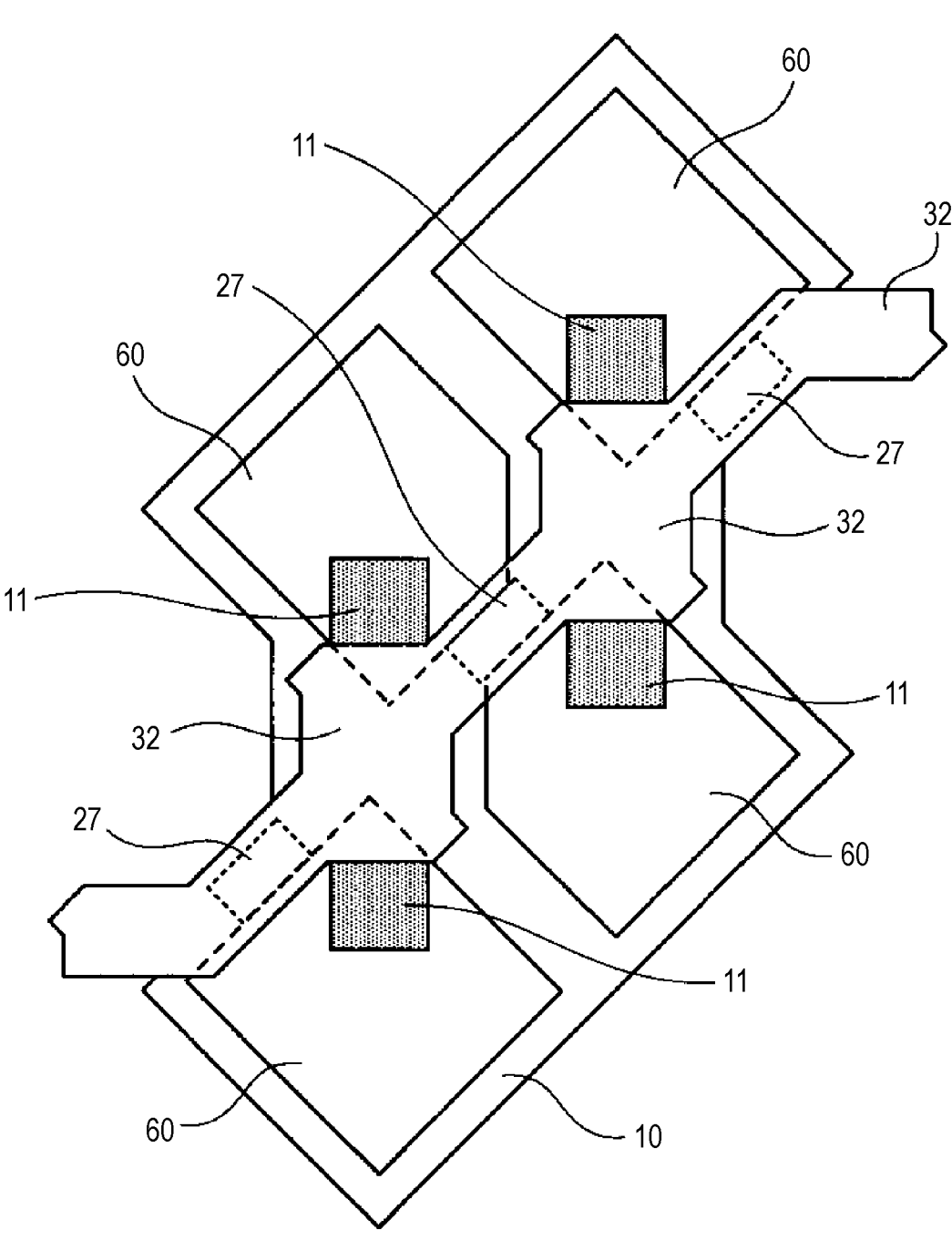
FIG. 41 a schematic planar configuration view of a relevant part of a solid-state imaging device according to Embodiment 28 of the invention.

FIG. 41 shows a schematic planar configuration of a solid-state imaging device according to Embodiment 28 of the invention. In FIG. 41, same symbols are given to portions corresponding to FIG. 40 and the repeated explanation is omitted.

The present embodiment differs from Embodiment 27 in a configuration of the planar gate electrode.

In the solid-state imaging device of the embodiment, the planar gate electrode 32 is shared between pixels adjacent in the vertical direction.

Also in the solid-state imaging device having the above configuration, signal charges accumulated in the photodiode PD are transferred along the potential gradient in the photodiode region 60, which is made by application of positive voltage to the vertical gate electrode 27 and the planar gate electrode 32. Then, the transferred signal charges are read to the floating diffusion region 11. In the embodiment, the vertical gate electrode 27 is shared between pixels adjacent in the oblique direction. Additionally, the planar gate electrode 32 is shared between pixels adjacent in the vertical direction. Accordingly, signal charges of four pixels shown in FIG. 41 are transferred at the same time by application of positive voltage to the vertical gate electrode 27 and the planar gate electrode 32. Then, signal charges accumulated in respective photodiodes PD are read to respective floating diffusion regions 11.

In the embodiment, the vertical gate electrode 27 and the planar gate electrode 32 are shared between adjacent two pixels, thereby reducing the pixel size. Moreover, since the floating diffusion region 11 is formed inside the photodiode region 60 in the solid-state imaging device of the embodiment, the pixel size can be reduced.

Also in the solid-state imaging device of the embodiment, the same advantages as Embodiment 1 can be obtained.

Embodiment 29

[Example in which a Vertical Gate Electrode and a Planar Gate Electrode are Shared Among Adjacent Pixels]

Figure 42:
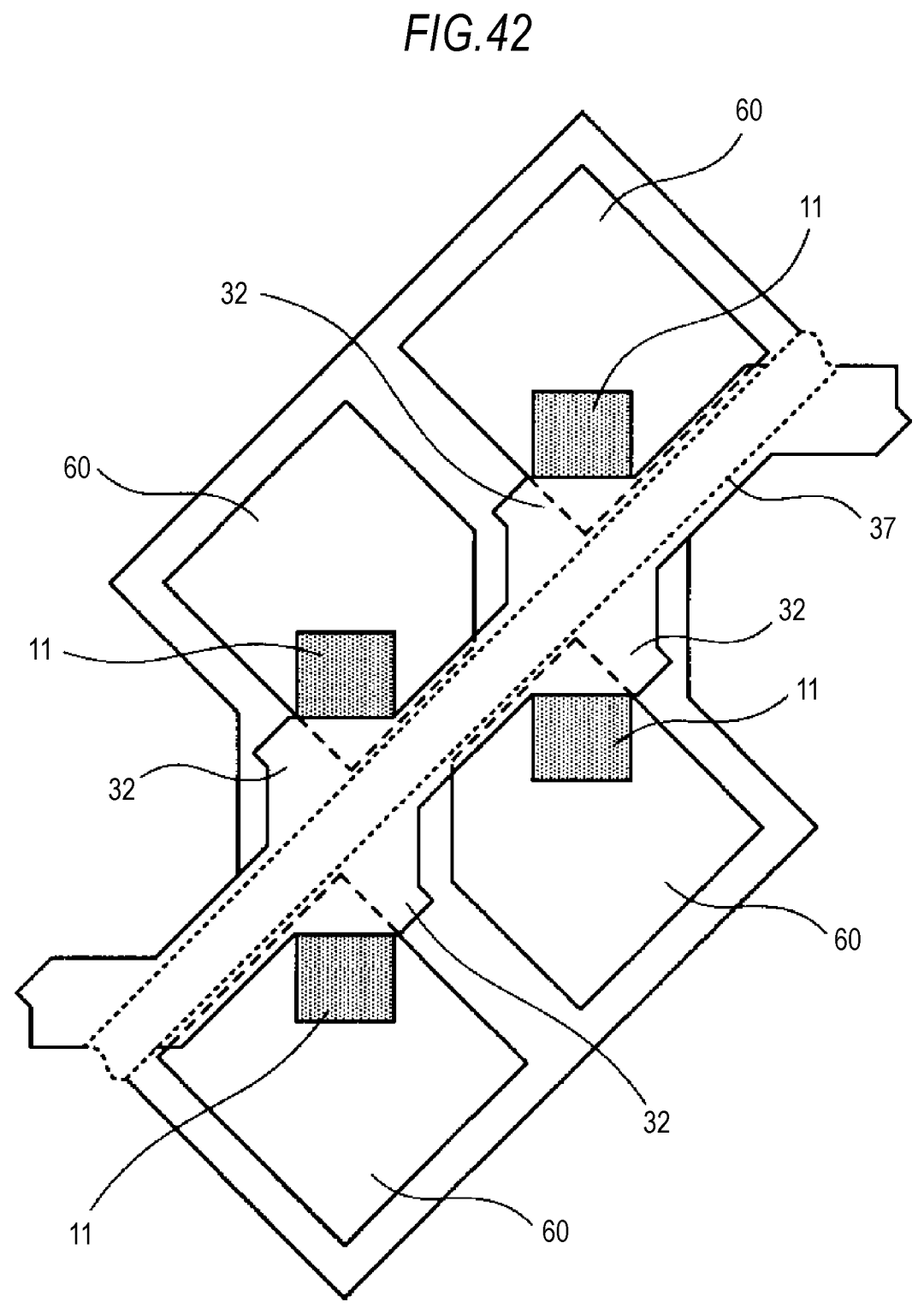

FIG. 42 shows a schematic planar configuration of a solid-state imaging device according to Embodiment 29 of the invention. In FIG. 42, same symbols are given to portions corresponding to FIG. 41 and the repeated explanation is omitted.

The present embodiment differs from Embodiment 28 in a configuration of the vertical gate electrode.

In the embodiment, a vertical gate electrode 37 is formed to be shared between pixels adjacent in the oblique direction as well as between pixels adjacent in the vertical direction, which is integrally formed extending to pixels adjacent in the oblique direction as well as pixels adjacent in the vertical direction.

Also in the solid-state imaging device having the above configuration, signal charges accumulated in the photodiode PD are transferred along the potential gradient in the photodiode region 60, which is made by application of positive voltage to the vertical gate electrode 37 and the planar gate electrode 32. Then, the transferred signal charges are read to the floating diffusion region 11. In the embodiment, the vertical gate electrode 37 is shared between pixels adjacent in the oblique direction as well as pixels adjacent in the vertical direction. Additionally, the planar gate electrode 32 is shared between pixels adjacent in the vertical direction. Accordingly, signal charges of four pixels shown in FIG. 42 are transferred at the same time by application of positive voltage to the vertical gate electrode 37 and the planar gate electrode 32. Then, signal charges accumulated in respective photodiodes PD are read to respective floating diffusion regions 11.

In the embodiment, the vertical gate electrode 37 and the planar gate electrode 32 are shared between adjacent pixels, thereby reducing the pixel size. Moreover, since the floating diffusion region 11 is formed inside the photodiode region 60 in the solid-state imaging device of the embodiment, the pixel size can be reduced.

Also in the solid-state imaging device of the embodiment, the same advantages as Embodiment 1 can be obtained.

Embodiment 30

[Example in which a Vertical Gate Electrode is Shared Between Adjacent Pixels]

Figure 43:
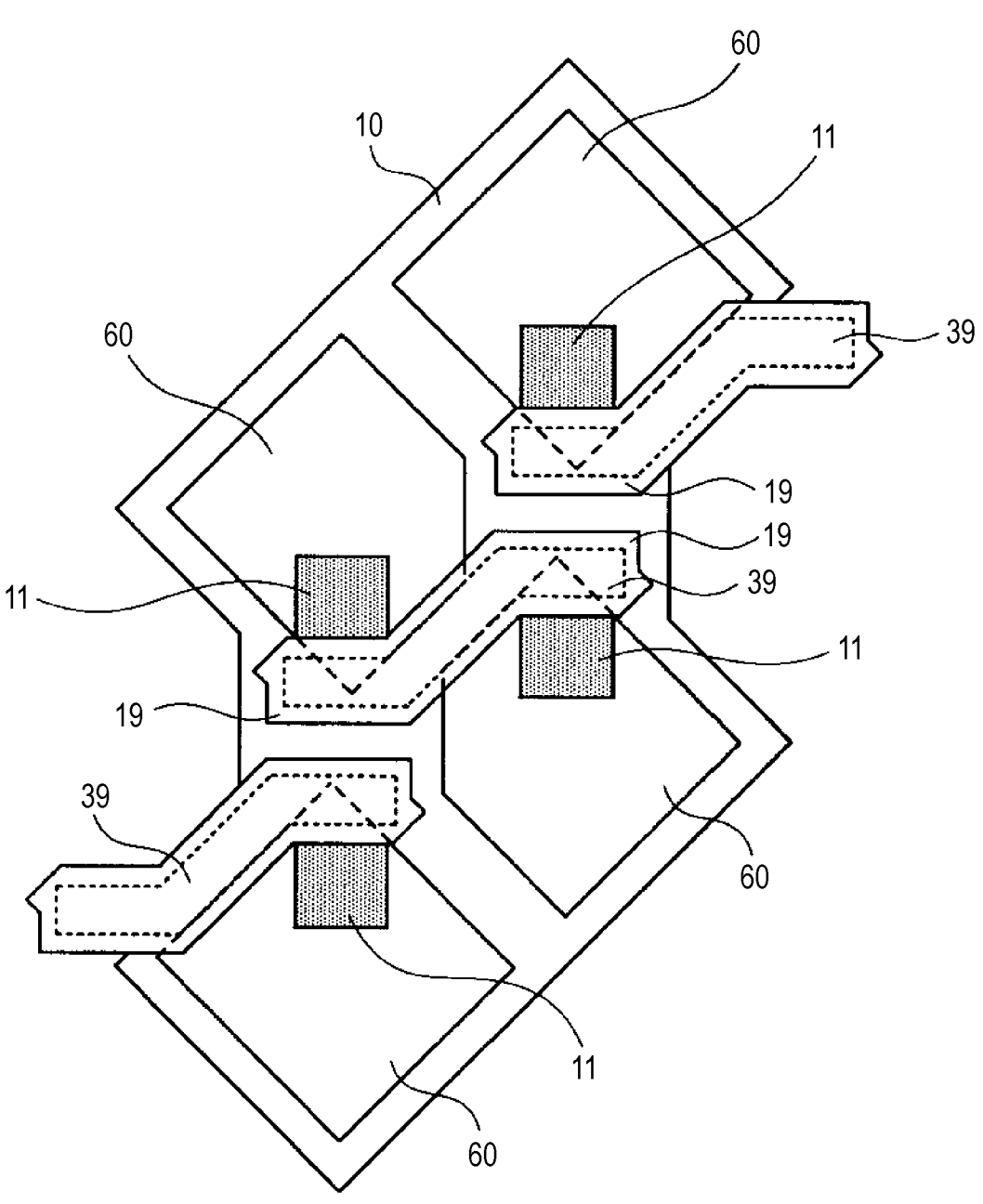
FIG. 43 a schematic planar configuration view of a relevant part of a solid-state imaging device according to Embodiment 30 of the invention.

FIG. 43 shows a schematic planar configuration of a solid-state imaging device according to Embodiment 30 of the invention. In FIG. 43, same symbols are given to portions corresponding to FIG. 25 and the repeated explanation is omitted.

In the solid-state imaging device of the embodiment, the charge readout transistor Tr included in one pixel includes a vertical gate electrode 39, the planar gate electrode 19 and the floating diffusion region 11.

The vertical gate electrode 39 included in one pixel is formed along one edge of the outer peripheral portion of the photodiode region 60 so as to extend to the edge and a corner portion of the photodiode region 60 which is adjacent to the edge. Then, the vertical gate electrode 39 formed along one edge of the outer peripheral portion of the photodiode region 60 is shared between pixels adjacent in the oblique direction.

The planar gate electrode 19 is formed integrally with the vertical gate electrode 39 at a region of the corner portion of the photodiode region 60 in which the vertical gate electrode 39 is formed.

The floating diffusion region 11 is formed in the photodiode region 60, which is adjacent to the vertical gate electrode 39.

Also in the solid-state imaging device having the above configuration, signal charges accumulated in the photodiode PD are transferred along the potential gradient in the photodiode region 60, which is made by application of positive voltage to the vertical gate electrode 39. Then, the transferred signal charges are read to the floating diffusion region 11. In the embodiment, the vertical gate electrode 39 is shared between pixels adjacent in the oblique direction. Accordingly, signal charges of two pixels adjacent in the oblique direction shown in FIG. 43 are transferred at the same time. Then, signal charges accumulated in respective photodiodes PD are read to respective floating diffusion regions 11.

In the embodiment, the vertical gate electrode 39 is shared between adjacent pixels, thereby reducing the pixel size. Moreover, since the floating diffusion region 11 is formed inside the photodiode region 60 in the solid-state imaging device of the embodiment, the pixel size can be reduced.

Also in the solid-state imaging device of the embodiment, the same advantages as Embodiment 1 can be obtained.

Embodiment 31

[Example in which a Vertical Electrode and a Planar Gate Electrode are Shared Between Adjacent Pixels]

Figure 44:
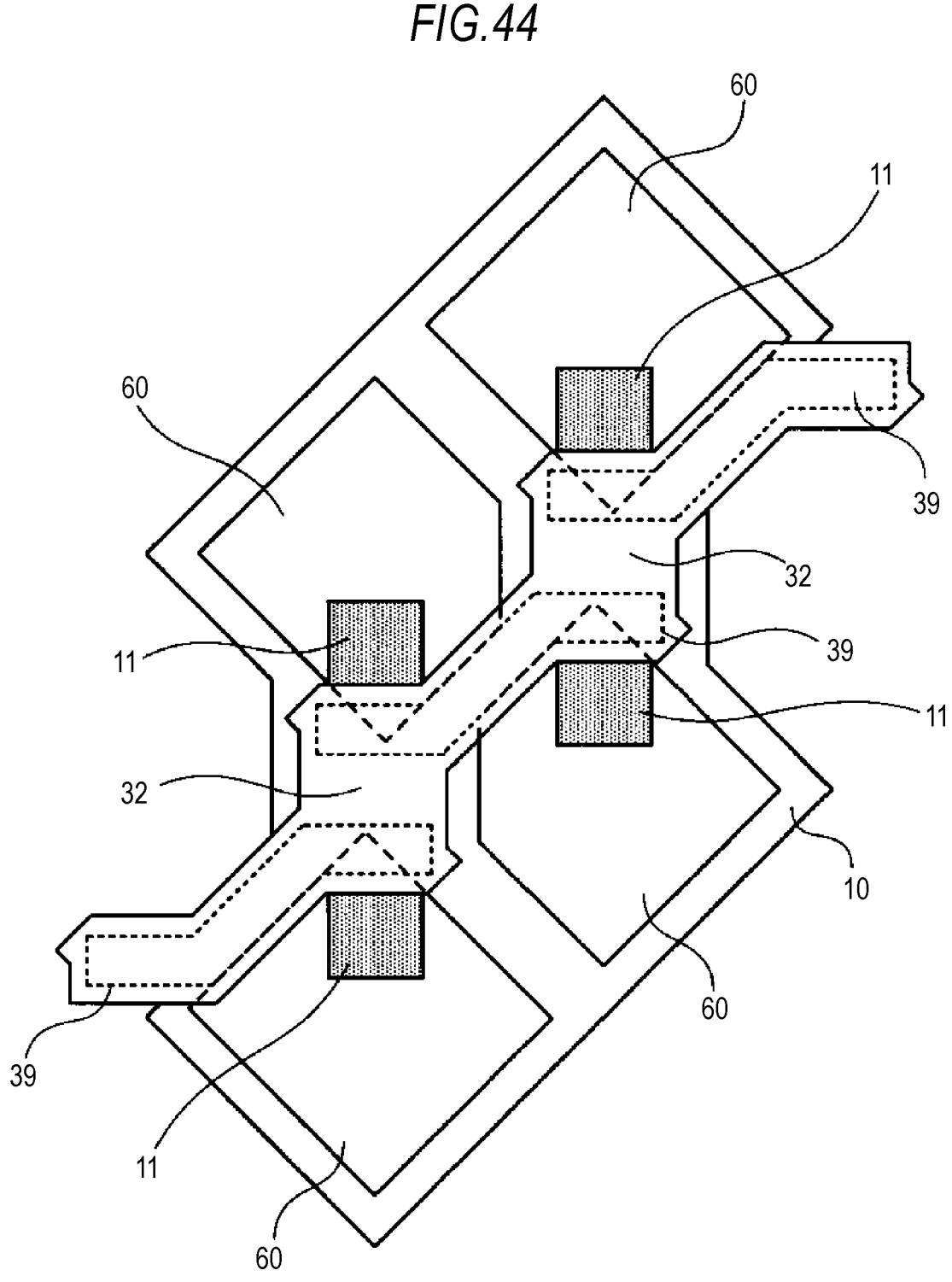
FIG. 44 a schematic planar configuration view of a relevant part of a solid-state imaging device according to Embodiment 31 of the invention.

FIG. 44 shows a schematic planar configuration of a solid-state imaging device according to Embodiment 31 of the invention. In FIG. 44, same symbols are given to portions corresponding to FIG. 43 and the repeated explanation is omitted.

Part of the present embodiment differs from Embodiment 30 in a configuration of the planar gate electrode.

In the embodiment, the planar gate electrode 32 is formed to be connected between pixels adjacent in the vertical direction.

Also in the solid-state imaging device having the above configuration, signal charges accumulated in the photodiode PD are transferred along the potential gradient in the photodiode region 60, which is made by application of positive voltage to the vertical gate electrode 39. Then, the transferred signal charges are read to the floating diffusion region 11. In the embodiment, the vertical gate electrode 39 is shared between pixels adjacent in the oblique direction. Additionally, the planar gate electrode 32 is shared between pixels adjacent in the vertical direction. Accordingly, signal charges of four pixels shown in FIG. 44 are transferred at the same time by application of positive voltage to the vertical gate electrode 39 and the planar gate electrode 32. Then, signal charges accumulated in respective photodiodes PD are read to respective floating diffusion regions 11.

In the embodiment, the vertical gate electrode 39 and the planar gate electrode 32 are shared between adjacent two pixels, thereby reducing the pixel size. Moreover, since the floating diffusion region 11 is formed inside the photodiode 60 in the solid-state imaging device of the embodiment, the pixel size can be reduced.

Also in the solid-state imaging device of the embodiment, the same advantages as Embodiment 1 can be obtained.

Embodiment 32

[Example in which a Vertical Gate Electrode and a Planar Gate Electrode are Shared Among Adjacent Pixels]

Figure 45:
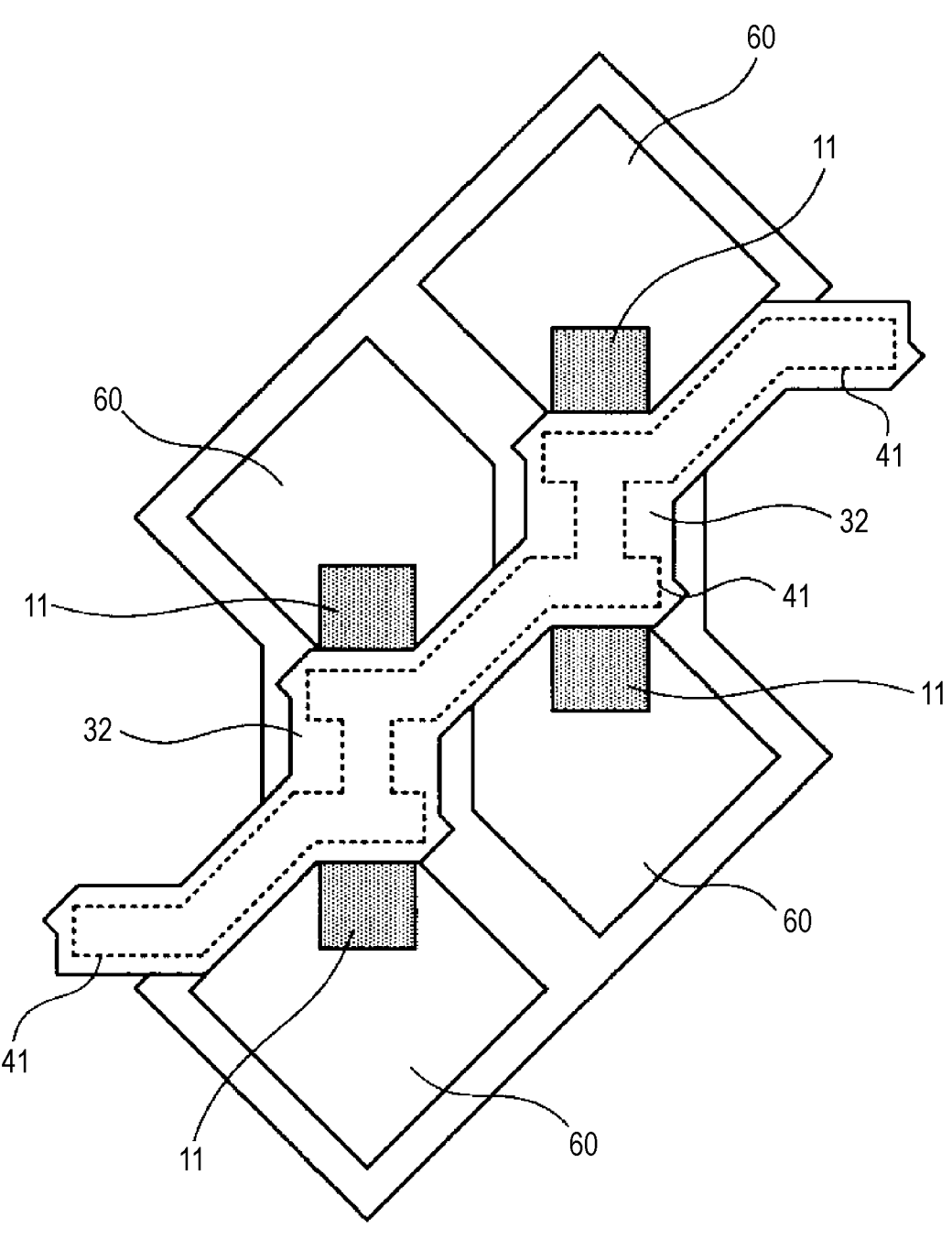
FIG. 45 a schematic planar configuration view of a relevant part of a solid-state imaging device according to Embodiment 32 of the invention.

FIG. 45 shows a schematic planar configuration of a solid-state imaging device according to Embodiment 32 of the invention. In FIG. 45, same symbols are given to portions corresponding to FIG. 44 and the repeated explanation is omitted.

Part of the present embodiment differs from Embodiment 31 in a configuration of the vertical gate electrode.

In the embodiment, a vertical gate electrode 41 is formed along one edge of the outer peripheral portion of the photodiode region 60 so as to extend to the edge and the corner portion of the photodiode region 60 which is adjacent to the edge. The vertical gate electrode 41 formed along one edge of the outer peripheral portion of the photodiode region 60 is shared between pixels adjacent in the oblique direction, which is formed extending to pixels adjacent in the vertical direction.

Also in the solid-state imaging device having the above configuration, signal charges accumulated in the photodiode PD are transferred along the potential gradient in the photodiode region 60, which is made by application of positive voltage to the vertical gate electrode 41. Then, the transferred signal charges are read to the floating diffusion region 11. In the embodiment, the vertical gate electrode 41 is shared between pixels adjacent in the oblique direction as well as between pixels adjacent in the vertical direction. Additionally, the planar gate electrode 32 is shared between pixels adjacent in the vertical direction. Accordingly, signal charges of four pixels shown in FIG. 45 are transferred at the same time by application of positive voltage to the vertical gate electrode 41. Then, signal charges accumulated in respective photodiodes PD are read to respective floating diffusion regions 11.

The vertical gate electrode 41 is shared between pixels adjacent in the oblique direction. Accordingly, by applying positive voltage to the vertical gate electrode 41, signal charges of four pixels shown in FIG. 45 are transferred at the same time. Then, the signal charges accumulated in the respective photodiodes PD are read to the respective floating diffusion regions 11.

In the embodiment, the vertical gate electrode 41 and the planar gate electrode 32 are shared between adjacent two pixels, thereby reducing the pixel size. Moreover, since the floating diffusion region 11 is formed in the photodiode region 60 in the solid-state imaging device of the embodiment, the pixel size can be reduced.

Also in the solid-state imaging device of the embodiment, the same advantages as Embodiment 1 can be obtained.

Embodiment 33

[Example in which a Vertical Gate Electrode is Shared Between Adjacent Pixels]

Figure 46:
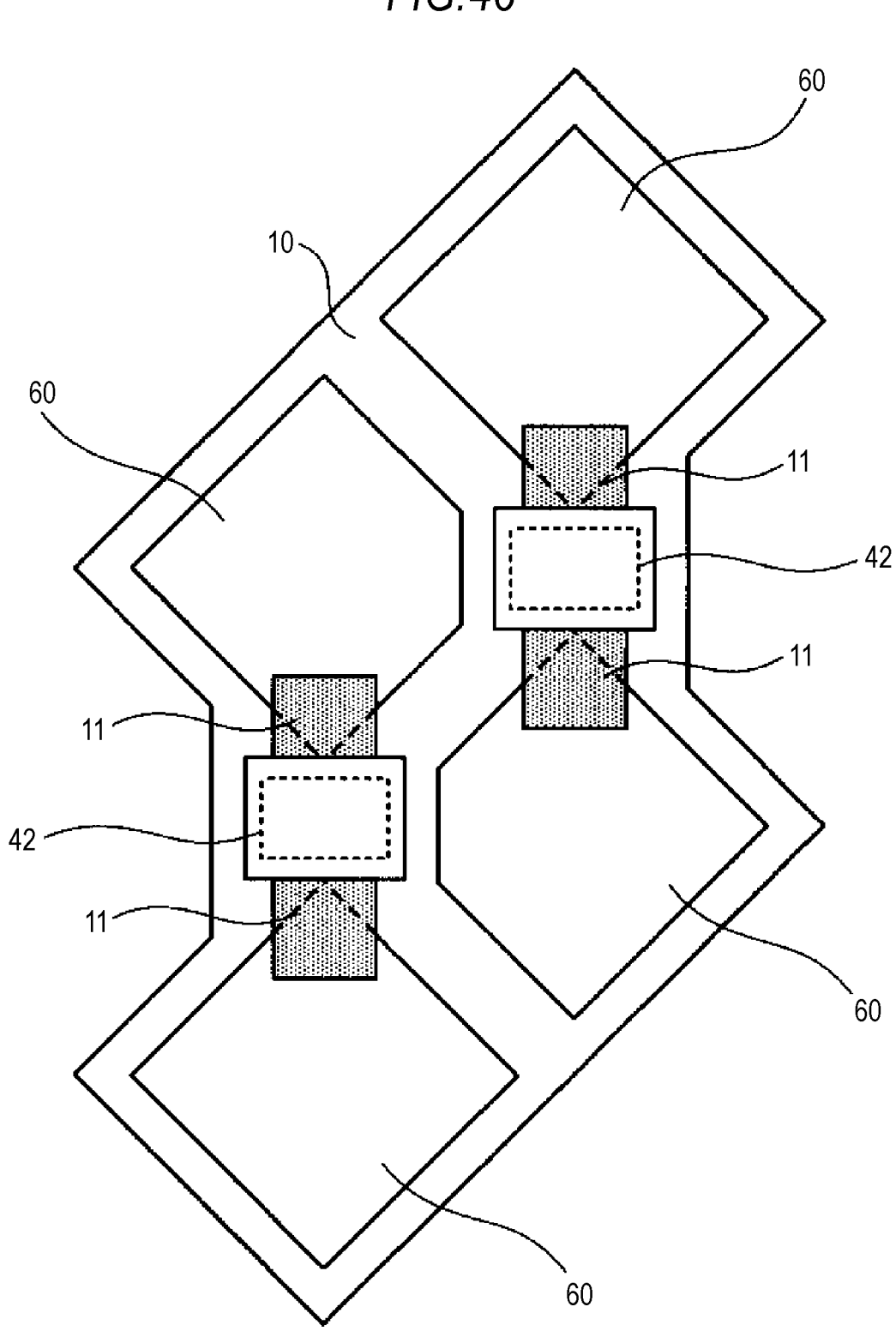
FIG. 46 a schematic planar configuration view of a relevant part of a solid-state imaging device according to Embodiment 33 of the invention.

FIG. 46 shows a schematic planar configuration of a solid-state imaging device according to Embodiment 33 of the invention. In FIG. 46, same symbols are given to portions corresponding to FIG. 22 and the repeated explanation is omitted.

In the solid-state imaging device of the embodiment, the charge readout transistor Tr included in one pixel includes a vertical gate electrode 42 and the floating diffusion region 11.

The vertical gate electrode 42 is formed at the outer peripheral portion of the photodiode region 60, which is shared between pixels adjacent in the vertical direction. The floating diffusion region 11 is formed between the photodiode region 60 and the vertical gate electrode 42.

Also in the solid-state imaging device having the above configuration, signal charges accumulated in the photodiode PD are transferred along the potential gradient in the photodiode region 60, which is made by application of positive voltage to the vertical gate electrode 42. Then, the transferred signal charges are read to the floating diffusion region 11. In the embodiment, the vertical gate electrode 42 formed at the outer peripheral portion of the photodiode region 60 is shared between pixels adjacent in the vertical direction. Accordingly, signal charges of two pixels adjacent in the vertical direction are transferred at the same time by application of positive voltage to the vertical gate electrode 42. Then, signal charges accumulated in photodiodes PD are read to respective floating diffusion regions 11.

In the embodiment, the vertical gate electrode 42 is shared between two pixels, thereby reducing the pixel size. Moreover, since the floating diffusion region 11 is formed inside the photodiode region 60 in the solid-state imaging device of the embodiment, the pixel size can be reduced.

Also in the solid-state imaging device of the embodiment, the same advantages as Embodiment 1 can be obtained.

Embodiment 34

[Example in which a Planar Gate Electrode and a Floating Diffusion Region are Shared Between Adjacent Pixels]

Figure 47:
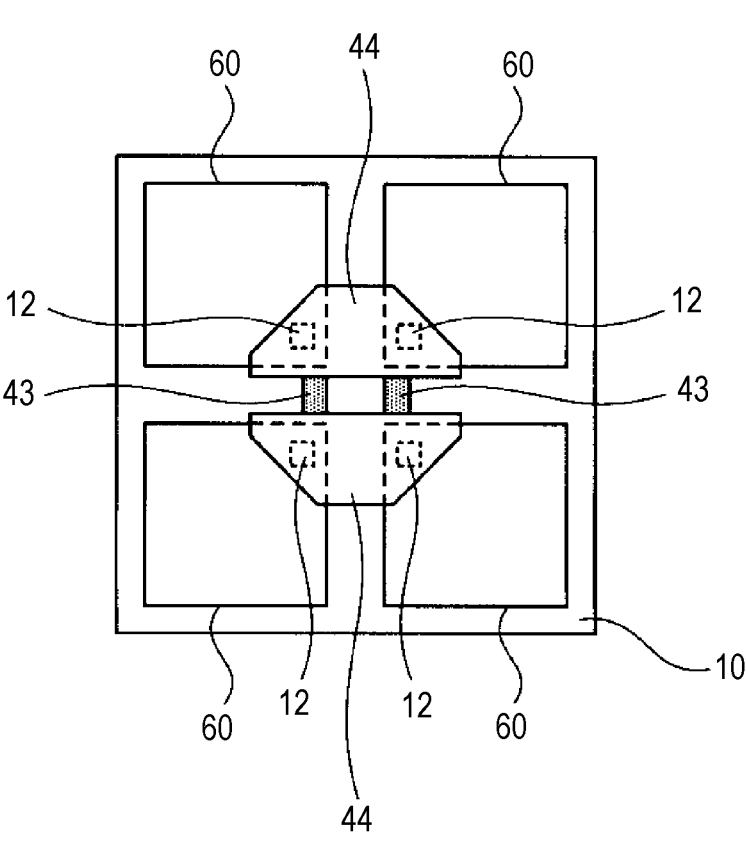
FIG. 47 a schematic planar configuration view of a relevant part of a solid-state imaging device according to Embodiment 34 of the invention.

FIG. 47 shows a schematic planar configuration of a solid-state imaging device according to Embodiment 34 of the invention. FIG. 47 is a plan view of a relevant part including adjacent four pixels, showing an example of a so-called tetragonal pixel arrangement, in which pixels are orthogonally arranged in the horizontal direction and in the vertical direction. That is, FIG. 47 shows a region of four pixels, namely, two pixels are arranged in the horizontal direction and two pixels are arranged in the vertical direction. In FIG. 47, same symbols are given to portions corresponding to FIG. 16 and the repeated explanation is omitted.

In the solid-state imaging device of the embodiment, the charge readout transistor Tr included in one pixel includes a planar gate electrode 44, the vertical gate electrode 12 integrally formed with the planar gate electrode 44 and a floating diffusion region 43.

The planar gate electrode 44 is formed at the corner portion of the photodiode region 60. The planar gate electrode 44 is shared between pixels adjacent in the horizontal direction. Under the planar gate electrode 44 positioned at the corner portion, the vertical gate electrode 12 integrally formed with the planar gate electrode 44 is formed. The vertical gate electrode 12 has a cross section of an approximately square shape, which is formed to have a size not enough to cover the whole lower surface of the planar gate electrode 44.

The floating diffusion region 43 is formed at a region outside the photodiode 60 and adjacent to the semiconductor substrate 13 under the planar gate electrode 44. The floating diffusion region 43 is shared between pixels adjacent in the vertical direction.

Also in the solid-state imaging device having the above configuration, signal charges accumulated in the photodiode PD are transferred along the potential gradient in the photodiode region 60, which is made by application of positive voltage to the vertical gate electrode 12 and the planar gate electrode 44. Then, the transferred signal charges are read to the floating diffusion region 43. In the embodiment, the planar gate electrode 44 is shared between pixels adjacent in the horizontal direction. Accordingly, signal charges of two pixels adjacent in the horizontal direction are transferred at the same time by application of positive voltage to the vertical gate electrode 12 and the planar gate electrode 44. Then, signal charges accumulated in respective photodiodes PD are read to respective floating diffusion regions 43. Additionally, in the embodiment, the vertical gate electrode 12 is formed to have a size not enough to cover the whole lower surface of the planar gate electrode 44. Accordingly, the transfer of signal charges transferred to the floating diffusion region 43 by the potential gradient in the photodiode region 60 is not interrupted by the vertical gate electrode 12.

In the embodiment, the vertical gate electrode 12 and the planar gate electrode 44 are shared between adjacent two pixels, thereby reducing the pixel size.

Also in the solid-state imaging device of the embodiment, the same advantages as Embodiment 1 can be obtained.

Embodiment 35

[Example in which a Planar Gate Electrode and a Floating Diffusion Region are Shared Between Adjacent Pixels]

Figure 48:
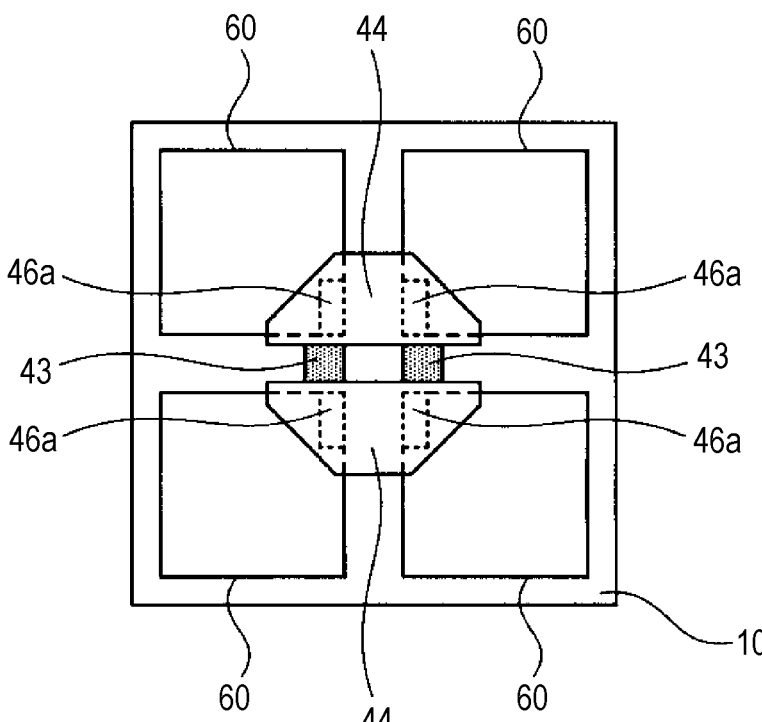
FIG. 48 a schematic planar configuration view of a relevant part of a solid-state imaging device according to Embodiment 35 of the invention.

FIG. 48 shows a schematic planar configuration of a solid-state imaging device according to Embodiment 35 of the invention. In FIG. 48, same symbols are given to portions corresponding to FIG. 47 and the repeated explanation is omitted.

The present embodiment differs from Embodiment 34 in a configuration of the vertical gate electrode.

In the embodiment, a vertical gate electrode 46a is formed under the planar gate electrode 44 along one edge extending in the vertical direction at the outer peripheral portion of the photodiode region 60.

Also in the solid-state imaging device having the above configuration, signal charges accumulated in the photodiode PD are transferred along the potential gradient in the photodiode region 60, which is made by application of positive voltage to the vertical gate electrode 46a and the planar gate electrode 44. Then, the transferred signal charges are read to the floating diffusion region 43. In the embodiment, the planar gate electrode 44 is shared between pixels adjacent in the horizontal direction. Accordingly, signal charges of two pixels adjacent in the horizontal direction are transferred at the same time by application of positive voltage to the vertical gate electrode 46a and the planar gate electrode 44. Then, signal charges accumulated in photodiodes PD are read to respective floating diffusion regions 43.

In the embodiment, the vertical gate electrode 46a is shared between adjacent two pixels, thereby reducing the pixel size.

Also in the solid-state imaging device of the embodiment, the same advantages as Embodiment 1 can be obtained.

Embodiment 36

[Example in which a Planar Gate Electrode, a Vertical Gate Electrode and a Floating Diffusion Region are Shared Between Adjacent Pixels]

Figure 4:
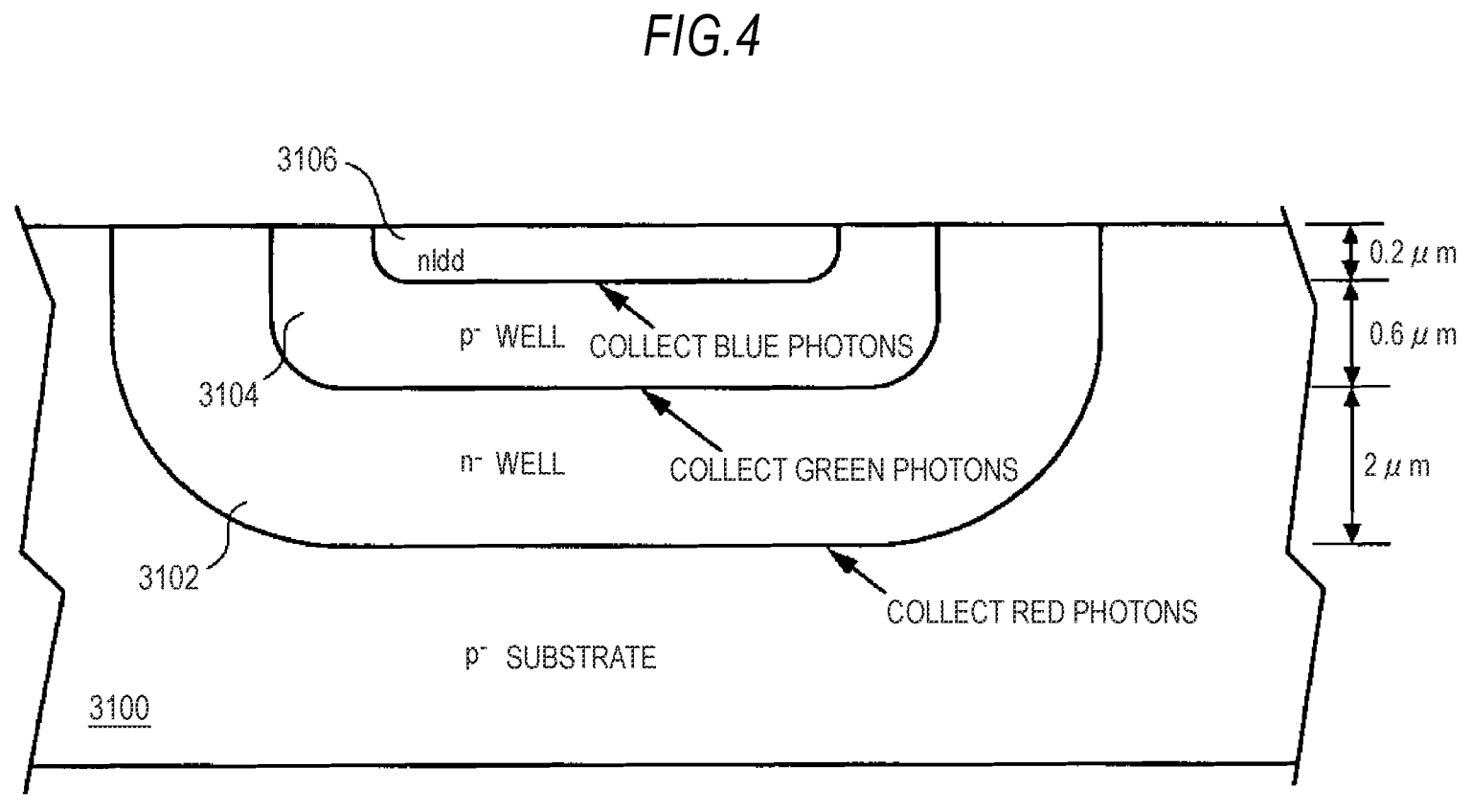
Figure 49:
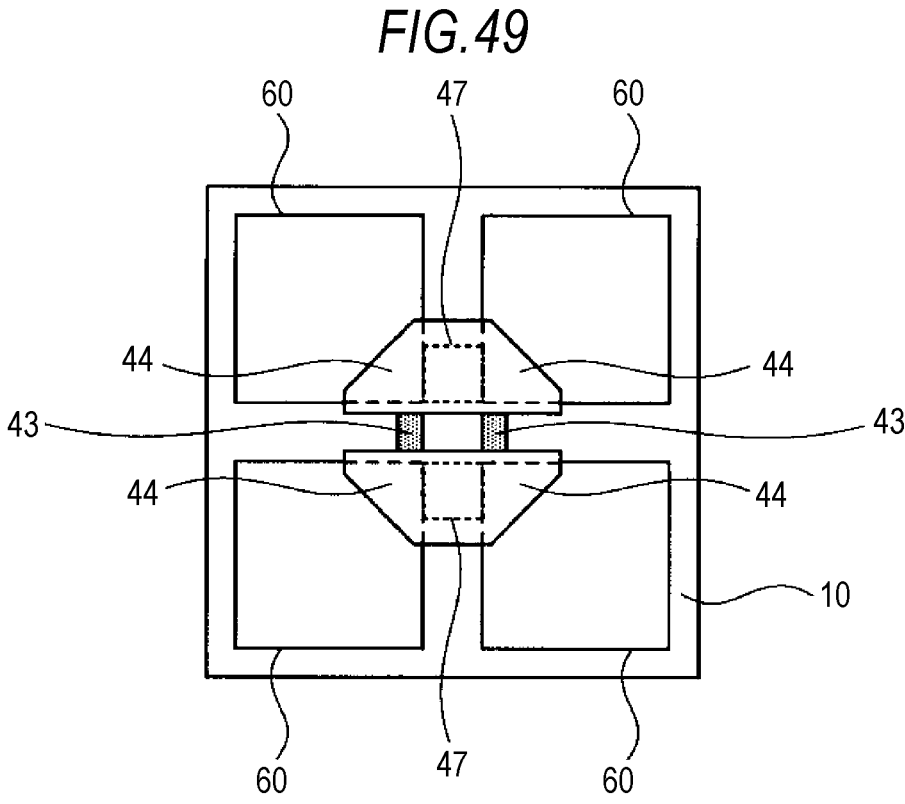
FIG. 49 a schematic planar configuration view of a relevant part of a solid-state imaging device according to Embodiment 36 of the invention.

FIG. 49 shows a schematic planar configuration of a solid-state imaging device according to Embodiment 36 of the invention. In FIG. 49, same symbols are given to portions corresponding to FIG. 4 8 and the repeated explanation is omitted.

Part of the present embodiment differs from Embodiment 35 in a configuration of the vertical gate electrode.

In the embodiment, a vertical gate electrode 47 is formed under the planar gate electrode 44 as well as at the outer peripheral portion of the photodiode region 60. The vertical gate electrode 47 is shared between pixels adjacent in the horizontal direction.

Also in the solid-state imaging device having the above configuration, signal charges accumulated in the photodiode PD are transferred along the potential gradient in the photodiode region 60, which is made by application of positive voltage to the vertical gate electrode 47 and the planar gate electrode 44. Then, the transferred signal charges are read to the floating diffusion region 43. In the embodiment, the vertical gate electrode 47 and the planar gate electrode 44 are shared between pixels adjacent in the horizontal direction. Accordingly, signal charges of two pixels adjacent in the horizontal direction are transferred at the same time by application of positive voltage to the vertical gate electrode 47 and the planar gate electrode 44. Then, signal charges accumulated in photodiodes PD are read to respective floating diffusion regions 43.

In the embodiment, the planar gate electrode 44 and the vertical gate electrode 47 shared between adjacent two pixels, thereby reducing the pixel size.

Also in the solid-state imaging device of the embodiment, the same advantages as Embodiment 1 can be obtained.

Embodiment 37

[Example in which a Planar Gate Electrode, a Vertical Gate Electrode and a Floating Diffusion Region are Shared Between Adjacent Pixels]

Figure 50:
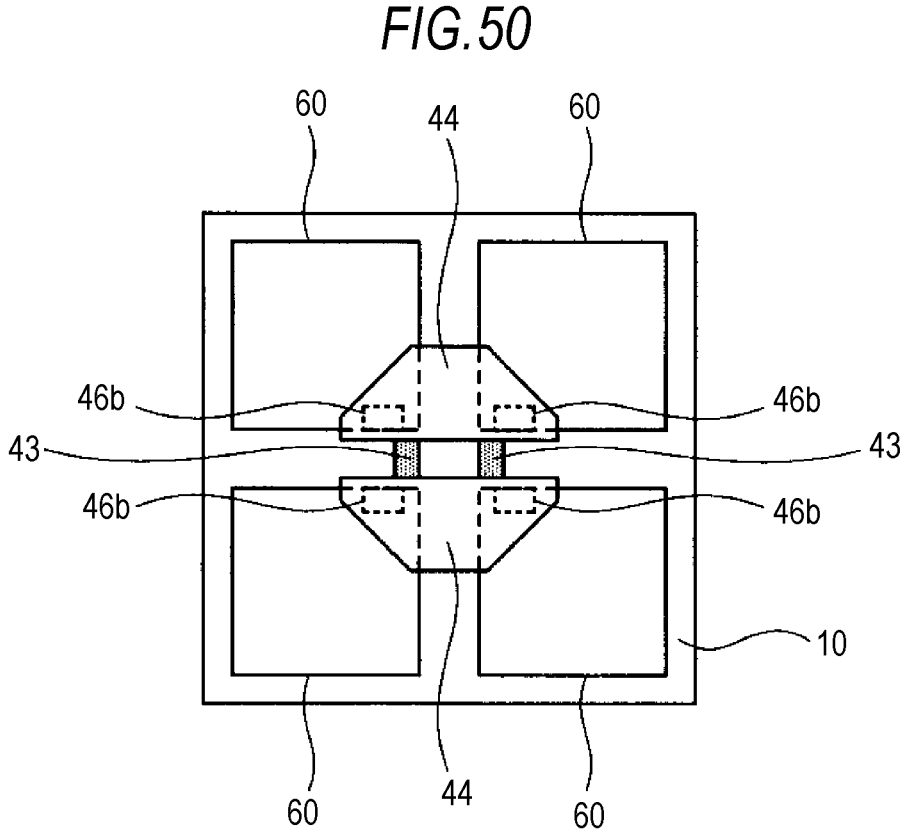
FIG. 50 a schematic planar configuration view of a relevant part of a solid-state imaging device according to Embodiment 37 of the invention.

FIG. 50 shows a schematic planar configuration of a solid-state imaging device according to Embodiment 37 of the invention. In FIG. 50, same symbols are given to portions corresponding to FIG. 4 9 and the repeated explanation is omitted.

The present embodiment differs from Embodiment 36 in a configuration of the vertical gate electrode.

In the embodiment, a vertical gate electrode 46b are formed under the planar gate electrode 44 as well as along one edge extending in the horizontal direction at the outer peripheral portion of the photodiode region 60.

Also in the solid-state imaging device having the above configuration, signal charges accumulated in the photodiode PD are transferred along the potential gradient in the photodiode region 60, which is made by application of positive voltage to the vertical gate electrode 46b and the planar gate electrode 44. Then, the transferred signal charges are read to the floating diffusion region 43. In the embodiment, the planar gate electrode 44 is shared between pixels adjacent in the horizontal direction. Accordingly, signal charges of two pixels adjacent in the horizontal direction are transferred at the same time by application of positive voltage to the vertical gate electrode 46b and the planar gate electrode 44. Then, signal charges accumulated in respective photodiodes PD are read to respective floating diffusion regions 43.

In the embodiment, the planar gate electrode 44 and the floating diffusion region 43 are shared between adjacent two pixels, thereby reducing the pixel size.

Also in the solid-state imaging device of the embodiment, the same advantages as Embodiment 1 can be obtained.

Embodiment 38

[Example in which a Planar Gate Electrode, a Vertical Gate Electrode and a Floating Diffusion Region are Shared Between Adjacent Pixels]

Figures 51, 52:
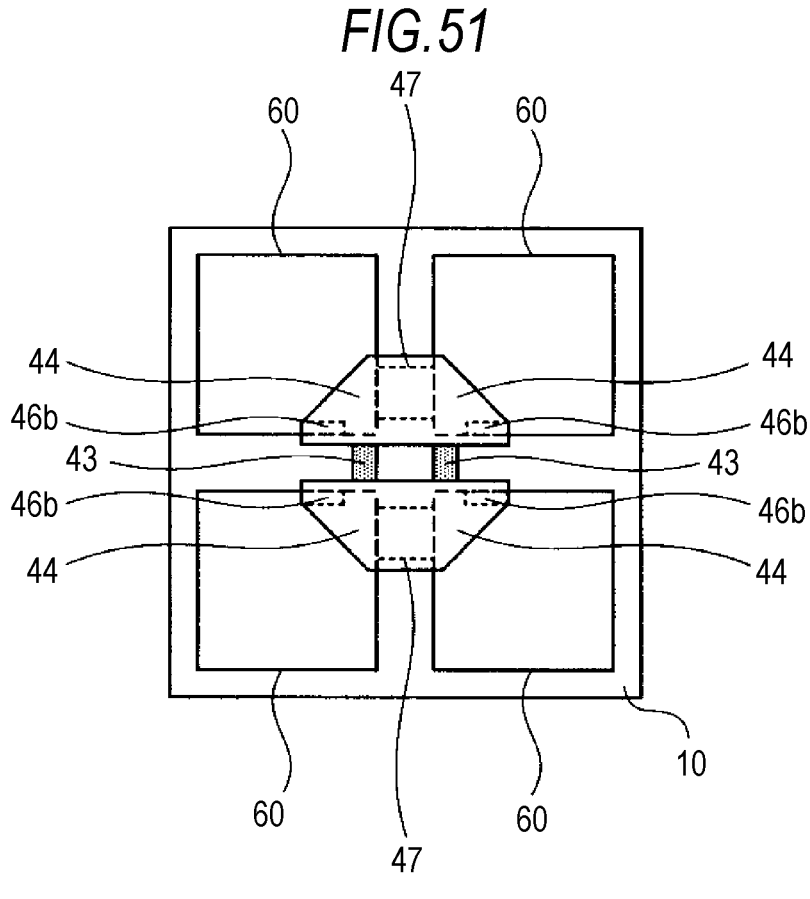
FIG. 51 a schematic planar configuration view of a relevant part of a solid-state imaging device according to Embodiment 38 of the invention.
FIG. 52 a schematic planar configuration view of a relevant part of a solid-state imaging device according to Embodiment 39 of the invention.

FIG. 51 shows a schematic planar configuration of a solid-state imaging device according to Embodiment 38 of the invention. In FIG. 51, same symbols are given to portions corresponding to FIG. 49 and FIG. 50, and the repeated explanation is omitted.

The present embodiment differs from Embodiment 37 in a configuration of the vertical gate electrode.

In the embodiment, the vertical gate electrode 46b are formed under the planar gate electrode 44 as well as along one edge extending in the horizontal direction at the outer peripheral portion of the photodiode region 60. Additionally, the vertical gate electrode 47 is formed under the planar gate electrode 44 at the outer peripheral portion of the photodiode region 60 so as to be shared between pixels adjacent in the horizontal direction.

Also in the solid-state imaging device having the above configuration, signal charges accumulated in the photodiode PD are transferred along the potential gradient in the photodiode region 60, which is made by application of positive voltage to the vertical gate electrodes 46*b*, 47 and the planar gate electrode 44. Then, the transferred signal charges are read to the floating diffusion region 43 through a region between the vertical gate electrode 46*b* and the vertical gate electrode 47. In the embodiment, the vertical gate electrode 47 is shared between pixels adjacent in the horizontal direction. Accordingly, signal charges of two pixels adjacent in the horizontal direction are transferred at the same time by application of positive voltage to the vertical gate electrodes 46*b*, 47 and the planar gate electrode 44. Then, signal charges accumulated in respective photodiodes PD are read to respective floating diffusion regions 43.

In the embodiment, the planar gate electrode 44, the vertical gate electrode 47 and the floating diffusion region 43 are shared between adjacent pixels, thereby reducing the pixel size.

Also in the solid-state imaging device of the embodiment, the same advantages as Embodiment 1 can be obtained.

Embodiment 39

[Example in which a Planar Gate Electrode, a Vertical Gate Electrode and a Floating Diffusion Region are Shared Between Adjacent Pixels]

FIG. 52 shows a schematic planar configuration of a solid-state imaging device according to Embodiment 39 of the invention. In FIG. 52, same symbols are given to portions corresponding to FIG. 51, and the repeated explanation is omitted.

Part of the present embodiment differs from Embodiment 38 in a configuration of the vertical gate electrode.

In the embodiment, the vertical gate electrode 46*a* is formed under the planar gate electrode 44 as well as along one edge extending in the vertical direction of the outer peripheral portion of the photodiode region 60. Additionally, the vertical gate electrode 46*b* is formed under the planar gate electrode 44 as well as along one edge extending in the horizontal direction of the outer peripheral portion of the photodiode region 60.

Also in the solid-state imaging device having the above configuration, signal charges accumulated in the photodiode PD are transferred along the potential gradient in the photodiode region 60, which is made by application of positive voltage to the vertical gate electrodes 46*a*, 46*b* and the planar gate electrode 44. Then, the transferred signal charges are read to the floating diffusion region 43 through a region between the vertical gate electrode 46*a* and the vertical gate electrode 46*b*. In the embodiment, the planar gate electrode 44 is shared between pixels adjacent in the horizontal direction. Accordingly, signal charges of two pixels adjacent in the horizontal direction are transferred at the same time by application of positive voltage to the vertical gate electrodes 46*a*, 46*b* and the planar gate electrode 44. Then, signal charges accumulated in respective photodiodes PD are read to respective floating diffusion regions 43.

In the embodiment, the planar gate electrode 44 is shared between adjacent two pixels, thereby reducing the pixel size.

Also in the solid-state imaging device of the embodiment, the same advantages as Embodiment 1 can be obtained.

Embodiment 40

[Example in which a Floating Diffusion Region is Shared Between Adjacent Pixels]

Figure 53:
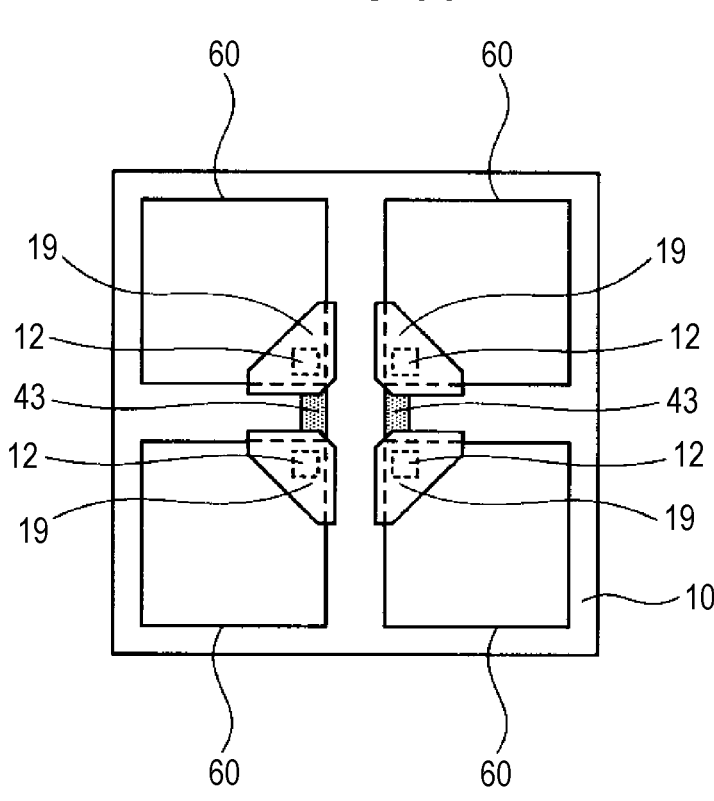
FIG. 53 a schematic planar configuration view of a relevant part of a solid-state imaging device according to Embodiment 40 of the invention.

FIG. 53 shows a schematic planar configuration of a solid-state imaging device according to Embodiment 40 of the invention. In FIG. 53, same symbols are given to portions corresponding to FIG. 16, and the repeated explanation is omitted.

In the solid-state imaging device of the embodiment, the charge readout transistor Tr included in one pixel includes the planar gate electrode 19, the vertical gate electrode 12 integrally formed with the planar gate electrode 19 and the floating diffusion region 43.

The planar gate electrode 19 is formed at a corner portion of the photodiode region 60. The vertical gate electrode 12 is formed under the planar gate electrode 19 positioned at the corner portion of the photodiode region 60, which is formed integrally with the planar gate electrode 19. The vertical gate electrode 12 has a cross-section of an approximately square shape, which is formed to have a size not enough to cover the whole lower surface of the planar gate electrode 19 formed at the corner portion of the photodiode region 60.

The floating diffusion region 43 is formed at a region outside the photodiode region 60, which is adjacent to the semiconductor substrate 13 under the planar gate electrode 19. The floating diffusion region 43 is shared between pixels adjacent in the vertical direction.

Also in the solid-state imaging device having the above configuration, signal charges accumulated in the photodiode PD are transferred along the potential gradient in the photodiode region 60, which is made by application of positive voltage to the vertical gate electrodes 12 and the planar gate electrode 19. Then, the transferred signal charges are read to the floating diffusion region 43. In the embodiment, the vertical gate electrode 12 is formed to have a size not enough to cover the whole lower surface of the planar gate electrode 19. Accordingly, the transfer of signal charges transferred to the floating diffusion region 43 by the potential gradient in the photodiode region 60 is not interrupted by the vertical gate electrode 12.

In the embodiment, the floating diffusion region 43 is shared between adjacent pixels, thereby reducing the pixel size.

Also in the solid-state imaging device of the embodiment, the same advantages as Embodiment 1 can be obtained.

Embodiment 41

[Example in which a Floating Diffusion Region is Shared Between Adjacent Pixels]

Figure 54:
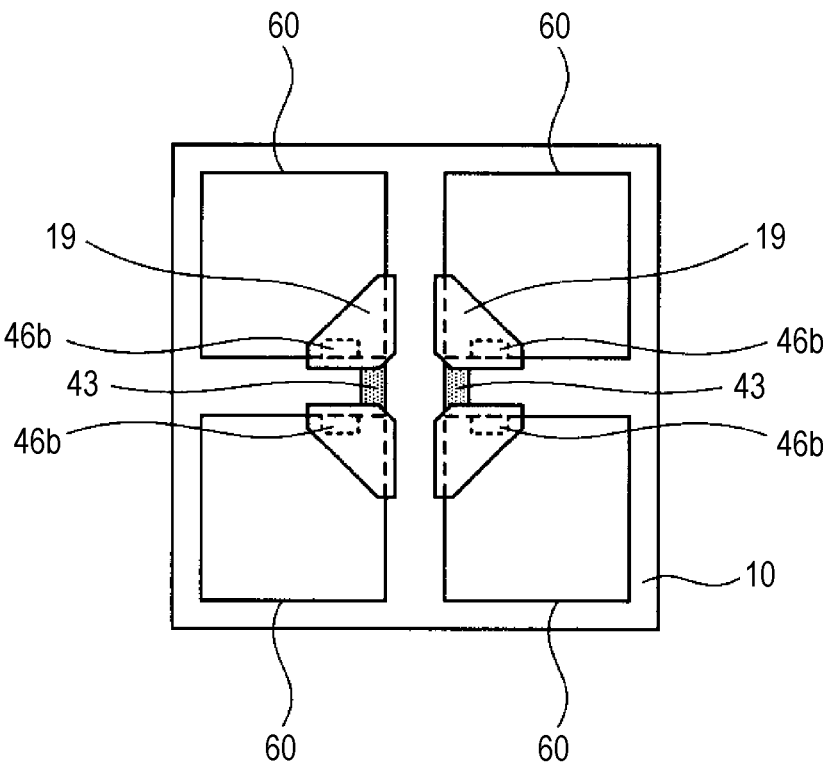
FIG. 54 a schematic planar configuration view of a relevant part of a solid-state imaging device according to Embodiment 41 of the invention.

FIG. 54 shows a schematic planar configuration of a solid-state imaging device according to Embodiment 41 of the invention. In FIG. 54, same symbols are given to portions corresponding to FIG. 53, and the repeated explanation is omitted.

The present embodiment differs from Embodiment 40 in a configuration of the vertical gate electrode.

In the embodiment, the vertical gate electrode 46*b* is formed under the planar gate electrode 19 as well as along one edge extending in the horizontal direction at the outer peripheral portion of the photodiode region 60.

Also in the solid-state imaging device having the above configuration, signal charges accumulated in the photodiode PD are transferred along the potential gradient in the semiconductor substrate, which is made by application of positive voltage to the vertical gate electrodes 46b and the planar gate electrode 19.

In the embodiment, the floating diffusion region 43 is shared between adjacent two pixels, thereby reducing the pixel size.

Also in the solid-state imaging device of the embodiment, the same advantages as Embodiment 1 can be obtained.

Embodiment 42

[Example in which a Floating Diffusion Region is Shared Between Adjacent Pixels]

Figure 55:
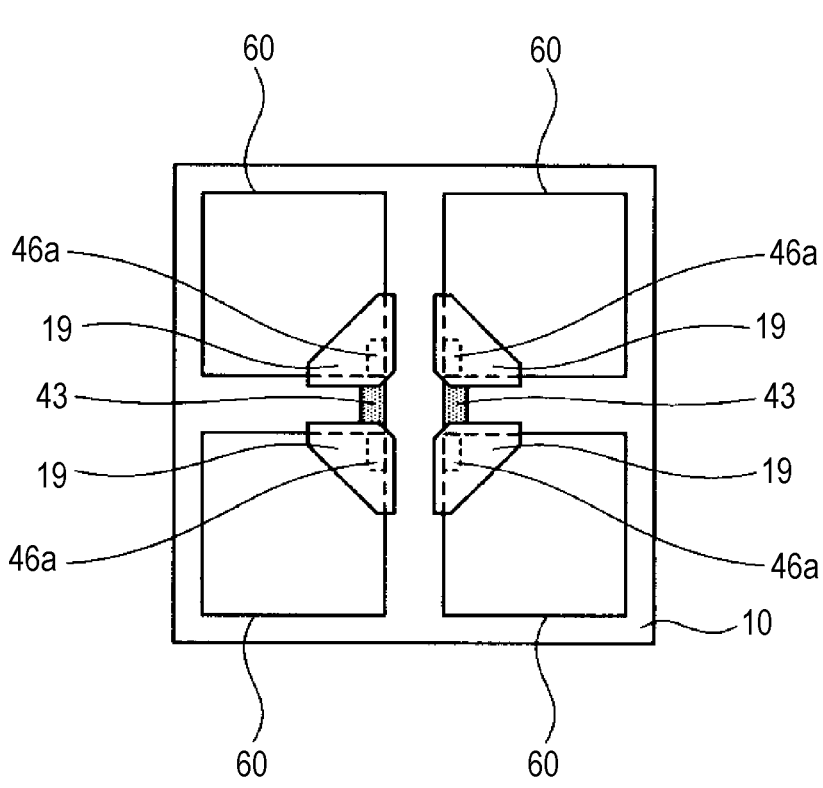
FIG. 55 a schematic planar configuration view of a relevant part of a solid-state imaging device according to Embodiment 42 of the invention.

FIG. 55 shows a schematic planar configuration of a solid-state imaging device according to Embodiment 42 of the invention. In FIG. 55, same symbols are given to portions corresponding to FIG. 54, and the repeated explanation is omitted.

The present embodiment differs from Embodiment 41 in a configuration of the vertical gate electrode.

In the embodiment, the vertical gate electrode 46a is formed under the planar gate electrode 19 as well as along one edge extending in the vertical direction at the outer peripheral portion of the photodiode region 60.

Also in the solid-state imaging device having the above configuration, signal charges accumulated in the photodiode PD are transferred along the potential gradient in the photodiode region 60, which is made by application of positive voltage to the vertical gate electrodes 46a and the planar gate electrode 19. Then, the transferred signal charges are read to the floating diffusion region 43.

In the embodiment, the floating diffusion region 43 is shared between adjacent pixels, thereby reducing the pixel size.

Also in the solid-state imaging device of the embodiment, the same advantages as Embodiment 1 can be obtained.

Embodiment 43

[Example in which a Floating Diffusion Region is Shared Between Adjacent Pixels]

Figure 56:
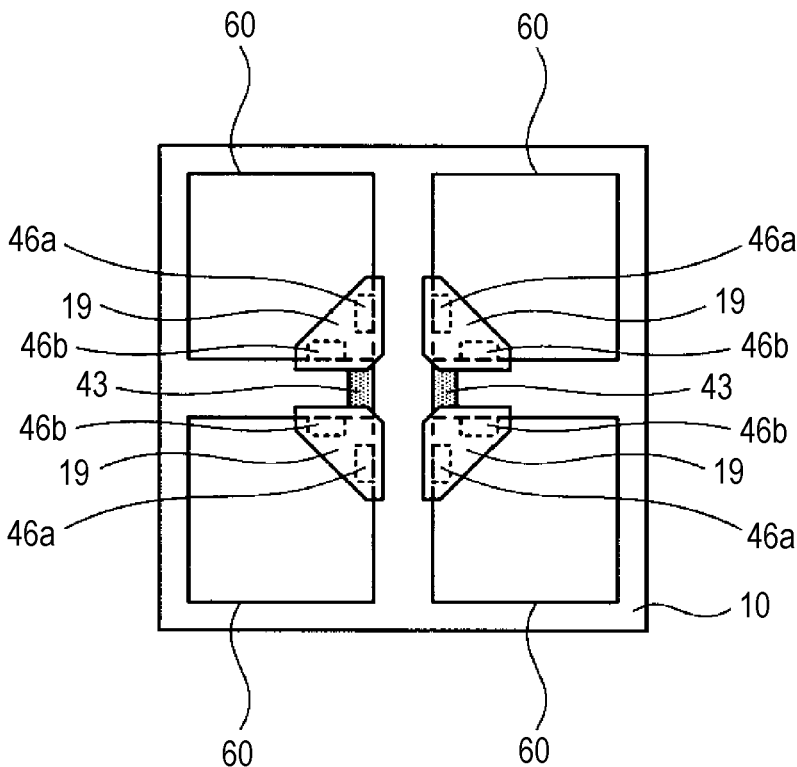
FIG. 56 a schematic planar configuration view of a relevant part of a solid-state imaging device according to Embodiment 43 of the invention.

FIG. 56 shows a schematic planar configuration of a solid-state imaging device according to Embodiment 43 of the invention. In FIG. 56, same symbols are given to portions corresponding to FIG. 55, and the repeated explanation is omitted. The present embodiment differs from Embodiment 42 in a configuration of the vertical gate electrode.

In the embodiment, the vertical gate electrode 46a is formed under the planar gate electrode 19 as well as along one edge extending in the vertical direction at the outer peripheral portion of the photodiode region 60. Additionally, the vertical gate electrode 46b is formed under the planar gate electrode 19 as well as along one edge extending in the horizontal direction at the outer peripheral portion of the photodiode region 60.

Also in the solid-state imaging device having the above configuration, signal charges accumulated in the photodiode PD are transferred along the potential gradient in the photodiode region 60, which is made by application of positive voltage to the vertical gate electrodes 46a, 46b and the planar gate electrode 19. Then, the transferred signal charges are read to the floating diffusion region 43 through a region between the vertical gate electrode 46a and the vertical gate electrode 46b.

In the embodiment, the floating diffusion region 43 is shared between adjacent pixels, thereby reducing the pixel size.

Also in the solid-state imaging device of the embodiment, the same advantages as Embodiment 1 can be obtained.

Embodiment 44

[Example in which a Floating Diffusion Region is Shared Among Adjacent Pixels]

Figure 57:
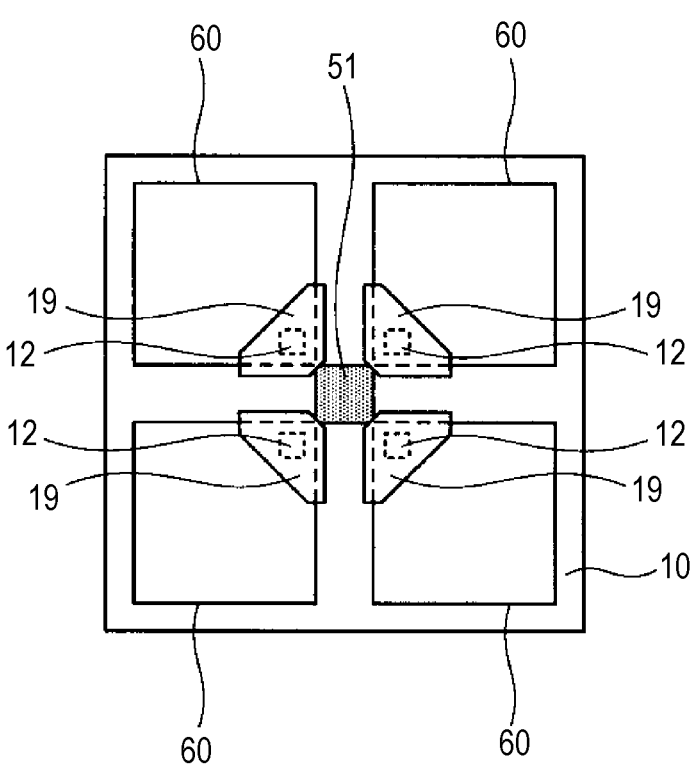
FIG. 57 a schematic planar configuration view of a relevant part of a solid-state imaging device according to Embodiment 44 of the invention.

FIG. 57 shows a schematic planar configuration of a solid-state imaging device according to Embodiment 44 of the invention. In FIG. 57, same symbols are given to portions corresponding to FIG. 53, and the repeated explanation is omitted.

In the solid-state imaging device of the embodiment, the charge readout transistor Tr included in one pixel includes the planar gate electrode 19, the vertical gate electrode 12 integrally formed with the planar gate electrode 19 and a floating diffusion region 51.

The planar gate electrode 19 is formed at the corner portion of the photodiode region 60. The vertical gate electrode 12 is formed under the planar gate electrode 19 positioned at the corner portion of the photodiode region, which is integrally formed with the planar gate electrode 19. The vertical gate electrode 12 has a cross section of an approximately square shape, which is formed to have a size not enough to cover the whole lower surface of the planar gate electrode 19 formed at the corner portion of the photodiode region 60.

The floating diffusion region 51 is formed at a region outside the photodiode region 60, which is adjacent to the semiconductor substrate 13 under the planar gate electrode 19. The floating diffusion region 51 is shared among four pixels, which are pixels adjacent in the vertical direction and pixels adjacent in the horizontal direction.

Also in the solid-state imaging device having the above configuration, signal charges accumulated in the photodiode PD are transferred along the potential gradient in the photodiode region 60, which is made by application of positive voltage to the vertical gate electrode 12 and the planar gate electrode 19. Then, the transferred signal charges are read to the floating diffusion region 51.

In the embodiment, the floating diffusion region 51 is shared among adjacent four pixels, thereby reducing the pixel size.

Also in the solid-state imaging device of the embodiment, the same advantages as Embodiment 1 can be obtained.

Embodiment 45

[Example in which a Floating Diffusion Region is Shared Among Adjacent Pixels]

Figure 58:
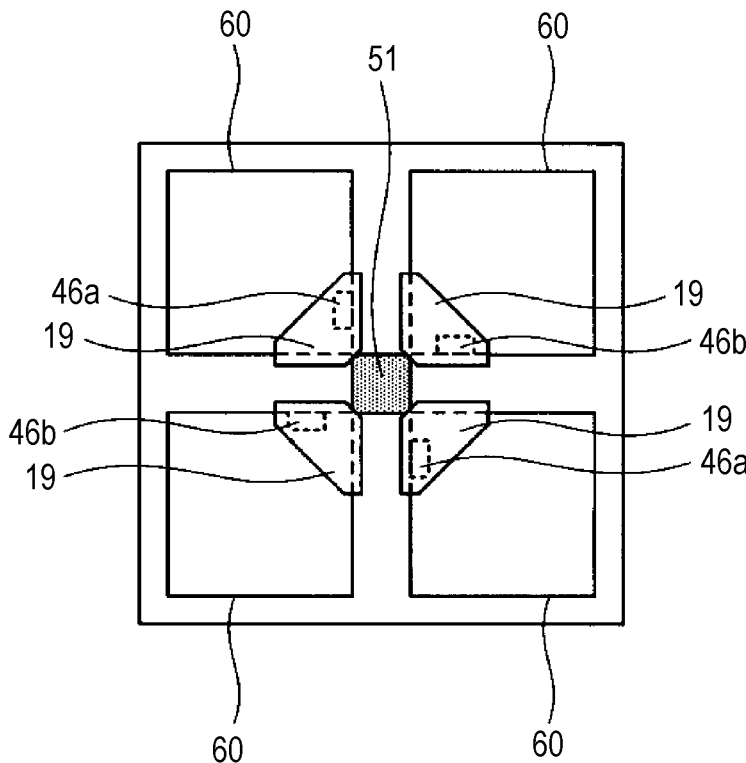
FIG. 58 a schematic planar configuration view of a relevant part of a solid-state imaging device according to Embodiment 45 of the invention.

FIG. 58 shows a schematic planar configuration of a solid-state imaging device according to Embodiment 45 of the invention. In FIG. 58, same symbols are given to portions corresponding to FIG. 57, and the repeated explanation is omitted. The present embodiment differs from Embodiment 44 in a configuration of the vertical gate electrode.

According to the embodiment, in pixels formed on one of diagonal lines, the vertical gate electrode 46a is formed under the planar gate electrode 19 as well as along one edge extending in the vertical direction at the outer peripheral portion of the photodiode region 60. On the other hand, in pixels formed on the other of diagonal lines, the vertical gate electrode 46b is formed under the planar gate electrode 19 as well as along one edge extending in the horizontal direction at the outer peripheral portion of the photodiode region 60.

Also in the solid-state imaging device having the above configuration, signal charges accumulated in the photodiode PD are transferred along the potential gradient in the photodiode region 60, which is made by application of positive voltage to the vertical gate electrodes 46a, 46b and the planar gate electrode 19. Then, the transferred signal charges are read to the floating diffusion region 51.

In the embodiment, the floating diffusion region 51 is shared among adjacent four pixels, thereby reducing the pixel size.

Also in the solid-state imaging device of the embodiment, the same advantages as Embodiment 1 can be obtained.

Embodiment 46

[Example in which a Floating Diffusion Region is Shared Among Adjacent Pixels]

Figures 59, 60:
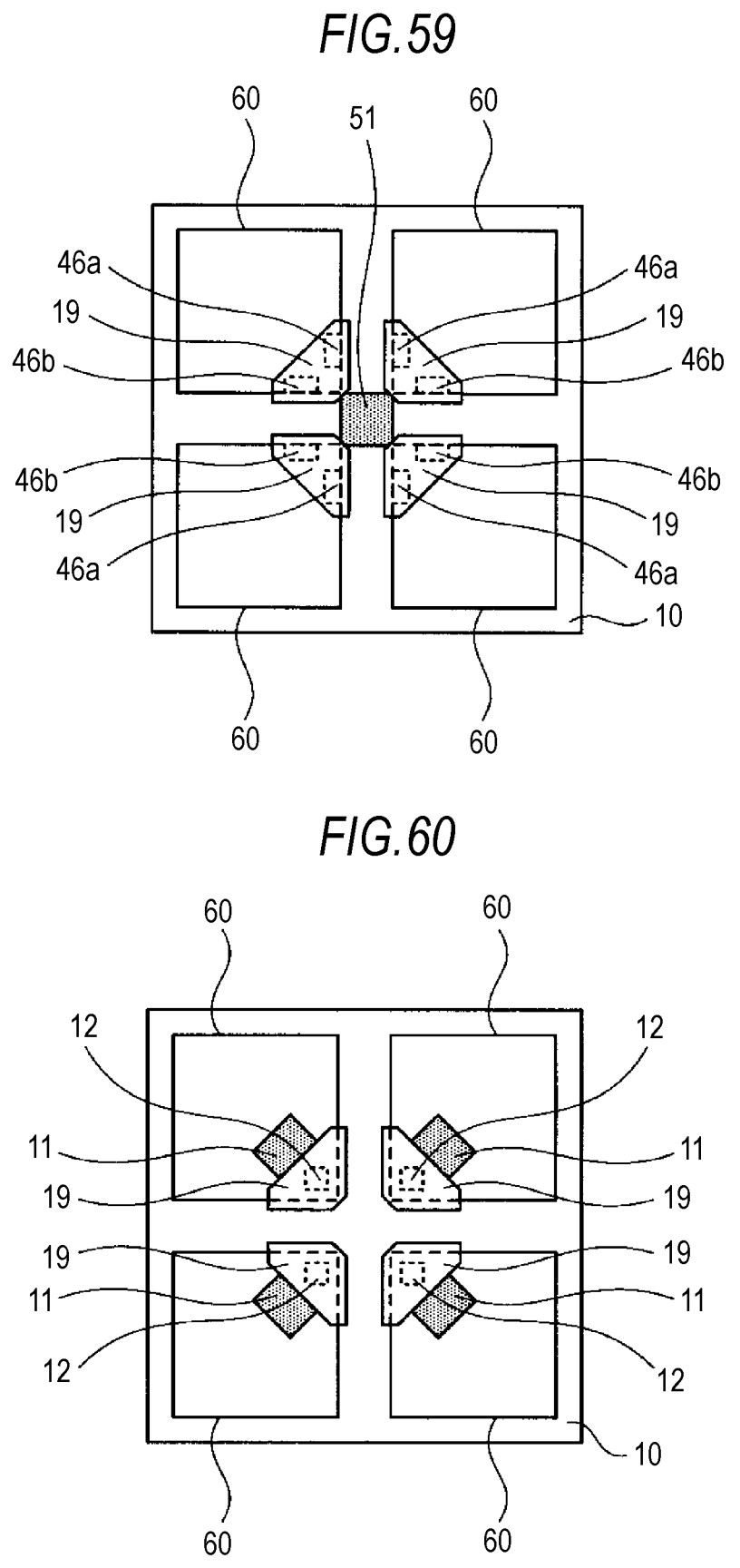

FIG. 59 shows a schematic planar configuration of a solid-state imaging device according to Embodiment 46 of the invention. In FIG. 59, same symbols are given to portions corresponding to FIG. 58, and the repeated explanation is omitted. The present embodiment differs from Embodiment 45 in a configuration of the vertical gate electrode.

In the embodiment, the vertical gate electrode 46a is formed under the planar gate electrode 19 as well as along one edge extending in the vertical direction at the outer peripheral portion of the photodiode region 60. Additionally, the vertical gate electrode 46b is formed under the planar gate electrode 19 as well as along one edge extending in the horizontal direction at the outer peripheral portion of the photodiode region 60.

Also in the solid-state imaging device having the above configuration, signal charges accumulated in the photodiode PD are transferred along the potential gradient in the photodiode region 60, which is made by application of positive voltage to the vertical gate electrodes 46a, 46b and the planar gate electrode 19. Then, the transferred signal charges are read to the floating diffusion region 51.

In the embodiment, the floating diffusion region 51 is shared among adjacent four pixels, thereby reducing the pixel size.

Also in the solid-state imaging device of the embodiment, the same advantages as Embodiment 1 can be obtained.

Embodiment 47

[Example in which a Charge Readout Transistor is Included in Each Pixel]

FIG. 60 shows a schematic planar configuration of a solid-state imaging device according to Embodiment 47 of the invention. In FIG. 60, same symbols are given to portions corresponding to FIG. 18, and the repeated explanation is omitted.

In the solid-state imaging device of the embodiment, the charge readout transistor Tr included in one pixel includes the planar gate electrode 19, the vertical gate electrode 12 integrally formed with the planar gate electrode 19 and the floating diffusion region 11.

The planar gate electrode 19 is formed at the corner portion of the photodiode region 60. The vertical gate electrode 12 is formed under the planar gate electrode 19 positioned at the corner portion of the photodiode region 60 integrally with the planar gate electrode 19. The vertical gate electrode 12 has a cross section of an approximately square shape, which is formed to have a size not enough to cover the whole lower surface of the planar gate electrode 19 formed at the corner portion of the photodiode region 60.

The floating diffusion region 11 is formed at a region inside the photodiode region 60 as well as adjacent to the semiconductor 13 under the planar gate electrode 19.

Also in the solid-state imaging device having the above configuration, signal charges accumulated in the photodiode PD are transferred along the potential gradient in the photodiode region 60, which is made by application of positive voltage to the vertical gate electrode 12 and the planar gate electrode 19. Then, the transferred signal charges are read to the floating diffusion region 11. In the embodiment, the vertical gate electrode 12 is formed to have a size not enough to cover the whole lower surface of the planar gate electrode 23. Therefore, the transfer of signal charges transferred to the floating diffusion region 11 by the potential gradient of the photodiode region 60 is not interrupted by the vertical gate electrode 12.

Also in the solid-state imaging device of the embodiment, the same advantages as Embodiment 1 can be obtained.

Embodiment 48

[Example in which a Charge Readout Transistor is Included in Each Pixel]

Figure 61:
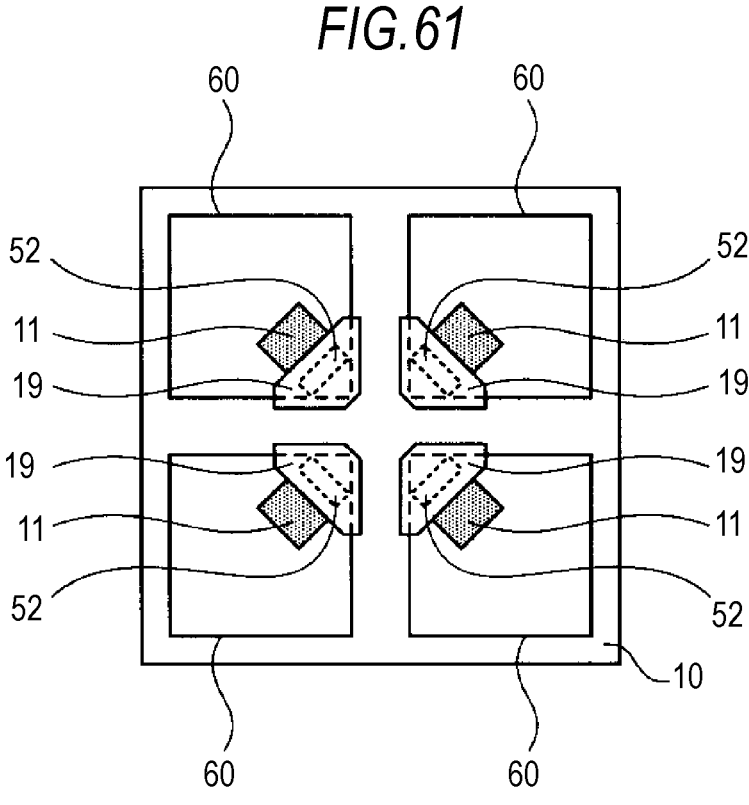
FIG. 61 a schematic planar configuration view of a relevant part of a solid-state imaging device according to Embodiment 48 of the invention.

FIG. 61 shows a schematic planar configuration of a solid-state imaging device according to Embodiment 48 of the invention. In FIG. 61, same symbols are given to portions corresponding to FIG. 60, and the repeated explanation is omitted. The present embodiment differs from Embodiment 47 in a configuration of the vertical gate electrode.

A vertical gate electrode 52 is formed under the planar gate electrode 19 so that a side surface of the vertical gate electrode 52 on the photodiode region 60 side has a larger area.

Also in the solid-state imaging device having the above configuration, signal charges accumulated in the photodiode PD are transferred along the potential gradient in the photodiode region 60, which is made by application of positive voltage to the vertical gate electrode 52 and the planar gate electrode 19. Then, the transferred signal charges are read to the floating diffusion region 11. Since the vertical gate electrode 52 is formed so that the side surface thereof on the photodiode region 60 side has a larger area in the embodiment, larger potential gradient can be formed in the photodiode region 60. Additionally, the floating diffusion region 11 is formed closer to the photodiode region 60 than the vertical gate electrode 52 inside the photodiode region 6 0, therefore, signal charges to be transferred are not interrupted by the vertical gate electrode 52 even when the vertical gate electrode 52 is formed to have a large size as described above.

Also in the solid-state imaging device of the embodiment, the same advantages as Embodiment 1 can be obtained.

Embodiment 49

[Example in which the Planar Gate Electrode is Shared Between Adjacent Pixels]

Figure 62:
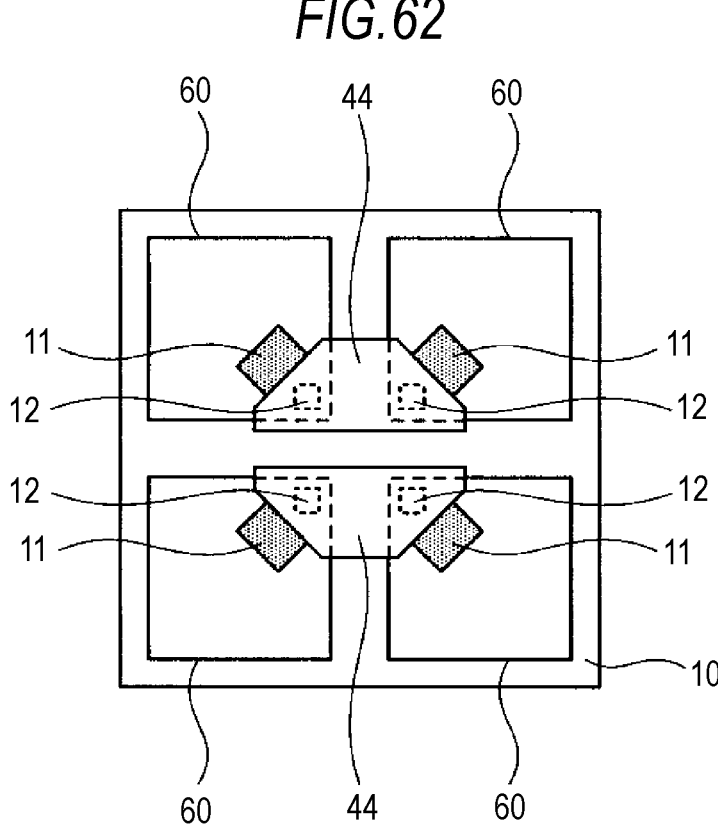
FIG. 62 a schematic planar configuration view of a relevant part of a solid-state imaging device according to Embodiment 49 of the invention.

FIG. 62 shows a schematic planar configuration of a solid-state imaging device according to Embodiment 49 of the invention. In FIG. 62, same symbols are given to portions corresponding to FIG. 47, and the repeated explanation is omitted.

In the embodiment, the charge readout transistor Tr included in one pixel includes the planar gate electrode 44, the vertical gate electrode 12 integrally formed with the planar gate electrode 44 and the floating diffusion region 11.

The planar gate electrode 44 is formed at the corner portion of the photodiode region 60. The planar gate electrode 44 is shared between pixels adjacent in the horizontal direction. The vertical gate electrode 12 is formed under the planar gate electrode 44 positioned at the corner portion of the photodiode region 60, which is integrally formed with the planar gate electrode 44. The vertical gate electrode 12 has a cross section of an approximately square shape, which is formed to have a size not enough to cover the whole lower surface of the planar gate electrode 19 formed at the corner portion of the photodiode region 60.

The floating diffusion region 11 is formed at a region inside the photodiode region 60 as well as adjacent to the semiconductor substrate 13 under the planar gate electrode 44.

Also in the solid-state imaging device having the above configuration, signal charges accumulated in the photodiode PD are transferred along the potential gradient in the photodiode region 60, which is made by application of positive voltage to the vertical gate electrode 12 and the planar gate electrode 44. Then, the transferred signal charges are read to the floating diffusion region 11. In the embodiment, the vertical gate electrode 12 is formed to have a size not enough to cover the whole lower surface of the planar gate electrode 19. Therefore, the transfer of signal charges transferred to the floating diffusion region 11 by the potential gradient of the photodiode region 60 is not interrupted by the vertical gate electrode 12.

In the embodiment, the planar gate electrode 44 is shared between adjacent pixels, thereby reducing the pixel size. Moreover, since the floating diffusion region 11 is formed inside the photodiode region 60 inside the solid-state imaging device of the embodiment, therefore, the pixel size can be reduced.

Also in the solid-state imaging device of the embodiment, the same advantages as Embodiment 1 can be obtained.

Embodiment 50

[Example in which the Planar Gate Electrode is Shared Between Adjacent Pixels]

Figure 63:
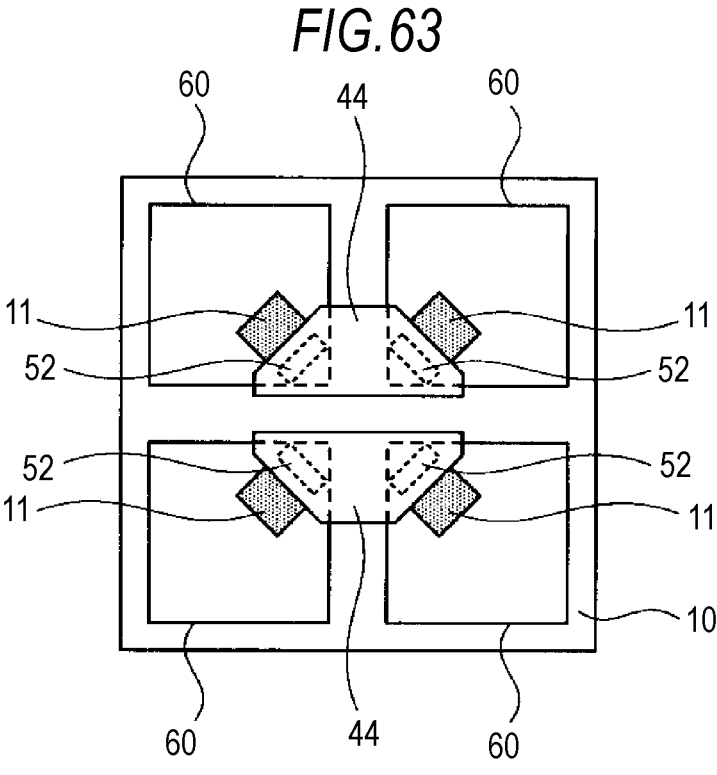
FIG. 63 a schematic planar configuration view of a relevant part of a solid-state imaging device according to Embodiment 50 of the invention.

FIG. 63 shows a schematic planar configuration of a solid-state imaging device according to Embodiment 50 of the invention. In FIG. 63, same symbols are given to portions corresponding to FIG. 62, and the repeated explanation is omitted.

The present embodiment differs from Embodiment 49 in a configuration of the vertical gate electrode.

A vertical gate electrode 52 is formed under the planar gate electrode 44 so that a side surface of the vertical gate electrode 52 on the photodiode region 60 side has a larger area.

Also in the solid-state imaging device having the above configuration, signal charges accumulated in the photodiode PD are transferred along the potential gradient in the photodiode region 60, which is made by application of positive voltage to the vertical gate electrode 52 and the planar gate electrode 44. Then, the transferred signal charges are read to the floating diffusion region 11. Since the vertical gate electrode 52 is formed so that the side surface thereof on the photodiode region 60 side has a larger area in the embodiment, larger potential gradient can be formed in the photodiode region 60. Additionally, the floating diffusion region

11 is formed closer to the photodiode region 60 than the vertical gate electrode 52 inside the photodiode region 6 0, therefore, signal charges to be transferred are not interrupted by the vertical gate electrode 52 even when the vertical gate electrode 52 is formed to have a larger size as described above.

In the embodiment, the planar gate electrode 44 is shared between adjacent pixels, thereby reducing the pixel size.

Also in the solid-state imaging device of the embodiment, the same advantages as Embodiment 1 can be obtained.

Embodiment 51

[Example in which a Planar Gate Electrode is Shared Between Adjacent Pixels]

Figure 64:
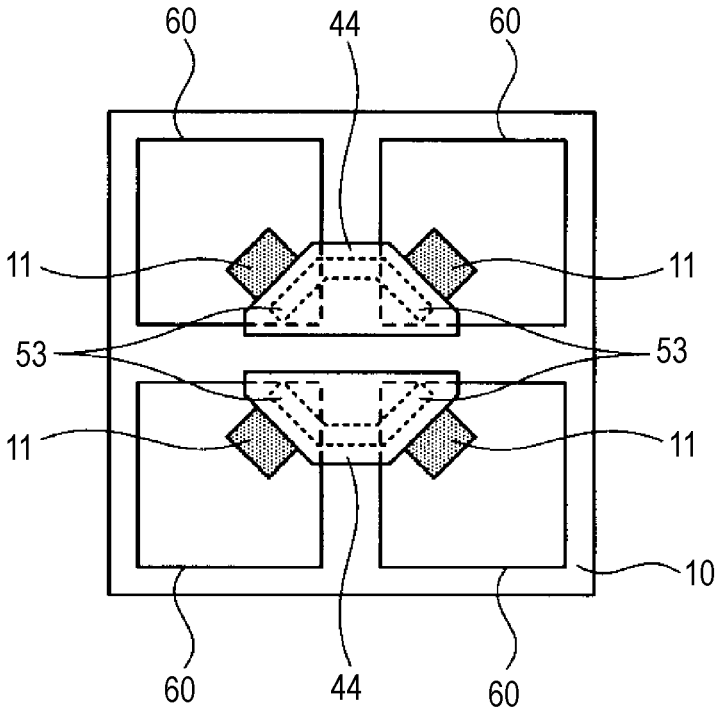
FIG. 64 a schematic planar configuration view of a relevant part of a solid-state imaging device according to Embodiment 51 of the invention.

FIG. 64 shows a schematic planar configuration of a solid-state imaging device according to Embodiment 51 of the invention. In FIG. 64, same symbols are given to portions corresponding to FIG. 63, and the repeated explanation is omitted. The present embodiment differs from Embodiment 50 in a configuration of the vertical gate electrode.

A vertical gate electrode 53 of the embodiment is formed under the planar gate electrode 44 so that a side surface of the vertical gate electrode 53 on the photodiode region 60 side has a larger area. The vertical gate electrode 53 is formed extending to pixels adjacent in the horizontal direction under the planar gate electrode 44 formed so as to be shared between pixels adjacent in the horizontal direction.

Also in the solid-state imaging device having the above configuration, signal charges accumulated in the photodiode PD are transferred along the potential gradient in the photodiode region 60, which is made by application of positive voltage to the vertical gate electrode 53 and the planar gate electrode 44. Then, the transferred signal charges are read to the floating diffusion region 11. Since the vertical gate electrode 53 is formed so that the side surface thereof on the photodiode region 60 side has a larger area in the embodiment, larger potential gradient can be formed in the photodiode region 60. Additionally, the floating region 11 is formed closer to the photodiode region 60 than the vertical gate electrode 53 inside the photodiode region 60, therefore, signal charges to be transferred are not interrupted by the vertical gate electrode 53 even when the vertical gate electrode 53 is formed to have a larger size as described above.

In the embodiment, the planar gate electrode 44 is shared between adjacent two pixels, thereby reducing the pixel size.

Also in the solid-state imaging device of the embodiment, the same advantages as Embodiment 1 can be obtained.

Embodiment 52

[Example in which a Planar Gate Electrode is Shared Among Adjacent Pixels]

Figure 65:
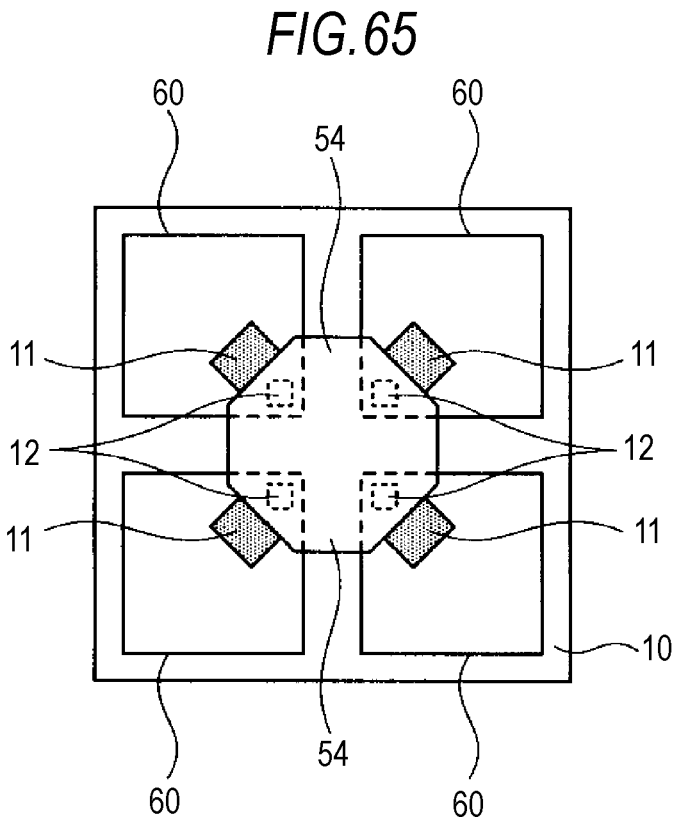
FIG. 65 a schematic planar configuration view of a relevant part of a solid-state imaging device according to Embodiment 52 of the invention.

FIG. 65 shows a schematic planar configuration of a solid-state imaging device according to Embodiment 52 of the invention. In FIG. 65, same symbols are given to portions corresponding to FIG. 62, and the repeated explanation is omitted.

In the embodiment, the charge readout transfer Tr included in one pixel includes a planar gate electrode 54, the vertical gate electrode 12 integrally formed with the planar gate electrode 54 and the floating diffusion region 11.

The planar gate electrode 54 is formed at the corner portion of the photodiode 60. The planar gate electrode 54 is shared between pixels adjacent in the horizontal direction as well as between pixels adjacent in the vertical direction. That is, the planar gate electrode 54 is shared among four pixels. Additionally, the vertical gate electrode 12 is formed under the planar gate electrode 54 positioned at the corner portion of the photodiode 60 integrally with the planar gate electrode 54.

The floating diffusion region 11 is formed at a region inside the photodiode region 60 as well as adjacent to the semiconductor substrate 13 under the planar gate electrode 54.

Also in the solid-state imaging device having the above configuration, signal charges accumulated in the photodiode PD are transferred along the potential gradient in the photodiode region 60, which is made by application of positive voltage to the vertical gate electrode 12 and the planar gate electrode 54. Then, the transferred signal charges are read to the floating diffusion region 11.

In the embodiment, the planar gate electrode 54 is shared among adjacent four pixels, thereby reducing the pixel size.

Also in the solid-state imaging device of the embodiment, the same advantages as Embodiment 1 can be obtained.

Embodiment 53

[Example in which a Planar Gate Electrode is Shared Among Adjacent Pixels]

Figure 66:
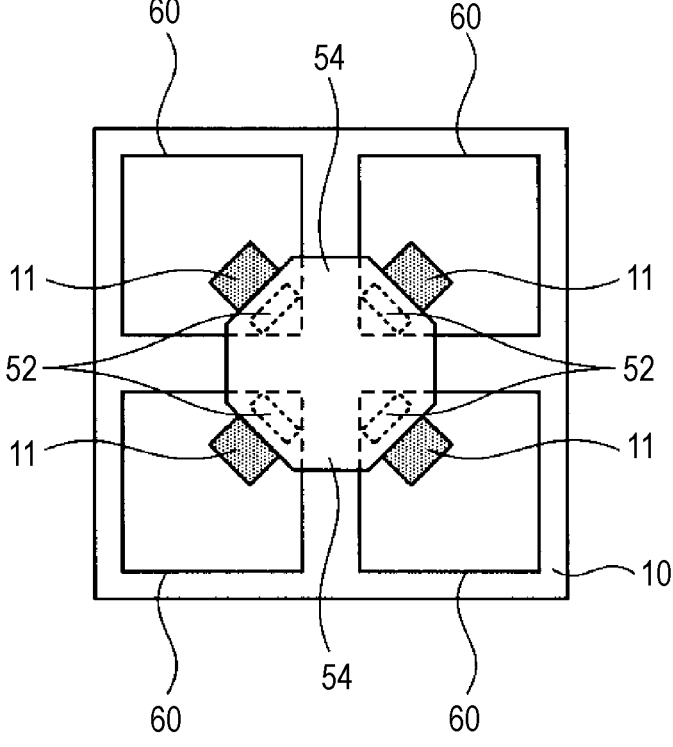
FIG. 66 a schematic planar configuration view of a relevant part of a solid-state imaging device according to Embodiment 53 of the invention.

FIG. 66 shows a schematic planar configuration of a solid-state imaging device according to Embodiment 53 of the invention. In FIG. 66, same symbols are given to portions corresponding to FIG. 65, and the repeated explanation is omitted. The present embodiment differs from Embodiment 52 in a configuration of the vertical gate electrode.

The vertical gate electrode 52 is formed under the planar gate electrode 54 so that a side surface of the vertical gate electrode 52 on the photodiode region 60 side has a larger area.

Also in the solid-state imaging device having the above configuration, signal charges accumulated in the photodiode PD are transferred along the potential gradient in the photodiode region 60, which is made by application of positive voltage to the vertical gate electrode 52 and the planar gate electrode 54. Then, the transferred signal charges are read to the floating diffusion region 11. Since the vertical gate electrode 52 is formed so that the side surface thereof on the photodiode region 60 side has a larger area in the embodiment, larger potential gradient can be formed in the photodiode region 60. Additionally, the floating diffusion region 11 is formed closer to the photodiode region 60 than the vertical gate electrode 52 inside the photodiode region 6 0, therefore, signal charges to be transferred are not interrupted by the vertical gate electrode 52 even when the vertical gate electrode 52 is formed to have a larger size as described above.

In the embodiment, the planar gate electrode 54 is shared among adjacent four pixels, thereby reducing the pixel size.

Also in the solid-state imaging device of the embodiment, the same advantages as Embodiment 1 can be obtained.

Embodiment 54

[Example in which a Planar Gate Electrode is Shared Among Adjacent Pixels]

Figure 67:
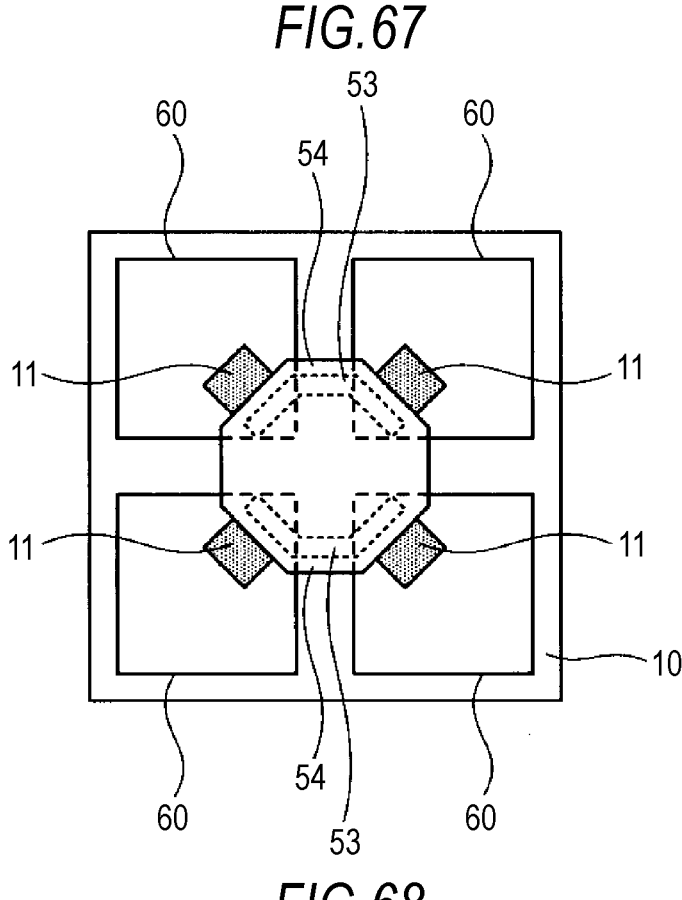
FIG. 67 a schematic planar configuration view of a relevant part of a solid-state imaging device according to Embodiment 54 of the invention.

FIG. 67 shows a schematic planar configuration of a solid-state imaging device according to Embodiment 54 of the invention. In FIG. 67, same symbols are given to portions corresponding to FIG. 66, and the repeated explanation is omitted. The present embodiment differs from Embodiment 53 in a configuration of the vertical gate electrode.

The vertical gate electrode 53 is formed under the planar gate electrode 54 so that a side surface of the vertical gate electrode 53 on the photodiode region 60 side has a larger area. The vertical gate electrode 53 is formed extending to pixels adjacent in the horizontal direction under the planar gate electrode 54 which is formed so as to be shared between pixels adjacent in the horizontal direction.

Also in the solid-state imaging device having the above configuration, signal charges accumulated in the photodiode PD are transferred along the potential gradient in the photodiode region 60, which is made by application of positive voltage to the vertical gate electrode 53 and the planar gate electrode 54. Then, the transferred signal charges are read to the floating diffusion region 11. Since the vertical gate electrode 53 is formed so that the side surface thereof on the photodiode region 60 side has a larger area in the embodiment, larger potential gradient can be formed in the photodiode region 60. Additionally, the floating diffusion region 11 is formed closer to the photodiode region 60 than the vertical gate electrode 53 even when the vertical gate electrode 53 is formed to have a larger size as described above.

In the embodiment, the planar gate electrode 54 is shared among adjacent four pixels, thereby reducing the pixel size.

Also in the solid-state imaging device of the embodiment, the same advantages as Embodiment 1 can be obtained.

Embodiment 55

[Example in which a Planar Gate Electrode is Shared Among Adjacent Pixels]

Figure 68:
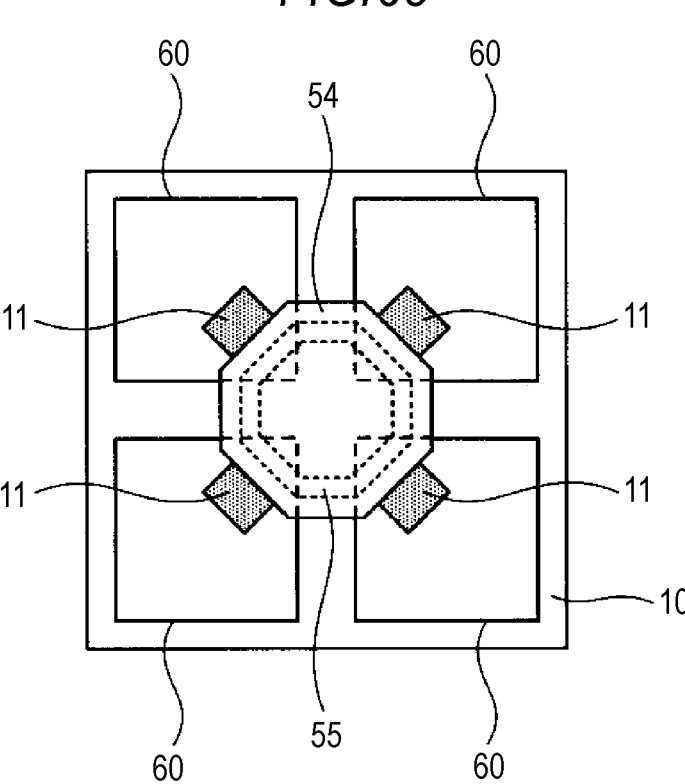
FIG. 68 a schematic planar configuration view of a relevant part of a solid-state imaging device according to Embodiment 55 of the invention.

FIG. 68 shows a schematic planar configuration of a solid-state imaging device according to Embodiment 55 of the invention. In FIG. 68, same symbols are given to portions corresponding to FIG. 67, and the repeated explanation is omitted. The present embodiment differs from Embodiment 54 in a configuration of the vertical gate electrode.

A vertical gate electrode 55 of the embodiment is formed under the planar gate electrode 54 so that a side surface of the vertical gate electrode 55 on the photodiode region 60 side has a larger area. The vertical gate electrode 55 is formed extending to pixels adjacent in the horizontal direction as well as in the vertical direction under the planar gate electrode 54 which is formed so as to be shared among pixels adjacent in the horizontal direction as well as in the vertical direction.

Also in the solid-state imaging device having the above configuration, signal charges accumulated in the photodiode PD are transferred along the potential gradient in the photodiode region 60, which is made by application of positive voltage to the vertical gate electrode 55 and the planar gate electrode 54. Then, the transferred signal charges are read to the floating diffusion region 11. Since the vertical gate electrode 55 is formed so that the side surface thereof on the photodiode region 60 side has a larger area in the embodiment, larger potential gradient can be formed in the photodiode region 60. Additionally, the floating diffusion region 11 is formed closer to the photodiode region 60 than the vertical gate electrode 55 inside the photodiode region 6 0, therefore, signal charges to be transferred are not interrupted by the vertical gate electrode 55 even when the vertical gate electrode 55 is formed to have a larger size as described above.

In the embodiment, the planar gate electrode 54 is shared among adjacent four pixels, thereby reducing the pixel size.

Also in the solid-state imaging device of the embodiment, the same advantages as Embodiment 1 can be obtained.

Embodiment 56

[Example Including Two Layers of Photodiodes]

Figures 69, 70:
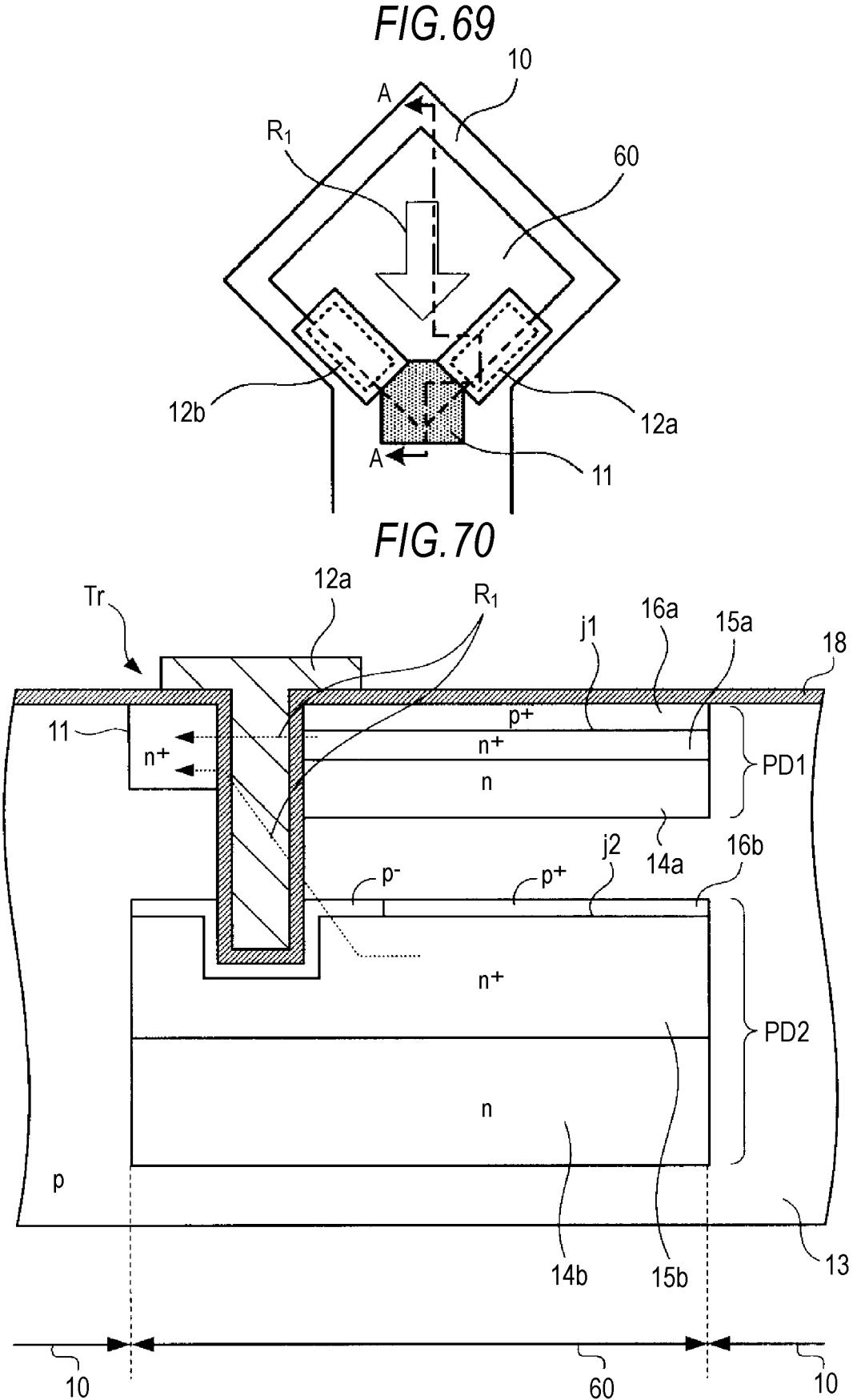
FIG. 69 a schematic planar configuration view of a relevant part of a solid-state imaging device according to Embodiment 56 of the invention.
FIG. 70 is a schematic cross-sectional configuration view taken along A-A line of FIG. 69.

FIG. 69 shows a schematic planar configuration of a solid-state imaging device according to Embodiment 56 of the invention and FIG. 70 shows a cross-sectional view taken along A-A line of FIG. 69. In FIG. 69 and FIG. 70, same symbols are given to portions corresponding to FIG. 6 and FIG. 7, and the repeated explanation is omitted. The present embodiment differs from Embodiment 1 in a configuration of the photodiode.

As shown in FIG. 70, in the solid-state imaging device of the embodiment, a first photodiode PD1 and a second photodiode PD2 are formed by being stacked in the depth direction of the semiconductor substrate 13 inside the photodiode region 60 of the semiconductor substrate 13. The first photodiode PD1 includes a p-type high concentration impurity region (p+ region) 16a, an n-type high concentration impurity region (n+ region) 15a and an n-type impurity region (n region) 14a. The first photodiode PD1 is mainly formed by a pn junction "j1" which is a joint surface between the p+ region 16a and the n+ region 15a. The second photodiode PD2 includes a p+ region 16b, an n+ region 15b and an n region 14b which are sequentially formed under the n+ region 15a included in the photodiode PD1. The second photodiode PD2 is mainly formed by a pn junction "j2" which is a joint surface between the p+ region 16b and the n+ region 15b.

As described above, in the embodiment, the photodiode formed within the photodiode region 60 has a configuration in which two layers of photodiodes are stacked in the depth direction of the semiconductor substrate 13.

The vertical gate electrodes 12a, 12b are formed by being buried in the semiconductor substrate 13 from the surface of the semiconductor substrate 13 to the depth where the electrodes touch the pn junction "j2" of the second photodiode PD2 formed at a deep position in the semiconductor substrate 13 through a gate insulating film 18.

In the solid-state imaging device having the above configuration, positive voltage is applied to the vertical gate electrodes 12a, 12b in the same manner as Embodiment 1, thereby changing the potential gradient in the photodiode region 60. Then, signal charges accumulated in the first photodiode PD1 and the second photodiode PD2 are transferred in the direction shown by an arrow R1 at the same time along the potential gradient in the photodiode region 60. Consequently, the signal charges are read to the floating diffusion region 11.

Also in the solid-state imaging device of the embodiment, the same advantages as Embodiment 1 can be obtained.

Furthermore, the solid-state imaging device of the embodiment has the configuration in which the two photodiodes of the first photodiode PD1 and the second photodiode PD2 are stacked inside the photodiode region 60. Accordingly, the saturation charge amount (Qs) in the photodiode region 60 is increased. Since signal charges accumulated in the first photodiode PD1 and the second photodiode PD2 are read at the same time, sensitivity can be improved.

Though the stacked structure including two photodiodes of the first photodiode PD1 and the second photodiode PD2 is applied in the embodiment, it is also preferable that plural layers including more than two layers can be stacked. In that case, the vertical gate electrodes 12a, 12b are formed so as to reach the pn junction of a photodiode which is formed at the deepest position from the surface side of the semiconductor substrate 13.

As described above, the configuration in which plural photodiodes are stacked in the depth direction of the semiconductor substrate 13 can be applied to examples in which the floating diffusion region is not included inside the photodiode region in Embodiments 2 to 55. Since the saturation charge amount (Qs) in the photodiode region 60 is increased also in these cases, sensitivity can be improved.

In the solid-state imaging devices according to above described Embodiments 1 to 55, cases in which the invention is applied to the image sensor in which unit pixels detecting signal charges corresponding to the light amount of visible light as physical quantity are arranged in a matrix state have been cited and explained. However, the application of the invention is not limited to the image sensor, and it is possible that the invention is applied to all column-type solid-state imaging devices in which column circuits are arranged at respective pixel columns in a pixel array portion.

Additionally, the application of the invention is not limited to the solid-state imaging device in which distribution of the incident light amount of visible light is detected and imaged as an image, and it is possible that the invention is applied to a solid-state imaging device in which distribution of the incident light amount of infrared rays, X-rays or particles is imaged as an image. In a broad sense, the invention can be also applied to all solid-state imaging devices (physical-quantity distribution detection devices) such as a fingerprint detection sensor which detects distribution of other physical quantities such as pressure or capacitance and images the distribution as an image.

Moreover, the invention is not limited to the solid-state imaging device which reads pixel signals from respective unit pixels by scanning respective unit pixels in the pixel array portion by the row. For example, the invention can be also applied to an X-Y address type solid-state imaging device which selects an arbitrary pixel by the pixel and reads signals by the pixel from the selected pixel.

The solid-state imaging device may be formed as a one-chip or may be formed as a module state having imaging functions, in which an imaging unit, a signal processing unit or an optical system are integrally packaged.

The invention is not limited to the solid-state imaging device but can be applied to an imaging apparatus. Here, the imaging apparatus means an electronic apparatus having imaging functions, for example, camera systems such as a digital still camera and a digital video camera, a cellular phone, and the like. There is a case in which the module state to be mounted on the electronic apparatus, namely, a camera module is defined as an imaging apparatus.

Embodiment 57

[Electronic Apparatus]

Hereinafter, an embodiment in which the solid-state imaging device according to the above embodiments of the invention is used in an electronic apparatus is shown. In the following description, an example in which a solid-state imaging device 1 applying any one of Embodiments 1 to 56 is used for a camera will be explained.

Figure 71:
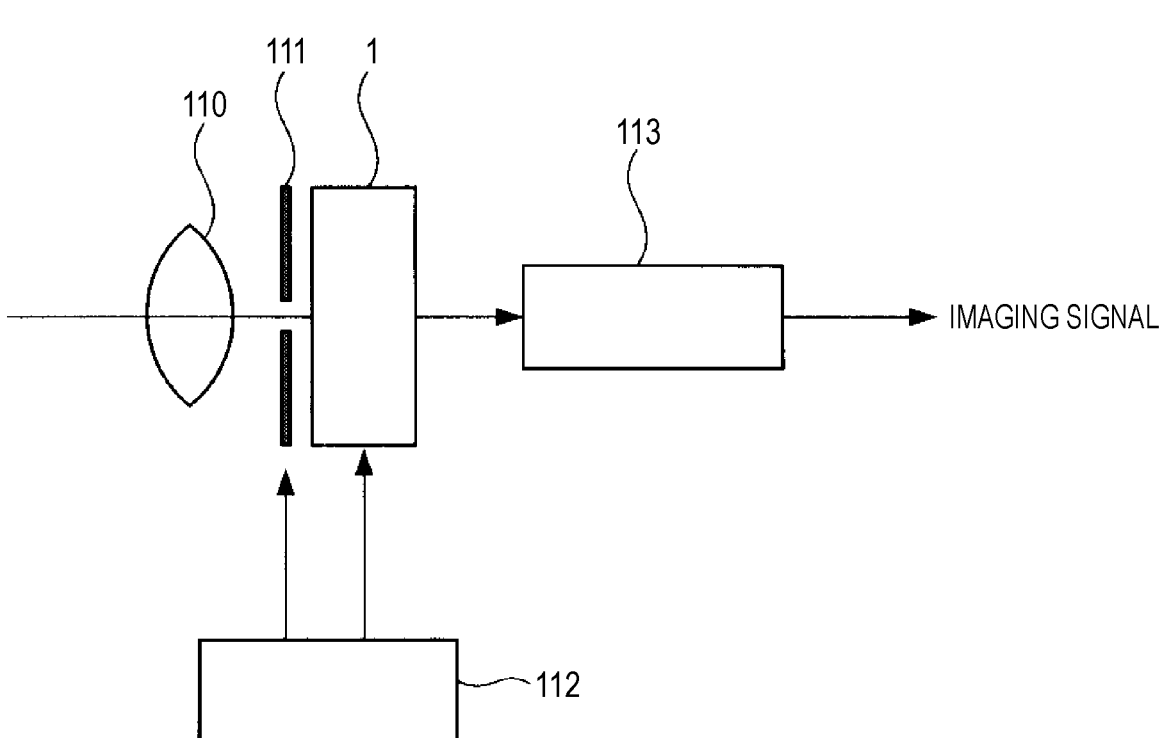
FIG. 71 is an electronic apparatus according to Embodiment 57 of the invention.

FIG. 71 shows a schematic planar configuration of a camera according to Embodiment 57 of the invention. The camera according to the embodiment is, for example, a video camera which can image still pictures or moving pictures. A camera according to the embodiment includes the solid-state imaging device 1, an optical lens 110, a shutter device 111, a drive circuit 112 and a signal processing circuit 113. The solid-state imaging device according to any one of Embodiments 1 to 55 can be applied to the solid-state imaging device 1.

The optical lens 110 images an image light (incident light) from a subject on an imaging surface of the solid-state imaging device 1. Accordingly, signal charges are accumulated in the solid-state imaging device 1 for a fixed period of time. The optical lens 110 may be an optical lens system including plural optical lenses.

The shutter device 111 controls an illumination period and a shielding period of light with respect to the solid-state imaging device 1.

The drive circuit 112 supplies a drive signal for controlling transfer operation of the solid-state imaging device 1 and shutter operation of the shutter device 111. The signal transfer is performed by a drive signal (timing signal) supplied from the drive circuit 112. The signal processing circuit 113 performs various signal processing. Video signals which have received signal processing are stored in a storage medium such as a memory or outputted to a monitor.

In the solid-state imaging device 1 a used for the camera according to the embodiment, the loss of the saturation charge amount (Qs) at the central portion of the photodiode can be reduced, thereby improving the saturation charge amount (Qs) and sensitivity. Additionally, the solid-state imaging device in which the configuration of the charge readout transistor is shared between adjacent pixels is used, thereby reducing the pixel size. Accordingly, it is possible to reduce the size of the camera in the camera according to the embodiment as well as it is possible to obtain the camera having higher image quality. That is, miniaturization, high resolution and high quality of the electronic apparatus can be realized.

A schematic configuration of an embodiment of a solid-state imaging device, namely, a CMOS solid-state imaging device to which the invention is applied is shown in FIG. 5. The solid-state imaging device 1 of the embodiment includes a pixel portion 3 (so-called imaging area) in which pixels 2 including plural photoelectric conversion elements are two-dimensionally arranged on a semiconductor substrate 1011, for example, a silicon substrate and a peripheral circuit portion. The pixel 2 includes a photodiode to be, for example, a photoelectric conversion element and plural pixel transistors (so-called MOS transistors) The plural pixel transistors include, for example, three transistors, for example, a transfer transistor, a reset transistor and an amplification transistor. It may include four transistors by adding a selection transistor. An equivalent circuit of a unit pixel is the same as a common configuration. An example of the unit pixel will be shown later.

The peripheral circuit portion includes a vertical drive circuit 4, column signal processing circuits 5, a horizontal drive circuit 6, an output circuit 7, a control circuit 8 and the like.

The control circuit 8 generates a clock signal, a control signal and the like to be references of operations of the vertical drive circuit 4, the column signal processing circuits 5, the horizontal drive circuit 6 and the like based on a vertical synchronization signal, a horizontal synchronization signal and a master clock, inputting these signals to the vertical drive circuit 4, the column signal processing circuits 5, the horizontal drive circuit 6 and the like.

The vertical drive circuit 4 includes, for example, a shift register, selectively scanning respective pixels 2 in the pixel portion 3 by the row sequentially in the vertical direction, supplying pixel signals based on signal charges generated in accordance with the light receiving amount, for example, in photodiodes to be photoelectric conversion elements of respective pixels 2 to the column signal processing circuits 5 through vertical signal lines 9.

The column signal processing circuits 5 are arranged, for example, at respective columns of pixels 2, performing signal processing such as noise removal to signals outputted from pixels 2 of one row by the pixel column using a signal from black reference pixels (formed around an effective pixel area). That is, the column signal processing circuits 5 perform signal processing such as a CDS and signal amplification for removing fixed pattern noise peculiar to the pixels 2. Horizontal selection switches (not shown) are provided at output stages of the column signal processing circuits 5 between the circuits 5 and a horizontal signal line 1010.

The horizontal drive circuit 6 includes, for example, a shift register, sequentially selecting respective column signal processing circuits 5 by sequentially outputting horizontal scanning pulses to thereby allow respective column signal processing circuits 5 to output pixel signals to a horizontal signal line 1010.

The output circuit 7 performs signal processing to signals sequentially supplied from respective column signal processing circuits 5 through the horizontal signal line 1010 and output the signals.

Figure 72:
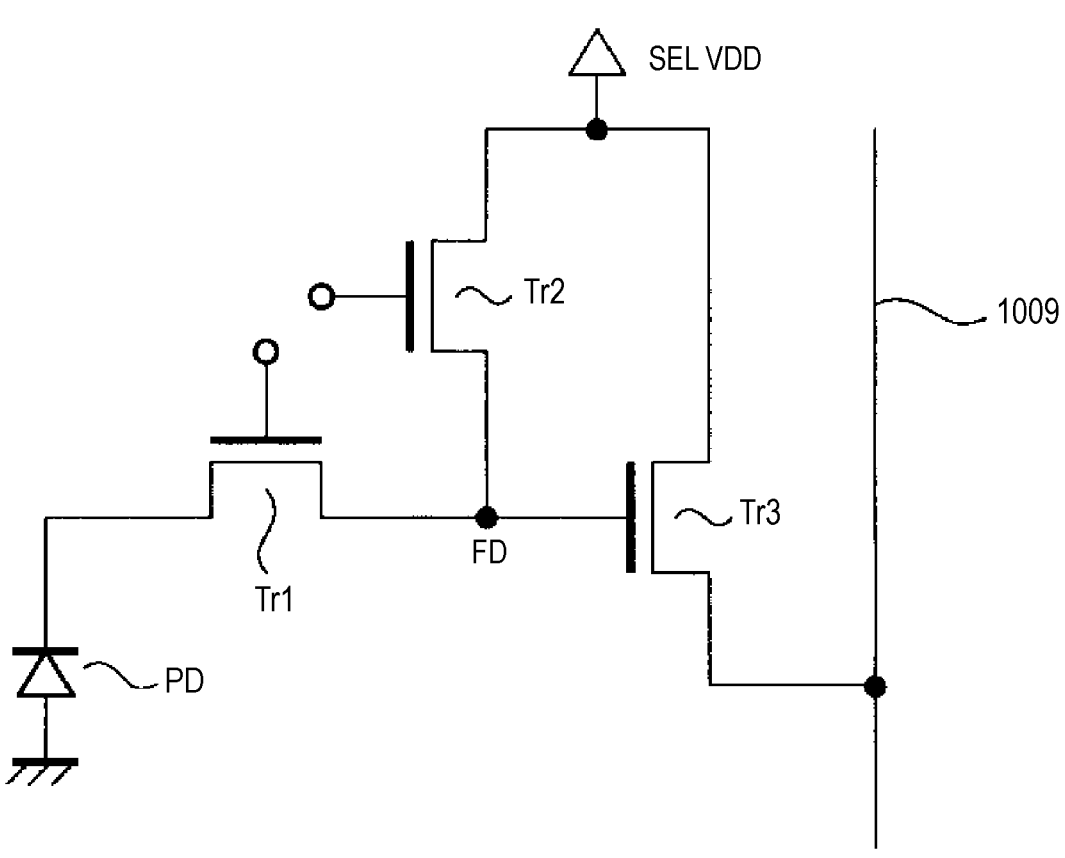
FIG. 72 is an equivalent circuit showing an example of a unit pixel in FIG. 5.

FIG. 72 shows an equivalent circuit of a unit pixel. A unit pixel 1002 according to an example of the circuit includes a photodiode PD which is one photoelectric conversion element and three pixel transistors which are a transfer transistor Tr1, a reset transistor Tr2 and an amplification transistor Tr3. These transistors Tr1 to Tr3 use n-channel MOS transistors in the example.

The transfer transistor Tr1 is connected between a cathod of the photodiode PD and a floating diffusion (FD). Signal charges (electrons in the example) which have been photo-electrically converted and accumulated in the photodiode PD are transferred to the floating diffusion (FD) by application of a transfer pulse to a transfer gate.

In the reset transistor Tr2, a drain thereof is connected to a selection power supply SELVDD and a source thereof is connected to the floating diffusion (FD). Before the transfer of signal charges from the photodiode PD to the floating diffusion (FD), a reset pulse is applied to a reset gate to thereby reset the potential of the floating diffusion (FD). The selection power supply SELVDD is a power supply which selectively takes a VDD level and a GND level as a power supply voltage.

The amplification transistor Tr3 has a source follower configuration, in which an amplification gate thereof is connected to the floating diffusion (FD), a drain thereof is connected to the selection power supply SELVDD and a source thereof is connected to a vertical signal line 1009. When the selection power supply SELVDD is in the VDD level, the circuit is in the operation state and a pixel 1002 is selected. The potential of the floating diffusion (FD) which has been reset by the reset transistor Tr2 is outputted to the vertical signal line 1009 as a reset level. Furthermore, the potential of the floating diffusion (FD) to which signal charges have been transferred by the transfer transistor Tr1 is outputted to the vertical signal line 1009 as a signal level.

When the solid-state imaging device of the embodiment is configured as a back-illuminated type in which light is incident from the back side of the substrate, a multilevel-wiring layer is formed at an upper side of the surface of the semiconductor substrate in which a pixel portion 1003 and a peripheral circuit portion are formed through an interlayer insulating film, and the back side will be a light incident surface (so-called light receiving surface). Over the pixel portion 1003 on the back side, on-chip color filters and further on-chip micro lenses are formed through a planarization film.

When the solid-state imaging device of the embodiment is configured as a front-illuminated type in which light is incident from the front surface side of the substrate, a multilevel-wiring layer is formed at an upper side of the surface of the substrate in which a pixel portion 1003 and a peripheral circuit portion are formed through an interlayer insulating film. In the pixel portion 1003, on-chip color filters and further on-chip micro lenses are formed over the multilevel-wiring layer through a planarization film.

Embodiment 58

[Configuration of a Solid-State Imaging Device]

Figure 73:
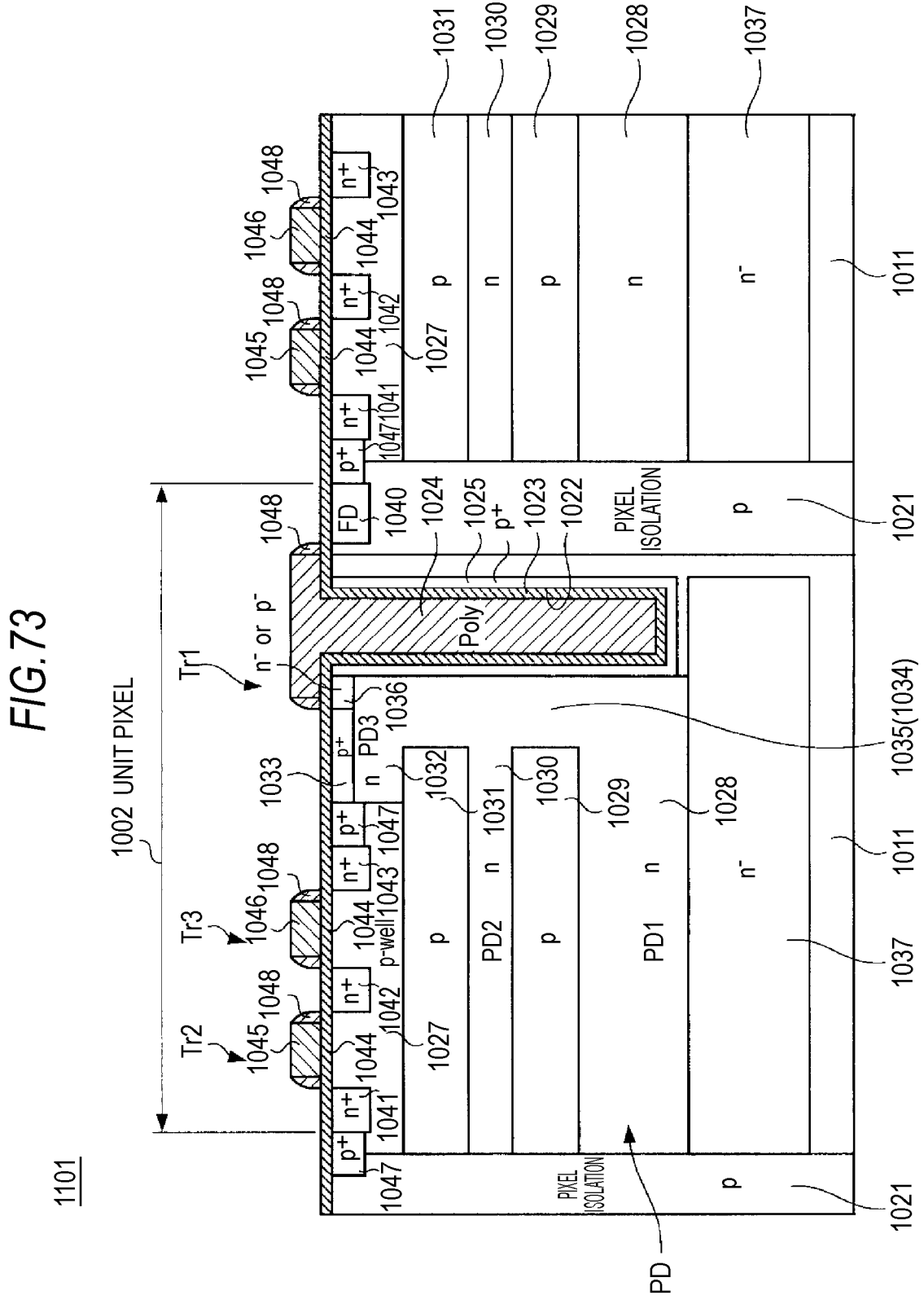
FIG. 73 is a configuration view of a relevant part of a solid-state imaging device according to Embodiment 58 of the invention.

FIG. 73 shows a solid-state imaging device according to Embodiment 58 of the invention. FIG. 73 shows a cross-sectional configuration of a relevant part of the pixel portion 1003. In a solid-state imaging device 1101 according to the embodiment, a pixel isolation region 1021 is formed on a first-conductive type, for example, a p-type silicon semiconductor substrate 1011, and the unit pixel 1002 including photodiodes PD and pixel transistors is formed at a region demarcated by the pixel isolation region 1021.

In the unit pixel 1002, photodiodes PD (PD1, PD2 and PD3) to be plural photoelectric conversion elements are formed in the semiconductor substrate 1011 in a layered manner, and the transfer transistor Tr1 is formed as a vertical transistor. That is, plural layers of photodiodes PD (PD1, PD2 and PD3) are formed by alternately stacking an n-type semiconductor region which is a second conductive type and a p-type semiconductor region which is a first conductive type in the depth direction of the semiconductor substrate 1011. The pixel isolation region 1021 can be made by, for example, the p-type semiconductor region.

In the vertical transfer transistor Tr1, a groove portion 1022 vertically extending in the depth direction of the semiconductor substrate 1011, and a columnar transfer gate electrode 1024 is formed by being buried into the groove portion 1022 through a gate insulating film 1023. The transfer gate electrode is formed so that an upper portion thereof protrudes along the surface of the semiconductor substrate 1011, and a floating diffusion (FD) 1040 is formed on the surface of the semiconductor substrate with an n-type semiconductor region so as to close to the protruding portion of the transfer gate. The transfer transistor Tr1 is formed at the end of the unit pixel 2, that is, the end of the photodiode PD (P1I to PD3).

The first photodiode PD1 is configured by including an n-type semiconductor region 1028 and a p-type semiconductor region 1029 thereon so that a pn junction surface is formed at the deepest position of the semiconductor substrate 1011. The second photodiode PD2 is configured by including an n-type semiconductor region 1030 and a p-type semiconductor region 1031 thereon so that a pn junction surface is formed at a position of an intermediate depth in the semiconductor substrate 1011. The third photodiode PD3 is configured by including an n-type semiconductor region 1032 and a p-type semiconductor region 1033 thereon so that a pn junction surface is formed at a position on the surface side of the semiconductor substrate 1011.

The third photodiode PD3 formed on the surface side of the semiconductor substrate 1011 is formed close to the transfer gate electrode 1024 side, leaving a p-type semiconductor well region 1027 in which the reset transistor Tr2 and the amplification transistor Tr3 which are pixel transistors are formed.

At the back side of the semiconductor substrate 1011, an n-type semiconductor region (n-region) 1037 having lower impurity concentration than then-type semiconductor region 1028 is formed from a portion just under the n-type semiconductor region 1028 of the first photodiode PD1 to a portion just under the transfer gate portion.

At the surface of the semiconductor substrate just under the portion of the transfer gate electrode 1024 protruding on the substrate surface, a channel region 1036 leading to the floating diffusion (FD) 1040 is formed so as to be adjacent to the p-type semiconductor region 1033 of the third photodiode PD3. The channel region 1036 is made of, for example, the n-region or the p-region.

The floating diffusion (FD) 1040 is formed on the surface of the semiconductor substrate by self-alignment using a sidewall 1048 as a mask, which is formed at the portion of the transfer gate electrode 1024 protruding on the substrate surface.

Further in the embodiment, an overflow path made of the n-type semiconductor region is formed, which connects n-type semiconductor regions 1028, 1030 and 1032 to one another which will be charge accumulation regions of respective photodiodes PD1 to PD3. Moreover, an ion implantation region for adjusting a gate interface is formed around the transfer gate portion, that is, at an interface between the gate insulating film 1023 formed at an inner surface of the groove portion 1022 and the semiconductor substrate 1011. As the ion implantation region, a p-type semiconductor region 1025 for suppressing dark current is formed in the embodiment.

The p-type semiconductor region 1025 has functions of reconnecting and cancelling out charges (electrons) causing dark current and white defects generating from the interface between the gate insulating film 1023 and the semiconductor substrate 1011 due to crystal defects or deformation at the time of forming the groove portion 1022 using selective etching and the like.

The overflow path 1035 is formed in contact with the p-type semiconductor region 1025 for suppressing dark current, which doubles as a channel region 1034 of the transfer gate portion. The overflow path 1035 has a potential shallower than depleted potentials in then-type semiconductor regions 1028, 1030 and 1032 which are charge accumulation regions of the photodiodes PD (PD1 to PD3) at the time of accumulating charges. The overflow path 1035 also has a deep potential working as the channel region 1034 for transferring signal charges from the photodiodes PD to the floating diffusion (FD) 1040 by a transfer pulse applied to the transfer gate electrode at the time of transferring charges.

The overflow path 1035 has a function of accumulating charges which have not been accumulated in a photodiode PD (charges exceeding the saturation charge amount) at the time of receiving light into an adjacent photodiode PD, exceeding potential of the overflow path 1035.

The overflow path 1035 is formed in contact with the p-type semiconductor region 1025 around the transfer gate portion. The overflow path 1035 is formed between the p-type semiconductor regions 1029, 1031 of the first and second photodiodes PD1, PD2 and the transfer gate portion. That is, the p-type semiconductor regions 1029, 1031 of the photodiodes PD are formed deviated from the transfer gate portion by a necessary distance. In other words, the p-type semiconductor regions 1029, 1031 are formed apart from the transfer gate portion by the width of the overflow path 1035.

In the p-type semiconductor well region 1027 on the surface of the semiconductor substrate 1011, n-type source/drain regions 1041, 1042 and 1043 are formed. One pair of source/drain regions 1041, 1042 among them and a reset gate electrode 1045 formed through a gate insulating film 1044 make up the reset transistor Tr2. The other pair of source/drain regions 1042, 1043 and an amplification gate electrode 1046 formed through the gate insulating film 1044 make up the amplification transistor Tr3. At a necessary position on the surface of the semiconductor substrate 1011, a channel stop region 1047 made of the p-type semiconductor region is formed.

Furthermore, a multilevel-wiring layer in which plural layers of wiring are arranged through an interlayer insulating film is formed on the surface of the semiconductor substrate 1011, though not shown.

The solid-state imaging device 1101 of the embodiment is configured as a back-illuminated type which illuminates light from the back side of the substrate. Accordingly, a p-type semiconductor region for suppressing dark current having high-concentration impurity is formed at the back side of the semiconductor substrate 1011 so as to touch then-type semiconductor region (n-region) 1037. Moreover, on the surface of the p-type semiconductor region, a color filter and an on-chip micro lens are formed through a planarization film.

Explanation of Operation

Next, the operation of the solid-state imaging device 1011 according to Embodiment 58 will be explained. At the time of accumulating charges, incident light is photoelectrically converted and signal charges are generated. The generated signal charges (electrons in the example) are moved to the n-type semiconductor region along the potential gradient and accumulated in the photodiode PD at a position where the potential energy is at the minimum. That is, signal charges are accumulated in any of then-type semiconductor region 1028 of the first photodiode PD1, then-type semiconductor region 1030 of the second photodiode PD2 which are buried into the substrate, and then-type semiconductor region 1032 of the third photodiode PD3 on the surface of the substrate. The respective n-type semiconductor regions 1028, 1030 and 1032 are totally depleted, and signal charges are accumulated into the potentials thereof.

When strong light is incident, signal charges to be generated is increased, which exceed the saturation charge amount of any of then-type semiconductor regions of the photodiodes PD1, PD2 and PD3. When any of the photodiodes PD1, PD2 and PD3 reaches the saturation charge amount, charges exceeding the saturation charge amount exceed the potential of the overflow path 1035 and accumulated in the n-type semiconductor region of the photodiode PD which has not been saturated.

As an example, when then-type semiconductor region 1028 of the first photodiode PD1 reaches the saturation charge amount first, charges exceeding the saturation charge amount are accumulated in then-type semiconductor region 1030 of the adjacent photodiode PD2 through the overflow path 1035. When then-type semiconductor region 1030 of the photodiode PD2 reaches the saturation charge amount, the charges exceeding the saturation charge amount are accumulated in then-type semiconductor region 1032 of the adjacent third photodiode PD3 through the overflow path 1035. Further, when then-type semiconductor region 1032 of the third photodiode PD3 reaches the saturation charge amount, charges exceeding the saturation charge amount flow to the floating diffusion (FD) 1040 through the channel region 1036 and are discharged.

At the time of transferring charges, a transfer pulse (positive voltage in the embodiment) is applied to the transfer gate electrode 1024 of the transfer transistor Tr1 to thereby turn on the transfer transistor Tr1. That is, potentials of the n-type semiconductor regions 1028, 1030 and 1032 of respective photodiodes PD (PD1, PD2 and PD3) and the overflow path 1035 connected to them are modulated by application of the transfer pulse. That is, the potential of the overflow path 1035 becomes deep and the potential gradient is formed toward the transfer gate portion. The signal charges accumulated in any of or all n-type semiconductor regions (1028, 103 0 and 103 2) of the photodiodes PD (PD1 to PD3) are transferred to the transfer gate portion, following the potential gradient. The signal charges which have reached the transfer gate portion are transferred to the channel region 1036 below the transfer gate portion on the surface side of the substrate along the transfer gate portion extending in the vertical direction of the substrate through the overflow path 1035 which has become the transfer channel 1034. After that, the signal charges are moved to the floating diffusion (FD) 1040, following the potential gradient formed in the channel region 1036 below the transfer gate portion on the surface.

In the solid-state imaging device 1101 according to Embodiment 58, plural photodiodes PD (PD1 to PD3) are stacked in the depth direction of the semiconductor substrate 11, and then-type semiconductor regions 1028 to 1032 of respective photodiodes PD1 to PD3 are connected through the overflow path 1035. When any of photodiodes PD reaches the saturation charge amount at the time of accumulating charges, charges exceeding the saturation charge amount are accumulated in another photodiode PD which has not been saturated through the overflow path 1035. According to the configuration, the effective saturation charge amount (Qs) per a unit pixel is increased to thereby increase the dynamic range as well as improve the contrast even when the pixel size is reduced.

The transfer transistor Tr1 is configured as the vertical transistor as well as the transfer transistor Tr1 is formed at the end of the pixel 2, thereby taking the area of the photodiode PD (PD1 to PD3) and increasing the saturation charge amount (Qs) per a unit pixel. The p-type semiconductor region 1025 covering the whole transfer gate portion of the vertical transfer transistor Tr1 is formed, thereby suppressing occurrence of dark current as well as suppressing occurrence of white defects caused by defects existing at side and bottom portions of the vertical transfer transistor Tr1.

The plural photodiodes PD are stacked and the overflow path 1035 is formed between the p-type semiconductor regions 1029, 1031 included in these photodiodes PD and the transfer gate portion. That is, The p-type semiconductor regions 1029, 1031 of the photodiodes PD are formed deviated from the transfer gate portion by a necessary distance. The offset amount is adjusted, thereby completely transfering signal charges accumulated in the photodiodes PD in the vertical direction through the channel region 1034 which doubles as the overflow path 1035. Additionally, it is possible to secure the saturation charge amount (Qs) of charges which can be accumulated in the photodiodes PD. Consequently, it is possible to obtain design of the configuration in which the complete transfer can be realized as well as the saturation charge amount (Qs) can be secured.

[Manufacturing Method of the Solid-State Imaging Device (1)]

FIG. 74 to FIG. 81 show an example of a manufacturing method of a solid-state imaging device 1101 according to Embodiment 58.

Figure 74:
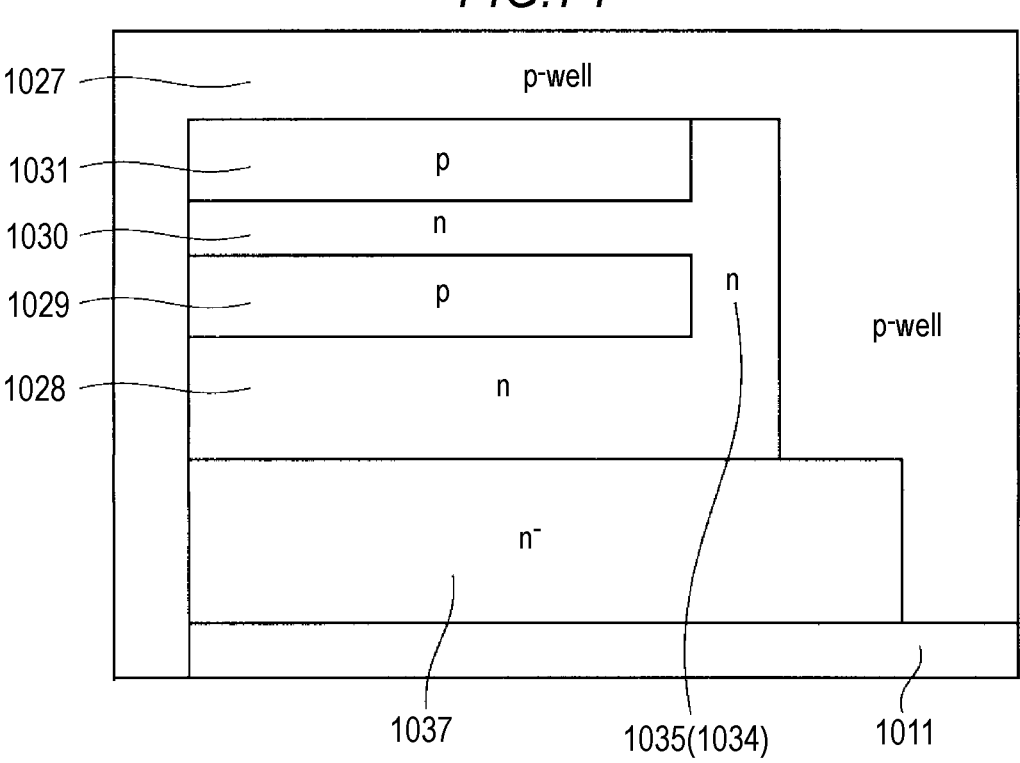
FIG. 74 is a manufacturing process view (No. 1) showing an example of a manufacturing method of a solid-state imaging device according to an embodiment of the invention.

First, as shown in FIG. 74, the p-type semiconductor well region 1027 is formed in the p-type semiconductor substrate 1011. The first photodiode PD1 and the second photodiode PD2 are formed by being stacked in the depth direction of the p-type semiconductor well region 1027. The first photodiode PD1 is formed by stacking then-type semiconductor region 1028 and the p-type semiconductor region 1029 so as to have the pn junction surface at the deepest portion of the semiconductor substrate 1011. The second photodiode PD2 is formed by stacking then-type semiconductor region 1030 and the p-type semiconductor region 1031 so as to form the pn junction surface similarly at an intermediate portion of the semiconductor substrate 1011. These n-type semiconductor regions 1028, 1030 as well as p-type semiconductor regions 1029, 1031 are alternately formed so as to touch to one another.

Additionally, the overflow path 1035 made of then-type semiconductor region is formed, which connects the respective n-type semiconductor regions 1028, 1030 of the photodiodes PD1, PD2. Also, then-type semiconductor region 1037 having lower impurity concentration than then-type semiconductor region 1028, which extends to the bottom portion of the transfer gate portion which is formed later just under the n-type semiconductor region 1028 of the first photodiode PD1 in the semiconductor substrate 1011. The above respective regions are formed by using ion implantation method.

Figure 75:
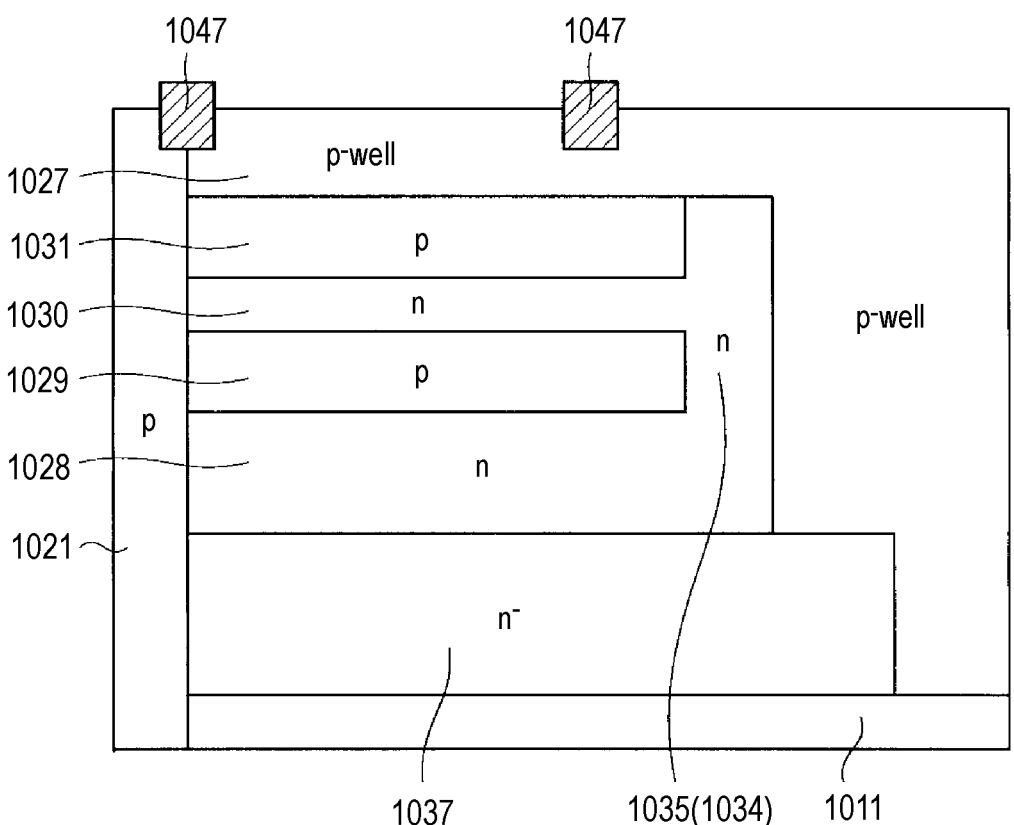
FIG. 75 is a manufacturing process view (No. 2) showing an example of a manufacturing method of a solid-state imaging device according to an embodiment of the invention.

Next, as shown in FIG. 75, the pixel isolation region 1021 made of the p-type semiconductor region for demarcating a unit pixel is formed on the semiconductor substrate 1011 by using the ion implantation method. Additionally, a channel stop region 1047 having a STI structure is formed at a necessary portion on the surface side of the semiconductor substrate 1011. The STI (Shallow Trench Isolation) structure is formed by forming a groove having a necessary depth by the selective etching from the substrate surface and burying the groove with a silicon oxide film. The channel stop region 1047 having the STI structure corresponds to a so-called element isolation region.

Figure 76:
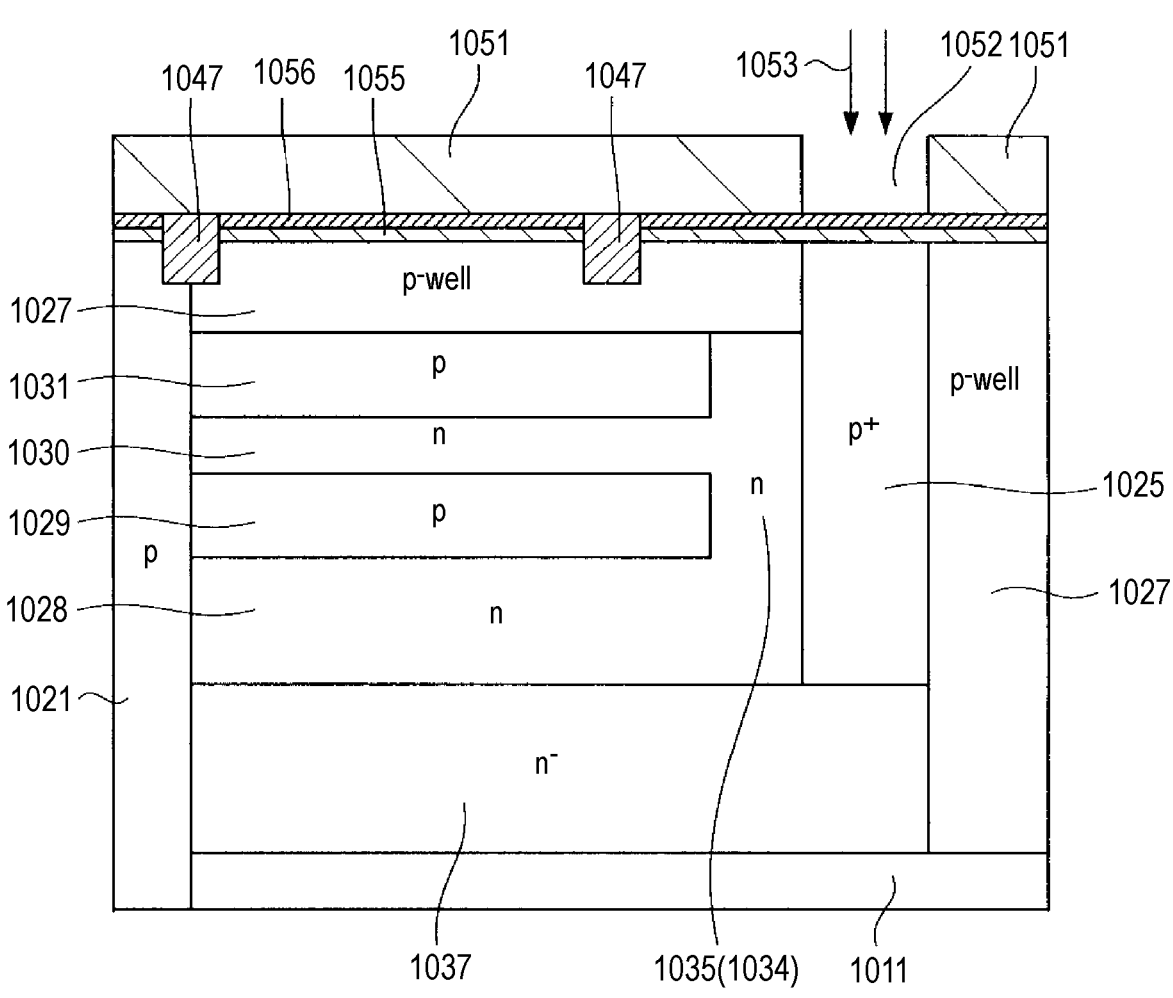
FIG. 76 is a manufacturing process view (No. 3) showing an example of a manufacturing method of a solid-state imaging device according to an embodiment of the invention.

Next, as shown in FIG. 76, on the surface of the semiconductor substrate 1011, insulating films, for example, a silicon oxide film 1055 and a silicon nitride film 1056 are formed so that they are on the same level as an upper surface of the channel stop region 1047. A resist mask 1051 is formed over the silicon nitride film 1056, which has an opening 1052 corresponding to a portion in which the vertical transfer gate electrode is formed. The opening 1052 is formed so as to be positioned at the end of the pixel. The p-type semiconductor region 1025 for suppressing dark current is formed in the semiconductor substrate 1011 by ion-implanting a p-type impurity 1053 through the opening 1052 of the resist mask 1052. The p-type semiconductor region 1025 is formed so as to touch then-type overflow path 1035 connecting n-type semiconductor regions of respective photodiodes PD (PD1, PD2 and PD3) as well as to reach then-type semiconductor region 1037 having low impurity concentration or to the vicinity thereof.

Figure 77:
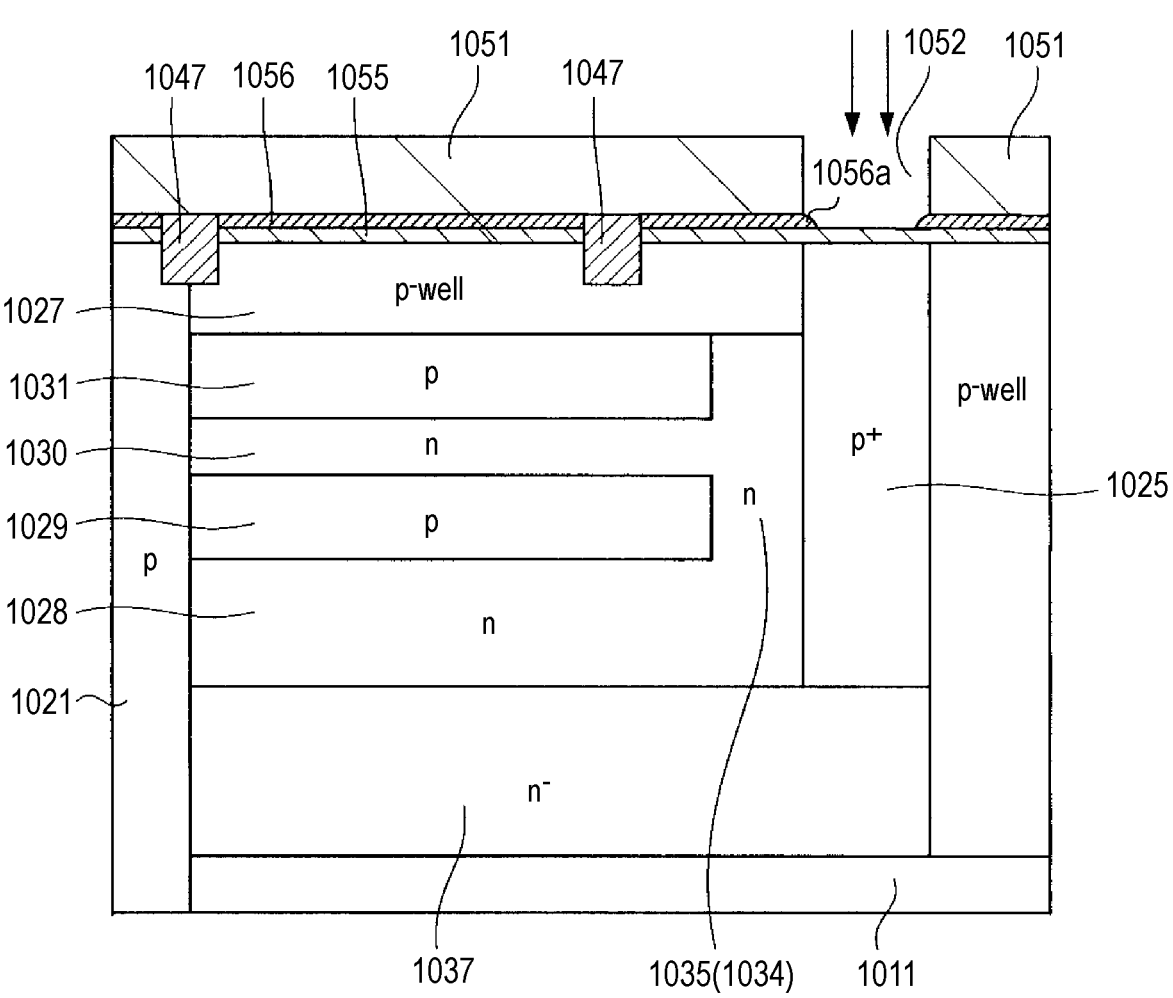
FIG. 77 is a manufacturing process view (No. 4) showing an example of a manufacturing method of a solid-state imaging device according to an embodiment of the invention.

Next, as shown in FIG. 77, isotropic etching is performed with respect to the opening 1052 of the resist mask 1051. A sidewall 1056a made of the silicon nitride film 1056 is formed by the isotropic etching.

Figure 78:
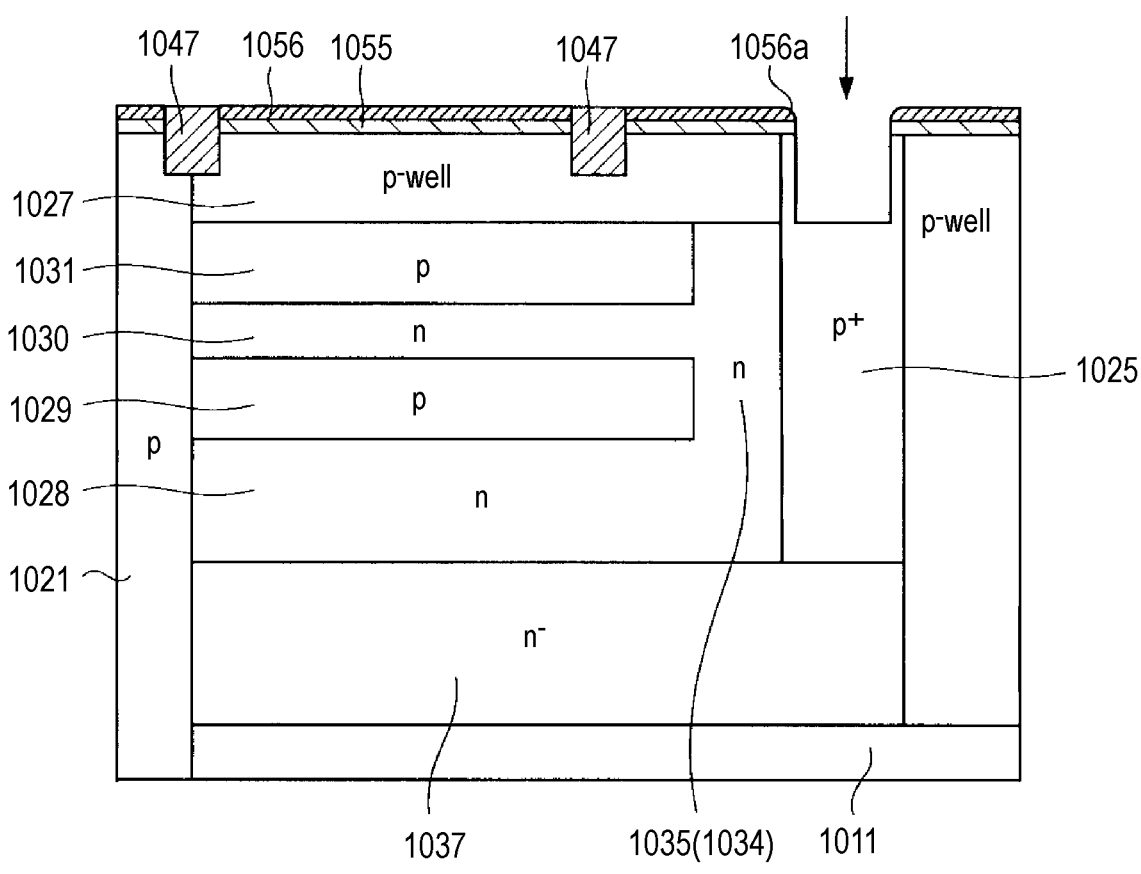
FIG. 78 is a manufacturing process view (No. 5) showing an example of a manufacturing method of a solid-state imaging device according to an embodiment of the invention.

Next, as shown in FIG. 78, the resist mask 1051 is removed, and the groove portion 1022 is formed by performing selective etching to the p-type semiconductor region 1025 by anisotropic etching, using the silicon nitride film 1056 having the sidewall 1056a as a mask. The groove portion 1022 is formed by so-called self alignment. The p-type semiconductor region 1025 and the groove portion 1022 are formed at the end of the pixel.

Figure 79:
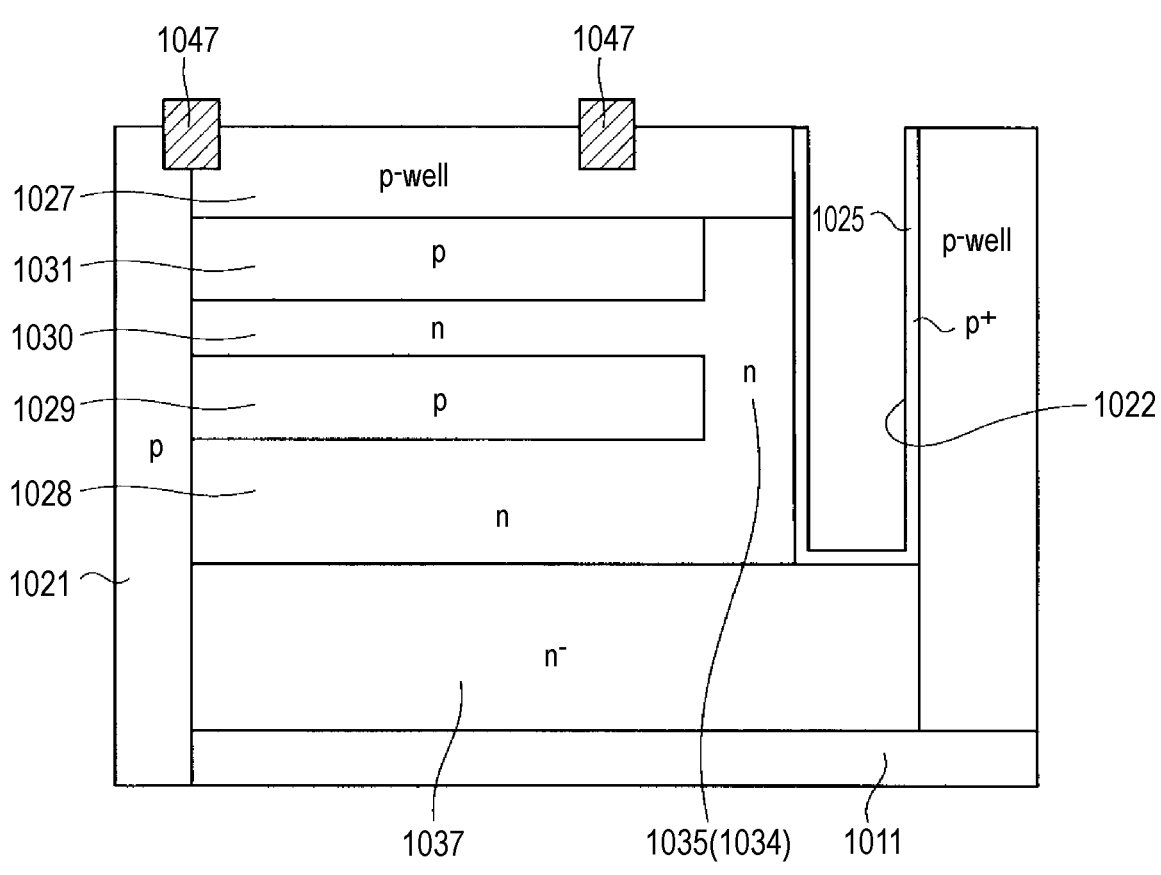
FIG. 79 is a manufacturing process view (No. 6) showing an example of a manufacturing method of a solid-state imaging device according to an embodiment of the invention.

Then, as shown in FIG. 79, the selective etching is allowed to proceed, thereby forming the groove portion 1022 so that the p-type semiconductor region 1025 remains by the necessary width at a side wall in the groove portion and a bottom surface of the groove portion. After that, the silicon oxide film 1055 and the silicon nitride film 1056 are removed.

Figure 80:
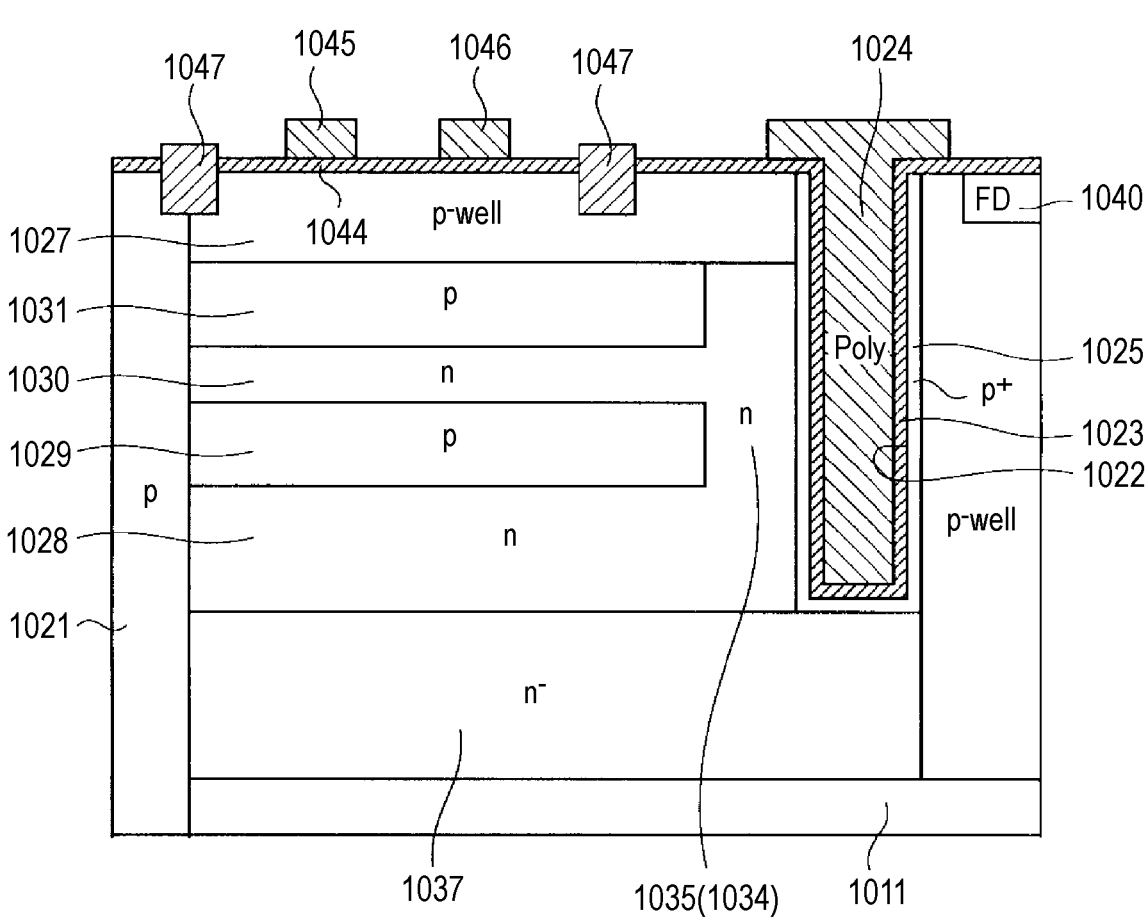
FIG. 80 is a manufacturing process view (No. 7) showing an example of a manufacturing method of a solid-state imaging device according to an embodiment of the invention.

Next, as shown in FIG. 80, the gate insulating film 1023 is formed over the surface of the inner surface of the groove portion 1022 and the surface of the semiconductor substrate 1011. As the gate insulating film 1023, for example, a silicon oxide (SiO2) film can be used. After that, a gate electrode material, for example, a polysilicon film is formed so as to be buried into the groove portion 1022 as well as over the surface of the semiconductor substrate 1011 and is patterned. Accordingly, the columnar transfer gate electrode 1024 part of which protrudes on the surface of the substrate as well as buried into the groove portion 1022 is formed. Additionally, the reset gate electrode 1045 and the amplification gate electrode 1046 made of, for example, the same polysilicon film are formed on the p-type semiconductor well region 1027 on the substrate surface through the gate insulating film 1023.

Figure 81:
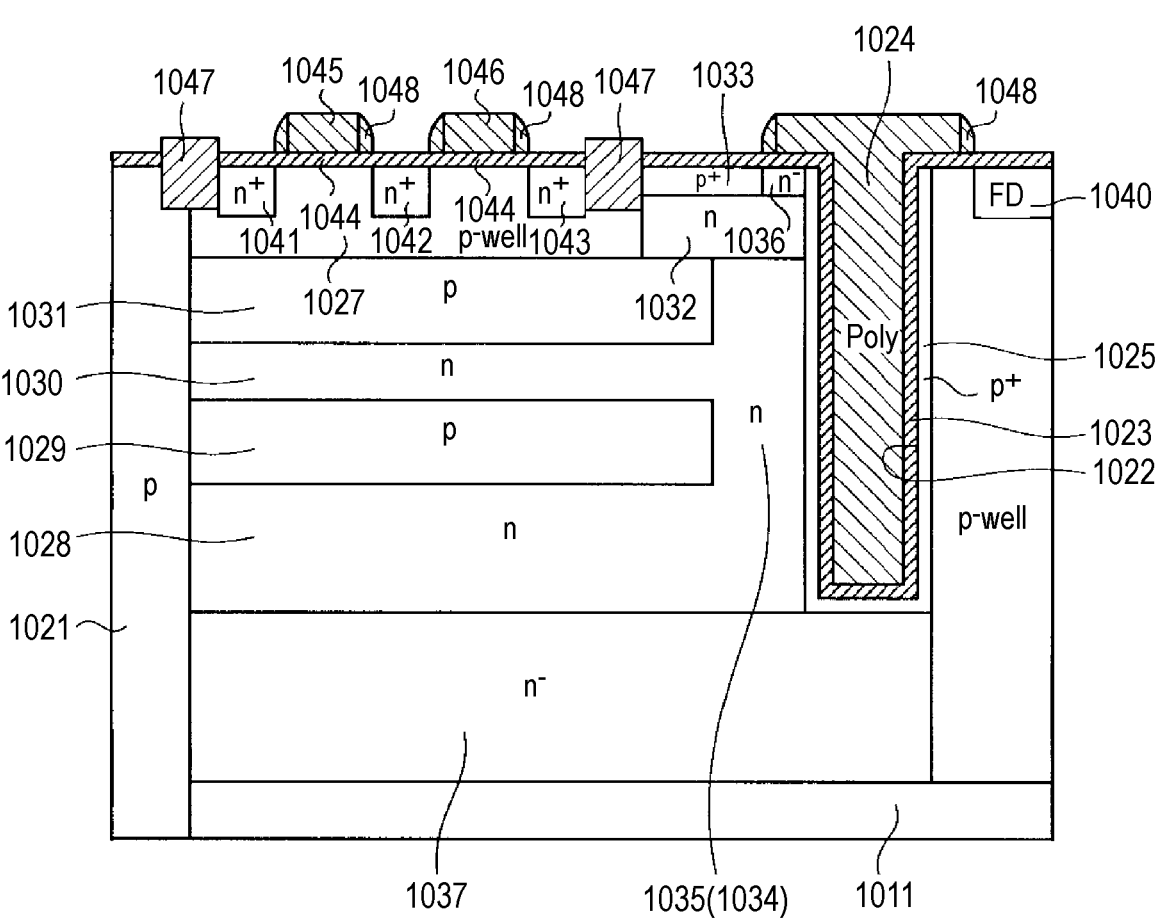
FIG. 81 is a manufacturing process view (No. 8) showing an example of a manufacturing method of a solid-state imaging device according to an embodiment of the invention.

Next, as shown in FIG. 81, sidewalls 1048 are respectively formed at the transfer gate electrode 1024, the reset gate electrode 1045 and the amplification gate electrode 1046. The n-type impurity is ion-implanted by using the respective sidewall 1048 as masks to thereby form the floating diffusion (FD) 1040, the source/drain regions 1041, 1042 and 1043 made of then-type semiconductor region by self alignment. Accordingly, the vertical transfer transistor Tr1, the reset transistor Tr2 and the amplification gate transistor Tr3 are formed. The vertical transfer transistor Tr1 is formed at the end of the pixel.

After the above process or before the above process, the third photodiode PD3 is formed on the surface of the p-type semiconductor well region 1027. The photodiode PD3 is formed by stacking then-type semiconductor region 1032 and the p-type semiconductor region 1033 thereon by ion implantation to form the pn junction. Further, the channel region 1036 made of the n-region or the p-region for suppressing dark current, which reaches the p-type semiconductor region 1025, is formed so as to adjacent to the p-type semiconductor region 1033.

After the above process, the multilevel wiring layer in which plural layers of wiring are arranged on the surface side of the semiconductor substrate 1011 through the interlayer insulating film in the ordinary manner. Also, on the back of the semiconductor substrate 1011, the p-type semiconductor region for suppression dark current so as to touch the n-type semiconductor region 1037, the planarization film, the color filter and the on-chip micro lens are sequentially formed. Accordingly, the intended back-illuminated solid-state imaging device 1101 can be obtained.

[Manufacturing Method of the Solid-State Imaging Device (2)]

Figure 82:
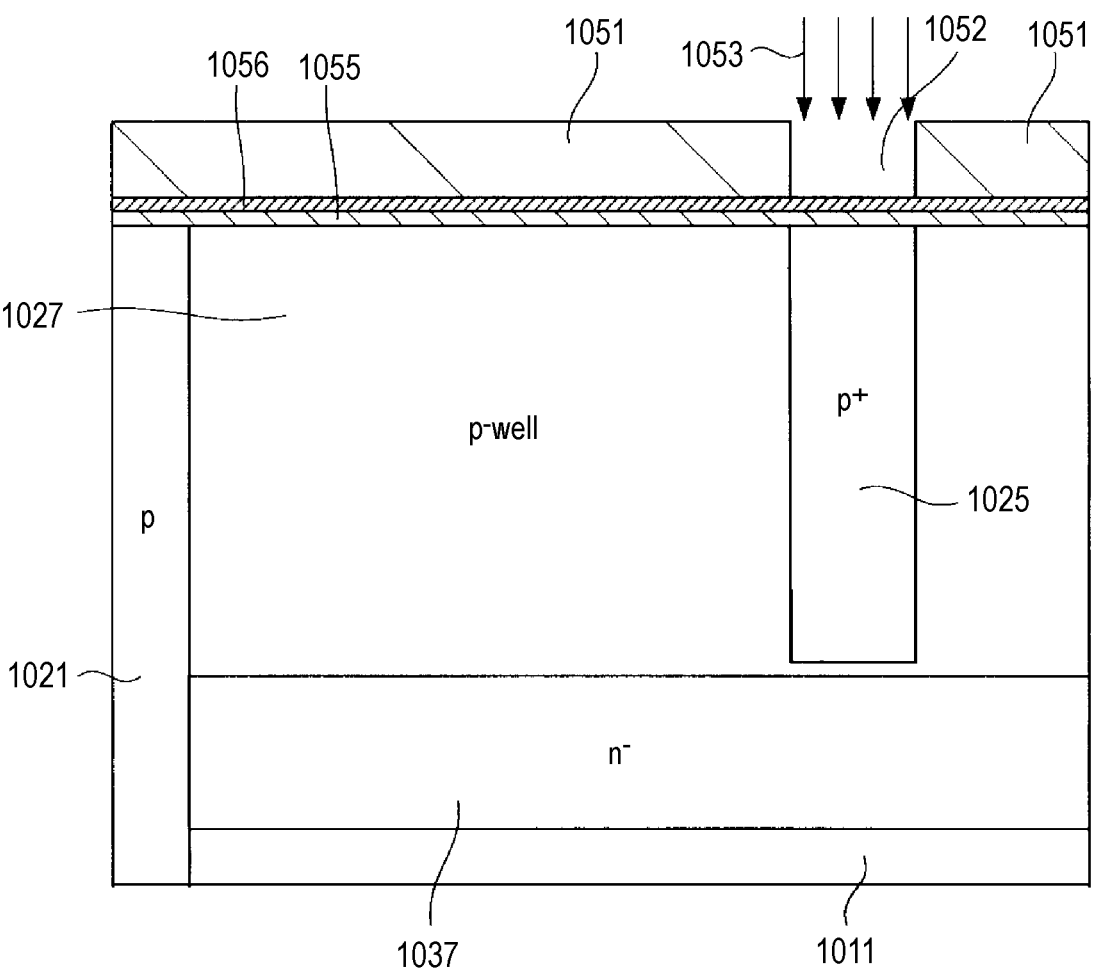
FIG. 82 is a manufacturing process view (No. 1) showing another example of a manufacturing method of a solid-state imaging device according to an embodiment of the invention.
Figure 84:
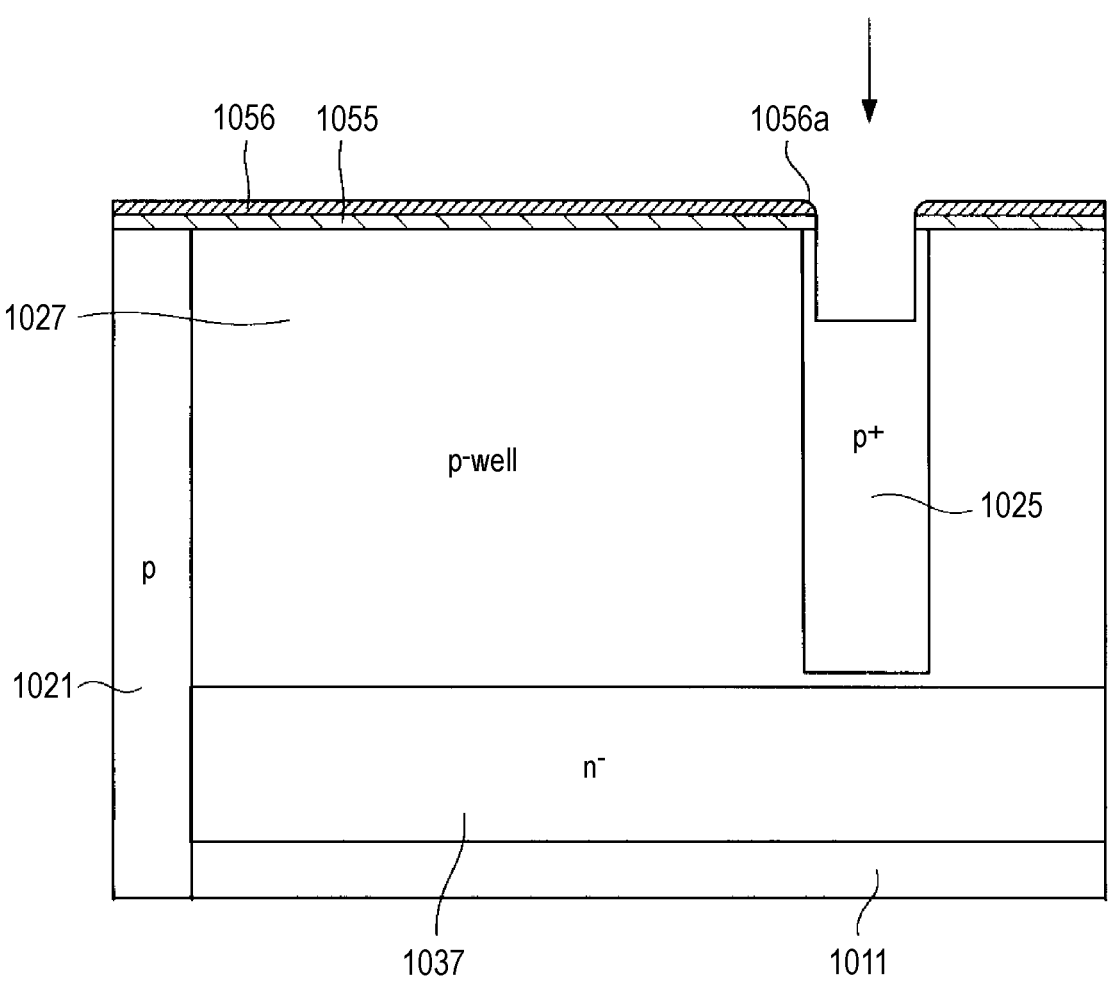
FIG. 84 is a manufacturing process view (No. 3) showing another example of a manufacturing method of a solid-state imaging device according to an embodiment of the invention.

FIG. 82 to FIG. 8 8 show another example of a manufacturing method of the solid-state imaging device 1101 according to Embodiment 58. First, as shown in FIG. 82, the p-type semiconductor well region 1027 and then-type semiconductor region 1037 having low impurity concentration thereunder are formed in the p-type semiconductor substrate 1011. The pixel isolation region 1021 made of the p-type semiconductor region for demarcating the unit pixel is formed at the p-type semiconductor well region 1027.

Then, on the surface of the semiconductor substrate 1011, the insulating films, for example, the silicon oxide film 1055 and the silicon nitride film 1056 are sequentially formed so that they are on the same level of the upper surface of the channel stop region 1047. The resist mask 1051 is formed on the silicon nitride film 1056, which has the opening 1052 corresponding to the portion in which the vertical transfer gate electrode is formed. The opening 1052 is formed so as to be positioned at the end of the pixel. The p-type semiconductor region 1025 for suppressing dark current is formed in the semiconductor substrate 1011 by ion implanting the p-type impurity 1053 through the opening 1052 of the resist mask 1051. The p-type semiconductor region 1025 is formed so as to reach then-type semiconductor region 1037 having low impurity concentration or to reach the vicinity thereof.

Figure 83:
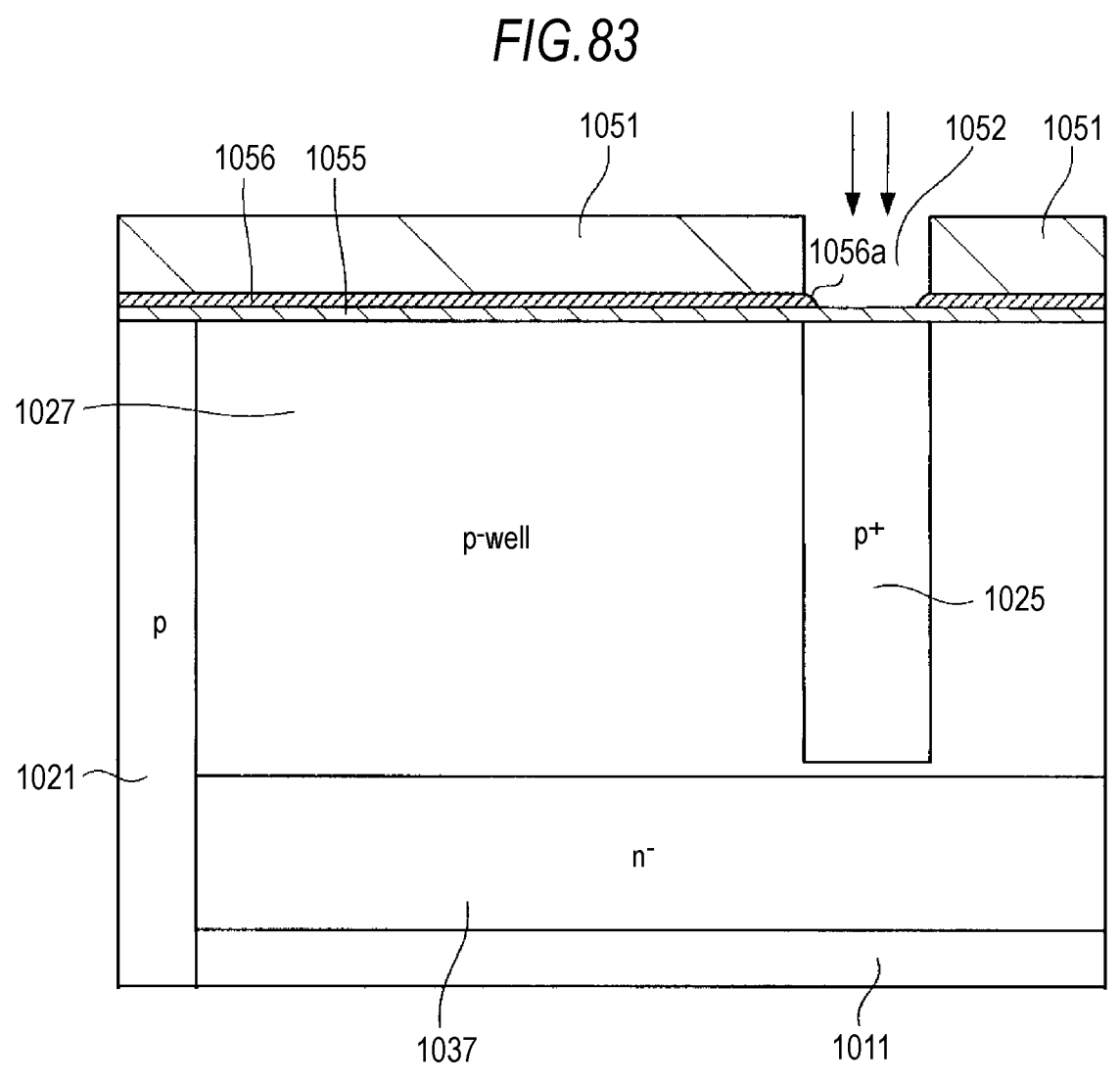

Next, as shown in FIG. 83, isotropic etching is performed to the opening 1052 of the resist mask 1051. The sidewall 1056a made of the silicon nitride film 1056 is formed by the isotropic etching.

Next, the resist mask 1051 is removed, and the groove portion 1022 is formed by performing selective etching to the p-type semiconductor region 1025 by anisotropic etching, using the silicon nitride film 1056 having the sidewall 1056a as a mask. The groove portion 1022 is formed by so-called self alignment. The p-type semiconductor region 1025 and the groove portion 1022 are formed at the end of the pixel.

Figure 85:
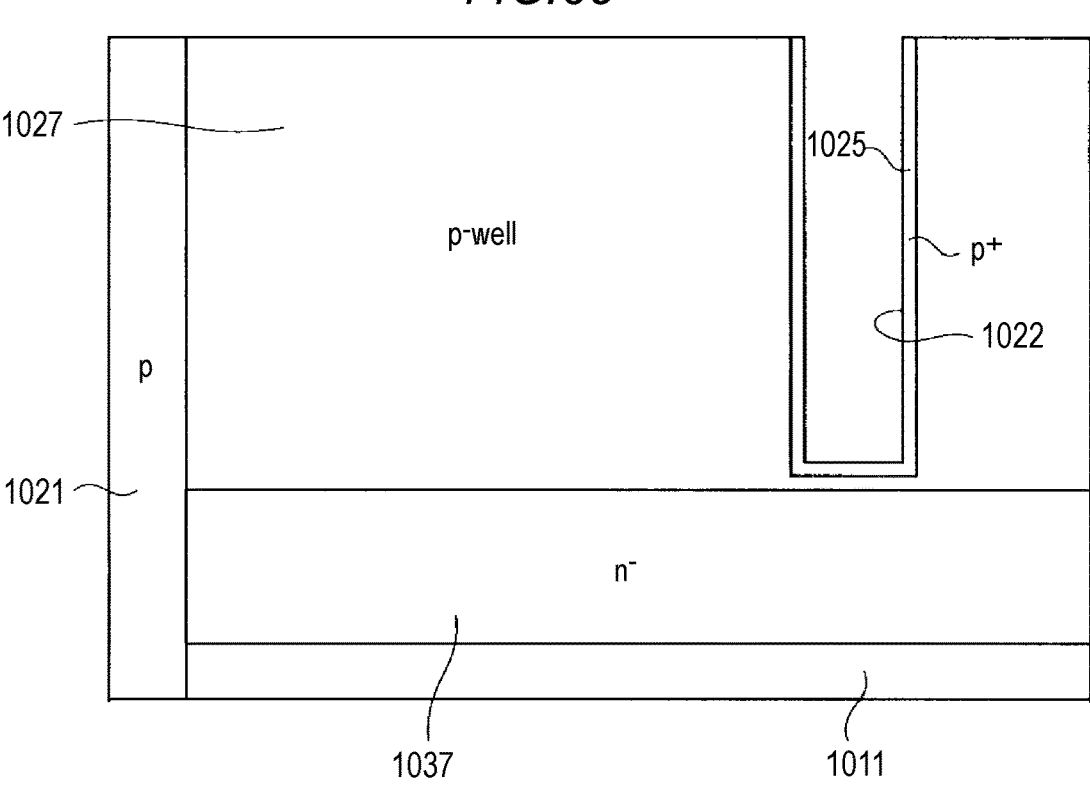
FIG. 85 is a manufacturing process view (No. 4) showing another example of a manufacturing method of a solid-state imaging device according to an embodiment of the invention.

Then, as shown in FIG. 85, the selective etching is allowed to proceed, thereby forming the groove portion 1022 so that the p-type semiconductor region 1025 remains by the necessary width at a side wall in the groove portion and a bottom surface of the groove portion. After that, the silicon oxide film 1055 and the silicon nitride film 1056 are removed.

Figure 86:
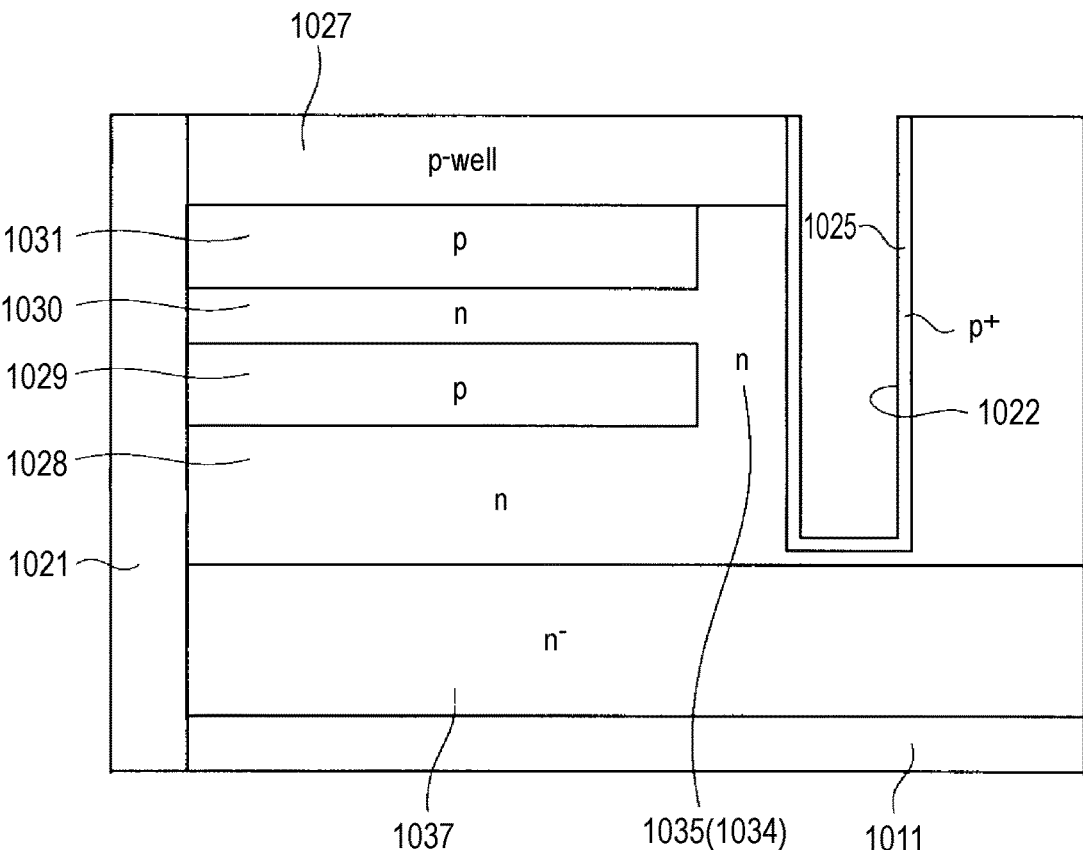
FIG. 86 is a manufacturing process view (No. 5) showing another example of a manufacturing method of a solid-state imaging device according to an embodiment of the invention.

Next, as shown in FIG. 86, the first photodiode PD1 and the second photodiode PD2 are formed by being stacked in the depth direction of the p-type semiconductor well region 1027 demarcated by each pixel isolation region 1021. The first photodiode PD1 is formed by stacking the n-type semiconductor region 1028 and the p-type semiconductor region 1029 so as to have the pn junction surface at the deepest portion of the semiconductor substrate 1011. The second photodiode PD2 is formed by stacking then-type semiconductor region 1030 and the p-type semiconductor region 1031 so as to form the pn junction surface similarly at the intermediate portion of the semiconductor substrate 1011. These n-type semiconductor regions 1028, 1030 and the p-type semiconductor region 1029, 1031 are alternately formed so as to touch to one another.

Additionally, the overflow path 1035 made of then-type semiconductor region is formed, which connects the respective n-type semiconductor regions 1028, 1030 of the photodiodes PD1, PD2. Then-type semiconductor region 1028 positioned at the deepest portion and the overflow path 1035 are formed so as to touch then-type semiconductor region

1037 having low impurity concentration at the lower layer. The above respective regions are formed by using ion implantation method.

Figure 87:
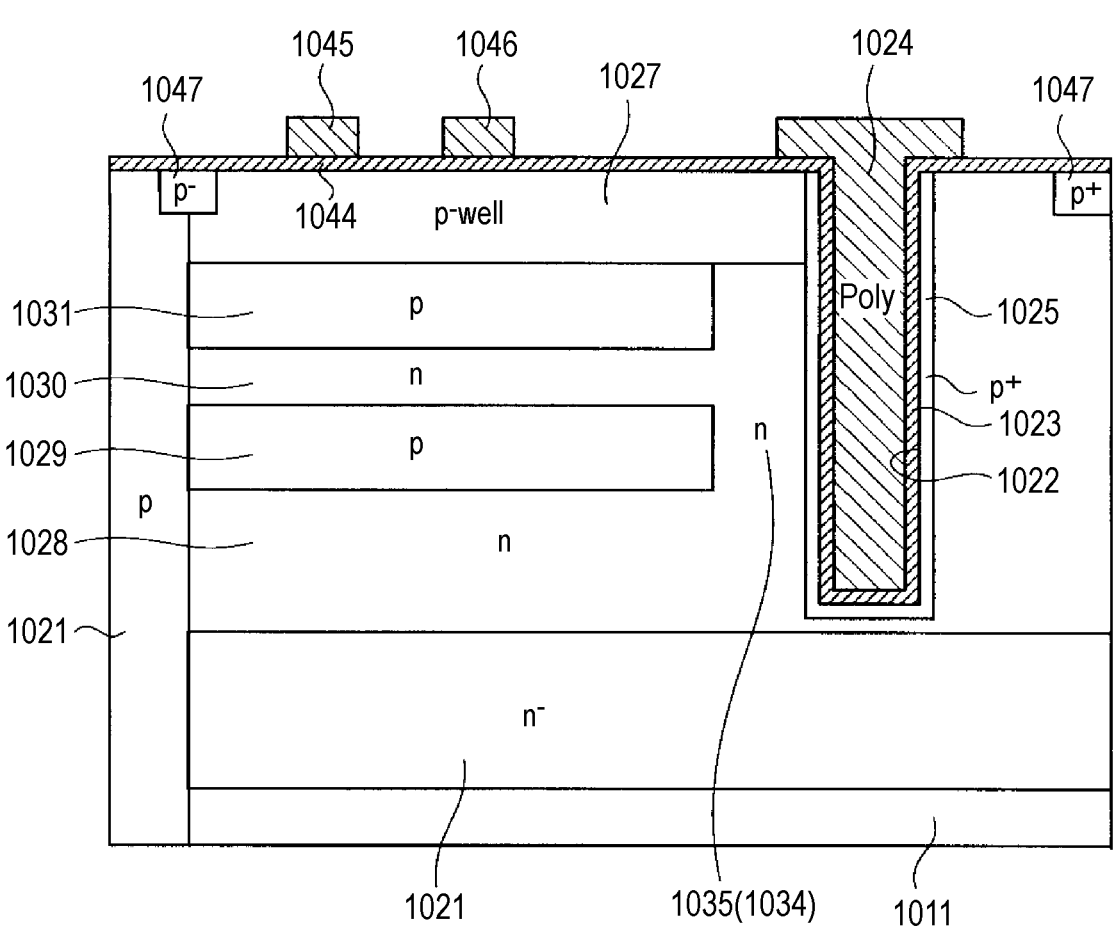
FIG. 87 is a manufacturing process view (No. 6) showing another example of a manufacturing method of a solid-state imaging device according to an embodiment of the invention.

Next, as shown in FIG. 87, the channel stop region 1047 made of the p-type semiconductor region having high impurity concentration is formed at a necessary portion on the surface side of the semiconductor substrate 1011. The channel stop region 1047 of the p-type semiconductor region corresponds to the so-called element isolation region.

Furthermore, the gate insulating film 1023 is formed over the inner surface of the groove portion 1022 and the surface of the semiconductor substrate 1011. As the gate insulating film 1023, for example, the silicon oxide (SiO2) film can be used. After that, a gate electrode material, for example, a polysilicon film is formed so as to be buried into the groove portion 1022 as well as over the surface of the semiconductor substrate 1011 and is patterned. Accordingly, the columnar transfer gate electrode 1024 part of which protrudes on the surface of the substrate as well as buried into the groove portion 1022 is formed. Additionally, the reset gate electrode 1045 and the amplification gate electrode 1046 made of, for example, the same polysilicon film are formed on the p-type semiconductor well region 1027 on the substrate surface through the gate insulating film 1023.

Figure 88:
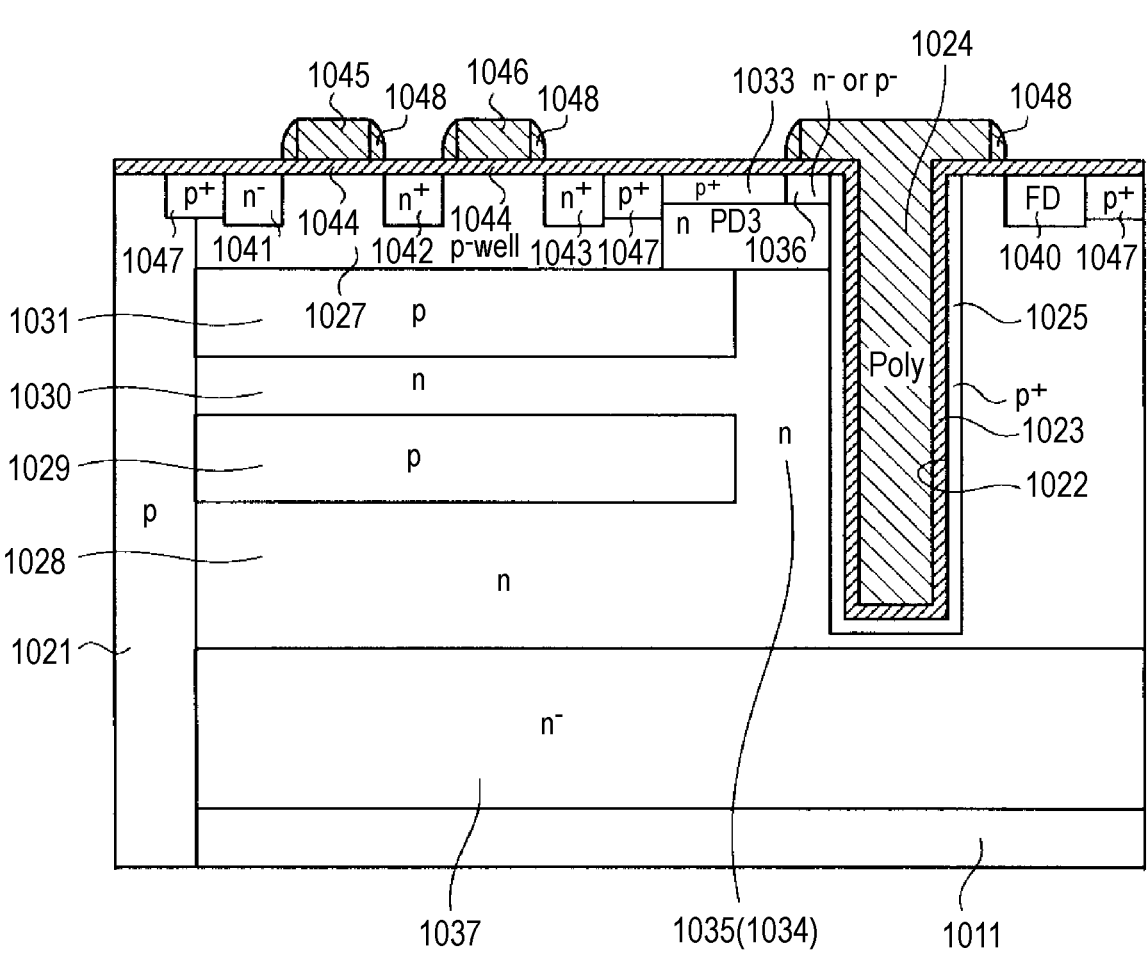
FIG. 88 is a manufacturing process view (No. 7) showing another example of a manufacturing method of a solid-state imaging device according to an embodiment of the invention.

Next, as shown in FIG. 88, sidewalls 1048 are respectively formed at the transfer gate electrode 1024, the reset gate electrode 1045 and the amplification gate electrode 1046. The n-type impurity is ion-implanted by using the respective sidewall 1048 as masks to thereby form the floating diffusion (FD) 1040, the source/drain regions 1041, 1042 and 1043 made of then-type semiconductor region by self alignment. Accordingly, the vertical transfer transistor Tr1, the reset transistor Tr2 and the amplification gate transistor Tr3 are formed. The vertical transfer transistor Tr1 is formed at the end of the pixel.

After the above process or before the above process, the third photodiode PD3 is formed on the surface of the p-type semiconductor well region 1027. The photodiode PD3 is formed by stacking then-type semiconductor region 1032 and the p-type semiconductor region 1033 thereon by ion implantation to form the pn junction. Further, the channel region 1036 made of the n-region or the p-region for suppression dark current, which reaches the p-type semiconductor region 1025 is formed so as to adjacent to the p-type semiconductor region 1033.

After the above process, the multilevel wiring layer in which plural layers of wiring are arranged on the surface side of the semiconductor substrate 1011 through the interlayer insulating film in the ordinary manner. Also, on the back of the semiconductor substrate 1011, the p-type semiconductor region for suppression dark current so as to touch the n-type semiconductor region 1037, the planarization film, the color filter and the on-chip micro lens are sequentially formed. Accordingly, the intended back-illuminated solid-state imaging device 1101 can be obtained.

As another method of forming the p-type semiconductor region 1025, it is also preferable that the groove portion 1022 is formed first, then, the p-type semiconductor region 1025 is formed in the inner-wall surface of the groove portion 1022 by inclined-ion implantation.

According to the above manufacturing method of the solid-state imaging device, the plural photodiodes PD stacked in the depth direction of the semiconductor substrate 1011, the overflow path 1035 and the p-type semiconductor region 1025 for suppressing dark current, which covers the transfer gate portion of the vertical transfer transistor Tr can be formed. That is, in respective examples, the solid-state imaging device 1011 in which the saturation charge amount (Qs) is increased and occurrence of white defects is suppressed by suppressing occurrence of dark current can be manufactured.

Also in the manufacturing methods according to the embodiment, the source/drain regions (n+ regions) 1041, 1042 and 1043 and the FD are formed by ion-implanting then-type impurity by self alignment, using the sidewalls 1048 at the sidewalls of the gate electrodes 1024, 1045 and 1056 as masks. Accordingly, the floating diffusion (FD) 1040 made of n+ region does not get into the portion under the transfer gate portion, which suppresses dark current due to GIDL. Since the floating diffusion (FD) 1040 is formed by using the sidewalls 1048 as masks, the floating diffusion (FD) 1040 can be formed apart from the vertical transfer gate portion constantly by a fixed distance even when mask misalignment happens at the time of forming the vertical transfer transistor Tr1.

After the p-type semiconductor region 1025 around the vertical transfer gate portion is formed by ion implantation through the resist mask 1051, the sidewall 1056a is formed with respect to the mask opening 1052 by isotropic etching, and part of the p-type semiconductor region 1025 is selectively etched by self alignment. Accordingly, the p-type semiconductor region 1025 corresponding to the wall surface of the groove portion 1022 having high aspect ratio can be formed with high accuracy.

The p-type semiconductor region 1025 is formed first, and the groove portion 1022 is formed by selectively etching the p-type semiconductor region 1025 after that, therefore, the p-type semiconductor region 1025 is formed at the bottom portion of the groove portion 1022. Therefore, it is possible to suppress dark current caused by defects occurring at the bottom portion of the vertical transfer transistor Tr1 as well as suppress occurrence of white defects.

Embodiment 59

[Configuration of a Solid-State Imaging Device]

Figure 89:
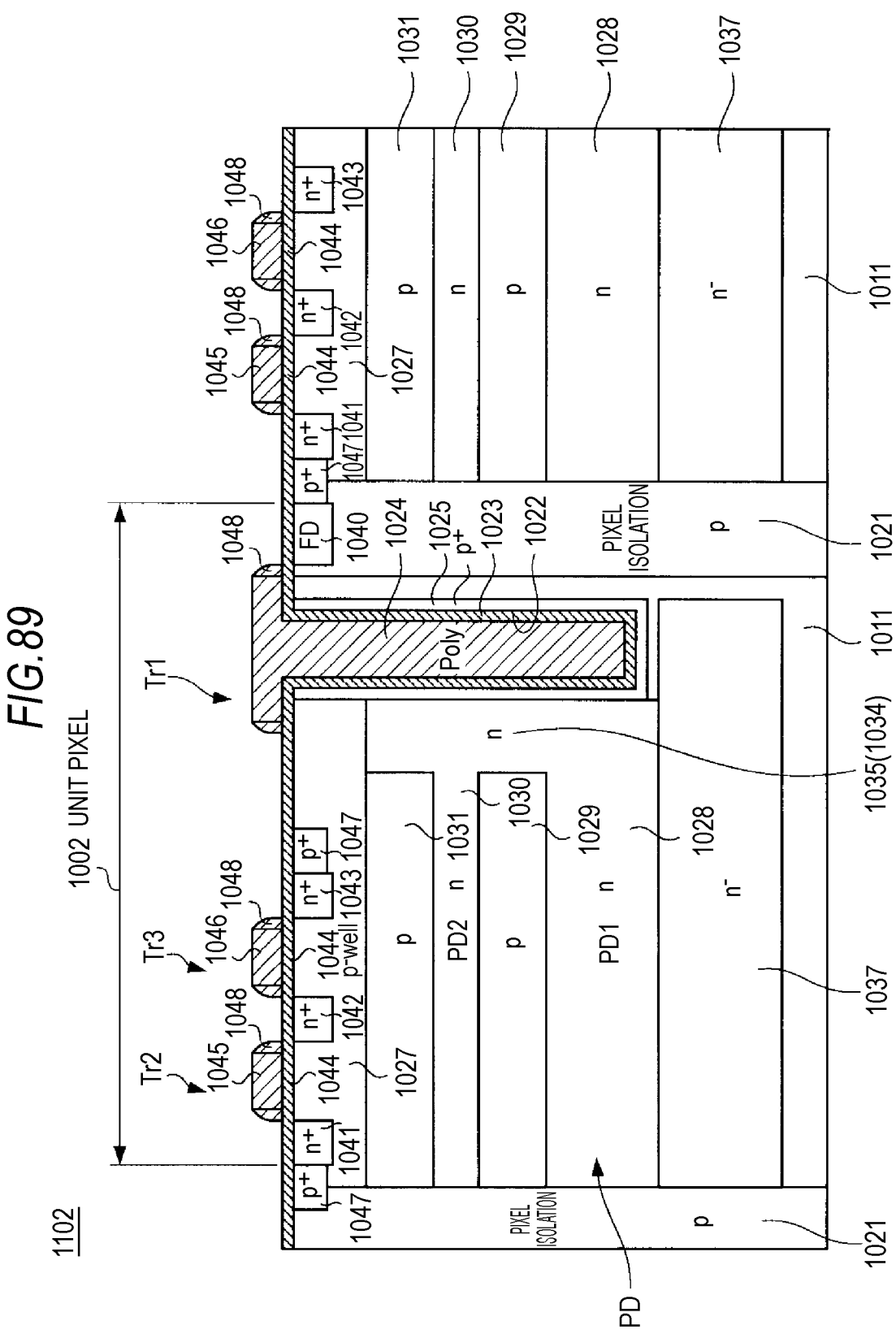
FIG. 89 is a configuration view of a relevant part of a solid-state imaging device according to Embodiment 59 of the invention.

FIG. 89 shows a solid-state imaging device according to Embodiment 59 of the invention. A solid-state imaging device 1102 according to the embodiment of the invention is configured by omitting then-type semiconductor region 1032 and the p-type semiconductor region 1033 which make up the third photodiode PD3 on the surface side of the substrate and the channel region 1036 in the solid-state imaging device 1101 of Embodiment 58. In the configuration, a p-type semiconductor well region under the transfer gate portion between the second photodiode PD2 and the substrate surface functions as the channel region 1036. Since other configurations are the same as Embodiment 58, the same symbols are given to portions corresponding to FIG. 73, and the repeated explanation is omitted.

The operation of the solid-state imaging device 1102 according to the present embodiment is the same as the operation explained in the above Embodiment 58.

In the solid-state imaging device 1102 according to Embodiment 59, the configuration in which the third photodiode PD3 on the substrate surface side is omitted is applied, therefore, the device is suitable for a case in which the pixel size is further reduced. That is, even when the pixel size is reduced to a degree that it is difficult to form the third photodiode PD3 on the substrate surface, the first and second photodiodes PD1, PD2 are formed in the depth direction, therefore, it is possible to secure the saturation charge amount (Qs) and to suppress dark current. Additionally, the same advantages as the ones explained in Embodiment 58 can be obtained.

Embodiment 60

[Configuration of a Solid-State Imaging Device]

Figure 90:
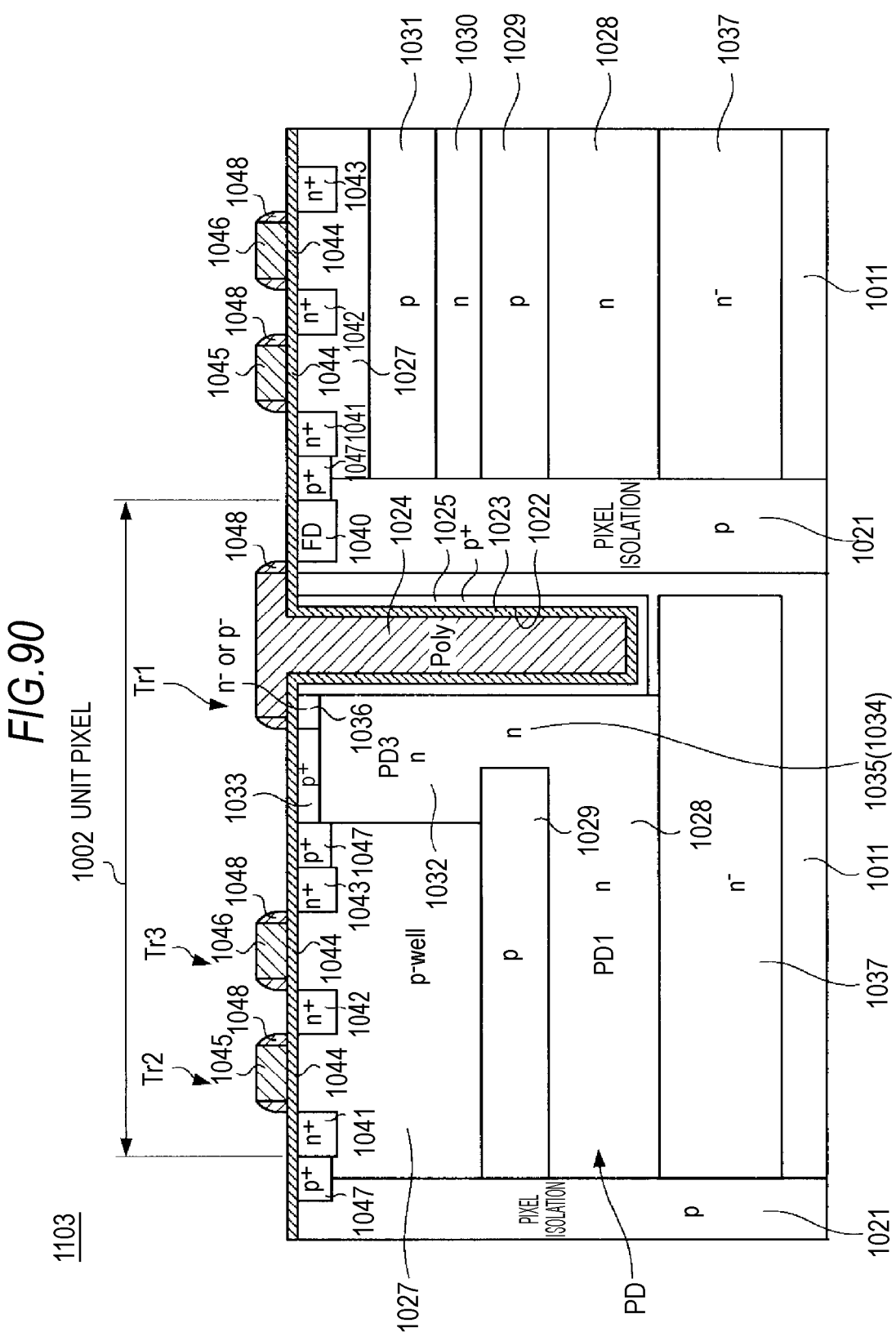
FIG. 90 is a configuration view of a relevant part of a solid-state imaging device according to Embodiment 60 of the invention.

FIG. 90 shows a solid-state imaging device according to Embodiment 60 of the invention. A solid-state imaging device 1103 according to the embodiment is configured by including two photodiodes, namely, the first photodiode PD1 buried in to the substrate and the third photodiode PD3 on the substrate surface side as plural photodiodes. That is, the configuration in which the second photodiode PD2 is omitted in Embodiment 58 is applied. Also in the example, the overflow path 1035 made of the n-type semiconductor region which connects then-type semiconductor region 1028 and 1032 to be charge accumulation regions of the first photodiode PD1 and the third photodiode PD3 mutually is formed. The overflow path 1035 doubles as the channel region 1034 of the transfer gate portion. Since other configurations are the same as Embodiment 58, the same symbols are given to portions corresponding to FIG. 73 in FIG. 90, and the repeated explanation is omitted.

According to the solid-state imaging device 1103 of Embodiment 6 0, the configuration in which two photodiodes which are the first photodiode PD1 buried in the substrate and the third photodiode PD3 on the substrate surface are included is applied. According to the configuration, it is possible to secure the saturation charge amount (Qs) and to suppress dark current. Since the two-layer structure of the photodiodes PD1, PD3 is applied, the depth of the vertical transfer transistor Tr1 can be made shallow. According to the configuration, transfer efficiency can be improved by shortening the transfer path as well as occurrence of white defects can be suppressed by reducing the interface area. Additionally, the same advantages as those explained in Embodiment 58 can be obtained.

Embodiment 61

[Configuration of a Solid-State Imaging Device]

A solid-state imaging device according to Embodiment 61 is configured by forming only one layer of buried photodiode PD as the photodiode, though not shown. That is, the solid-state imaging device according to the embodiment has a configuration in which the second photodiode PD2, the third photodiode PD3 and the channel region 1036 are omitted from the configuration of the solid-state imaging device 1011 of Embodiment 58. The p-type semiconductor well region 1027 under the transfer gate portion between the first photodiode PD1 and the substrate surface functions as the channel region. Other configurations are the same as FIG. 73.

Also in the solid-state imaging device according to Embodiment 61, the transfer transistor Tr1 is formed at the end of the pixel, therefore, the area of the photodiode PD can be widely secured, which increases the saturation charge amount (Qs). Additionally, since the p-type semiconductor region 1025 is formed around the vertical transfer gate portion, it is possible to suppress occurrence of dark current and occurrence of white defects.

In the solid-state imaging device according to Embodiment 61, it is also preferable to apply a configuration in which an n-type semiconductor region is formed around the transfer gate portion of the vertical transfer transistor instead of the p-type semiconductor region. In the case of the configuration, charge transfer efficiency can be further improved.

Embodiment 62

[Configuration of a Solid-State Imaging Device]

Figure 91:
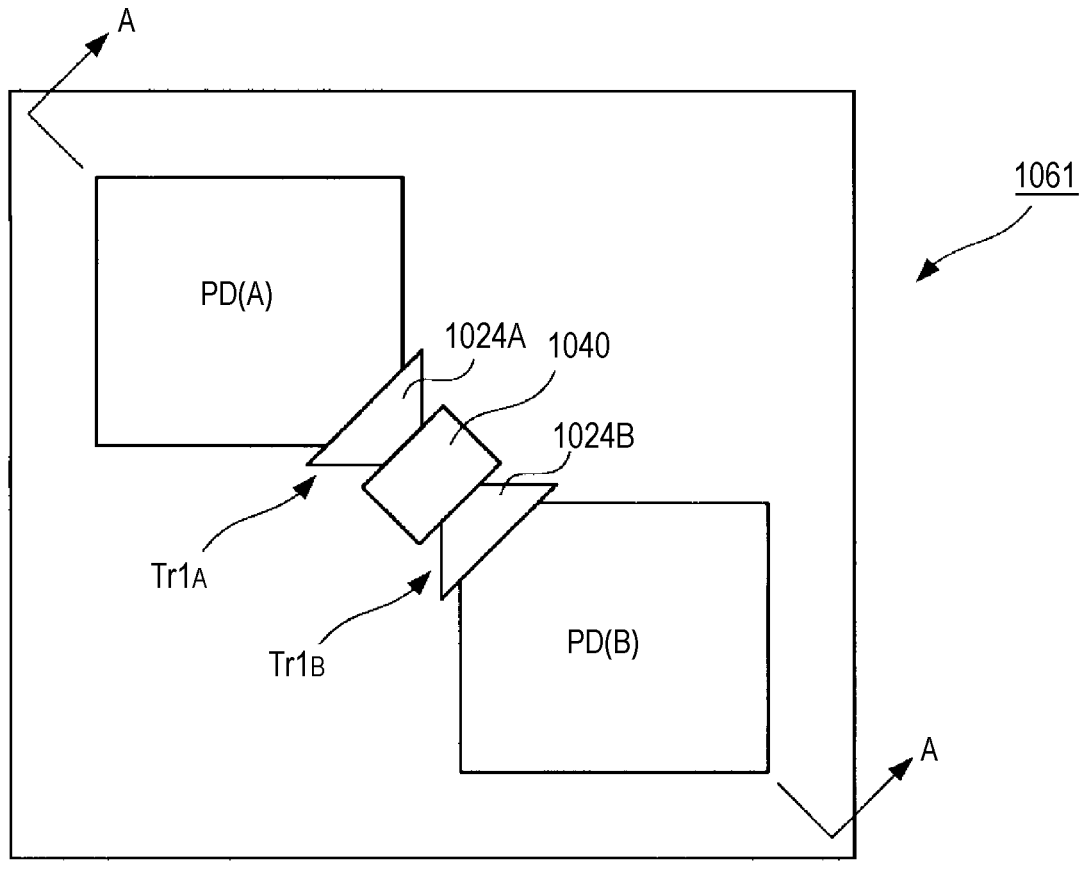
FIG. 91 is a configuration view of a relevant part of a solid-state imaging device according to Embodiment 61 of the invention.
Figure 92:
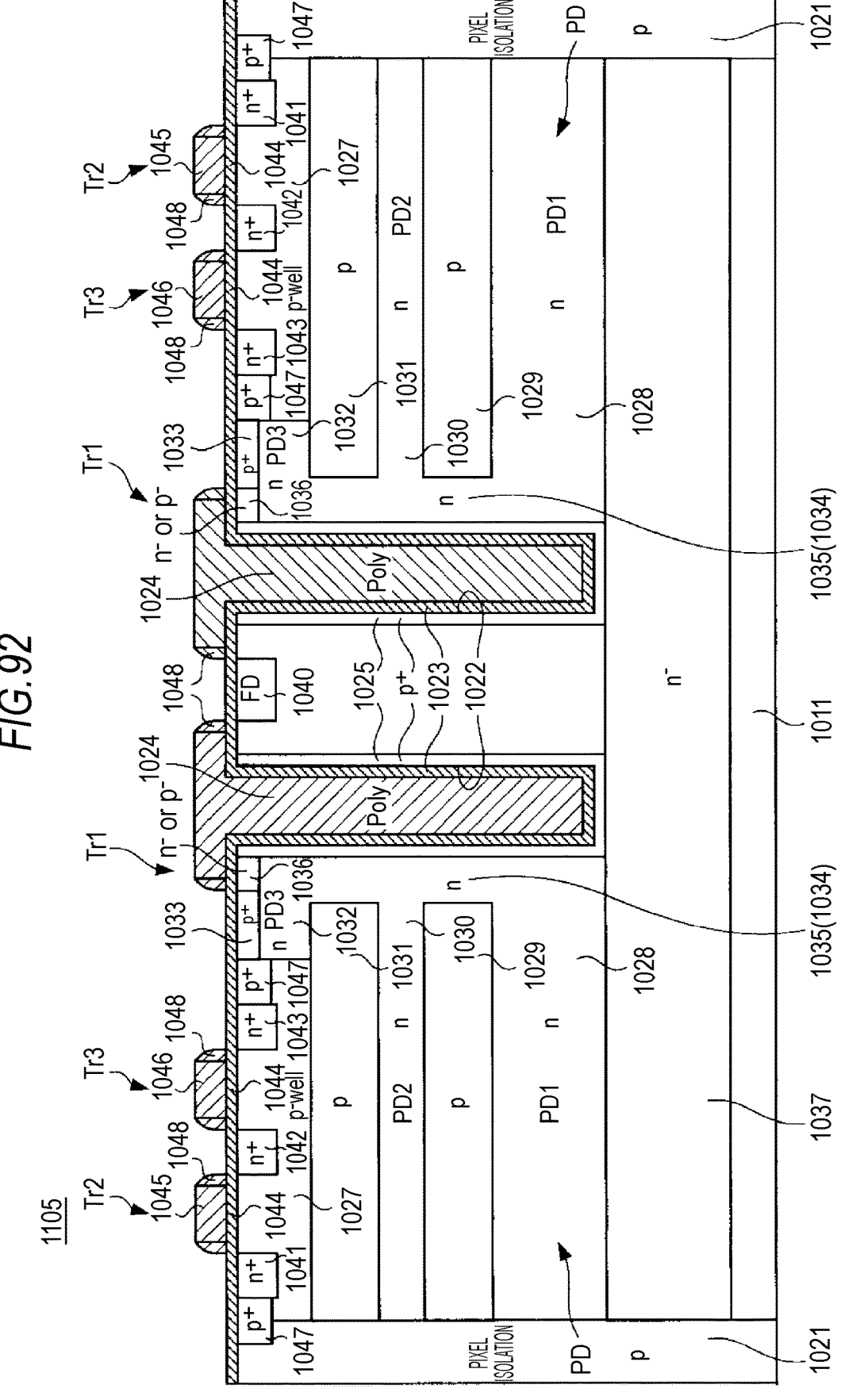
FIG. 92 is a cross-sectional view taken along A-A line of FIG. 91.

FIG. 91 and FIG. 92 show a solid-state imaging device according to Embodiment 62 of the invention. A solid-state imaging device 1105 according to the embodiment is configured by arranging a pixel configuration 1061 (hereinafter, referred to as a joint pixel) two-dimensionally, in which plural photodiodes, namely, two photodiodes in the example share pixel transistors other than the transfer transistors.

Figure 93:
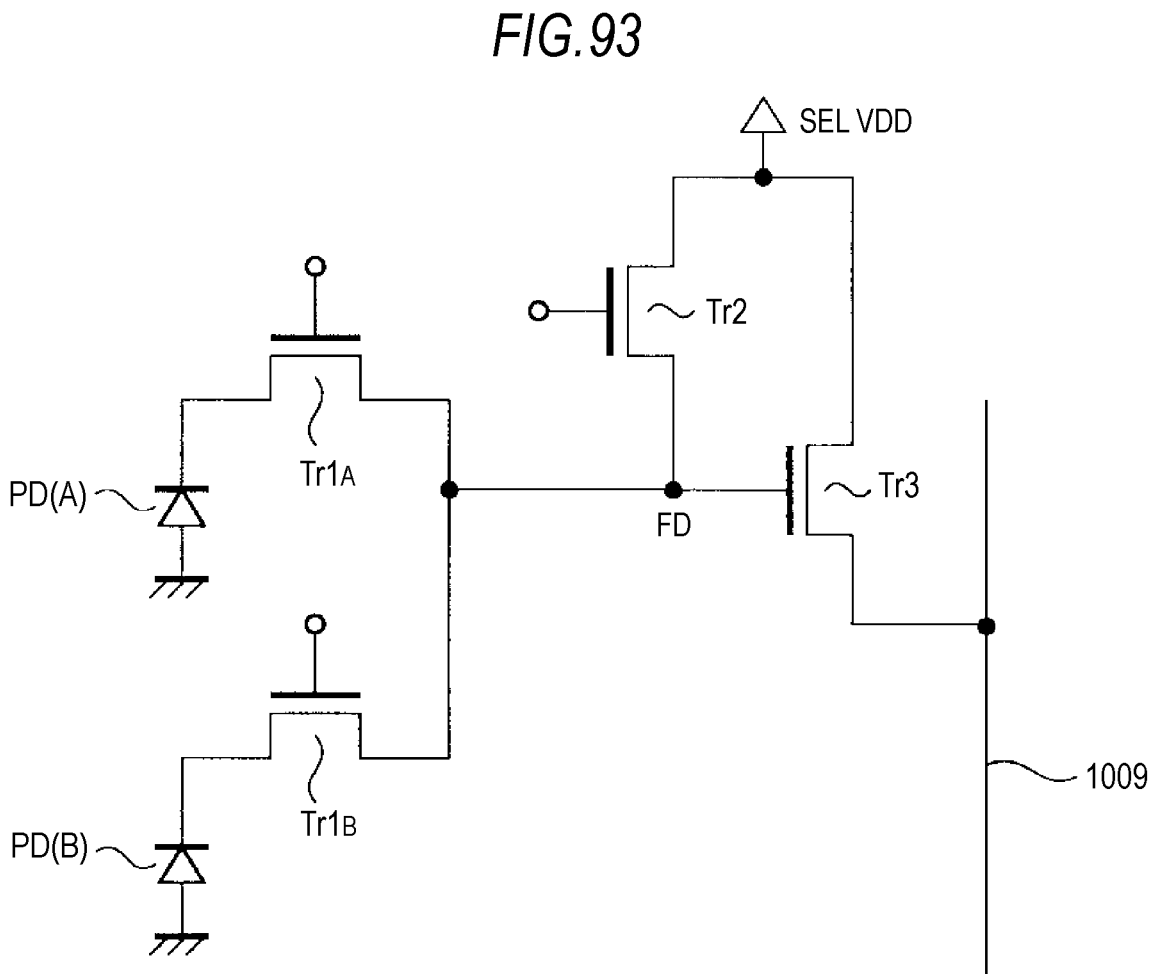
FIG. 93 is an equivalent circuit showing an example of a joint pixel of a solid-state imaging device according to Embodiment 62 of the invention.

FIG. 93 shows a circuit configuration of the joint pixel 1061 which have two pixels according to the embodiment. The two photodiodes PD(A), PD(B) are respectively connected to sources of corresponding two transfer transistor Tr1A, Tr1B. Drains of the transfer transistor Tr1A, Tr1B are connected to a source of one reset transistor Tr2. The floating diffusion (FD) 1040 shared between the respective transfer transistors Tr1A, Tr1B and the reset transistor Tr2 is connected to a gate of one amplification transistor Tr3. A drain of the reset transistor Tr2 and a drain of the amplification transistor Tr3 are connected to the above-described selection power supply SELVDD and a source of the amplification transistor Tr3 is connected to the vertical signal line 1009.

FIG. 91 shows a schematic planar configuration of the joint pixel 1061. In the joint pixel 1061, the shared floating diffusion (FD) 1040 is arranged at the center, and two photodiodes PD (A), PD (B) are arranged sandwiching the floating diffusion (FD) 1040. The respective transfer transistors Tr1A, Tr1B are arranged facing to each other at ends of respective pixels, namely, positions corresponding to corner portions of the photodiodes PD (A), PD (B). Respective transfer gate electrodes 1024A, 1024B are formed between the photodiodes PD(A), PD(B) and the floating diffusion (FD) 1040. As shown in FIG. 92, the reset transistor Tr2 and the amplification transistor Tr3 are formed on the substrate surface side on the photodiode.

The solid-state imaging device 1105 according to the embodiment forms a symmetrical configuration in which two sets of the vertical transistor and the photodiode sandwich the floating diffusion (FD) 1040 at the center. That is, a configuration of the vertical transfer transistor Tr1A and the photodiode PD(A) is arranged at one side and a configuration of the vertical transfer transistor Tr1B and the photodiode PD (B) is arranged at the other side. The reset transistor Tr2 and the amplification transistor Tr3 are formed at the p-type semiconductor well region 1027.

The configuration of the vertical transfer transistors Tr1A, Tr1B, and the configuration of the photodiodes PD(A), PD(B) including the first to third photodiodes PD1 to PD3 and the overflow path 1035 are the same as those shown in FIG. 73.

According to the solid-state imaging device 1105 which joins pixels, the saturation charge amount (Qs) of the unit pixel is increased as well as the area of the photodiode is widened due to the joint pixel, which further increases the saturation charge amount (Qs) Additionally, the p-type semiconductor region 1025 is formed around the vertical transfer gate portion, therefore, dark current due to detects existing by the vertical transfer gate portion can be suppressed as well as occurrence of white defects can be suppressed.

Additionally, the same advantages as those explained in Embodiment 58 can be obtained.

Embodiment 63

[Configuration of a Solid-State Imaging Device]

Figure 94:
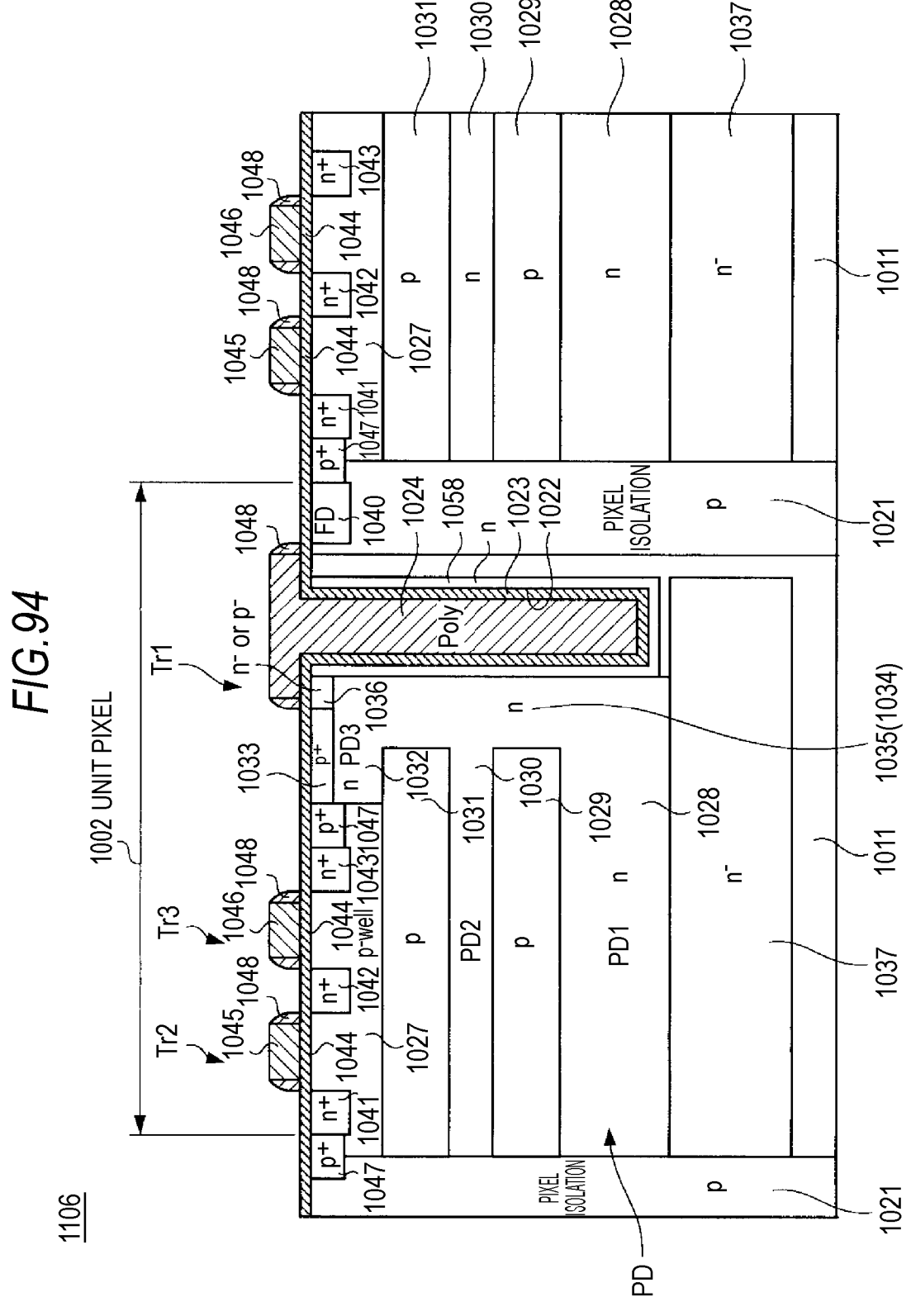
FIG. 94 is a configuration view of a relevant part of a solid-state imaging device according to Embodiment 63 of the invention.

FIG. 94 shows a solid-state imaging device according to Embodiment 63 of the invention. A solid-state imaging device 1106 according to the embodiment has a configuration in which plural photodiodes PD (PD1 to PD3) are formed in the depth direction of the semiconductor substrate 1011 and the transfer transistor Tr1 is formed in a vertical type, the channel direction of which is vertical with respect to the semiconductor substrate. Additionally, the overflow path 1035 made of then-type semiconductor region which connects then-type semiconductor regions 1028, 1030 and 1032 to be charge accumulation regions of the respective photodiodes PD1 to PD3 to one another is formed. In the example, the overflow path 1035 is formed so as to double as the channel region 1034.

Further in the embodiment, an ion implantation region for adjusting a gate interface is formed around the transfer gate portion, that is, at the gate interface between the gate insulating film 1023 formed at an inner wall surface of the groove portion 1022 and the semiconductor substrate 1011. As the ion implantation region, an n-type semiconductor region 1058 is formed in the embodiment. Then-type semiconductor region 1058 is formed by an ion implantation process which is different from the formation process of the overflow path 1035 and then-type semiconductor regions 1028, 1030 and 1032 of the photodiodes PD, which contributes to the improvement of charge transfer efficiency. The bottom portion of the groove portion 1022 is made of the p-type semiconductor region, not the n-type semiconductor region 1058. The n-type semiconductor region 1058 can be formed by forming the groove portion 1022 after ion-implanting an n-type impurity into the semiconductor substrate by applying the same process as the formation process of the p-type semiconductor region 1025 for suppressing dark current in Embodiment 58 which have been described above. Or, then-type semiconductor region 1058 can be formed by a process in which inclined ion implantation is performed into the side wall of the groove after forming the groove. Since other configurations are the same as Embodiment 58, the same symbols are given to portions corresponding to FIG. 73, and repeated explanation is omitted.

In the solid-state imaging device 1106 according to Embodiment 63, plural photodiodes PD (PD1 to PD3) are stacked in the depth direction of the semiconductor substrate 1011 and then-type semiconductor regions 1028 to 1032 of the respective photodiodes PD1 to PD3 are connected through the overflow path 1035. At the time of accumulating charges, when any of photodiodes PD reaches the saturation charge amount, charges exceeding the saturation charge amount are accumulated in another photodiode PD which has not been saturated through the overflow path 1035. According to the configuration, effective saturation charge amount (Qs) per a unit pixel is increased, dynamic range can increased and the contrast can be improved even when the pixel size is reduced.

Furthermore, then-type ion implantation region 1058 is formed at the gate interface around the vertical transfer gate portion, therefore, charge transfer efficiency can be further improved.

The transfer transistor Tr1 is formed as the vertical transistor as well as the transfer transistor Tr1 is formed at the end of the pixel 1002, thereby securing the area of the photodiodes PD (PD1 to PD3) widely and increasing the saturation charge amount (Qs) per a unit pixel.

In addition to the above, plural photodiodes PD are stacked and the overflow path 1035 is formed between the p-type semiconductor regions 1029, 1031 which make up the photodiodes PD and the transfer gate portion in the same manner as explained in Embodiment 58. That is, the p-type semiconductor regions 1029, 1031 of the photodiodes PD are formed apart from the transfer gate portion by a necessary distance. The signal charges accumulated in the photodiodes PD can be completely transferred in the vertical direction through the channel region 1034 which is used as the overflow path 1035 by adjusting the offset amount. Additionally, the saturation charge amount (Qs) to be accumulated in the photodiodes PD can be secured. As a result, the configuration which realizes such complete transfer as well as which secures the saturation charge amount (Qs) can be designed.

The configuration in which then-type semiconductor region 1058 is provided around the vertical transfer gate portion in Embodiment 63 can be applied also to the solid-state imaging devices having photodiode configurations shown in Embodiments 59, 60 and 62 described above.

In the above embodiments, the solid-state imaging devices using electrons as signal charges have been explained. The invention can be also applied to a solid-state imaging device using holes as signal charges. In this case, concerning the conductive type of respective semiconductor regions, the first conductive type will be the n-type and the second conductive type will be the p-type, which is converse to the above embodiments.

Embodiment of an Electronic Apparatus

[Configuration of an Electronic Apparatus]

The solid-state imaging device according to any of the embodiments of the invention can be applied to electronic apparatuses such as camera systems including a digital camera, a video camera and the like providing with the solid-state imaging device, a cellular phone having imaging functions and other apparatuses having imaging functions.

FIG. 71 shows Embodiment 62 in which the invention is applied to a camera as an example of electronic apparatuses. A camera according to the embodiment is, for example, a video camera which can image still pictures or moving pictures. A camera according to the embodiment includes a solid-state imaging device 1, an optical lens (optical system) 110, a shutter device 111, a drive circuit 112 and a signal processing circuit 113.

As the solid-state imaging device 1, any one of the solid-state imaging devices of Embodiment 58 to Embodiment 63 described above is applied. Preferably, any of the solid-state imaging devices in Embodiments 58, 59, 60, 62 and 63 is applied. The optical lens 110 images image light (incident light) from a subject on an imaging surface of the solid-state imaging device 1. Accordingly, signal charges are accumulated in the solid-state imaging device 1 for a fixed period of time. The optical lens 110 may be an optical system including plural optical lenses. The shutter device 112 controls an illumination period and a shielding period of light with respect to the solid-state imaging device 1. The drive circuit 112 supplies control signals controlling transfer operation and shutter operation of the solid-state imaging device 1. The signal transfer of the solid-state imaging device 1 is performed by a drive signal (timing signal) supplied from the drive circuit 112. The signal processing circuit 113 performs various signal processing. Video signal which have received signal processing are stored in a recording medium such as a memory or outputted to a monitor.

In the camera according to the embodiment, increase of the saturation charge amount (Qs), and improvement of the dynamic range can be realized occurrence of dark current and thereby occurrence of white defects can be suppressed, as a result, the pixel size can be reduced. Therefore, the electronic apparatus can be small in size as well as the electronic apparatus having high image quality can be obtained.

[Whole Configuration of a Solid-State Imaging Device]

The whole configuration of a CMOS solid-state imaging device, namely, a CMOS image sensor to which Embodiment 64 and Embodiment 65 which will be explained below are applied is explained with reference to FIG. 5.

A solid-state imaging device 1 shown in FIG. 5 includes an imaging area 3 having plural pixels 2 arranged on a semiconductor substrate 2030 made of Si, a vertical drive circuit 4, column signal processing circuits 5, a horizontal drive circuit 6, an output circuit 7, a control circuit 8 and the like as peripheral circuits of the imaging area 3.

The pixel 2 includes a photodiode as a photoelectric conversion element and plural MOS transistors, and plural pixels 2 are arranged regularly on the semiconductor substrate 2030 in a two-dimensional array state.

The imaging area 3 includes the plural pixels 2 regularly arranged in the two-dimensional array state. The imaging area 3 includes an effective pixel area in which light is actually received and signal charges generated by photoelectric conversion are accumulated and a black reference pixel area which is formed around the effective pixel area for outputting optical black to be a reference of a black level.

The control circuit 8 generates a clock signal, a control signal and the like to be references of operations of the vertical drive circuit 4, the column signal processing circuits 5, the horizontal drive circuit 6 and the like based on a vertical synchronization signal, a horizontal synchronization signal and a master clock. The clock signal, the control signal and the like generated in the control circuit 8 are inputted to the vertical drive circuit 4, the column signal processing circuits 5 and the horizontal drive circuit 6 and the like.

The vertical drive circuit 4 includes, for example, a shift register, selectively scanning respective pixels 2 in the imaging area 3 by the row sequentially in the vertical direction. Then, pixel signals based on signal charges generated in accordance with the light receiving amount in photodiodes of respective pixels 2 are supplied to the column signal processing circuits 5 through vertical signal lines.

The column signal processing circuits 5 are arranged, for example, at respective columns of pixels 2, performing signal processing such as noise removal or signal amplification to signals outputted from pixels 2 of one row by the pixel column using a signal from a black reference pixel area (formed around the effective pixel area though not shown). Horizontal selection switches (not shown) are provided at output stages of the column signal processing circuits 5 between the circuits 5 and a horizontal signal line 2031.

The horizontal drive circuit 6 includes, for example, a shift register, sequentially selecting respective column signal processing circuits 5 by sequentially outputting horizontal scanning pulses to thereby allow respective column signal processing circuits 5 to output pixel signals to the horizontal signal lines 2031.

The output circuit 7 performs signal processing to signals sequentially supplied from respective column signal processing circuits 5 through the horizontal signal line 2031 and output the signals.

The solid-state imaging devices explained as follows are included in the solid-state imaging device 1 shown in FIG. 5, and they particularly show cross-sectional configurations in effective imaging areas.

Embodiment 64

[Configuration of a Solid-State Imaging Device]

Figure 95:
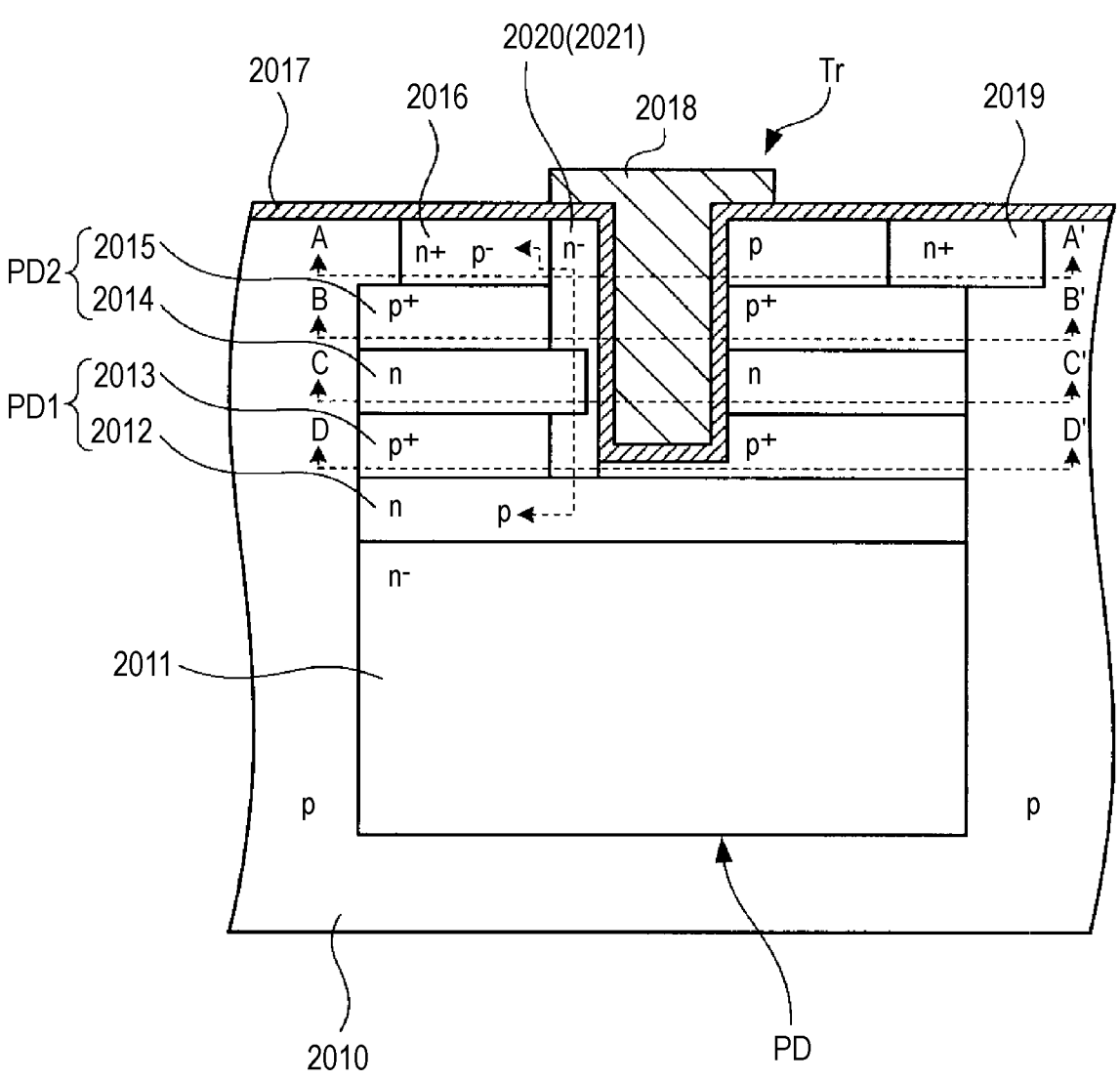
FIG. 95 is a cross-sectional configuration view of a solid-state imaging device according to Embodiment 64 of the invention.

FIG. 95 shows a schematic cross-sectional configuration of a solid-state imaging device according to Embodiment 64 of the invention. FIG. 95 shows a cross-sectional configuration of one pixel.

[Configuration]

A solid-state imaging device of the present embodiment includes plural layers of photodiodes formed by being stacked with junction surfaces between a p-type impurity region as a first conductive type and an n-type impurity region as a second conductive type in different depths in a semiconductor substrate 2010, a vertical transistor Tr and an overflow path 2021.

The configuration of the solid-state imaging device of the embodiment will be described in detail below.

The semiconductor substrate 2010 is made of a semiconductor material including a p-type impurity region (p).

The photodiode PD includes an n-type low concentration impurity region (hereinafter, referred to as an n-region) 2011 formed in the semiconductor substrate 2010, a first n-type impurity region 2012, a first p-type high concentration impurity region 2013, a second n-type impurity region 2014 and a second p-type high concentration impurity region 2015 which are sequentially stacked on the surface side with respect to then-region 2011. In the photodiode PD, a first photodiode PD1 is formed by including a junction surface between the first n-type impurity region 2012 and the first p-type high concentration impurity region 2013. Also, a second photodiode PD2 is formed by including a junction surface between the second n-type impurity region 2014 and the second p-type high concentration impurity region 2015. Accordingly, in the embodiment, the photodiode PD including the first photodiode PD1 and the second photodiode PD2 is formed in the depth direction of the semiconductor substrate 2010. FIG. 96A, FIG. 96B, FIG. 96C and FIG. 96D respectively show cross-sectional views taken along A-A' line, B-B' line, C-C' line and D-D' line of FIG. 95.

The vertical transistor includes a reading gate electrode 2018 formed through a gate insulating film 2017, a floating diffusion region 2016 and a transfer channel 2020.

The reading gate electrode 2018 is formed in a columnar shape in the depth reaching the first p-type high concentration impurity region 2013 included in the first photodiode PD1 from the surface of the semiconductor substrate 2010. That is, the reading gate electrode 2018 is formed in a vertical shape along the second photodiode PD2 and the first photodiode PD1 formed from the surface of the semiconductor substrate 2010 in the depth direction. As can be seen from planar configurations of respective layers shown in FIG. 96A to FIG. 96D, the reading gate electrode 2018 is formed at the central portion of the first photodiode PD1 and the second photodiode PD2 included in the pixel in the embodiment. The gate insulating film 2017 is formed between the reading gate electrode 2018 and the semiconductor substrate 2010 as well as formed extending on the surface of the semiconductor substrate 2010.

The reading gate electrode 2018 formed in the columnar shape is formed by polysilicon buried into a groove portion formed in a columnar shape in the depth reaching the first p-type high concentration impurity region 2013 from the surface side of the semiconductor substrate 2010 through the gate insulating film 2017. As the gate insulating film 2017, a silicon oxide film and the like can be used.

The floating diffusion region 2016 is made of an n-type high concentration impurity region (n+), which is formed at the surface of the semiconductor substrate 2010.

The transfer channel 2020 is made of an n-type low concentration impurity region (n−), which is formed at a portion adjacent to the reading gate electrode 2018 formed in the semiconductor substrate 2010 through the gate insulating film 2017. The transfer channel 2020 is formed so as to touch the floating diffusion region 2016 and the first and second n-type impurity regions 2012, 2014 included in the first and second photodiodes PD1, PD2. The second n-type impurity region 2014 is formed so as to be closer to the reading gate electrode 2018 in the region of the transfer channel 2020. If the second n-type impurity region 2014 completely touches the reading gate electrode 2018 through the gate insulating film 2017, junction capacitance is increased and efficiency is reduced when signal charges are transferred through the transfer channel. However, the second n-type impurity region 2014 is formed close to the reading gate electrode 2018 without touching the electrode, thereby further increasing the saturation charge amount of the second photodiode PD2.

In the vertical transistor Tr, when positive voltage is applied to the reading gate electrode 2018, the potential of the transfer channel 2020 is changed. Accordingly, signal charges accumulated in the first and second photodiodes PD1, PD2 included in the photodiode PD are transferred through the transfer channel 2020 and read to the floating diffusion region 2016.

Figure 97:
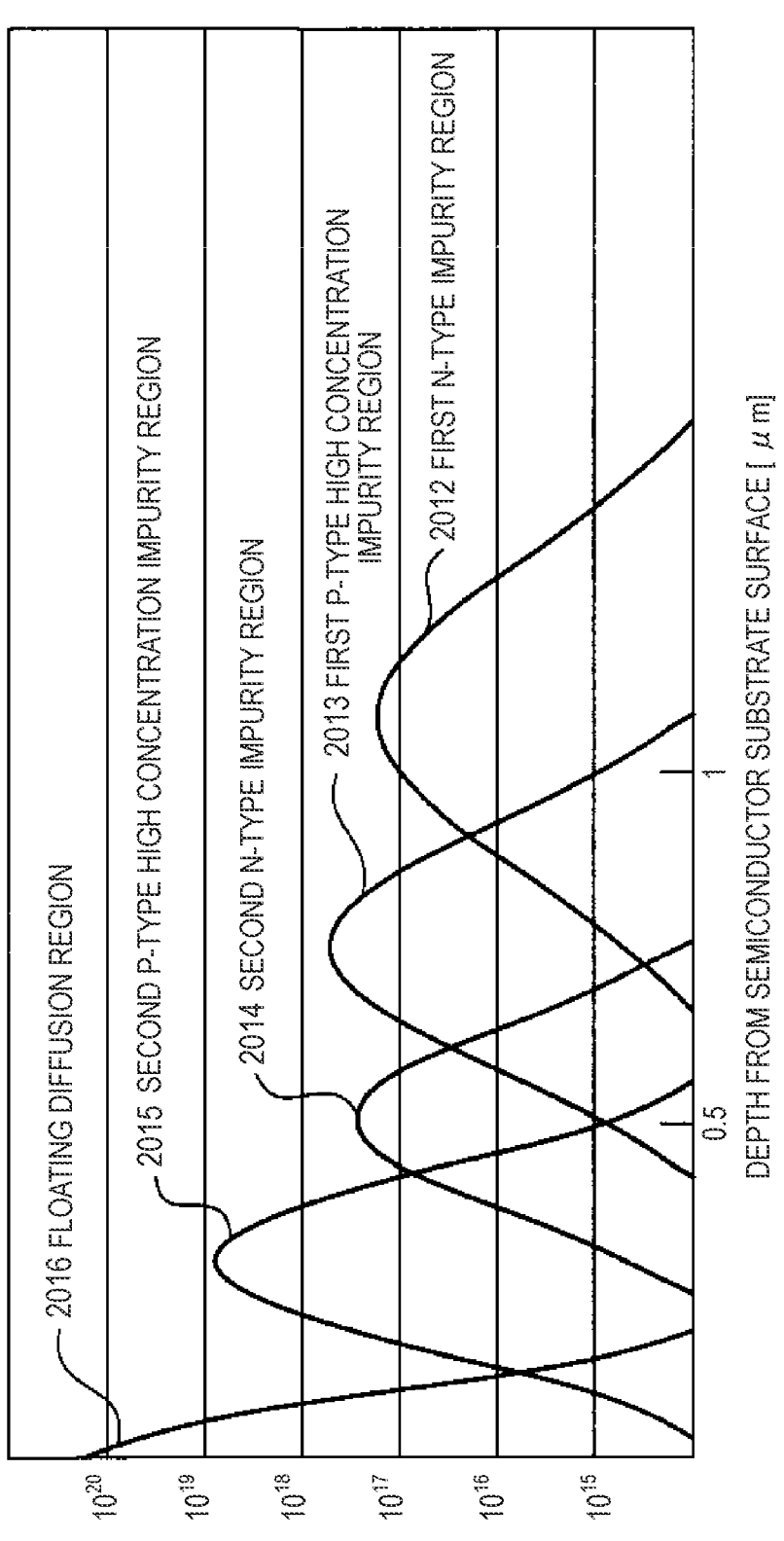
FIG. 97 is an impurity concentration distribution graph of the solid-state imaging device according to Embodiment 64.

FIG. 97 shows the impurity concentration of the first photodiode PD1, the second photodiode PD2 and the floating diffusion region 2016 in the solid-state imaging device of the embodiment. The horizontal axis in FIG. 97 indicates the depth from the surface of the semiconductor substrate 2010 and the vertical axis indicates the impurity concentration.

As shown in FIG. 97, the impurity concentration of the first n-type impurity region (n) 2012 included in the photodiode PD1 is $1017/cm^3$. The impurity concentration of the first p-type high concentration impurity region (p+) 2013 included in the photodiode PD1 is 1017 to $1018/cm^3$. The impurity concentration of the second n-type impurity region (n) 2014 included in the second photodiode PD2 is $1017/cm^3$. The impurity concentration of the second p-type high concentration impurity region (p+) 2015 included in the second photodiode PD2 is 1018 to $1019/cm^3$. The impurity concentration of then-type high concentration impurity region (n+) included in the floating diffusion region 2016 is $1020/cm^3$ or more. The impurity concentration shown in FIG. 97 is displayed in logarithms, therefore, the first n-type impurity region 2012 and the second n-type impurity region 2014 are in the same order, however, the impurity concentration of the second n-type impurity region 2014 is approximately twice higher in fact.

Also according to the impurity concentration distribution shown in FIG. 97, the second n-type impurity region 2014 is totally depleted. The second n-type impurity region 2014 has the impurity concentration distribution which can allow the region to be totally depleted, thereby allowing the second n-type impurity region 2014 to be totally depleted again when signal charges accumulated in the second n-type impurity region 2014 are transferred, as a result, all signal charges can be transferred. The remnant of signal charges is not mixed into signal charges to be accumulated next and residual images can be eliminated by totally depleting the second n-type impurity region 2014 as described above.

According to the concentration distribution shown in FIG. 97, the efficiency of reading signal charges accumulated in the first and second photodiodes PD1, PD2 formed in the depth direction of the semiconductor substrate 2010 to the floating diffusion region 2016 can be improved.

When plural layers of p-type impurity regions and n-type impurity regions are formed by ion implantation, the impurity region at a deep position in the semiconductor substrate 2010 tends to spread and have low concentration. Therefore, the manufacture with the impurity concentration distribution like the embodiment is easy.

Furthermore, when the second n-type impurity region 2014 included in the second photodiode PD2 is formed so as to be close to the reading gate electrode 2018, the impurity concentration of a region close to the reading gate electrode 2018 becomes high. Accordingly, it is possible to accumulate electrons at the region close to the reading gate electrode 2018 and the transfer becomes easy.

In the embodiment, the transfer channel 2020 doubles as the overflow path 2021. The overflow path 2021 is used as a path for transferring signal charges exceeding the saturation charge amount of one photodiode to the other photodiode or to the floating diffusion region 2016 at the time of accumulating signal charges in the photodiode PD. That is, the first and second pohotodiods PD1, PD2 and the floating diffusion region 2016 are electrically connected by the overflow path 2021 at the time of accumulating signal charges to the photodiode PD.

In the embodiment, when one photodiode is regarded as the first photodiode PD1, the other photodiode can be regarded as the second photodiode PD2.

A source/drain region of another MOS transistor included in one pixel is formed by an n-type high concentration impurity region (n+) 2019 on the surface of the semiconductor substrate 2010. As the MOS transistor, for example, a selection transistor, a reset transistor, an amplification transistor or the like can be cited. In FIG. 95, only one source/drain region included in the MOS transistor formed in one pixel is typically shown.

Figure 98:
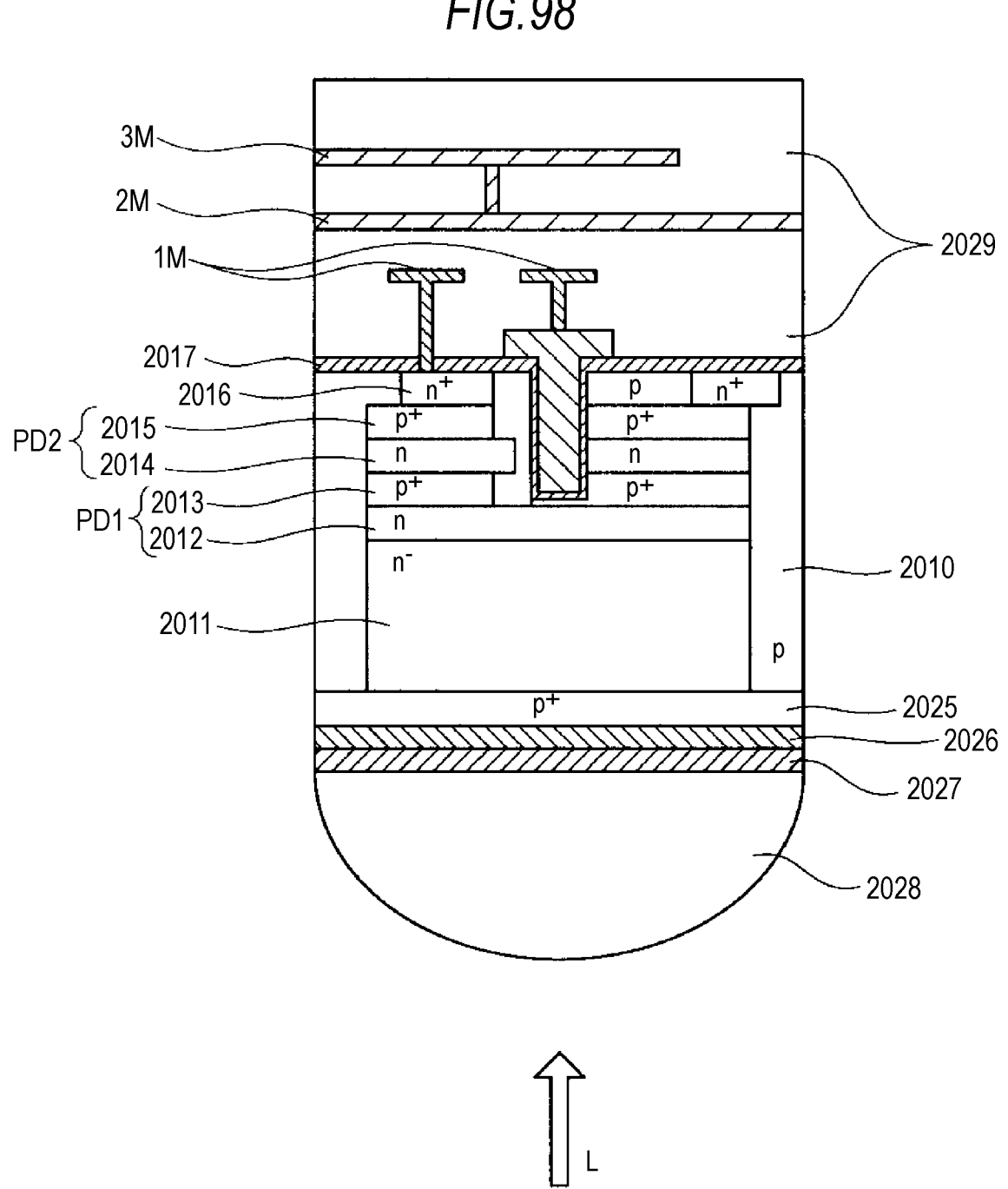
FIG. 98 is a view when the solid-state imaging device according to Embodiment 64 is applied to a back-illuminated type.

The solid-state imaging device of the embodiment can be used as a back-illuminated solid-state imaging device and as a front-illuminated solid-state imaging device. FIG. 98 shows a schematic cross-sectional configuration when it is used as the back-illuminated solid-state imaging device.

As shown in FIG. 98, desired wiring layers are formed on the surface side of the semiconductor substrate 2010 through an interlayer insulating film 2029. In an example shown in FIG. 98, three wiring layers 1M to 3M are formed. The desired wirings are connected to one another through a contact portion.

On the back side of the semiconductor substrate 2010, a p-type high concentration impurity region 2025 is formed so as to touch then-region 2011 included in the photodiode PD. Furthermore, on the back side of the semiconductor substrate 2010, for example, a passivation film 2026 made of SiN, a color filter 2027 and an on-chip lens 2028 are sequentially formed.

[Drive Method]

Hereinafter, a drive method will be explained, citing a case in which the solid-state imaging device of the embodiment is the back-illuminated type as an example.

First, a light Lis illuminated from the back side of the solid-state imaging device shown in FIG. 98, that is, from the on-chip lens 2028 side. Then, the light condensed by the on-chip lens 2028 is incident on the photodiode PD through the color filter 2027.

The light incident on the photodiode PD is photoelectrically converted in then-region 2011, the first photodiode PD1 and the second photodiode PD2 to generate signal charges. The generated signal charges are accumulated in the first n-type impurity region 2012 included in the first photodiode PD1 or in the second n-type impurity region 2014 included in the second photodiode PD2. The solid-state imaging device of the embodiment is configured to have a configuration in which a bottom portion of the reading gate electrode 2018 touches the first p-type high concentration impurity region 2013 through the gate insulating film 2017, and negative voltage is applied to the reading gate electrode 2018 at the accumulating signal charges. According to this, holes are pinned at the bottom portion of the reading gate electrode 2018 through the gate insulating film 201 7. The hole pinning in which holes are pinned occurs as described above, thereby shutting dark current noise entering from the bottom portion of the reading gate electrode 2018 and the gate insulating film 2017 into the first p-type high concentration impurity region 2013. Accordingly, it is possible to reduce dark current reaching the first photodiode PD1 and the second photodiode PD2.

FIG. 99A to FIG. 99E show potential distribution views taken along P-P′ line in FIG. 95, showing states of signal charges accumulated in potential wells made of the first n-type impurity region 2012 and the second n-type impurity region 2014 at the time of accumulating signal charges. In the solid-state imaging device of the embodiment, as shown in FIG. 99A to FIG. 99E, the first photodiode PD1 formed on a deeper side of the semiconductor substrate 2010 has higher potential than the second photodiode PD2. The potential well formed in the first photodiode PD1 is shallower than the potential well formed in the second photodiode PD2.

Figures 99A, 99B, 99C, 99D, 99E:
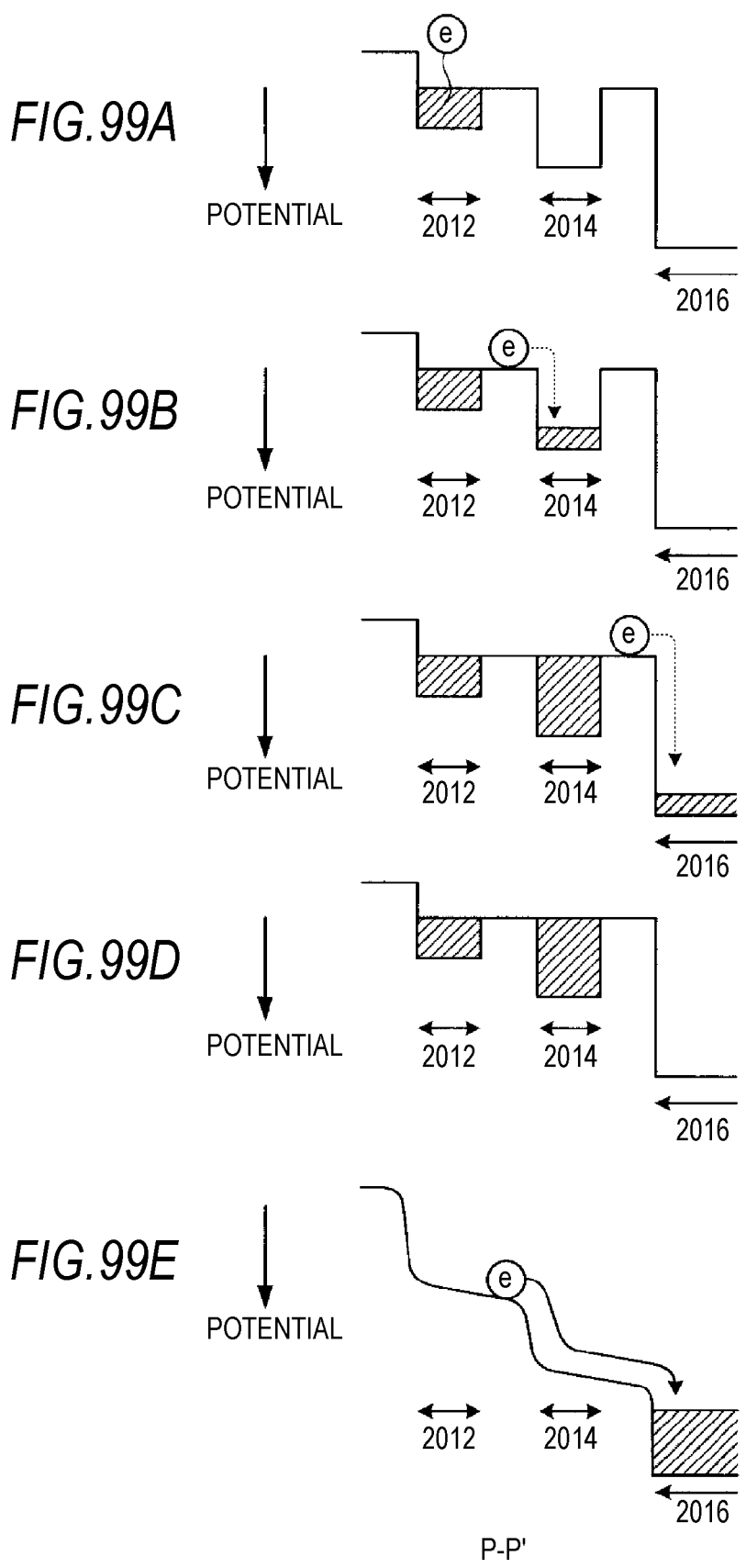
FIG. 99A to FIG. 99E are views schematically showing potentials and accumulated signal charges when seen in p-p cross section of FIG. 95.

The signal charges generated by photoelectric conversion in the photodiode PD are accumulated in the potential well made of the first n-type impurity region 2012 at first as shown in FIG. 99A. Then, strong light is radiated, signal charges to be generated are increased and exceed the saturation charge amount of the first n-type impurity region 2012. In such a case, signal charges "e" overflowed the potential well made of the first n-type impurity region 2012 are transferred to the potential well made of the second n-type impurity region 2014 as shown in FIG. 99B through the overflow path 2021. At this time, the potentials are as shown in FIG. 99A to FIG. 99E, therefore, the signal charges "e" exceeding the saturation charge amount of the first n-type impurity region 2012 are completely transferred to the second n-type impurity region 2014.

Then, as shown in FIG. 99C, the signal charges "e" further exceeding the saturation charge amount of the potential well made of the second n-type impurity region 2014 are transferred to the floating diffusion region 2016. Then, as shown in FIG. 99D, the signal charges "e" transferred to the floating diffusion region 2016 are reset by reset voltage applied to the floating diffusion region 2016. That is, in the embodiment, the signal charges "e" exceeding the saturation charge amounts of the first and second photodiodes PD1, PD2 are transferred to the floating diffusion region 2016 and are reset there.

After signal charges are accumulated, positive voltage is applied to the reading gate electrode 2018. Then, the potential of the transfer channel 2020 which doubles as the overflow path 2021 becomes deep as shown in FIG. 99E. Accordingly, signal charges accumulated n the first n-type impurity region 2012 and the second n-type impurity region 2014 are transferred through the transfer channel 2020 and read to the floating diffusion region 2016 at the same time.

The drive method after that is the same as drive of a normal solid-state imaging device. That is, signal charges are transferred to the floating diffusion region 2016 and voltage change in the floating diffusion region 2016 is amplified by a not-shown amplification transistor to be outputted.

In the solid-state imaging device of the embodiment, two photodiodes including the first and second photodiodes PD1, PD2 are formed in the depth direction of the semiconductor substrate 2010. The overflow path 2021 through which signal charges can be transferred at the time of accumulating signals between the first photodiode PD1, the second photodiode PD2 and the floating diffusion region 2016. Accordingly, signal charges exceeded the saturation charge amount of one photodiode and overflowed the photodiode are accumulated in another photodiode. According to the configuration, the saturation charge amount of the whole photodiode PD is increased. As a result, the sensitivity of the solid-state imaging device can be improved.

When signal charges overflow further another photodiode, the charges are transferred to the floating diffusion region 2016 and reset by application of reset voltage.

In the solid-state imaging device of the embodiment, the vertical transistor Tr including the reading gate electrode 2018 which is buried in the depth direction of the photodiode PD is formed. Accordingly, signal charges accumulated in the first and second photodiodes PD1, PD2 formed in the depth direction of the semiconductor substrate 2010 can be completely transferred to the floating diffusion region 2016.

Though the solid-state imaging device of the embodiment is configured by two photodiodes including the first photodiode PD1 and the second photodiode PD2, it is possible that two or more, a plural desired number of photodiodes can be stacked. The plural number of photodiodes are stacked, thereby increasing the saturation charge amount (Qs) as well as improving sensitivity even when the pixel size is reduced. That is, the pixel size reduction can be easily realized while increasing the saturation charge amount and improving sensitivity, therefore, the configuration of the embodiment is advantageous for reducing the pixel size. Additionally, since the saturation charge amount can be increased and the dynamic range can be increased, improvement of the contrast is realized.

Furthermore, when the back-illuminated solid-state imaging device is applied, the side in which plural pixel transistors included in the solid-state imaging device are formed is opposite to the side on which light is incident. Since the area for openings is necessary on the surface of the semiconductor substrate 2010 in the case of the front-illuminated type, positions of forming pixel transistors formed on the semiconductor 2010 are limited. However, in the case of the back-illuminated solid-state imaging device, the pixel transistors, wiring and the like are not arranged on the light incident side, therefore, the area of the photodiode PD can be expanded and the arrangement is not affected by design rules at the reduction of the pixel size. Additionally, since the photodiode on the surface side can be formed in a deep position of the semiconductor substrate 2010, it is possible to reduce effects of the defect level on the surface of the semiconductor substrate 2010.

In the solid-state imaging device of the embodiment, bottom portions of the reading gate electrode 2018 and the gate insulating film 2017 are formed in the depth reaching the first p-type high concentration impurity region. However, the reading gate electrode 2018 may be formed to the depth in which signal charges accumulated in the first photodiode PD1 can be read. For example, it is also preferable that the reading gate electrode 2018 is formed so as to reach the junction surface between the first n-type impurity region 2012 and the first p-type high concentration impurity region 2013. However, when the reading gate electrode 2018 touches then-type impurity region, coupling capacitance is increased at the time of reading signal charges, therefore, reading efficiency is reduced. In the embodiment, the bottom portions of the reading gate electrode 2018 and the gate insulating film 2017 do not touch then-type impurity region, thereby improving reading efficiency.

Figure 100:
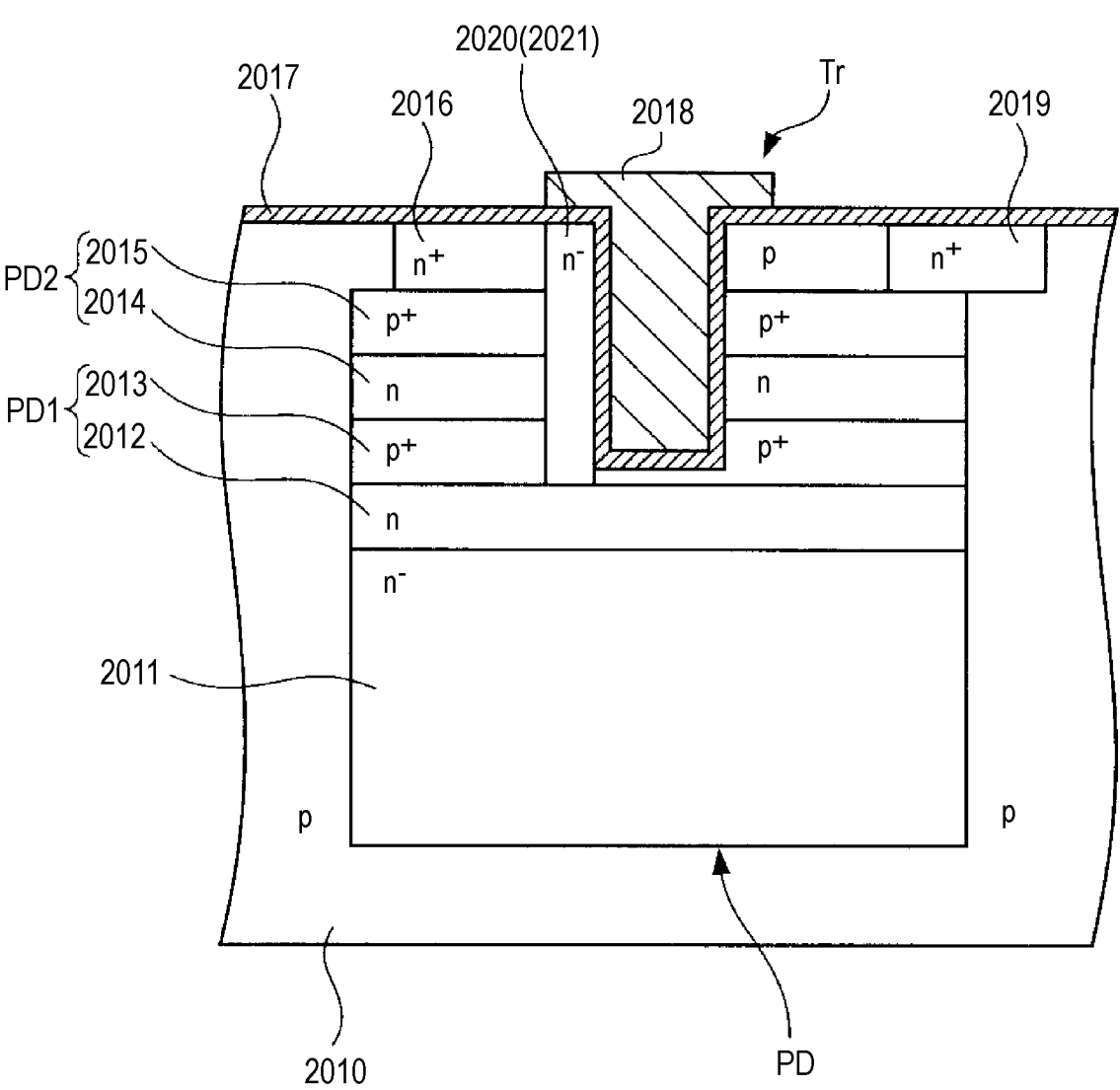
FIG. 100 shows another example of the solid-state imaging device according to Embodiment 64.

In the embodiment, it is also preferable that the second n-type impurity region 2014 in the photodiodes PD formed in the depth direction of the semiconductor substrate 2010 is formed apart from the reading gate electrode 2018 by the same distance as the first and second p-type high concentration impurity regions 2013, 2015 as shown in FIG. 100.

Embodiment 65

[Configuration of a Solid-State Imaging Device]

Figure 101:
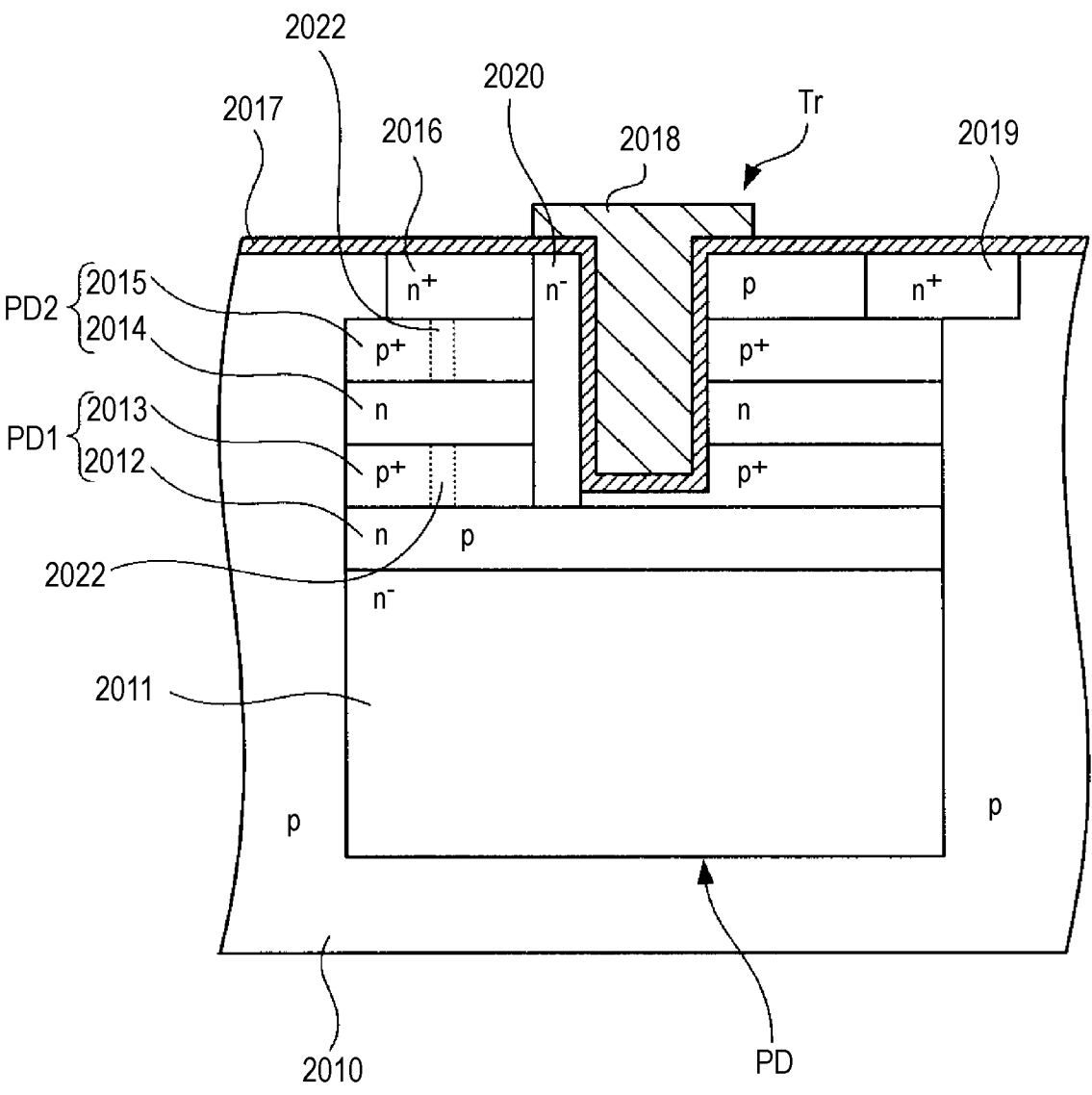
FIG. 101 is a cross-sectional configuration view of a solid-state imaging device according to Embodiment 65 of the invention.

FIG. 101 shows a schematic cross-sectional configuration of a solid-state imaging device according to Embodiment 65. In FIG. 101, same symbols are given to portions corresponding to FIG. 95 and the repeated explanation is omitted.

In the solid-state imaging device of the embodiment, an overflow path 2022 is made of an n-type impurity region formed at parts of the first p-type high concentration impurity region 2013 and the second p-type high concentration impurity region 2015. The overflow path 2022 is formed by ion-implanting the n-type impurity into parts of the first and second p-type high concentration impurity region 2013, 2015. Then-type impurity region formed in the first p-type high concentration impurity region 2013 electrically connects the first n-type impurity region 2012 to the second n-type impurity region 2014. Also, then-type impurity region formed in the second p-type high concentration impurity region 2015 electrically connects the second n-type impurity region 2014 to the floating diffusion region 2016.

In the solid-state imaging device of the embodiment, at the time of accumulating signal charges, signal charges overflowed a potential well made of the first n-type impurity region 2012 are accumulated in the second n-type impurity region 2014 through the overflow path 2022 formed in the first p-type high concentration impurity region 2013. Then, signal charges further overflowed a potential well made of the second n-type impurity region 2014 are transferred to the floating diffusion region 2016 through the overflow path 2022 formed in the second p-type high concentration impurity region 2015 and are reset there.

Then, after accumulating signal charges, positive voltage is applied to the reading gate electrode 2018. As a result, the potential of the transfer channel 2020 which doubles as the overflow path 2021 becomes deep in the same manner as Embodiment 64. According to this, signal charges accumulated in the first n-type impurity region 2012 and the second n-type impurity region 2014 are transferred through the transfer channel 2020 and read to the floating diffusion region 2016 at the same time.

Also in the solid-state imaging device of the embodiment, the same advantages as Embodiment 64 can be obtained. In the embodiment, the overflow path 2022 is made of then-type impurity region, however, it is also preferable that the overflow path 2022 is made of a p-type low impurity region if it is a region having the potential which can transfer overflowed signal charges.

The configuration of the overflow path in the invention is not limited to the configurations of the overflow path in Embodiment 64 and Embodiment 65 described above. It is possible to apply a configuration in which signal charges exceeded the saturation charge amounts of respective photodiodes and overflowed the photodiodes can be transferred among plural photodiodes at the time of accumulating signal charges.

In the above embodiments of the solid-state imaging device, the case in which the invention is applied to the image sensor in which unit pixels detecting signal charges corresponding to the light amount of visible light as physical quantity are arranged in a matrix state has been explained as an example. However, the invention is not limited to the application to the image sensor, and it is possible to be applied to the entire column-type solid-state imaging device in which column circuits are arranged at respective pixel columns in the pixel array area.

Additionally, the application of the invention is not limited to the solid-state imaging device in which distribution of the incident light amount of visible light is detected and imaged as an image, and it is possible that the invention is applied to a solid-state imaging device in which distribution of the incident light amount of infrared rays, X-rays or particles is imaged as an image. In a broad sense, the invention can be also applied to all solid-state imaging devices (physical quantity distribution detection devices) such as a fingerprint detection sensor which detects distribution of other physical quantities such as pressure or capacitance.

Moreover, the invention is not limited to the solid-state imaging device which reads pixel signals from respective unit pixels by scanning respective unit pixels in the pixel array portion row by row. For example, the invention can be also applied to an X-Y address type solid-state imaging device which selects an arbitrary pixel by the pixel and reads signals by the pixel from the selected pixel.

The solid-state imaging device may be formed as a one-chip or may be formed as a module state having imaging functions, in which an imaging unit, a signal processing unit or an optical system are integrally packaged.

The invention is not limited to the solid-state imaging device but can be applied to an imaging apparatus. Here, the imaging apparatus means an electronic apparatus having imaging functions, for example, camera systems such as a digital still camera and a digital video camera, a cellular phone and the like. There is a case in which the module state to be mounted on the electronic apparatus, namely, a camera module is defined as an imaging apparatus.

Embodiment 66

[Electronic Apparatus]

Hereinafter, an embodiment in which the solid-state imaging device according to the above embodiments of the invention is used in an electronic apparatus is shown. In the following description, an example in which a solid-state imaging device which has been explained in Embodiments 64 or Embodiment 65 is used for a camera will be explained.

FIG. 71 shows a schematic planar configuration according to Embodiment 66 of the invention. The camera according to the embodiment is, for example, a video camera which can image still pictures or moving pictures. A camera according to the embodiment includes the solid-state imaging device 1, an optical lens 110, a shutter device 111, a drive circuit 112 and a signal processing circuit 113.

The optical lens 110 images an image light (incident light) from a subject on an imaging surface of the solid-state imaging device 1. Accordingly, signal charges are accumulated in the solid-state imaging device 1 for a fixed period of time. The optical lens 110 may be an optical lens system including plural optical lenses.

The shutter device 111 controls an illumination period and a shielding period of light with respect to the solid-state imaging device 1.

The drive circuit 112 supplies a drive signal for controlling transfer operation of the solid-state imaging device 1 and shutter operation of the shutter device 111. The signal transfer is performed by a drive signal (timing signal) supplied from the drive circuit 112. The signal processing circuit 113 performs various signal processing. Video signals which have received signal processing are stored in a storage medium such as a memory or outputted to a monitor.

In related arts, the saturation charge amount of the photodiode is reduced due to reduction of the open area ratio by reducing the pixel size, therefore, the size reduction and high image quality in the electronic apparatus contradict each other. However, in the camera of the embodiment, it is possible to reduce the pixel size in the solid-state imaging device while increasing the saturation charge amount (Qs) as well as improving sensitivity. Accordingly, it is possible to reduce size of the electronic apparatus as well as to obtain the electric apparatus having higher image quality. In short, the size reduction, high resolution and high image quality can be realized in the electronic apparatus.

In the solid-state imaging device according to Embodiments 64 to 66 described above, the invention is applied to the solid-state imaging device in which signal charges are electrons, however, it is possible to be applied to a solid-state imaging device in which signal charges are holes. In such case, the above examples can be achieved by regarding the first conductive type as then-type and regarding the second conductive type as the p-type.

FIG. 5 shows a schematic configuration of an embodiment of a solid-state imaging device, namely, a CMOS image sensor to which the invention is applied. A solid-state imaging device 3001 according to the embodiment includes an imaging area 3 in which plural pixels 2 including photodiodes which are photoelectric converter are arranged regularly in a two-dimensional array state on a semiconductor substrate, for example, a Si substrate 11, a vertical drive circuit 4, column signal processing circuits 5, a horizontal drive circuit 6, an output circuit 7, a control circuit 8 and the like as peripheral circuits thereof.

The control circuit 8 generates a clock signal, a control signal and the like to be references of operations of the vertical drive circuit 4, the column signal processing circuits 5, the horizontal drive circuit 6 and the like based on a vertical synchronization signal, a horizontal synchronization signal and a master clock. The clock signal, the control signal and the like generated in the control circuit 8 are inputted to the vertical drive circuit 4, the column signal processing circuits 5 and the horizontal drive circuit 6 and the like.

The vertical drive circuit 4 includes, for example, a shift register, selectively scanning respective pixels 2 in the imaging area 3 by the row sequentially in the vertical direction. Then, pixel signals based on signal charges generated in accordance with the light receiving amount in photodiodes of respective pixels 2 are supplied to the column signal processing circuits 5 through vertical signal lines.

The column signal processing circuits 5 are arranged, for example, at respective columns of pixels 2, performing signal processing such as noise removal or signal amplification to signals outputted from pixels 2 of one row by the pixel column using a signal from a black reference pixel area (formed around the effective pixel area though not shown) Horizontal selection switches (not shown) are provided at output stages of the column signal processing circuits 5 between the circuits 5 and a horizontal signal line 3010.

The horizontal drive circuit 6 includes, for example, a shift register, sequentially selecting respective column signal processing circuits 5 by sequentially outputting horizontal scanning pulses to thereby allow respective column signal processing circuits 5 to output pixel signals to the horizontal signal lines 3010.

The output circuit 7 performs signal processing to signals sequentially supplied from respective column signal processing circuits 5 through the horizontal signal line 3010 and output the signals.

The solid-state imaging devices in Embodiments 67 to 71 explained as follows are included in the solid-state imaging device 1 shown in FIG. 5, in which cross-sectional configurations of pixels 2 in the effective imaging areas are different to one another. Since other configurations are the same as FIG. 5, only cross-sectional configurations of relevant parts are shown in Embodiments 67 to 71, explanation of other configurations is omitted.

Embodiment 67

Figure 102:
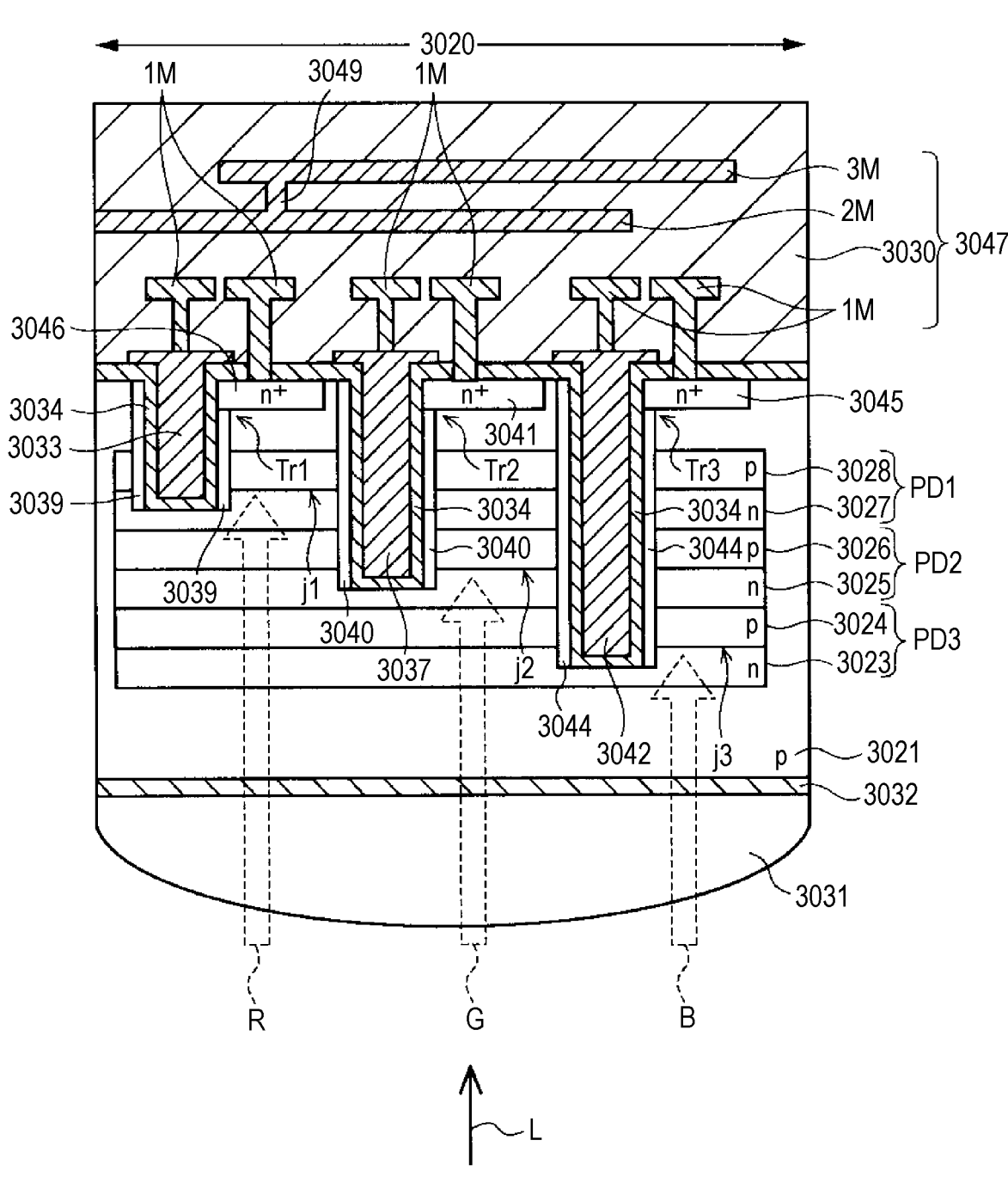
FIG. 102 is a schematic cross-sectional configuration view of a solid-state imaging device according to Embodiment 67 of the invention.

FIG. 102 shows a cross-sectional configuration in a pixel portion of a solid-state imaging device according to Embodiment 67 of the invention. FIG. 102 shows the cross-sectional configuration of one pixel, namely, a unit pixel area 3020.

The solid-state imaging device of the embodiment includes first conductive-type semiconductor layers and second conductive-type semiconductor layers formed by staking plural layers alternately in the depth direction from one face (hereinafter, a surface) side in a first-conductive type silicon substrate 3021. Additionally, plural vertical transistors Tr1, Tr2 and Tr3 formed in desired depths from the surface side of the silicon substrate 3021. The vertical transistors Tr1, Tr2 and Tr3 correspond to charge transfer transistors which will be described later. On the surface side of the silicon substrate 3021, a wiring layer 3047 is formed and on the back side of the silicon substrate 3021, an on-chip lens 3031 is formed. In short, the solid-state imaging device of the embodiment exemplifies a back-illuminated solid-state imaging device in which light is incident from the opposite side of the wiring layer 3047.

In the following description, it is defined that the first conductive type is a p-type and the second conductive type is an n-type, and the first conductive type semiconductor layer indicates a p-type semiconductor layer and the second conductive type semiconductor layer indicates an n-type semiconductor layer which are formed in a stacked manner.

The p-type semiconductor layer and the n-type semiconductor layer formed so to be stacked alternately in the silicon substrate 3021 are formed at a region to be a photodiode in the unit pixel area 3020. In the embodiment, a first p-type semiconductor layer 3028, a first n-type semiconductor layer 3027, a second p-type semiconductor layer 3026, a second n-type semiconductor layer 3025, a third p-type semiconductor layer 3024 and a third n-type semiconductor layer 3023 are sequentially stacked in the surface side of the silicon substrate 3021. The p-type semiconductor layers and n-type semiconductor layers stacked alternately make up plural photodiodes in the unit pixel area 3020. The first to third p-type semiconductor layers 3028, 3026, and 3024 and the first to third n-type semiconductor layers 3027, 3025 and 3023 are formed in a flat-plate shape and stacked. In the embodiment, the first to third p-type semiconductor layers 3028, 3026, and 3024 have higher impurity concentration than the p-type silicon substrate 3021.

The first n-type semiconductor layer 3027 which is formed on the most front side is formed so that the depth of a pn junction "j1" between the first p-type semiconductor layer 3028 and the first n-type semiconductor layer 3027 will be the depth corresponding to a position where red light is absorbed when light is illuminated from the back side. The second n-type semiconductor layer 3025 formed in the second depth from the front side is formed so that the depth of a pn junction "j2" between the second p-type semiconductor layer 3026 and the second n-type semiconductor layer 3025 will be the depth corresponding to a position where green light is absorbed when light is illuminated from the back side. The third n-type semiconductor layer 3023 formed on the most back side is formed so that the depth of a pn junction "j3" between the third p-type semiconductor layer 3024 and the third n-type semiconductor layer 3023 will be the depth corresponding to a position where blue light is absorbed when light is illuminated from the back side.

Then, the first p-type semiconductor layer 3028 and the first n-type semiconductor layer 3027 make up a first photodiode PD1 which performs photoelectric conversion of red light.

The second p-type semiconductor layer 3026 and the second n-type semiconductor layer 3025 make up a photodiode PD2 which performs photoelectric conversion of green light.

The third p-type semiconductor layer 3024 and the third n-type semiconductor layer 3023 make up a photodiode PD3 which performs photoelectric conversion of blue light.

The pn junctions "j1" to "j3" are formed in the first to third photodiodes PD1 to PD3, thereby forming potential wells in the first to third n-type semiconductor layers 3027, 3025 and 3023. Accordingly, in the first to third photodiodes PD1 to PD3, signal charges obtained by photoelectric conversion at respective first to third n-type semiconductor layers 3027, 3025 and 3023 and the vicinity thereof are accumulated in the potential wells formed in respective first to third n-type semiconductor layers 3027, 3025 and 3023. That is, the respective first to third n-type semiconductor layers 3027, 3025 and 3023 correspond to signal accumulation regions. The accumulation capacitance of signal charges is determined by the potential difference between then-type semiconductor layer and the p-type semiconductor layer and the depletion layer capacitance. Since the first to third p-type semiconductor layers 3028, 3026 and 3024 have higher impurity concentration than the silicon substrate 3021 in the embodiment, the accumulation capacitance of signal charges in the first to third photodiodes PD1 to PD3 can be sufficiently secured.

In the present embodiment, the transfer transistor Tr1, Tr2 and Tr3 including gate electrodes 3033, 3037 and 3042 corresponding to the above respective first to third photodiodes PD1 to PD3 are formed.

First, the gate electrode 3033 of the first transfer transistor Tr1 is formed in a depth reaching the pn junction "j1" of the first photodiode PD1 from the surface side of the silicon substrate 3021. The gate electrode 3037 of the second transfer transistor Tr2 is formed in a depth reaching the pn junction "j2" of the second photodiode PD2 from the surface side of the silicon substrate 3021. The gate electrode 3042 of the third transfer transistor Tr3 is formed in a depth reaching the pn junction "j3" of the third photodiode PD3 from the surface side of the silicon substrate 3021.

These gate electrodes 3033, 3037 and 3042 are formed by providing vertical openings in the silicon substrate 3021 in which the first to third photodiode PD1 to PD3 are formed, and burying an electronic material to the openings through a gate insulating film 3034. Additionally, the gate electrodes 3033, 3037 and 3042 are formed in a columnar shape or a prismatic shape, which is formed in a long vertical shape along the depth direction of the silicon substrate 3021. In respective vertical transfer transistors Tr1, Tr2 and Tr3, a gate portion is respectively formed by including each of the gate electrodes 3033, 3037 and 3042, the gate insulating film 3034 and a later-described channel portion.

Here, a gate length of the gate portion including the gate electrode 3042 of the third transfer transistor Tr3 is longer than a gate length of the gate portion including the gate electrode 3037 of the second transfer transistor Tr2. A gate length of the gate portion including the gate electrode 3037 of the second transfer transistor Tr2 is longer than a gate length of the gate portion including gate electrode 3033 of the first transfer transistor Tr1.

At regions on the surface of the silicon substrate 3021 as well as touching gate portions corresponding to the respective gate electrodes 3033, 3037 and 3042, n-type semiconductor regions having high impurity concentration, namely, n+source/drain regions 3046, 3041 and 3045 are individually formed. Accordingly, the first to third transfer transistors Tr1, Tr2 and Tr3 included in the solid-state imaging device of the embodiment are vertical transistors in which signal charges are transferred in a vertical direction along the vertical gate electrodes 303 3, 3037 and 3042 buried in the silicon substrate 3021.

According to the above configuration, a channel portion 3039 of the first transfer transistor Tr1 is formed from the first n-type semiconductor layer 3027 to the n+source/drain region 3 046 along the vertical gate electrode 3033. A channel portion 3040 of the second transfer transistor Tr2 is formed from the second n-type semiconductor layer 3025 to the n+source/drain region 3041 along the vertical gate electrode 3037. A channel portion 3044 of the third transfer transistor Tr3 is formed from the third n-type semiconductor layer 3023 to the n+source/drain region 3045 along the vertical gate electrode 3042. These channel portions 3039, 3040 and 3044 are preferably formed in the vertical direction with respect to the surface of the silicon substrate 3021 so as to be parallel to the respective gate electrodes 3033, 3037 and 3042.

In the first transfer transistor Tr1, the first n-type semiconductor layer 3027 included in the first photodiode PD1 doubles as the source/drain region. Accordingly, signal charges accumulated in the first n-type semiconductor layer 3027 are transferred to the n+source/drain region 3046 through the channel portion 3039.

In the second transfer transistor Tr2, the second n-type semiconductor layer 3025 included in the second photodiode PD2 doubles as the source/drain region. Accordingly, signal charges accumulated in the second n-type semiconductor layer 3025 are transferred to the n+source/drain region 3041 through the channel portion 3040.

In the third transfer transistor Tr3, the third n-type semiconductor layer 3023 included in the third photodiode PD3 doubles as the source/drain region. Accordingly, signal charges accumulated in the third n-type semiconductor layer 3023 are transferred to the n+source/drain region 3045 through the channel portion 3044.

In the first to third transfer transistor Tr1 to Tr3, the n+source/drain regions 3046, 3041 and 3045 formed at regions on the surface of the silicon substrate 3021 as well as touching the respective gate electrodes 3033, 3037 and 3042 will be floating diffusions FD, respectively.

The wiring layer 3047 is formed on the surface side of the silicon substrate 3021. In the wiring layer 3047, desired wirings are formed through an interlayer insulating film 3030. The embodiment is an example of including wirings M1 to M3 formed in three layers, and these wirings M1 to M3 are connected to desired gate electrodes or a power supply. The connection among wirings M1 to M3 are performed by providing a contact 3049 or a VIA.

On the back side of the silicon substrate 3021, the on-chip lens 3031 is formed. Light illuminated from the back side of the silicon substrate 3021 is condensed on the on-chip lens 3031 and incident into the unit pixel area 3020 through, for example, a silicon oxide film 3032.

In the solid-state imaging device having the above configuration, light incident from the back side of the silicon substrate 3021 is photoelectrically converted in the first to third photodiodes PD1 to PD3, and signal charges are accumulated. Since the first to third photodiodes PD1 to PD3 are respectively formed in different depths in the silicon substrate 3021, lights having different wavelengths are absorbed in the first to third photodiodes PD1 to PD3 respectively. In the first photodiode PD1, red light is absorbed, in the second photodiode PD2, green light is absorbed and in the third photodiode PD3, blue light is absorbed.

Then, respective lights incident on the first to third photodiodes PD1 to PD3 are photoelectrically converted and signal charges by the photoelectric conversion are accumulated into the first to third n-type semiconductor layers 3027, 3025 and 3023. That is, signal charges obtained by photoelectric conversion of red light are accumulated in the first n-type semiconductor layer 3027, signal charges obtained by photoelectric conversion of green light are accumulated in the second n-type semiconductor region 3025, and signal charges obtained by photoelectric conversion of blue light are accumulated in the third n-type semiconductor region 3023.

As described above, in the solid-state imaging device of the embodiment, the first to third photodiodes PD1 to PD3 are included in the unit pixel area 3020, therefore, signal charges obtained by three lights can be accumulated respectively.

Incidentally, in the solid-state imaging device of the embodiment, the gate electrode 3042 of the third transfer transistor Tr3 which has the longest channel length touches all then-type semiconductor layers 3027, 3025 and 3023 through the gate insulating film 3034. The gate electrode 3027 of the second transfer transistor Tr2 which has the second longest channel length touches the first and second n-type semiconductor layers 3027, 3025 through the gate insulating film 3034.

Figure 103:
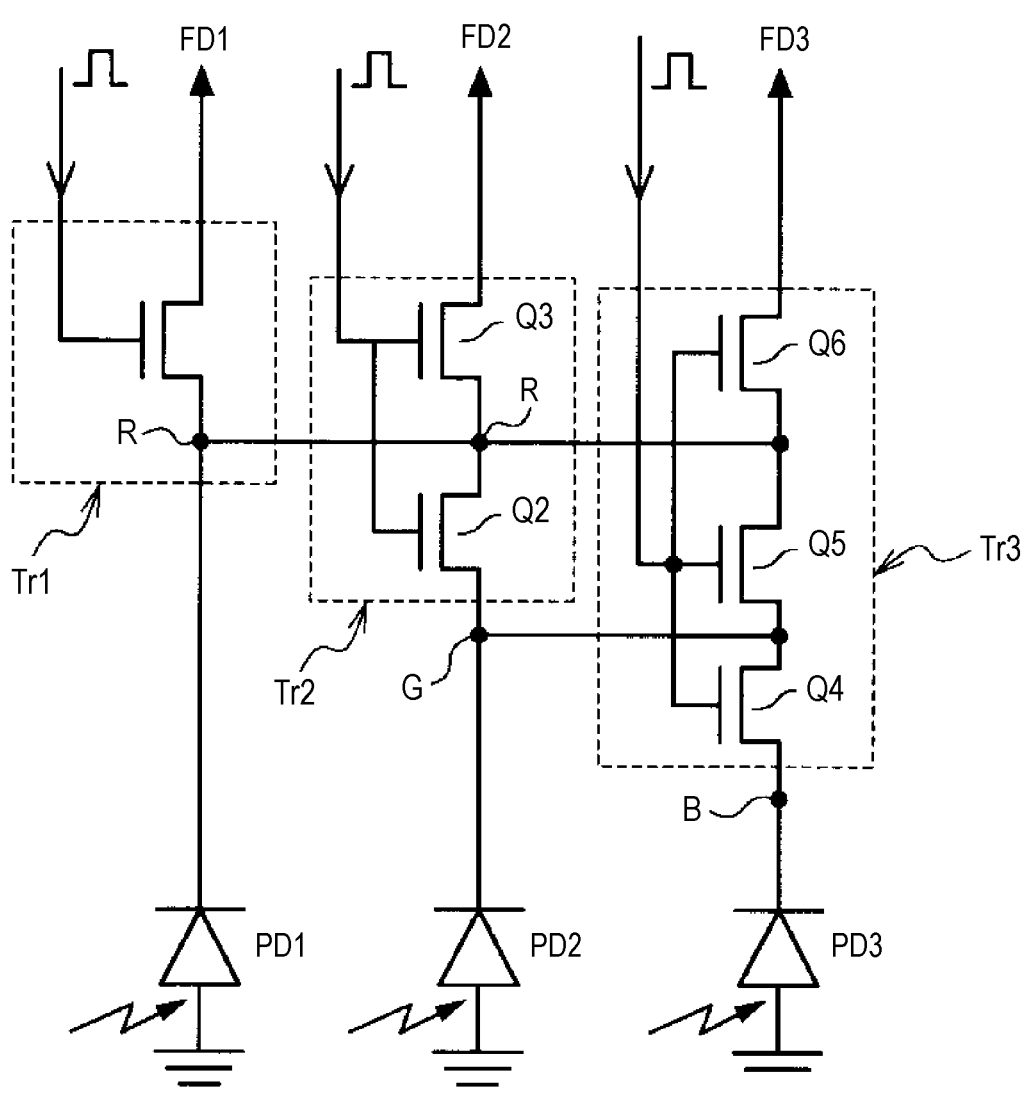
FIG. 103 is an equivalent circuit of a unit pixel of the solid-state imaging device according to Embodiment 67.

FIG. 103 shows an equivalent circuit of a unit pixel in the solid-state imaging device of the embodiment. In the unit pixel, the first photodiode PD1, the second photodiode PD2 and the third photodiode PD3 are included, and respective photodiodes PD1, PD2 and PD3 are connected to respective floating diffusions PD1, FD2 and FD3 through the first, second and third transfer transistors Tr1, Tr2 and Tr3. The second transfer transistor Tr2 includes two transistors Q2, Q3 which are equivalently connected in series. The third transfer transistor Tr3 includes three transistors Q4, Q5 and Q6 which are equivalently connected in series. Gates of the two transistors Q2 and Q3 included in the second transfer transistor Tr2 are connected to each other. Gates of the three transistors Q4, Q5 and Q6 included in the third transistor Tr3 are connected to one another. Further, a source of the first transfer transistor, a source of the transistor Q3 included in the second transistor Tr2 and a source of the transistor Q6 included in the third transfer transistor Tr3 are connected to one another. Additionally, a source of the transistor Q2 included in the second transfer transistor Tr2 and a source of the transistor Q5 included in the third transfer transistor Tr3 are connected to each other.

As can be seen from FIG. 103, in the configuration of the embodiment, signal charges of red color in the first photodiode PD1 are transferred to the first to third floating diffusions FD1 to FD3 by the first to third transfer transistors Tr1 to Tr3, signal charges of green color from the second photodiode PD2 are transferred to the second and third floating diffusions FD2, FD3 by the second and third transfer transistors Tr2, Tr3.

As a result, signal charges obtained by photoelectric conversion of lights of various colors are read by the same transfer transistors all together except in the gate electrode 3033 of the first transfer transistor Tr1, which causes color mixture.

A method of reading signal charges accumulated in the respective first to third photodiodes PD1 to PD3 without causing color mixture in the solid-state imaging device of the embodiment will be explained below.

First, light is illuminated from the back side of the solid-state imaging device to accumulate signal charges in the first to third photodiodes PD1 to PD3.

Next, signal charges are read by using the third transfer transistor Tr3. As described above, the gate electrode 3042 of the third transfer transistor Tr3 touches the first to third n-type semiconductor layers 3027, 3025 and 3023 through the gate insulating film 3034. Therefore, signal charges accumulated in the first to third n-type semiconductor layers 3027, 3025 and 3023 are read to the n+source/drain region 3045 of the third transfer transistor Tr3 to be the third floating diffusion FD3 along the channel portion 3044 formed under the gate electrode 3042 of the third transfer transistor Tr3. That is, all signal charges accumulated in the first to third photodiodes PD1 to PD3 are read out by the gate electrode 3042 of the third transfer transistor Tr3. An output potential by signal charges read to the n+source/drain region 3045 of the third transfer transistor Tr3 will be an output potential arising from red, green and blue lights.

The output potential is VRGB.

Next, light is illuminated from the back side of the solid-state imaging device again to accumulate signal charges in the first to third photodiodes PD1 to PD3.

Then, signal charges are read by using the second transfer transistor Tr2. As described above, the gate electrode 3037 of the second transfer transistor Tr2 touches the first and second n-type semiconductor layers 3027, 3025 through the gate insulating film 3034. Therefore, signal charges accumulated in the first and second n-type semiconductor layers 3027, 3025 are read to the n+source/drain region 3041 of the second transfer transistor Tr2 to be the second floating diffusion FD2 along the channel portion 3040 formed under the gate electrode 3037 of the second transfer transistor Tr2. That is, signal charges accumulated in the first and second photodiodes PD1, PD2 are read out by the gate electrode 3037 of the second transfer transistor Tr2. An output potential by signal charges read to the n+source/drain region 3041 of the second transfer transistor Tr2 will be an output potential arising from red and green lights.

The output potential is VRG.

Next, light is illuminated from the back side of the solid-state imaging device again to accumulate signal charges in the first to third photodiodes PD1 to PD3.

Then, signal charges are read by using the first transfer transistor Tr1. The gate electrode 3033 touches only the first n-type semiconductor layer 3027 through the gate insulating film 3034. Therefore, signal charges accumulated in the first n-type semiconductor layer 3027 are read to the n+source/drain region 3046 of the first transfer transistor Tr1 to be the first floating diffusion FD1 along the channel portion 3039 formed under the gate electrode 3033 of the first transfer transistor Tr1. An output potential by signal charges read to the n+source/drain region 3046 of the first transfer transistor Tr1 will be an output potential arising from only red light.

The output potential is VR.

Then, output potentials VR, VG and VB corresponding to respective colors are calculated by the three output potentials VRGB, VRG and VR read by the above procedure.

For example, the output potential VB corresponding to blue light is detected by the following calculation formula.

$$VRGB - VRG = VB$$

The output potential VG corresponding to green light is detected by the following calculation formula.

$$VRG - VR = VG$$

The output potential VR corresponding to red light is equivalent to the output potential detected by the first transfer transistor Tr1.

The above calculations are performed by signal processing in the peripheral circuits, and color separation of three colors can be performed according to the calculations.

According to the embodiment, it is possible to read charges accumulated in the photodiodes formed at the deep position in the silicon substrate 3021 efficiently without residual charges by using the vertical transfer transistors in which gate electrodes are buried in respective depths of plural photodiodes. As a result, residual images can be suppressed.

Additionally, the vertical transfer transistors in which gate electrodes 3033, 3037 and 3042 are buried in the silicon substrate 3021 are used, therefore, it is not necessary that then-type semiconductor layers 3027, 3025 and 3023 to be respective charge accumulation regions of the first to third photodiodes PD1 to PD3 are exposed on the surface of the silicon substrate 3021. Therefore, it is possible to prevent noise on the surface of the silicon substrate 3021, which occurs while signal charges are accumulated in the first to third photodiodes PD1 to PD3.

Furthermore, according to the embodiment, the first to third photodiodes PD1 to PD3 are formed by stacking plural layers of flat plate-shaped p-type semiconductor layers and n-type semiconductor layers, and depths of pn junctions of respective photodiodes are fixed in the substrate. Accordingly, color mixture in respective photodiodes can be suppressed.

Moreover, the flat plate-shaped p-type semiconductor layers and n-type semiconductor layers are alternately stacked, thereby forming plural different photodiodes in the depth direction, and further, the gate electrodes 3033, 3037 and 3042 are buried in the depths of respective first to third photodiodes PD1 to PD3. Therefore, the design of further stacking the p-type semiconductor layer and the n-type semiconductor layer to increase the photodiode is easy, and the design of forming the corresponding buried gate electrode is also easy. In the embodiment, three photodiodes are formed in the unit pixel area 3020, however, it is not limited to this and four or more photodiodes can be formed.

In plural photodiodes formed by stacking the flat plate-shaped p-type semiconductor layers and the n-type semiconductor layers, the open area ratio can be equally formed in the unit pixel area, and the open area ratio of each photodiode is not reduced. Therefore, color separation can be performed without reducing the open area rate in plural photodiodes in the unit pixel area.

Also in the embodiment, it is possible to increase the open area ratio and improve sensitivity by applying the back-illuminated type.

In the method of reading signal charges sequentially from the third transfer transistor Tr3 including the gate electrode 3042 having the longest gate length in the first to third transfer transistors Tr1 to Tr3 as in the embodiment, time for accumulating signal charges is necessary every time signal charges are read.

Embodiment 68

Next, as a solid-state imaging device according to Embodiment 68, a solid-state imaging device and a reading method thereof which can read signal charges of the first to third photodiodes PD1 to PD3 at the same time will be explained. Since a cross-sectional configuration in the unit pixel area 3020 of the solid-state imaging device according to the embodiment of the invention is the same as Embodiment 67 shown in FIG. 102, it is not shown. Since a circuit configuration of a transfer transistor portion in the solid-state imaging device of the embodiment is also the same as FIG. 103, it is not shown.

In the present embodiment, positions in which the gate electrodes 3033, 3037 and 3042 in the first to third transfer transistors Tr1 to Tr3 in Embodiments 67 to 69 are formed are prescribed in the solid-state imaging device in Embodiment 67.

In the embodiment, the signal charge amount accumulated in the third photodiode PD3 is read by each of the first to third transfer transistors Tr1 to Tr3 in equal proportions, for example, one third each. For that purpose, for example, positions where the gate electrodes 3033, 3037 and 3042 of the first to third transfer transistors Tr1 to Tr3 are formed are prescribed as positions where the signal charge amount accumulated in the third photodiode PD3 can be read in equal proportions, namely, one third each.

Additionally, the signal charge amount accumulated in the second photodiode PD2 is read by each of the first and second transfer transistors Tr1, Tr2 in equal proportions, namely, one half each. For that purpose, for example, positions where the gate electrodes 3033, 3037 of the first and second transfer transistors Tr1, Tr2 are formed are prescribed as positions where the signal charge amount accumulated in the second photodiode PD2 can be read in equal proportions, namely, one half each.

In the solid-state imaging device of the embodiment, signal charges are read by the first to third transfer transistors Tr1 to Tr3 at the same time.

Signal charges arising from red light accumulated in the first photodiode PD1 is read to each of the n+source/drain regions 3046, 3041 and 3045 by the channel portions 3039, 3040 and 3044 of the first to third transfer transistors Tr1 to Tr3 in equal proportions, namely, one third each. That is, in the circuit diagram shown in FIG. 103, signal charges of red color transferred from the first photodiode PD1 are transferred by each of the first to third transfer transistors Tr1 to Tr3 in equal proportions, namely, one third each. Signal charges of green color transferred from the second photodiode PD2 are transferred by each of the second and third transfer transistors Tr2, Tr3 in equal proportions, namely, one half each. Also, all signal charges of blue color transferred from the third photodiode PD3 are transferred by the third transfer transistor Tr3.

According to the same principle, signal charges arising from green light accumulated in the second photodiode PD2 are read to the n+source/drain regions 3046, 3041 by the channel portions 3039, 3040 of the first and second transfer transistors Tr1, Tr2 in equal proportions, namely, one half each.

Signal charges arising from blue light accumulated in the third photodiode PD3 are read to the n+source/drain region 3045 only by the channel portion 3044 of the third transfer transistor Tr3.

Here, signal charges accumulated in the first photodiode PD1 are represented as ER, signal charges accumulated in the second photodiode PD2 are represented as EG and signal charges accumulated in the third photodiode PD3 are represented as EB.

Then, signal charges read to the n+source/drain region 3045 by the third transfer transistor Tr3 are represented as $(\frac{1}{3})$ER+$(\frac{1}{2})$EG+EB. Signal charged read to the n+source/drain region 3041 are represented as $(\frac{1}{3})$ER+$(\frac{1}{2})$EG. Additionally, signal charges read to the n+source/drain region 3046 are represented as $(\frac{1}{3})$ER.

The signal charges read as described above are calculated at the peripheral circuits to derive respective signal charges ER, EG and EB, thereby performing color separation of three colors.

In the embodiment, positions where the gate electrodes 3033, 3037 and 3042 in the first to third transfer transistors Tr1 to Tr3 are formed are prescribed, however, it is not limited to this. It is also preferable that charge amounts which can be read in respective first to third transfer transistors Tr1 to Tr3 are checked in advance and respective signal charges ER, EG and EB are calculated in consideration of these values.

In the embodiment, the same advantages as Embodiment 67 can be obtained as well as the advantage in which signal charges of plural photodiodes formed in the unit pixel area can be read at the same time can be obtained.

Embodiment 69

Figures 104A, 104B:
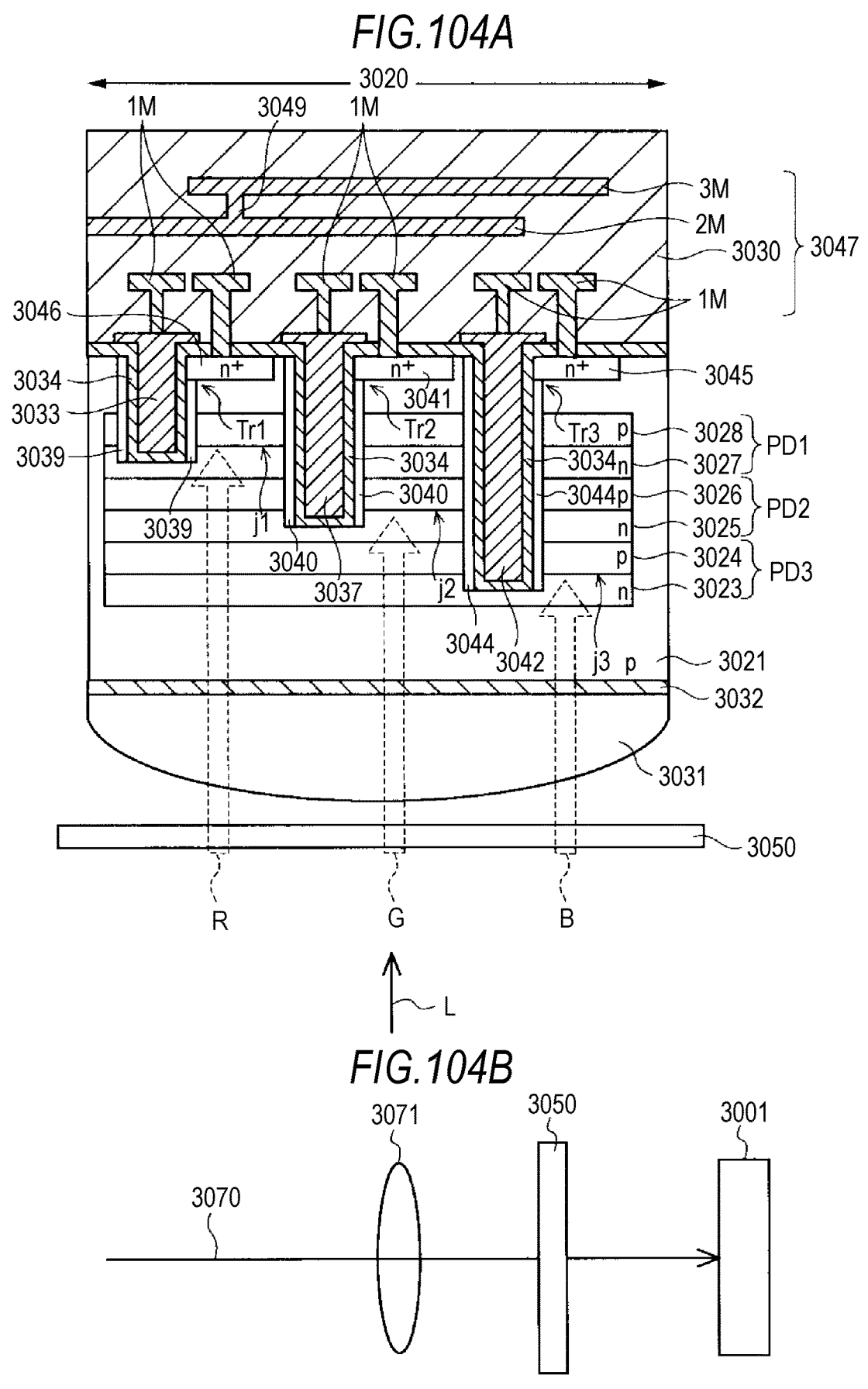

Next, FIG. 104A shows a cross-sectional configuration in a pixel portion of a solid-state imaging device according to Embodiment 6 9 of the invention. FIG. 104A shows the cross-sectional configuration in one pixel, namely, in the unit pixel area 3020. In FIG. 104A, same symbols are given to portions corresponding to FIG. 102, and the repeated explanation is omitted. In addition, since the circuit diagram of the transfer transistors of the solid-state imaging device in the embodiment is the same as FIG. 103, it is not shown.

In the embodiment, a mechanical shutter 3050 is provided on the light incident side, namely, the back side of the solid-state imaging device. Other configurations are the same as Embodiment 67.

The mechanical shutter 3050 used in the embodiment opens when light is incident and shuts when light incident is not necessary.

A method of reading signal charges accumulated in the first to third photodiodes PD1 to PD3 in the solid-state imaging device of the embodiment will be explained below.

First, light is incident on the first to third photodiodes PD1 to PD3 in the opened state of the mechanical shutter 3050 to accumulate signal charges by photoelectric conversion.

Next, the mechanical shutter 3050 is shut to block outer light which is incident on the first to third photodiodes PD1 to PD3. In this stage, a state in which signal charges are accumulated in the first to third photodiodes PD1 to PD3 is kept.

Next, signal charges accumulated in the first photodiode PD1 are read to the n+source/drain region 3046 by the first transfer transistor Tr1. Since signal charges corresponding to red light are accumulated in the first photodiode PD1, signal charges read to the n+source/drain region 3046 of the first transfer transistor Tr1 are obtained by photoelectric conversion of red light.

Next, signal charges accumulated in the second photodiode PD2 are read to the n+source/drain region 3041 by the second transfer transistor Tr2. Since the gate electrode 3037 in the second transfer transistor Tr2 also touches the first n-type semiconductor layer 3027 included in the first photodiode PD1 through the gate insulating film 3034, the first n-type semiconductor layer 3027 is connected to the n+source/drain region 3041 of the second transfer transistor Tr2 by the channel portion 3040 of the second transfer transistor Tr2. However, signal charges accumulated in the first photodiode PD1 (first n-type semiconductor layer 3027) have already been read in the previous stage. Accordingly, only the signal charges accumulated in the second photodiode PD2 are read to the n+source/drain region 3041 of the second transfer transistor Tr2. That is, in the circuit diagram of FIG. 103, there is no signal transferred from the first photodiode PD1 to the second transfer transistor Tr2.

Since signal charges corresponding to green light are accumulated in the second photodiode PD2, signal charges read to the n+source/drain region 3041 of the second transfer transistor Tr2 are obtained by photoelectric conversion of green light.

Subsequently, signal charges accumulated in the third photodiode PD3 are read to the n+source/drain region 3045 by the third transfer transistor Tr3. The gate electrode 3042 in the third transfer transistor Tr3 also touches the first and second n-type semiconductor layers 3027, 3025 included in the first and second photodiodes PD1, PD2 through the gate insulating film 3034, therefore, the first n-type semiconductor layer 3027, the second n-type semiconductor layer 3025 are connected to the n+source/drain region 3045 of the third transfer transistor Tr3 by the channel portion 3044 of the third transfer transistor Tr3. However, signal charges accumulated in the first and second photodiodes PD1, PD2 (first and second n-type semiconductor layers 3027, 3025) have already been read in the previous stage. Accordingly, only the signal charges accumulated in the third photodiode PD3 are read to the n+source/drain region 3045 of the third transfer transistor Tr3. That is, in the circuit diagram of FIG. 103, there is no signal transferred from the first and second photodiodes PD1, PD2 to the third transfer transistor Tr3. Since signal charges corresponding to blue light are accumulated in the third photodiode PD3, signal charges read to the n+source/drain region 3045 of the third transfer transistor Tr3 are obtained by photoelectric conversion of blue light.

In the embodiment, signal charges are read from the photodiodes connected to the gate electrodes in the order from the shallower to deeper positions, thereby performing color separation of three colors of red, green and blue. In the embodiment, outside light is blocked by the mechanical shutter 3050 when signal charges are read. Accordingly, it is possible to prevent accumulation of signal charges in other photodiodes while reading signal charges of a certain photodiode.

When the mechanical shutter 3050 having the above configuration is actually used, the mechanical shutter 3050 is arranged between the solid-state imaging device 3001 in which pixels 3002 are arranged in an array state and an optical lens system 3071 for condensing light signals 3070 on the solid-state imaging device 3001 as shown in FIG. 104B. In the configuration, light signals incident on the whole imaging area of the solid-state imaging device 3001 are controlled.

In the embodiment, not only the same advantages as Embodiment 67 can be obtained but also an advantage in which signal charges of plural photodiodes formed in the unit pixel area can be read at the same time by using the mechanical shutter 3050.

In the embodiment, the example of using the mechanical shutter 3050 is shown, however, if time necessary for reading charges is sufficiently short as compared with exposure time, the above advantage can be obtained even when the mechanical shutter is not provided.

Embodiment 70

Figure 105:
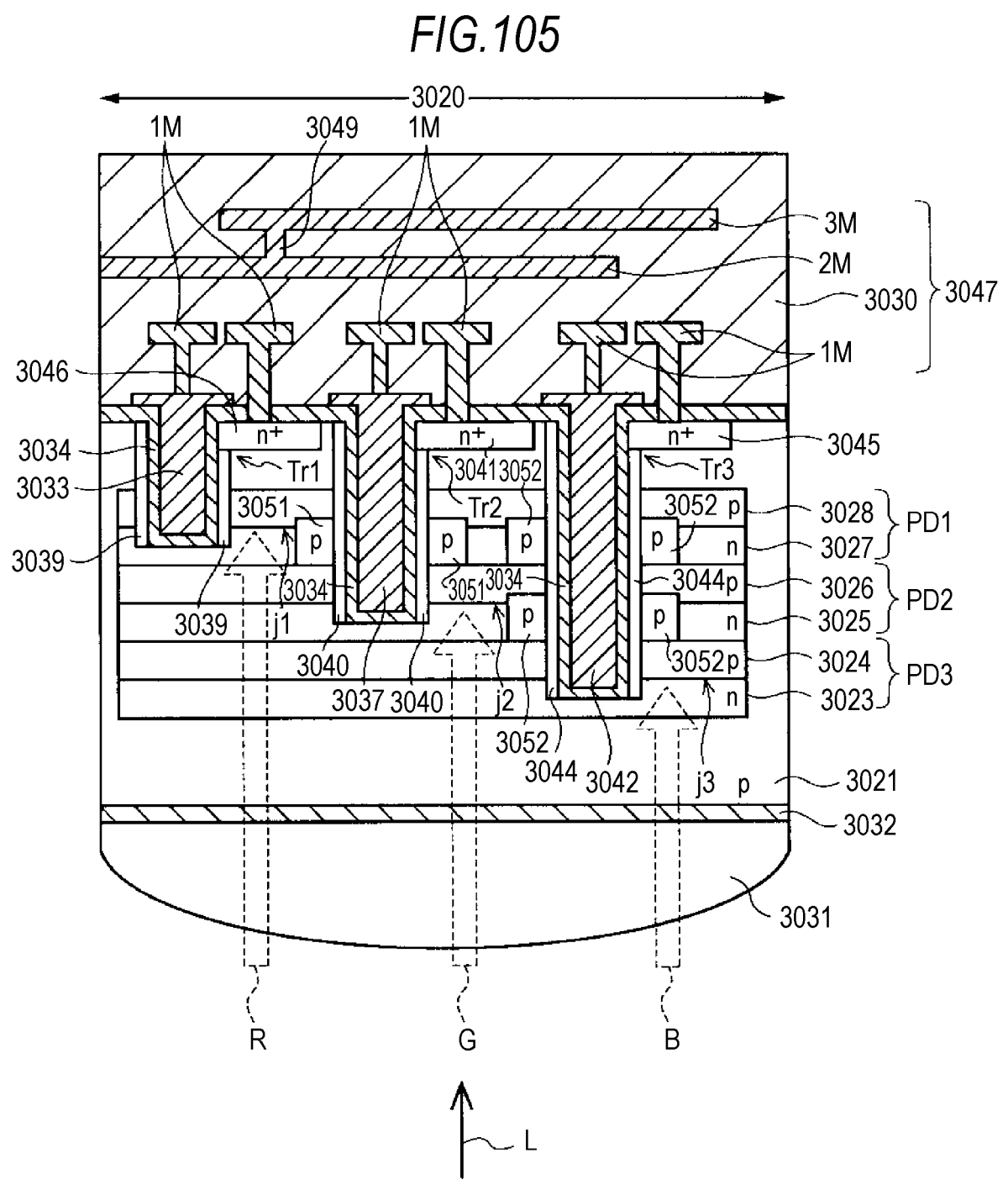

Next, FIG. 105 shows a cross-sectional configuration of a pixel portion in a solid-state imaging device according to Embodiment 70 of the invention. FIG. 105 shows the cross-sectional configuration in one pixel, namely, in the unit pixel area 3020. In FIG. 105, same symbols are given to portions corresponding to FIG. 102, and the repeated explanation is omitted.

In the solid-state imaging device of the embodiment, the configuration of a contact portion between the gate portion and the n-type semiconductor layer included in the photodiode in the solid-state imaging device of Embodiment 67 is partly modified.

As shown in FIG. 105, a p-type semiconductor region 3051 is formed around the gate electrode 3037 positioned in the depth of the first n-type semiconductor layer 3027 in the gate electrode 3037 included in the second transfer transistor Tr2. That is, the p-type semiconductor region 3051 is formed in a portion of the first n-type semiconductor layer 3027 to be the charge accumulation region of the first photodiode which touches the second transfer transistor Tr2.

Also, a p-type semiconductor region 3052 is formed around the gate electrode 3042 positioned in the depth of the first n-type semiconductor layer 3027 and the second n-type semiconductor layer 3025 in the gate electrode 3042 included in the third transfer transistor Tr3. That is, the p-type semiconductor region 3052 is formed in portions of the first and second n-type semiconductor layers 3027, 3025 to be the charge accumulation regions of the first and second photodiodes PD1, PD2 which touch the third transfer transistor Tr3.

As described above, the portions of photodiodes other than the photodiode to be a reading target which touch the gate electrodes 3037, 3042 included in the second and third transfer transistors Tr2, Tr3 are covered with the p-type semiconductor regions having the inverse characteristic to the n-type semiconductor layer as the charge accumulation region. It is possible to suppress movement of signal charges accumulated in then-type semiconductor layer to the channel portion at the portions where the p-type semiconductor regions are formed.

Figure 106:
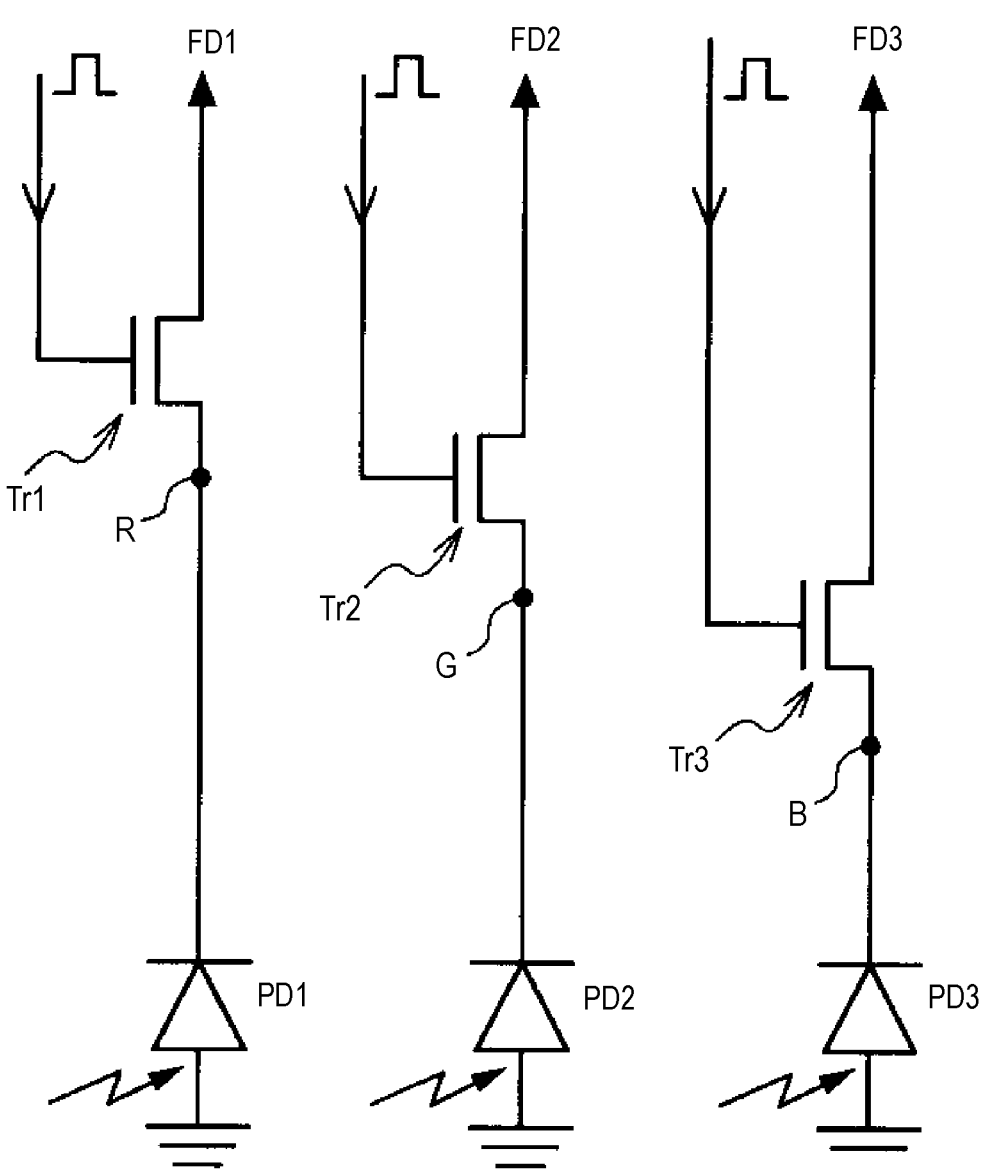
FIG. 106 is an equivalent circuit of a unit pixel of the solid-state imaging device according to Embodiment 70.

FIG. 106 shows an equivalent circuit of a unit pixel in the solid-state imaging device of the embodiment. In the embodiment, the p-type semiconductor regions 3051, 3052 are formed at necessary positions of the gate electrode 3037 and the gate electrode 3042, thereby transferring signal charges accumulated in the first to third photodiodes PD1 to PD3 by independent circuits respectively.

Therefore, in the second transfer transistor Tr2, only the signal charges accumulated in the second photodiode PD2 are read. Similarly, in the third transfer transistor Tr3, only the signal charges accumulated in the third photodiode PD3 are read. The gate electrode 3033 included in the first transfer transistor Tr1 is originally configured to touch only the first photodiode PD1. Accordingly, also in the first transfer transistor Tr1, only the signal charges accumulated in the first photodiode PD1 are read.

According to the embodiment, the circuits which transfer signal charges are independent from one another, therefore, signal charges arising from one color can be read in one transfer transistor. Therefore, signal charges accumulated in the first to third photodiodes PD1 to PD3 can be read in the unit pixel area 3020 at the same time as well as independently.

In the embodiment, not only the same advantages as Embodiment 67 can be obtained but also signal charges accumulated in respective photodiodes can be read at the same time because signal charges of one photodiode are read by one transfer transistor.

Embodiment 71

Figure 107:
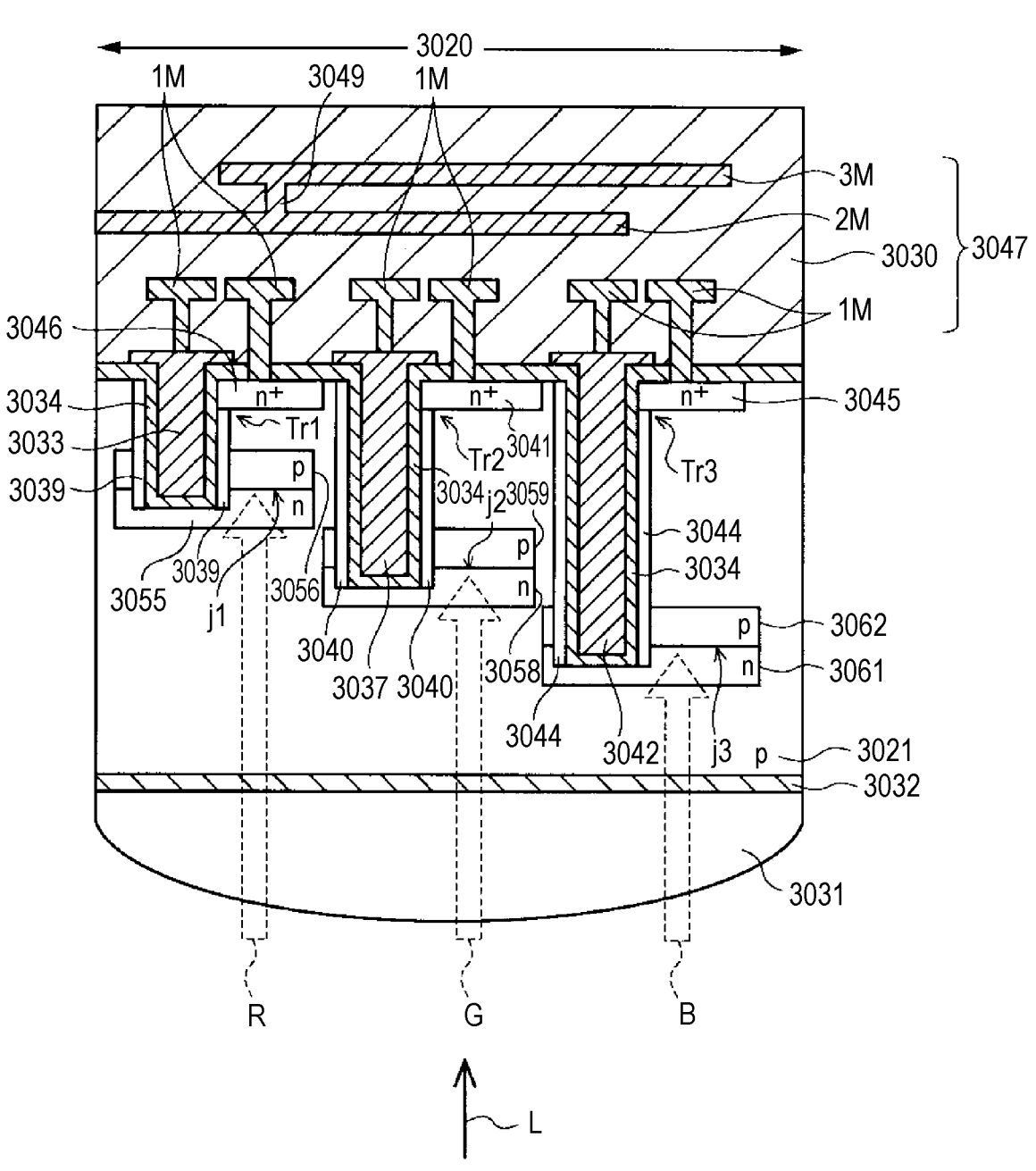
FIG. 107 is a schematic cross-sectional configuration view of a solid-state imaging device according to Embodiment 71 of the invention.

FIG. 107 shows a cross-sectional configuration in a pixel portion of a solid-state imaging device according to Embodiment 71. FIG. 107 shows the cross-sectional configuration in one pixel, namely, in the unit pixel area 3020. In FIG. 107, same symbols are given to the same portions corresponding to FIG. 102 and the repeated explanation is omitted. The circuit configuration of the transfer transistor portion of the solid-state imaging device of the embodiment is the same as FIG. 106, therefore, it is not shown.

In the solid-state imaging device of the embodiment, the configuration of then-type semiconductor layer and the p-type semiconductor layer included in the photodiode in the solid-state imaging device of Embodiment 67 is modified.

In the embodiment, three photodiodes each having a planar p-type semiconductor layer and an n-type semiconductor layer are formed separately in different depths in the silicon substrate 3021 in the unit pixel area 3020. The respective photodiodes are formed by staking the p-type semiconductor layer, the n-type semiconductor layer and the p-type semiconductor layer in this order from the surface side.

In the embodiment, a photodiode formed by stacking a p-type semiconductor layer 3056 an n-type semiconductor layer 3055 and a p-type semiconductor layer 3054, which is positioned on the most front side in the silicon substrate 3021 is the first photodiode PD1. Also, a photodiode formed by stacking a p-type semiconductor layer 3059, an n-type semiconductor layer 3058 and a p-type semiconductor layer 3057, which is positioned in the middle of the silicon substrate 3021 is the second photodiode PD2. Further, a photodiode formed by stacking a p-type semiconductor layer 3062, an n-type semiconductor layer 3061 and a p-type semiconductor layer 3060, which is positioned on the most back side in the silicon substrate 3021 is the third photodiode PD3.

The pn junction "j1" between the p-type semiconductor layer 3056 and then-type semiconductor layer 3055 included in the first photodiode PD1 is formed in the depth in which red light is absorbed when light is illuminated from the back side.

The pn junction "j2" between the p-type semiconductor layer 3059 and then-type semiconductor layer 3058 included in the second photodiode PD2 is formed in the depth in which green light is absorbed when light is illuminated from the back side.

The pn junction "j3" between the p-type semiconductor layer 3062 and then-type semiconductor layer 3061 included in the third photodiode PD3 is formed in the depth in which blue light is absorbed when light is illuminated from the back side.

Also in the embodiment, the gate electrodes 3033, 3037 and 3042 of transfer transistors corresponding to the above respective first to third photodiodes PD1 to PD3 are formed in the same manner as Embodiment 67 to Embodiment 70.

First, the gate electrode 3033 of the first transfer transistor Tr1 is formed in the depth reaching the pn junction "j1" of the first photodiode PD1 from the surface side of the silicon substrate 3021. The gate electrode 3037 of the second transfer transistor Tr2 is formed in the depth reaching the pn junction "j2" of the second photodiode PD2 from the surface side of the silicon substrate 3021. The gate electrode 3042 of the third transfer transistor Tr3 is formed in the depth reaching the pn junction "j3" of the third photodiode PD3 from the surface side of the silicon substrate 3021. Other configurations of the first to third transfer transistors Tr1 to Tr3 are the same as Embodiment 67 to Embodiment 70, therefore, repeated explanation is omitted.

In the embodiment, signal charges accumulated in the first photodiode PD1 are read by the first transfer transistor Tr1. Signal charges accumulated in the second photodiode PD2 are read by the second transfer transistor Tr2. Further, signal charges accumulated in the third photodiode PD3 are read by the third transfer transistor Tr3.

According to the solid-state imaging device of the embodiment, the first to third photodiodes PD1 to PD3 are formed separately, and each of the gate electrodes 3033, 3037 and 3042 of the first to third transfer transistors Tr1 to Tr3 touches only the desired photodiode through the gate insulate film 3034. The solid-state imaging device having the above configuration has the circuit configuration as shown in FIG. 106. As shown in FIG. 106, also in the embodiment, signal charges accumulated in the first to third photodiodes PD1 to PD3 are transferred by independent circuits respectively. Accordingly, in each of the first to third transfer transistors Tr1 to Tr3, only the signal charges by one color light can be read, respectively. As a result, it is possible to prevent color mixture.

The above-described solid-state imaging devices according to Embodiment 67 to Embodiment 71 are included in, for example, the solid-state imaging device 1 shown in FIG. 5. The solid-state imaging device 1 shown in FIG. 5 has a configuration in which pixels are arranged in a two-dimensional array state, however, the configuration adapted to the solid-state imaging devices according to Embodiment 67 to Embodiment 71 is not limited to this. For example, a solid-state imaging device having a configuration in which pixels are linearly arranged can be applied.

In the above embodiments, the solid-state imaging devices when applied to the CMOS image sensor are shown, however, the invention can be applied to CCD image sensor. Further, solid-state imaging devices of Embodiments 67 to 71 take the back-illuminated type in which light is incident from the opposite side of the wiring layer 3047 as an example, however, it is not limited to this. That is, it is possible to apply a front-illuminated solid-state imaging device in which light is incident from the same surface side as the wiring layer.

In the case of applying the front-illuminated solid-state imaging device, it is preferable that the pn junction "j1" is in the depth corresponding to a position where blue light is absorbed when light is illuminated from the front surface side in the solid-state imaging devices according to Embodiment 67 to Embodiment 71. Also, it is preferable that the pn junction "j2" is in the depth corresponding to a position where green light is absorbed when light is illuminated from the front surface side. Further, it is preferable that the pn junction "j3" is in the depth corresponding to a position where red light is absorbed when light is illuminated from the front surface side. The gate lengths of the gate electrodes 3033, 3037, 3042 of the first to third transfer transistors Tr1, Tr2 and Tr3 may be formed so as to correspond to the above. That is, when applying the front-illuminated solid-state imaging device, the gate electrodes 3033, 3037 and 3042 of the first to third transfer transistors Tr1 to Tr3 in FIG. 102 correspond to blue, green and red photodiodes, respectively.

In the embodiments, the invention is applied to the solid-state imaging device in which signal charges are electrons. The invention also can be applied to a solid-state imaging device in which signal charges are holes. In this case, it is possible to configure the device by using an opposite conductive-type semiconductor substrate and a semiconductor layer.

The solid-state imaging device according to the above embodiments can be applied to electronic apparatuses such as a camera, a cellular phone with a camera, and other apparatuses having imaging functions.

Figure 108:
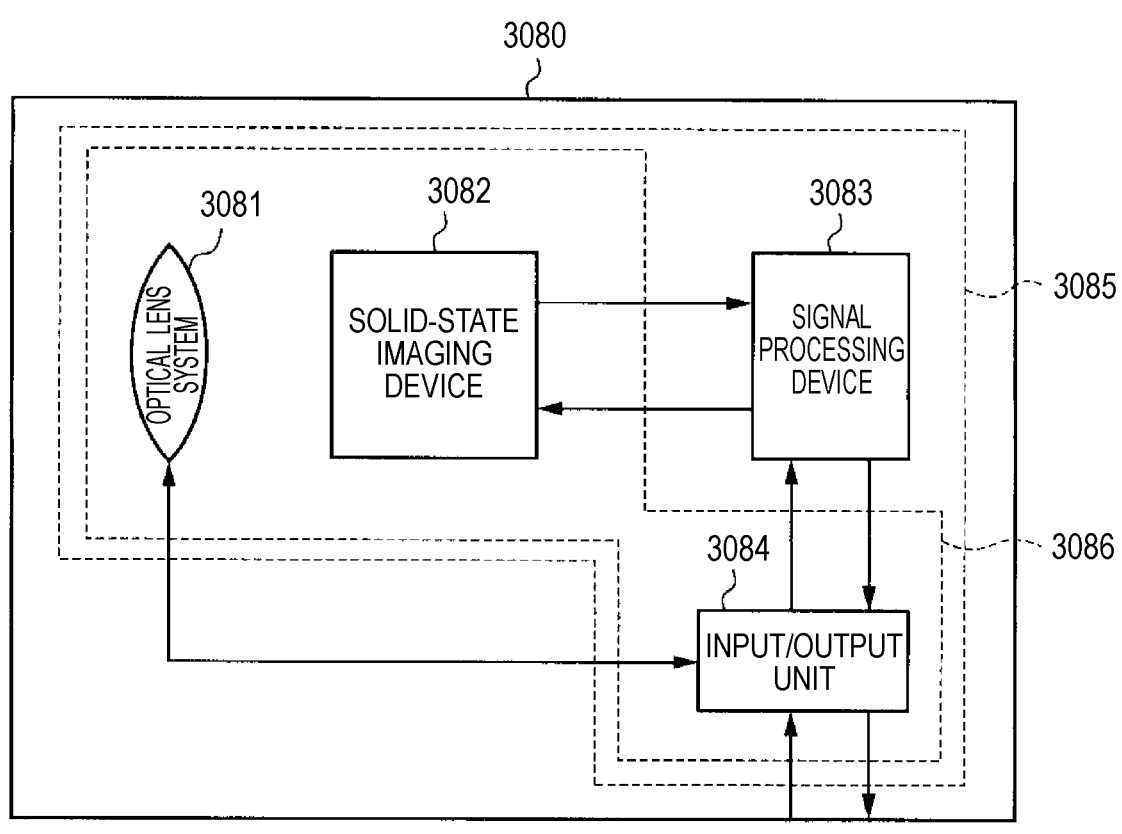
FIG. 108 is a schematic configuration view of an electronic apparatus according to an embodiment of the invention.

Next, FIG. 108 shows an embodiment of an electronic apparatus to which the solid-state imaging device according to Embodiment 67 to Embodiment 71 is used. In the embodiment, a camera is used as an example of an electronic apparatus.

As shown in FIG. 108, it is preferable that an electronic apparatus 3080 according to the embodiment is configured as an electronic apparatus 3085 which includes a solid-state imaging device 3082, an optical lens system 3081, an input/output unit 3084 and a signal processing device 3083, or configured as an electronic apparatus 3086 which includes the solid-state imaging device 3082, the optical lens system 3081 and the input/output unit 3084. As the solid-state imaging device 3082, the solid-state imaging device according to Embodiment 67 to Embodiment 71 is used.

The solid-state imaging device according to Embodiment 67 to Embodiment 71 is provided in the electronic apparatus 3080 of the embodiment, thereby reducing color mixture, false colors, residual images and noise, as a result, images with color sensitivity can be obtained.

The configuration of FIG. 108 can be realized as a camera module, or an imaging module including imaging functions. The invention can be applied to electronic apparatuses such as a cellular phone with a camera, and other apparatuses including imaging functions by including such module.

It should be understood by those skilled in the art that various modifications, combinations, sub-combinations and alterations may occur depending on design requirements and other factors insofar as they are within the scope of the appended claims or the equivalents thereof.

What is claimed is:

1. A light detecting device, comprising:
a semiconductor region, comprising:
    a first photoelectric conversion region;
    a second photoelectric conversion region; and
    a first floating diffusion region disposed between the first photoelectric conversion region and the second photoelectric conversion region;
a pixel isolation region surrounding the semiconductor region;
a first gate electrode and a second gate electrode configured to transfer a charge in the first photoelectric conversion region to the first floating diffusion region; and
a third gate electrode and a fourth gate electrode configured to transfer a charge in the second photoelectric conversion region to the first floating diffusion region,
    wherein each of the first to fourth gate electrodes is disposed adjacent to the pixel isolation region.

2. The light detecting device according to claim 1, wherein the first floating diffusion region is disposed adjacent to the pixel isolation region.

3. The light detecting device according to claim 1, wherein the first gate electrode or second gate electrode overlaps with the first photoelectric conversion region and wherein the third gate electrode or the fourth gate electrode overlaps with the second photoelectric conversion region.

4. The light detecting device according to claim 1, wherein the first floating diffusion region is provided between the first gate electrode, the second gate electrode, the third gate electrode and the fourth gate electrode.

5. The light detecting device according to claim 1, wherein the first gate electrode and the second gate electrode are provided on side portions of the first photoelectric conversion region and wherein the third gate electrode and the fourth gate electrode are provided on side portions of the second photoelectric conversion region.

6. The light detecting device according to claim 1, wherein the first floating diffusion region is provided outside of each of the first photoelectric conversion region and the second photoelectric conversion region.

7. The light detecting device according to claim 1, wherein the first floating diffusion region is shared by the first photoelectric conversion region and the second photoelectric conversion region.

8. The light detecting device according to claim 1, wherein the first gate electrode and the second gate electrode are provided on adjacent side portions of the first photoelectric conversion region and wherein the third gate electrode and the fourth gate electrode are provided on adjacent side portions of the second photoelectric conversion region.

9. The light detecting device according to claim 1, further comprising:
a third photoelectric conversion region;
a fourth photoelectric conversion region;
a second floating diffusion region disposed between the third photoelectric conversion region and the fourth photoelectric conversion region;
a fifth gate electrode and a sixth gate electrode configured to transfer a charge in the third photoelectric conversion region to the second floating diffusion region; and

a seventh gate electrode and an eighth gate electrode configured to transfer a charge in the fourth photoelectric conversion region to the second floating diffusion region, wherein each of the fifth to eighth gate electrodes is disposed adjacent to the pixel isolation region.

10. The light detecting device according to claim 9, wherein one of the fifth to fourth gate electrodes for the first and second photoelectric conversion regions is a shared gate electrode for one of the fifth to eighth gate electrodes for the third and fourth photoelectric conversion regions.

11. An electronic apparatus, comprising:

an optical lens system;

a light detecting device, comprising:

a semiconductor region, comprising:

a first photoelectric conversion region;

a second photoelectric conversion region; and a first floating diffusion region disposed between the first photoelectric conversion region and the second photoelectric conversion region;

a pixel isolation region surrounding the semiconductor region;

a first gate electrode and a second gate electrode configured to transfer a charge in the first photoelectric conversion region to the first floating diffusion region; and a third gate electrode and a fourth gate electrode configured to transfer a charge in the second photoelectric conversion region to the first floating diffusion region, wherein each of the first to fourth gate electrodes is disposed adjacent to the pixel isolation region; and a signal processing device which processes output signals from the light detecting device.

12. The electronic apparatus according to claim 11, wherein the first floating diffusion region is disposed adjacent to the pixel isolation region.

13. The electronic apparatus according to claim 11, wherein the first gate electrode or second gate electrode overlaps with the first photoelectric conversion region and wherein the third gate electrode or the fourth gate electrode overlaps with the second photoelectric conversion region.

14. The electronic apparatus according to claim 11, wherein the first floating diffusion region is provided between the first gate electrode, the second gate electrode, the third gate electrode and the fourth gate electrode.

15. The electronic apparatus according to claim 11, wherein the first gate electrode and the second gate electrode are provided on side portions of the first photoelectric conversion region and wherein the third gate electrode and the fourth gate electrode are provided on side portions of the second photoelectric conversion region.

16. The electronic apparatus according to claim 11, wherein the first floating diffusion region is provided outside of each of the first photoelectric conversion region and the second photoelectric conversion region.

17. The electronic apparatus according to claim 11, wherein the first floating diffusion region is shared by the first photoelectric conversion region and the second photoelectric conversion region.

18. The electronic apparatus according to claim 11, wherein the first gate electrode and the second gate electrode are provided on adjacent side portions of the first photoelectric conversion region and wherein the third gate electrode and the fourth gate electrode are provided on adjacent side portions of the second photoelectric conversion region.

19. The electronic apparatus according to claim 11, further comprising:

a third photoelectric conversion region;

a fourth photoelectric conversion region;

a second floating diffusion region disposed between the third photoelectric conversion region and the fourth photoelectric conversion region;

a fifth gate electrode and a sixth gate electrode configured to transfer a charge in the third photoelectric conversion region to the second floating diffusion region; and a seventh gate electrode and an eighth gate electrode configured to transfer a charge in the fourth photoelectric conversion region to the second floating diffusion region, wherein each of the fifth to eighth gate electrodes is disposed adjacent to the pixel isolation region.

20. The electronic apparatus according to claim 19, wherein one of the fifth to fourth gate electrodes for the first and second photoelectric conversion regions is a shared gate electrode for one of the fifth to eighth gate electrodes for the third and fourth photoelectric conversion regions.

* * * * *